(12) United States Patent
Lee et al.

(10) Patent No.: US 8,962,106 B2
(45) Date of Patent: Feb. 24, 2015

(54) LIQUID CRYSTAL DISPLAY DEVICE, ALIGNMENT FILM, AND METHODS FOR MANUFACTURING THE SAME

(75) Inventors: Taek-Joon Lee, Hwaseong-si (KR); Keun-Chan Oh, Cheonan-si (KR); Jun-Hyup Lee, Seoul (KR); Sang-Gyun Kim, Asan-si (KR); Jang-Hyun Kim, Seoul (KR); Tae-Hoon Kim, Jinju-si (KR)

(73) Assignee: Samsung Display Co., Ltd., Yongin, Gyeonggi-Do (KR)

(*) Notice: Subject to any disclaimer, the term of this patent is extended or adjusted under 35 U.S.C. 154(b) by 132 days.

(21) Appl. No.: 13/556,601

(22) Filed: Jul. 24, 2012

(65) Prior Publication Data

US 2013/0101755 A1 Apr. 25, 2013

(30) Foreign Application Priority Data

Oct. 20, 2011 (KR) .................. 10-2011-0107357

(51) Int. Cl.
*C09K 19/00* (2006.01)
*G02F 1/1337* (2006.01)

(52) U.S. Cl.
CPC .... *G02F 1/133707* (2013.01); *G02F 1/133711* (2013.01); *G02F 1/133753* (2013.01); *G02F 1/133788* (2013.01); *G02F 2001/133746* (2013.01)
USPC .......... 428/1.23; 428/1.2; 428/1.21; 349/123; 349/131; 528/30; 528/38

(58) Field of Classification Search
CPC .................. C08G 77/20; G02F 2001/133742; G02F 2001/133746; G02F 2001/133749; G02F 1/133711; G02F 1/133719

USPC ........ 428/1.2, 1.21, 1.13, 1.23; 349/123, 131; 528/30, 38
See application file for complete search history.

(56) References Cited

U.S. PATENT DOCUMENTS

| 4,937,208 | A | * | 6/1990 | Yamamoto | 501/12 |
|---|---|---|---|---|---|
| 5,256,456 | A | * | 10/1993 | Ogawa | 428/1.23 |
| 5,824,377 | A | | 10/1998 | Pirwitz et al. | |
| 5,889,571 | A | | 3/1999 | Kim et al. | |
| 2007/0224369 | A1 | | 9/2007 | Kojima | |
| 2011/0043739 | A1 | | 2/2011 | Sumiya et al. | |
| 2012/0249940 | A1 | * | 10/2012 | Choi et al. | 349/123 |

FOREIGN PATENT DOCUMENTS

| JP | 2010140010 | 6/2010 |
|---|---|---|
| KR | 10-2011-0018927 | 2/2011 |
| WO | 2009148099 | 12/2009 |

OTHER PUBLICATIONS

WO 2009/148099 corresponds to KR10-2011-0018927.
European Search Report dated Feb. 28, 2013 in corresponding European Appln. No. 12189329.1-1904.

* cited by examiner

*Primary Examiner* — Michele L Jacobson
*Assistant Examiner* — Ruiyun Zhang
(74) *Attorney, Agent, or Firm* — F. Chau & Associates, LLC

(57) ABSTRACT

An alignment film includes a first pre-tilt functional group, a second pre-tilt functional group and a first vertical alignment functional group, which are linked to polysiloxane on a substrate. The first vertical alignment functional group includes a cyclic compound and is aligned substantially perpendicularly to the substrate. The first pre-tilt functional group is crosslinked to the second pre-tilt functional group and tilted with respect to the substrate.

14 Claims, 77 Drawing Sheets

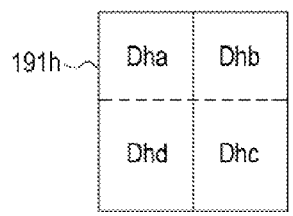
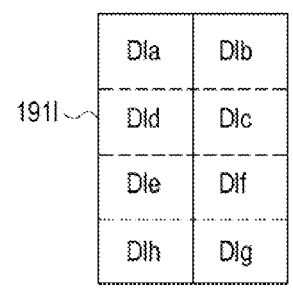
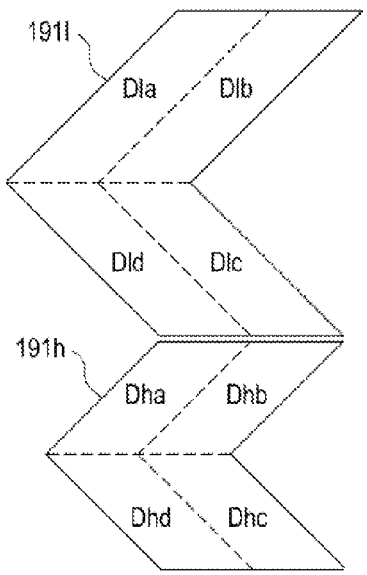
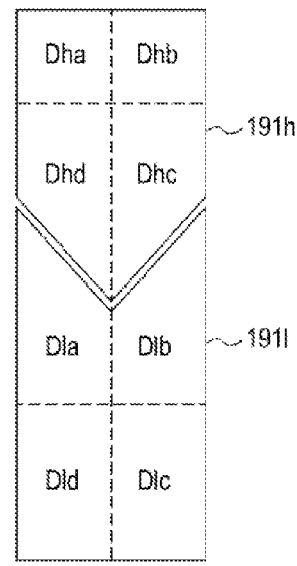
FIG.33A  FIG.33B  FIG.33C
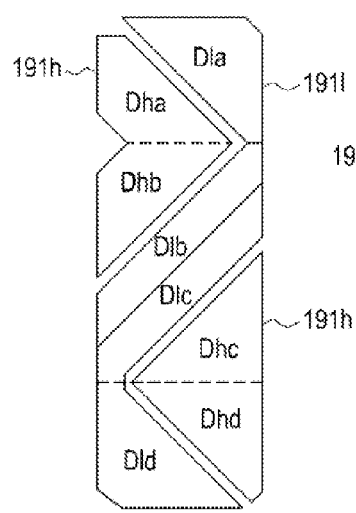
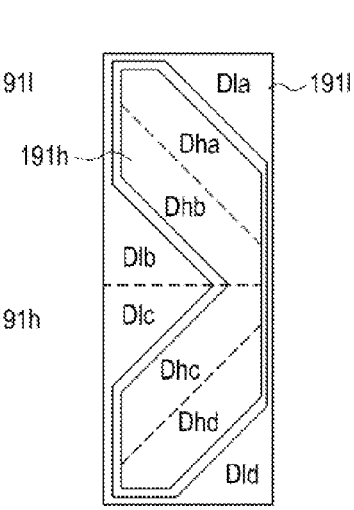
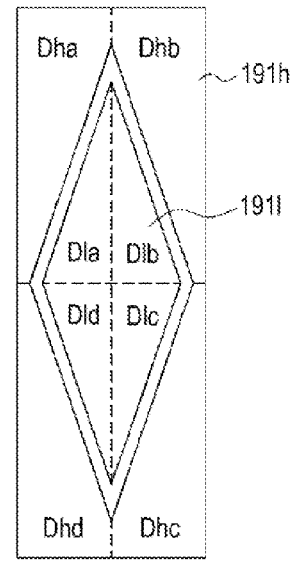
FIG.33D  FIG.33E  FIG.33F

LIQUID CRYSTAL DISPLAY DEVICE, ALIGNMENT FILM, AND METHODS FOR MANUFACTURING THE SAME

CROSS-REFERENCE TO RELATED APPLICATIONS

This application claims priority under 35 U.S.C. §119(a) to a Korean Patent Application Serial No. 10-2011-0107357 filed on Oct. 20, 2011, the disclosure of which is hereby incorporated by reference herein in its entirety.

TECHNICAL FIELD

The present disclosure relates to a liquid crystal display device, an alignment film, and methods for manufacturing the same

DISCUSSION OF THE RELATED ART

In general, liquid crystal display devices may be classified into, for example, a twisted nematic-type device, a horizontal electric field-type device, and a vertical alignment-type device according to the characteristics of a liquid crystal layer. A Patterned Vertically Aligned (PVA) mode, e.g., the vertical alignment-type approach, has been developed to realize a wide viewing angle. To further increase the side visibility of the PVA mode, a micro-slit mode and a Super Vertical Alignment (SVA) mode have been developed. In the SVA mode, a reactive mesogen may exist in a liquid crystal layer to align liquid crystal molecules. The reactive mesogen may exist in the liquid crystal layer without being cured or hardened. If light is irradiated thereto, the reactive mesogen may be cured, thereby pre-tilting the liquid crystal molecules. Depending on the pre-tilt angle of the liquid crystal molecules, a response time of the liquid crystal display device may be changed and light leakage defects may occur.

Therefore, an alignment film for optimizing the pre-tilt angle of the liquid crystal molecules may be required. To increase the characteristics and reliability of the alignment film, a material forming the alignment film should include various functional groups.

SUMMARY OF THE INVENTION

An exemplary embodiment of the present invention may provide a liquid crystal display device having a fast response time and reduced light leakage defects.

An exemplary embodiment of the present invention may provide an alignment film having a high reliability.

In accordance with an exemplary embodiment of the present invention, an alignment film includes a first pre-tilt functional group, a second pre-tilt functional group and a first vertical alignment functional group, which are linked to polysiloxane on a substrate. The first vertical alignment functional group includes a cyclic compound and is aligned substantially perpendicularly to the substrate. The first pre-tilt functional group is cross-linked to the second pre-tilt functional group and tilted with respect to the substrate.

A mol % composition ratio of the first vertical alignment functional group and the first pre-tilt functional group may be about 1:about 1.5 to about 11.

The first vertical alignment functional group may include any one of an alkyl benzene group, a cholesteric group, an alkylated alicyclic group, or an alkylated aromatic group.

The first pre-tilt functional group may be greater than the second pre-tilt functional group in chain length.

The first and second pre-tilt functional groups may each include a different one of a vinyl group, a styrene group, a methacrylate group, a cinnamate group, and an acrylic group.

A mol % composition ratio of the first vertical alignment functional group, the first pre-tilt functional group, and the second pre-tilt functional group is about 1:about 1.5 to about 11:about 1 to about 3.

The alignment film may further include a sol-gel catalyst or an aggregation inhibitor linked to the polysiloxane.

The sol-gel catalyst or the aggregation inhibitor may include any one of an amino group and a thiol group.

A mol % composition ratio of the first vertical alignment functional group, the first pre-tilt functional group, and the aggregation inhibitor may be about 1:about 1.5 to about 11:about 0.5 to about 4.

The alignment film may further include a second vertical alignment functional group linked to the polysiloxane, and the second vertical alignment functional group may include no cyclic compound.

A mol % composition ratio of the first vertical alignment functional group, the second vertical alignment functional group, and the first pre-tilt functional group may be about 1:about 0.3 to about 3:about 1.5 to about 11.

In accordance with an exemplary embodiment of the present invention, a liquid crystal display device includes a liquid crystal layer comprising liquid crystal molecules and interposed between first and second display panels and an alignment film formed on at least one of the first and second display panels. The alignment layer includes a first pre-tilt functional group, a second pre-tilt functional group and a first vertical alignment functional group, which are linked to polysiloxane. The first vertical alignment functional group includes a cyclic compound and is configured to align first liquid crystal molecules among the liquid crystal molecules to be substantially perpendicularly to the first or second substrate. The first pre-tilt functional group is cross-linked to the second pre-tilt functional group and aligns second liquid crystal molecules among the liquid crystal molecules to be tilted with respect to the first or second display panels.

In accordance with an exemplary embodiment of the present invention, a method for forming an alignment film on a display panel is provided.

The method includes providing a display panel having an electrode formed thereon, forming a surface alignment reactant on the electrode, wherein the surface alignment reactant comprises a first surface alignment material including a plurality of pre-tilting functional groups having different chain lengths bonded to a siloxane and a second surface alignment material including a phase separation enhancer functional group bonded to a siloxane. The first surface alignment material is a vertical alignment material configured to align liquid crystals substantially perpendicular to a plane of the display panel.

In addition, the method further includes performing a first heating process on the surface alignment reactant to cause the surface alignment reactant to become phase separated into a surface inorganic layer and a surface functional group layer, wherein the surface inorganic layer includes the second surface alignment material and the surface functional group layer includes the first surface alignment material and irradiating the surface functional group layer to thereby form an alignment layer on the electrode.

BRIEF DESCRIPTION OF THE DRAWINGS

Exemplary embodiments of the present invention can be understood in more detail from the following description taken in conjunction with the accompanying drawings, in which:

FIGS. 20A to 20C illustrate patterns of main layers constituting the pixel shown in FIG. 18, in which FIG. 20A illustrates a pattern of a gate layer conductor, FIG. 20B illustrates a pattern of a data layer conductor, and FIG. 20C illustrates a pattern of a pixel electrode layer;

FIGS. 26A to 26C illustrate patterns of main layers constituting the pixel shown in FIG. 25, in which FIG. 26A illustrates a pattern of a gate layer conductor, FIG. 26B illustrates a pattern of a data layer conductor, and FIG. 26C illustrates a pattern of a pixel electrode layer;

FIGS. 33A to 33I illustrate shapes and splitting structures of pixel electrodes constituting a liquid crystal display device.

DETAILED DESCRIPTION OF EXEMPLARY EMBODIMENTS

Figure 1:
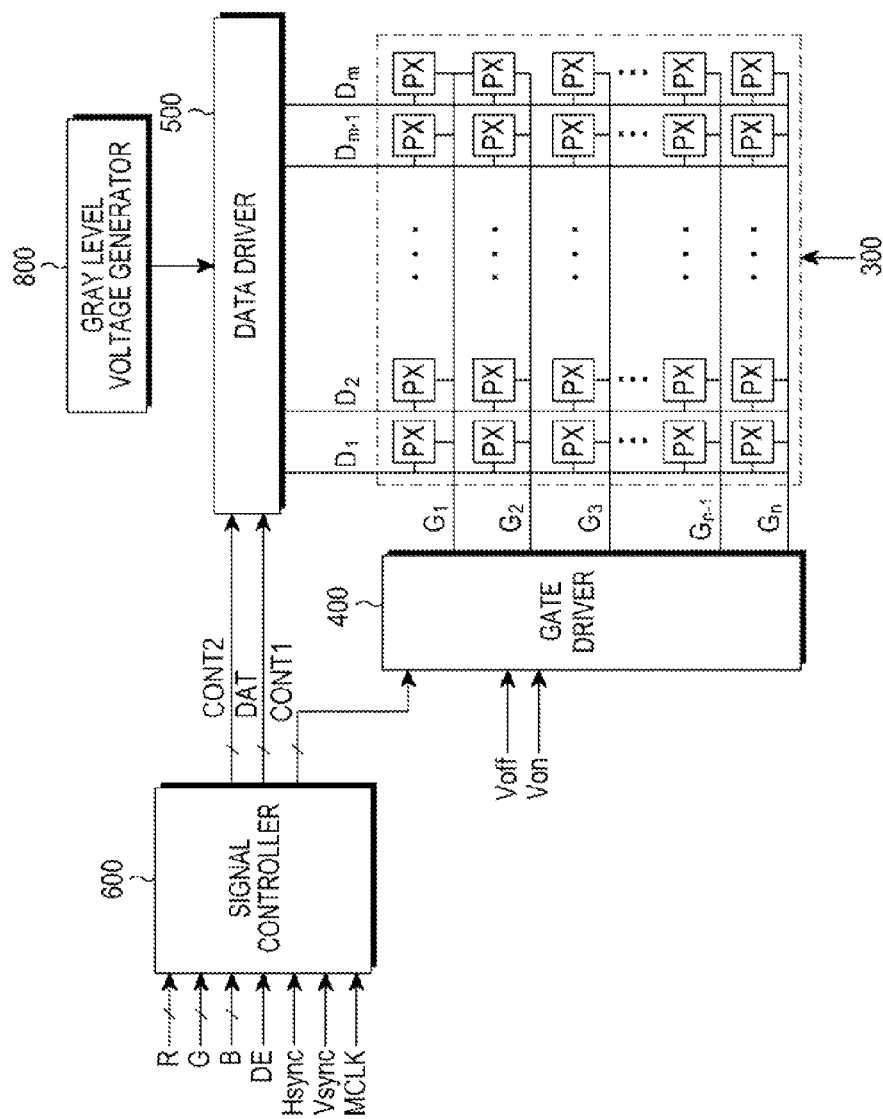
FIG. 1 is a block diagram of a liquid crystal display device according to an exemplary embodiment of the present invention.

Exemplary embodiments of the present invention will now be described in detail with reference to the accompanying drawings.

In this specification, the same drawing reference numerals will be understood to refer to the same elements, features and structures. In the drawings, the thickness of layers, films, panels, regions, etc., may be exaggerated for clarity. It will be understood that when an element such as, for example, a layer, film, region, or substrate is referred to as being "on", "connected to" or "coupled to" another element, it can be directly on, connected to or coupled to the other element or intervening elements may also be present. Like reference numerals designate like elements throughout the specification.

As used herein, the singular forms, "a", "an", and "the" are intended to include plural forms as well, unless the context clearly indicates otherwise.

Figure 2:
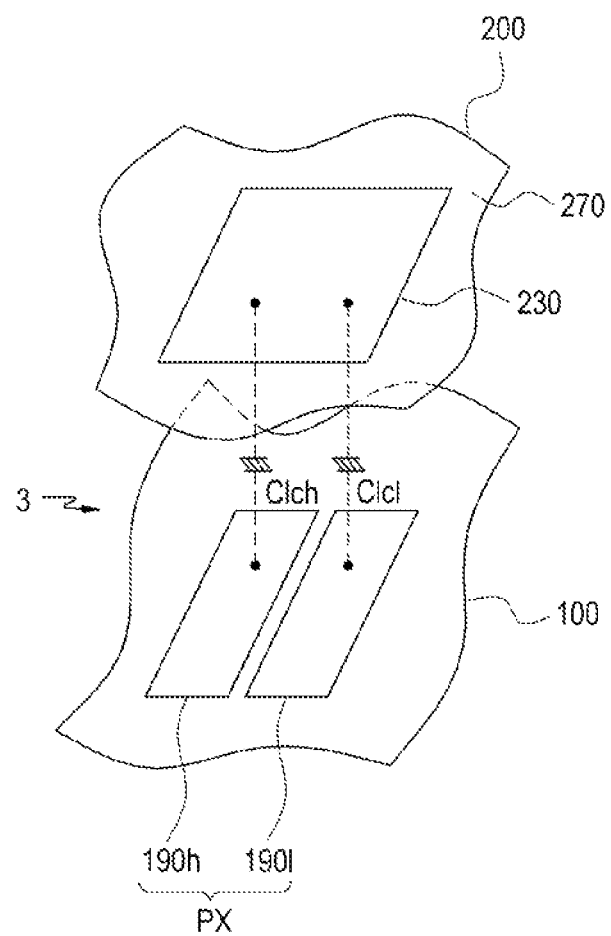
FIG. 2 schematically illustrates the structure of two subpixels in a liquid crystal display device according to an exemplary embodiment of the present invention.

A liquid crystal display device according to an exemplary embodiment of the present invention will be described in detail with reference to FIGS. 1 and 2. FIG. 1 is a block diagram of a liquid crystal display device according to an exemplary embodiment of the present invention. FIG. 2 schematically illustrates the structure of two subpixels 190$h$ and 190$l$ constituting one pixel PX in a liquid crystal display device according to an exemplary embodiment of the present invention. As illustrated in FIG. 1, the liquid crystal display device includes, for example, a liquid crystal display panel assembly 300, a gate driver 400, a data driver 500, a signal controller 600, and a gray level voltage generator 800.

The signal controller 600 receives control signals from a host (not shown), which include, for example, video signals R, G and B, a data enable signal DE, horizontal and vertical synchronization signals Hsync and Vsync, and a clock signal MCLK. The signal controller 600 outputs data control signals CONT2 and video data signals DAT to the data driver 500, and outputs gate control signals CONT1 for selecting gate lines, to the gate driver 400. The signal controller 600 may output light source control signals to a light source generator (not shown) to adjust the light source.

The gray level voltage generator 800 generates all gray level voltages or a limited number of gray level voltages (hereinafter referred to as 'reference gray level voltages'), which are provided to pixels PX, and outputs them to the data driver 500. The reference gray level voltage is different from the common voltage Vcom in polarity.

The data driver 500 receives a reference gray level voltage from the gray level voltage generator 800, and outputs gray level voltages to a plurality of data lines $D_1$-$D_m$ in response to the data control signals CONT2 and the video data signals DAT from the signal controller 600. When the gray level voltage generator 800 provides only a limited number of reference gray level voltages, the data driver 500 may generate a larger number of extended gray level voltages by dividing the reference gray level voltages. When providing the extended gray level voltages to the data lines $D_1$-$D_m$, the data driver 500 performs inversion driving of alternately applying a voltage having the same difference but a different polarity with respect to the common voltage Vcom in every frame, to each of the pixels. The inversion driving methods may be classified into, for example, frame inversion in which data voltages are supplied such that data voltages applied to all pixels are the same in polarity in one frame and data voltage's polarities of all pixels are inversed in the next frame, column inversion in which data voltages are supplied such that polarities of the data voltages applied to pixels on the adjacent data lines $D_1$-$D_m$ are inversed in one frame, point inversion in which data voltages are supplied such that voltage polarities of adjacent pixels PX are different from each other and 2+1 inversion in which data voltages are supplied such that two pixels PX adjacent to the same data line $D_1$-$D_m$ (171) have the same polarity and one pixel PX adjacent to the two pixels PX having the same polarity has a different polarity in a repeated manner.

The gate driver 400 sequentially outputs gate signals to a plurality of gate lines $G_1$-$G_n$ in response to the gate control signals CONT1. The gate signal has a gate-on voltage Von capable of turning on Thin Film Transistors (TFTs) connected to a selected gate line, and a gate-off signal Voff capable of turning off TFTs connected to unselected gates.

The liquid crystal display panel assembly 300 includes, for example, a lower display panel 100, an upper display panel 200 facing the lower display panel 100, and a liquid crystal layer 3 interposed between the lower display panel 100 and the upper display panel. The lower display panel 100 has pixels PX arranged in the form, for example, of a matrix of rows and columns, multiple gate lines $G_1$-$G_n$ (121) to which pixels PX on the same rows are connected, and multiple data lines $D_1$-$D_m$ (171) to which pixels PX on the same columns are connected. FIG. 2 illustrates the schematic structure of one pixel PX among the multiple pixels PX shown in FIG. 1. One pixel PX is divided into, for example, a pair of a first subpixel 190$h$ and a second subpixel 190$l$ spaced apart from each other. First and second subpixel electrodes 191$h$ and 191$l$ are formed in areas of the first and second subpixels 190$h$ and 190$l$, respectively. The subpixels 190$h$ and 190$l$ have liquid crystal capacitors Clch and Clcl, and storage capacitors Csth and Cstl, respectively. Each of the liquid crystal capacitors Clch and Clcl is formed by the liquid crystal layer 3 interposed between one terminal of each of the subpixel electrodes 191$h$ and 191$l$ formed on the lower display panel 100 and one terminal of a common electrode 270 formed on the upper display panel 200. In an embodiment of the present invention, the subpixels 190$h$ and 190$l$ may alternatively be connected to TFTs connected to different data lines $D_1$-$D_m$.

The common electrode 270 is formed on the entire surface of the upper display panel 200, and receives the common voltage Vcom. For example, the common electrode 270 together with the pixel electrode 191 may be formed on the lower display panel 100, and may have a line or bar shape depending on the shape of the pixel electrode 191.

Figure 4A:
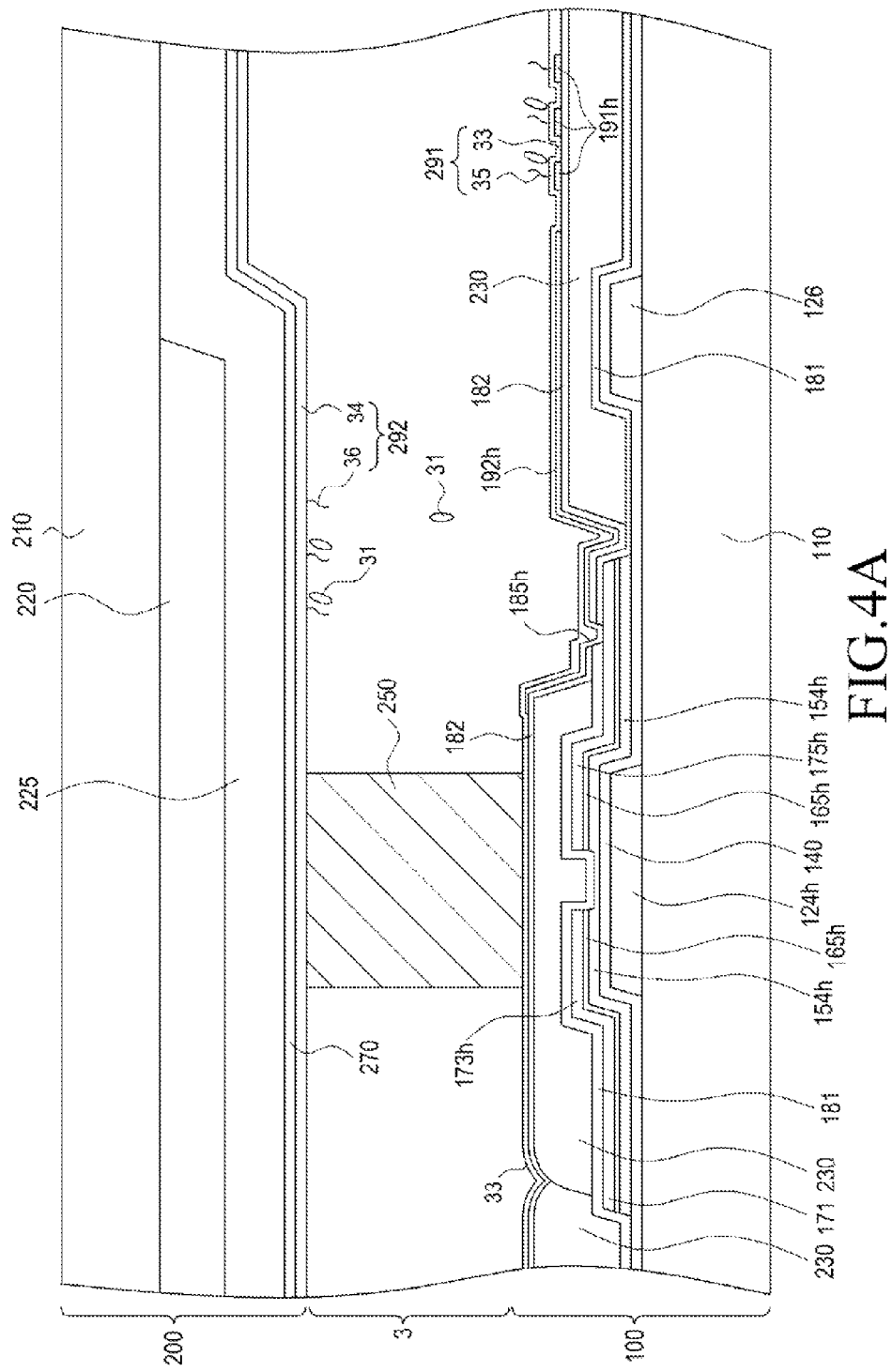
FIG. 4A is a cross-sectional view taken along line 4a-4a' of the liquid crystal display panel assembly shown in FIG. 3.

The liquid crystal layer 3 is filled in a sealant (not shown) formed between the lower and upper display panels 100 and 200. The liquid crystal layer 3 serves as a dielectric. The sealant is formed on any one of the lower and upper display panels 100 and 200, when combining or assembling the two display panels 100 and 200. The lower and upper display panels 100 and 200, as shown in FIG. 4A, may maintain a cell gap of, for example, about 2.0 μm to about 5.0 μm by a spacer 250 or a sealant (not shown). For example, a cell gap of about 3.3 μm to about 3.7 μm, may be maintained between the lower and upper display panels 100 and 200 by a spacer 250 or a sealant (not shown). In an embodiment of the present invention, the spacer 250 may alternatively be formed on a TFT because the area where the TFT is formed is wide.

Polarizers (not shown) may be disposed on the lower and upper display panels 100 and 200 such that their polarization axes or transmission axes may substantially cross each other perpendicularly. In other words, the polarizers may be formed, for example, on the top or bottom of the lower and upper display panels 100 and 200. Alternatively, the polarizers may be formed on the top or bottom of only one of the lower and upper display panels 100 and 200. In an exemplary embodiment of the present invention, to reduce the diffraction of the external light, refractive indexes of the polarizers may be, for example, about 1.5, and their haze values may be, for example, about 2% to about 5%. The refractive indexes of the polarizers and the refractive indexes of other materials described below were measured in the light source with a wavelength of, for example, about 550 nm to about 580 nm.

The liquid crystal display device may be manufactured by connecting the driving devices 400, 500, 600 and 800 to the liquid crystal display panel assembly 300. The driving devices 400, 500, 600 and 800 may be, for example, directly mounted on the liquid crystal display panel assembly 300 after being formed on a single Integrated Circuit (IC) chip, may be attached to the liquid crystal display panel assembly 300 in the form of a Tape Carrier Package (TCP) after being mounted on a Flexible Printed Circuit Film (FPCF, not shown), or may be connected to the liquid crystal display panel assembly 300 after being mounted on a separate Printed Circuit Board (PCB, not shown). In contrast, while signal lines $G_1 \sim G_n$ and $D_1 \sim D_n$, and TFTs Qh, Ql and Qc (shown in FIG. 3) are formed, each or a combination of their driving devices 400, 500, 600 and 800 may be formed on the liquid crystal display panel assembly 300.

The principles of displaying video in the liquid crystal display device will be described below in brief. If a data voltage is supplied to a pixel electrode of each pixel PX of the liquid crystal display device, a voltage charged in the pixel PX generates an electric field in the liquid crystal layer 3 by the voltage difference between the pixel electrode and the common electrode 270. Because of the electric field formed in the liquid crystal layer 3, liquid crystal molecules 31 of the liquid crystal layer 3 are tilted or move with a directivity. The light passing through the liquid crystal layer 3 along the tilt or direction of the liquid crystal molecules 31 undergo phase retardation. The light passes through the polarizer or is absorbed into the polarizer according to the phase difference caused by the phase retardation of the light. Therefore, if the data voltage supplied to the pixel electrode 191 is adjusted, the light transmittance for the primary colors is changed, allowing the liquid crystal display device to render the video. The primary colors include colors selected from, for example, red, green, blue, cyan, magenta, yellow, and white. In accordance with an exemplary embodiment of the present invention, the primary colors may include, for example, red, green and blue. Alternatively, to improve the video quality, four or more colors including the red, green, blue and yellow may be used as the primary colors.

Figure 3:
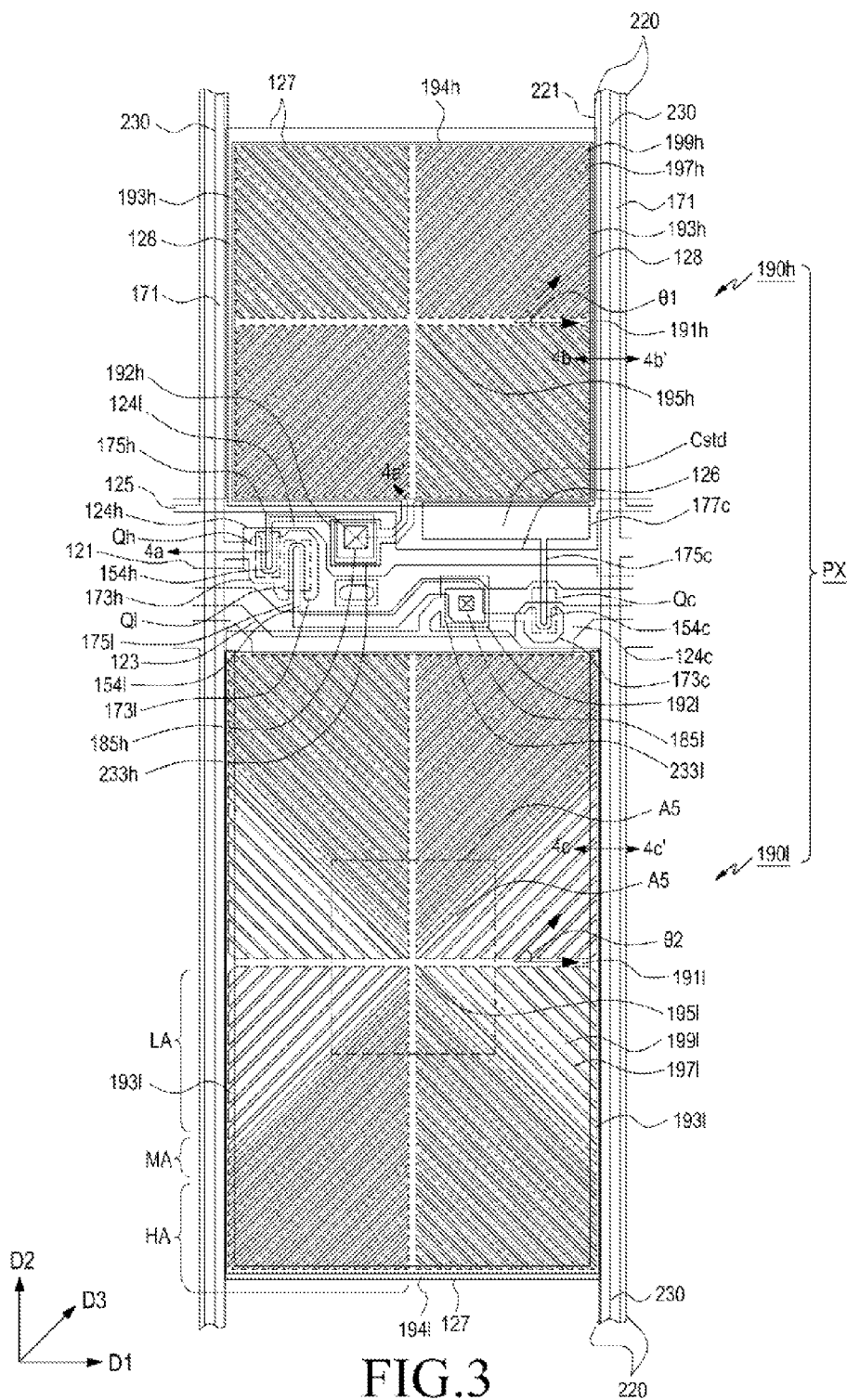
FIG. 3 illustrates the layout of a liquid crystal display panel assembly according to an exemplary embodiment of the present invention.
Figure 4B:
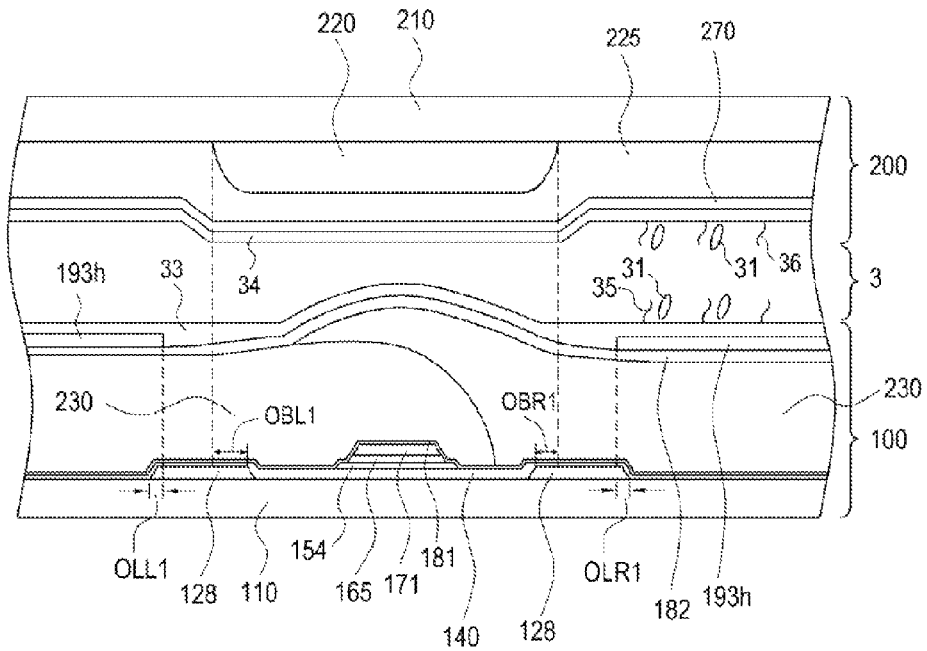
FIG. 4B is a cross-sectional view taken along line 4b-4b' of the liquid crystal display panel assembly shown in FIG. 3.
Figure 4C:
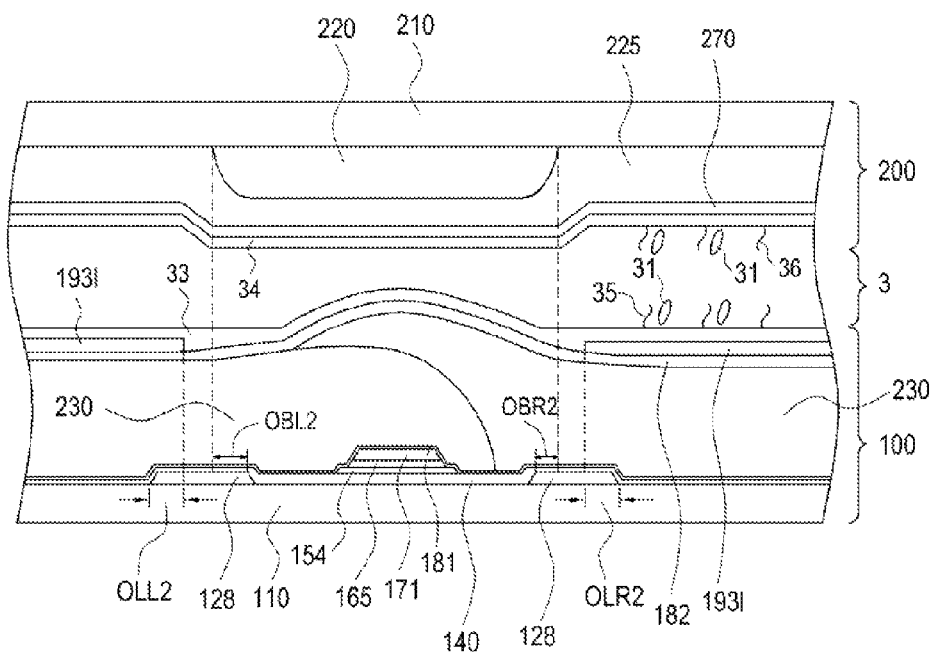
FIG. 4C is a cross-sectional view taken along line 4c-4c' of the liquid crystal display panel assembly shown in FIG. 3.
Figure 5A:
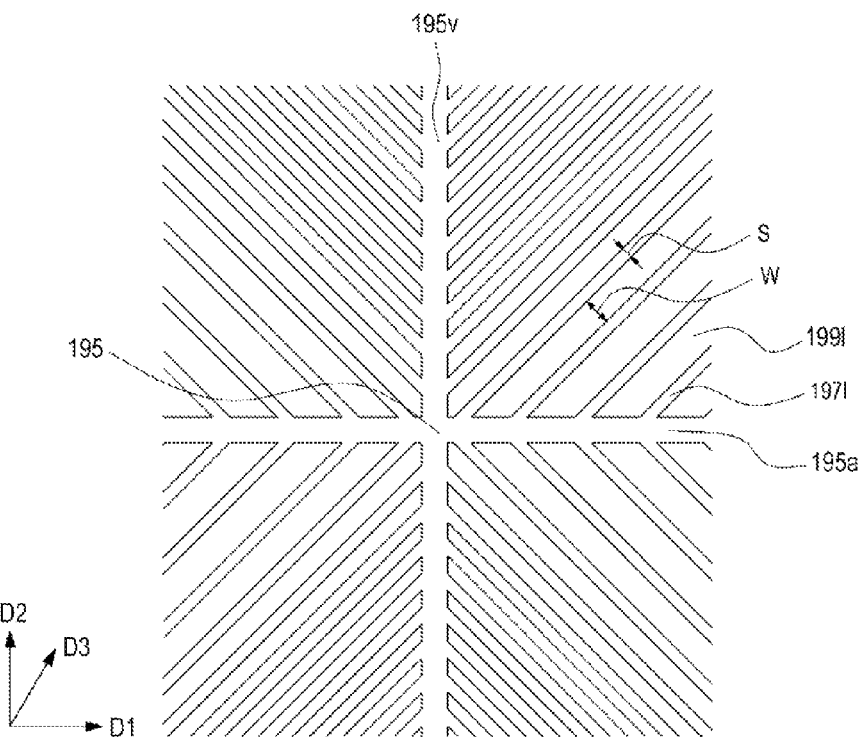
FIG. 5A is an enlarged plan view of the central part A5 of the second subpixel electrode 191l shown in FIG. 3.
Figure 5B:
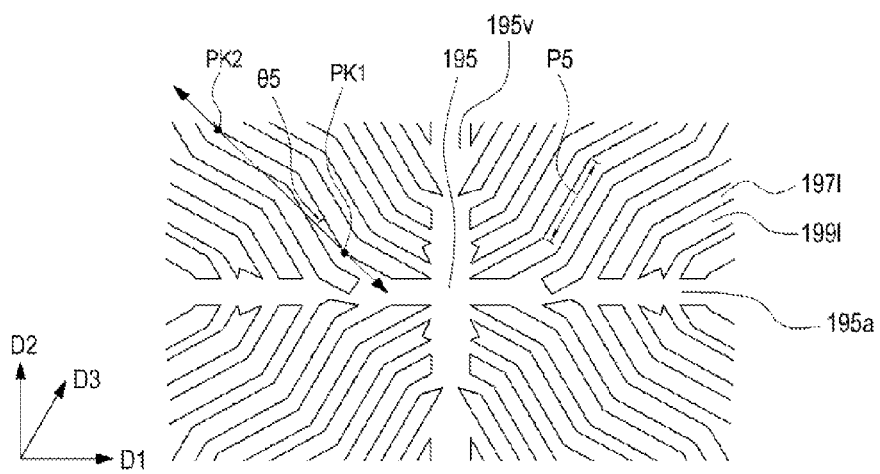
FIG. 5B is an enlarged plan view illustrating another example of the subpixel electrode shown in FIG. 5A.

A liquid crystal display panel assembly 300 according to an exemplary embodiment of the present invention will be described in detail below with reference to FIGS. 3 to 5B. FIG. 3 illustrates the layout of one unit pixel constituting the liquid crystal display panel assembly 300 according to an exemplary embodiment of the present invention. FIG. 4A is a cross-sectional view taken along line 4a-4a' of the liquid crystal display panel assembly 300 shown in FIG. 3. FIG. 4B is a cross-sectional view taken along line 4b-4b' of the liquid crystal display panel assembly 300 shown in FIG. 3. FIG. 4C is a cross-sectional view taken along line 4c-4c' of the liquid crystal display panel assembly 300 shown in FIG. 3. FIG. 5A is an enlarged plan view of the central part A5 of the second subpixel electrode shown in FIG. 3. FIG. 5B is an enlarged plan view illustrating an example of the subpixel electrode shown in FIG. 5A. Although an enlarged plan view of one pixel is shown in FIG. 3, it should be noted that pixels may be arranged in the form of a matrix of rows and columns.

The liquid crystal display panel assembly 300 includes, for example, a lower display panel 100, an upper display panel 200, a liquid crystal layer 3, and a polarizer. The upper display panel 200 will be described first in detail. The upper display panel 200 includes, for example, a light blocking member 220, an overcoat 225, a common electrode 270, and an upper-plate alignment film 292, which are formed on an upper substrate 210.

The light blocking member 220 is formed on the transparent upper substrate 210 made of, for example, a glass or plastic material. The upper substrate 210 has a thickness of about 0.2 mm to about 0.7 mm. The upper substrate 210 may have a refractive index of, for example, about 1.0 to about 2.5, more preferably about 1.5. The light blocking member 220, also called a black matrix, may be made of a metal such as chromium oxide (CrOx), molybdenum oxide (MoOx), aluminum oxide (AlOx), titanium oxide (TiOx), copper oxide (CuOx), and an opaque organic film material. The metal and the organic film of the light blocking member 220 have a thickness of, for example, about 300 Å to about 2000 Å and about 2 μm to about 5 μm, respectively. The light blocking member 220 has a plurality of apertures which are similar to the pixels PX in shape so that the light may pass through the pixels PX. The light blocking member 220 may be formed between the pixels PX to prevent the light leakage between the pixels PX. The light blocking member 220 may be formed in the portions corresponding to a gate line 121, a data line 171, and TFTs Qh, Ql and Qc, which are formed on the lower display panel 100. In an embodiment of the present invention, to simplify the manufacturing process of the liquid crystal display panel assembly 300 and increase the transmittance of the liquid crystal display device, the light blocking member 220 may be formed on an inside of a lower substrate 110, where the gate line 121, the data line 171 and the TFTs are formed, or on an outside of the lower substrate 110, where the gate line 121, the data line 171 and the TFTs are not formed.

The overcoat 225 is formed on the light blocking member 220. The overcoat 225 planarizes the curved surface of the lower layer or lower film such as the light blocking member 220, or prevents the elution of impurities from the lower layer. The overcoat 225 has a thickness of, for example, about 1 μm to about 3 μm. For example, the overcoat 225 may have a thickness of about 1.2 μm to about 1.5 μm. The overcoat 225 may have a refractive index of, for example, about 1.5 to about 2.5, more preferably about 1.8. In an embodiment, when the light blocking member 220 is formed on the lower display panel 100, the overcoat 225 may be formed on the light blocking member 220 formed on the lower display panel 100, instead of being formed on the upper display panel 200. According to an exemplary embodiment of the present invention, the overcoat 225 may include, for example, an acrylic material. The acrylic material included in the overcoat 225 may be cured in a process of forming the overcoat 225. The transmittance of the short-wavelength Ultraviolet (UV) may be higher in the overcoat 225 including the cured acrylic material than in the overcoat 225 including an imide-based material. If the transmittance of the short-wavelength UV is high in the overcoat 225, the intensity or amount of light, which is incident thereupon to cure or harden a photo hardener or reactive mesogen (RM) in the below-described electric-field lithography or fluorescent lithography, may increase, which thereby may contribute to an increase in cross-linking rate. The acrylic material may be included in the overcoat 225 included in the below-described stacked structure of the upper plate or the lower plate.

The common electrode 270 having no multiple slits is formed on the overcoat 225. The common electrode 270 may be formed of, for example, the same material as that of the pixel electrode 191. For example, the common electrode 270 may be formed of a transparent conductor such as indium-tin-oxide (ITO) and indium-zinc-oxide (IZO), aluminum zinc oxide (AZO), cadmium tin oxide (CTO) silver nanowire (AgNW), gallium-doped zinc oxide (GZO), fluorine tin oxide (FTO), antimony-doped tin oxide (ATO), zirconium oxide (ZrO2), zinc oxide (ZnO) and combinations thereof. The common electrode 270 has a thickness of, for example, about 500 Å to about 2000 Å. For example, the common electrode 270 may have a thickness of about 1200 Å to about 1500 Å. The common electrode 270 may maximize the transmittance of the liquid crystal display device. In order to reduce the diffraction of the external light, refractive indexes of the common electrode 270 formed of IZO and ITO may be about 1.5 to about 2.5 and about 1.5 to about 2.3, respectively. In an embodiment of the present invention, alternatively, a plurality of slits for forming more fringe electric fields may be formed in the common electrode 270.

The upper-plate alignment film 292 is formed on the common electrode 270 to maintain the liquid crystal molecules 31 in a specific array. The upper-plate alignment film 292 is formed by, for example, applying a liquid organic material having an alignment property by a method such as inkjet or roll printing, and then curing it thermally or by means of the light source such as infrared and UV. The upper-plate alignment film 292 includes, for example, an upper-plate main alignment film 34, and may further include an upper-plate photo hardening layer 36. The main alignment film 34 may be, for example, a vertical alignment material that substantially vertically aligns the major axis (or principal axis) of the liquid crystal molecules 31 with respect to the lower and upper substrates 110 and 210 or the main alignment film 34. The main alignment film 34 has a thickness of, for example, about 500 Å to about 1500 Å. For example, the main alignment film 34 may have a thickness of, for example, about 700 Å to about 1000 Å. A refractive index of the main alignment film 34, which may increase the transmittance of the liquid crystal display device, may be, for example, about 1.6. It will be understood by those of ordinary skill in the art that the main alignment film 34 may be a film of the material that is generally used in a Vertical Alignment (VA) mode or a Twisted Nematic (TN) mode. The photo hardening layer 36 is formed of the material that is cured by the light so that the major axis (or principal axis) of the liquid crystal molecules 31 may have a pre-tilt angle with respect to the lower and upper substrates 110 and 210 or the main alignment film 34. The material constituting the photo hardening layer 36 may include, for example, a photo hardener, a reactive mesogen, a photo-reactive polymer, a photo-polymerizable material, or a photo-isomerizable material. The upper-plate alignment film 292 may be a film made of, for example, at least one material selected from a polyimide-based compound, a polyamic acid-based compound, a polysiloxane-based compound, a polyvinylcinnamate-based compound, a polyacrylate-based compound, a polymethylmethacrylate-based compound, a photo hardener, a reactive mesogen, a photo-reactive polymer, a photo-polymerizable material, a photo-isomerizable material, and mixtures thereof. The reactive mesogen may be, for example, acrylate, methacrylate, epoxy, oxetane, vinyl-ether, styrene, or thiolene group. The photo-reactive polymer may be, for example, an azo-based compound, a cinnamate-based compound, a chalcone-based compound, a coumarin-based compound, or a maleimide-based compound. The photo-polymerizable material may be, for example, chalcone or coumarin. The photo-isomerizable material may be, for example, azo or double tolane. The upper-plate main alignment film 34 and the upper-plate photo hardening layer 36 constituting the upper-plate alignment film 292 may be formed by, for example, the methods described below with reference to FIGS. 6A to 6C.

The upper-plate alignment film 292 may be a film capable of further including a photo initiator made of, for example, at least one material selected from Benzyl dimethyl ketal (Irgacure-651, Ciba, Switzerland), α-amino acetophenone (Irgacure-907, Ciba, Switzerland), 1-hydroxy cyclohexyl phenyl keton (Irgacure-184, Ciba, Switzerland), and mixtures thereof.

The material constituting the upper-plate alignment film 292 according to an exemplary embodiment of the present invention may be a mixture of any one of, for example, a photo-reactive polymer and a reactive mesogen, and a polyimide-based polymer. Alternatively, the upper-plate alignment film 292 may be made of, for example, the main alignment film 34 except for the photo hardening layer 36.

A reactive mesogen according to an exemplary embodiment of the present invention will be described. The reactive mesogen forms an alignment film, and is cured by light or heat to form photo hardening layers 35 and 36 that will be described below. For example, chemical structure of the reactive mesogen may b. a photo-reactive dimethacrylate group monomer that is represented by the following formula XVI-R, and more specifically, may be a monomer that is represented by any of the following formulas: XVII-R1, XVII-R2, XVII-R3, XVII-R4, XVII-R5 or XVII-R6.

Formula XVI-R

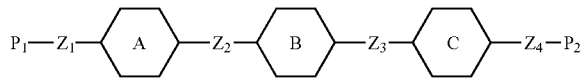

where A, B and C each may be any one selected from benzene ring, cyclohexyl ring and naphthalene ring. The external hydrogen atoms of each ring constituting A, B and C are not substituted, or at least one of the hydrogen atoms can be substituted by alkyl group, fluorine (F), chlorine (Cl) or methoxy group (OCH$_3$). P1 and P2 each may be any one selected from acrylate, methacrylate, epoxy, oxetane, vinyl-ether, styrene, and thiolene group. Z1, Z2 and Z3 each may be single bonds, linkage groups or a combination of linkage groups. A single bond means that A, B and C directly bond each other without intermediates. A linkage group may be —OCO—, —COO—, alkyl group, —O— or a linkage group which can be readily used by those of ordinary skill in the field of the art.

For example, the reactive mesogen may be a monomer that is represented by any one of the following formulas XVII-R1, XVII-R2, XVII-R3, XVII-R4, XVII-R5 and XVII-R6:

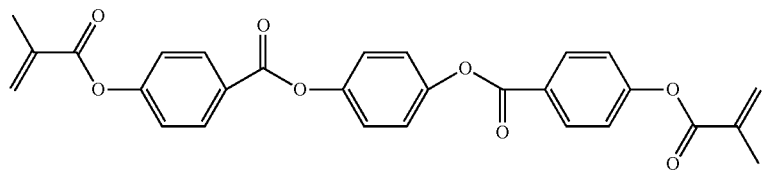

Formula XVII-R1

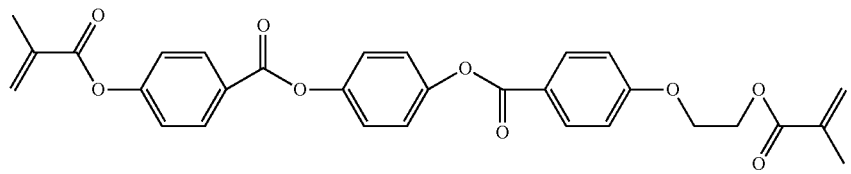

Formula XVII-R2

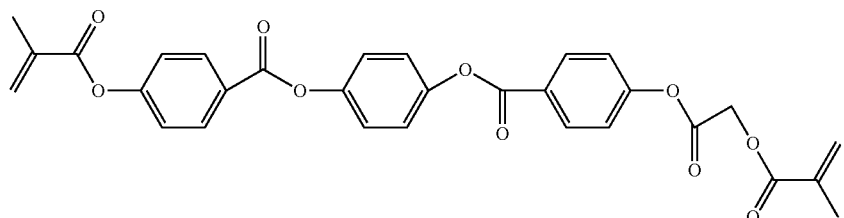

Formula XVII-R3

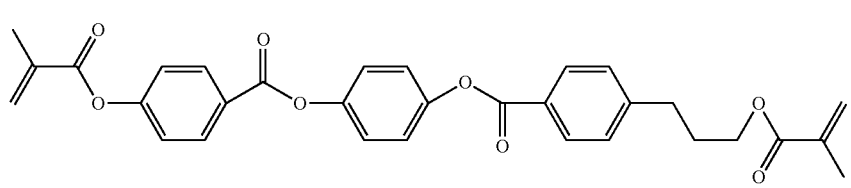

Formula XVII-R4

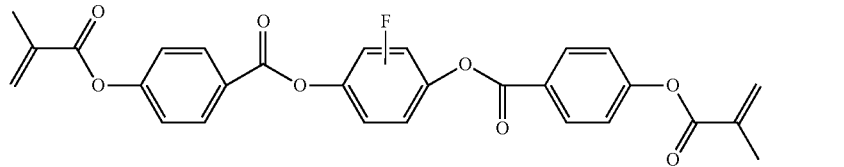

Formula XVII-R5

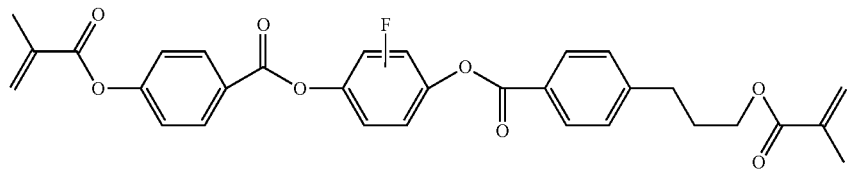

Formula XVII-R6

To evaluate the characteristics of the reactive mesogen according to exemplary embodiments of the present invention, the liquid crystal display device was manufactured by applying the reactive mesogen of formula XVII-R6 among the above-described reactive mesogens. The liquid crystal display panel assembly was manufactured based on the SVA mode described with reference to FIG. 6A. The structure of the pixel PX of the liquid crystal display device was substantially the same as that of FIG. 3. A cell gap of the liquid crystal layer 3 was about 3.5 μm, and an illumination of the UV applied to the fluorescent lithography was about 0.15 mW/cm$^2$. A width of a micro branch 197 of the pixel electrode 191, an exposure voltage, a UV intensity of the electric-field lithography, and a time of the fluorescent lithography are shown in Table 1.

TABLE 1

| | Width of micro branch (μm) | Exposure voltage (V) | UV intensity of electric-field lithography (J/cm$^2$) | Time of fluorescent lithography (minute) |
|---|---|---|---|---|
| Experiment 1 | 3 | 9.5 | 5 | 60 |
| Experiment 2 | 3 | 9.5 | 7 | 60 |
| Experiment 3 | 3 | 9.5 | 9 | 60 |
| Experiment 4 | 5 | 9.5 | 7 | 80 |
| Experiment 5 | 5 | 9.5 | 7 | 100 |
| Experiment 6 | 5 | 9.5 | 7 | 120 |
| Experiment 7 | 5 | 9.5 | 7 | 140 |

Figure 11:
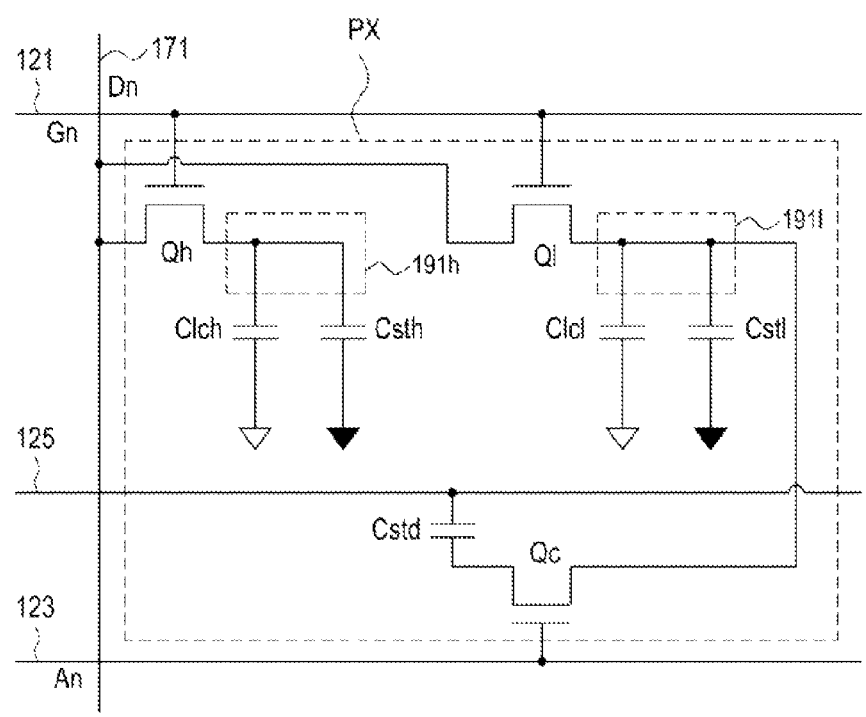
FIG. 11 illustrates an equivalent circuit for one pixel of a liquid crystal display device according to an exemplary embodiment of the present invention.

The manufactured liquid crystal display device was operated by 1 Gate line 1 Data line (1G1D) driving of a charge-sharing method described below with reference to FIG. 11.

In all exemplary experiments shown in Table 1, a black afterimage of the liquid crystal display device showed a level of about 2, and an inter-gray level response time was about 0.007 seconds to about 0.009 seconds. Therefore, it could be understood that the reactive mesogen of formula XVII-R6 showed good characteristics even when it is applied to a wide range of process conditions.

In the afterimage evaluation method, after a check pattern image is displayed on the liquid crystal display device for about one day or more and then replaced with other images, the check pattern is observed and evaluated in a level of 1 to 5. A level of 1 represents a level in which the check pattern is not observed at a side. A level of 2 represents a level in which the check pattern is slightly observed at a side. A level of 3 represents a level in which the check pattern is clearly observed at a side. A level of 4 represents a level in which the check pattern is slightly observed in the front. A level of 5 represents a level in which the check pattern is clearly observed in the front. Evaluating the black afterimage includes displaying a check pattern image, replacing it with a black pattern, and then observing the check pattern. Evaluating a surface afterimage includes displaying a check pattern image, replacing it with gray level patterns, and then observing the check pattern.

Lower Display Panel

The lower display panel 100 will be described in detail below. The lower display panel 100 includes thereon, for example, a gate layer conductor, which becomes a gate line 121, a down gate line 123 and a storage electrode line 125, a gate insulating layer 140, a semiconductor 154, a linear ohmic contact member 165, a data layer conductor (171, 173, 175 and 177*c*), a first protection film 181, a color filter 230, a second protection film 182, a pixel electrode 191, and a lower-plate alignment film 291.

The gate layer conductor including multiple gate lines 121, multiple down gate lines 123 and multiple storage electrode lines 125 is formed on the lower substrate 110 made of, for example, a glass or plastic material. The lower substrate 110 has a thickness of, for example, about 0.2 mm to about 0.7 mm. The lower substrate 110 may have a refractive index of, for example, about 1.0 to about 2.5. For example, the lower substrate 110 may have a refractive index of about 1.5. The gate line 121 and the down gate line 123 extend mainly in the horizontal direction and transfer gate signals. The gate layer conductor may be formed of a material selected from, for example, chromium (Cr), molybdenum (Mo), titanium (Ti), aluminum (Al), copper (Cu), silver (Ag), cobalt (Co) and mixtures thereof. In an embodiment, the gate layer conductor may have a single layer structure. Alternatively, in an embodiment, the gate layer conductor may alternatively have, for example, a double layer structure or triple layer structure. For example, the double layer structure may be aluminum (Al)/molybdenum (Mo), aluminum (Al)/titanium (Ti), aluminum (Al)/tantalum (Ta), aluminum (Al)/nickel (Ni), aluminum (Al)/titanium nitride (TiNx), aluminum (Al)/cobalt (Co), copper (Cu)/copper (Cu) manganese (Mn), copper (Cu)/titanium (Ti), copper (Cu)/titanium nitride (TiN), or copper (Cu)/titanium oxide (TiOx). The triple layer structure may be, for example, molybdenum (Mo)/aluminum (Al)/molybdenum (Mo), titanium (Ti)/aluminum (Al)/titanium (Ti), cobalt (Co)/aluminum (Al)/cobalt (Co), titanium (Ti)/aluminum (Al)/titanium (Ti), titanium nitride (TiNx)/aluminum (Al)/titanium (Ti), copper (Cu) manganese (Mn)/copper (Cu)/copper (Cu) manganese (Mn), titanium (Ti)/copper (Cu)/titanium (Ti), titanium nitride (TiNx)/copper (Cu)/titanium nitride (TiNx), or titanium oxide (TiOx)/copper (Cu)/titanium oxide (TiOx). The gate line 121 includes, for example, first and second gate electrodes 124*h* and 124*l*, which are formed to protrude. The down gate line 123 includes, for example, a third gate electrode 124*c* formed to protrude. The first and second gate electrodes 124*h* and 124*l* are connected to each other, forming one protrusion. The storage electrode line 125 extends in the horizontal and vertical directions to surround the perimeter of the first and second subpixel electrodes 191*h* and 191*l*, and transfers a predetermined voltage, for example, a common voltage Vcom. In contrast, the storage electrode line 125 may transfer predetermined swing voltages having two or more levels. The storage electrode line 125 includes multiple storage electrode line's vertical portions 128 that extend approximately perpendicularly to the gate line 121, a storage electrode line's horizontal portion 127 that connects ends of the storage electrode line's vertical portions 128 to each other, and a storage electrode line's extension portion 126 formed to protrude from the storage electrode line's horizontal portion 127.

The gate insulating layer 140 is formed on the gate layer conductor. The gate insulating layer 140 may be a film made of, for example, an inorganic insulating material, an organic insulating material, or an organic/inorganic insulating material. The inorganic insulating material may be, for example, silicon nitride (SiNx), silicon oxide (SiOx), titanium oxide (TiO$_2$), alumina (Al$_2$O$_3$), zirconia (ZrO$_2$), silicon oxynitride (SiOxNy), yttrium oxide (Y$_2$O$_3$), hafnium oxide (HfOx), aluminum nitride (AlN), aluminum oxynitride (AlNO), barium titanate (BaTiO3), lead titanate (PbTiO$_3$), or a combination thereof.

The organic insulating material may be, for example, poly siloxane, phenyl siloxane, polyimide, silsesquioxane, silane, or an organic insulating material known to those skilled in the art. The organic/inorganic insulating material may be a mixture of at least one or more materials selected from the above-described inorganic and organic insulating materials. For example, the organic insulating material of poly siloxane, and the organic/inorganic insulating material made of poly siloxane have high heat resistance, high light permeability, and excellent adhesion to other layers at about 350° C. or more. The gate insulating layer 140 made of an inorganic insulating material may have, for example, a thickness of about 2000 Å to about 4000 Å. For example, the gate insulating layer 140 made of an inorganic insulating material may have, for example, a thickness of about 3000 Å. The gate insulating layer 140 made of an organic insulating material or an organic/inorganic insulating material may have a thickness of, for example, about 3000 Å to about 5000 Å. For example, the gate insulating layer 140 made of an organic insulating material or an organic/inorganic insulating material may have a thickness of, for example, about 4000 Å. The silicon nitride (SiNx), the silicon oxide (SiOx), the organic insulating material, or the organic/inorganic insulating material constituting the gate insulating layer 140, used to increase the transmittance of the liquid crystal display device, may have a refractive index of, for example, about 1.6 to about 2.1, about 1.35 to about 1.65, about 1.4 to about 1.7 or about 1.4 to about 1.9, respectively. For example, the silicon nitride (SiNx), the silicon oxide (SiOx), the organic insulating material, or the organic/inorganic insulating material constituting the gate insulating layer 140, used to increase the transmittance of the liquid crystal display device, may have a refractive index of, for example, about 1.85, about 1.5, about 1.55, or about 1.6, respectively. As the gate insulating layer 140 is closer to the lower substrate 110 in terms of the refractive index, the transmittance of the liquid crystal display device may be increased. The gate insulating layer 140 may have a single layer structure. Alternatively, the gate insulating layer 140 may have a multi layer structure.

The semiconductor 154 that can be made of, for example, hydrogenated amorphous silicon, crystalline silicon, or oxide semiconductor, is formed on the gate insulating layer 140. A data line 171, a source electrode 173 and a drain electrode 175 substantially overlap on the semiconductor 154. First and second semiconductors 154h and 154l formed on the first and second gate electrodes 124h and 124l are formed to be separated from a third semiconductor 154c formed on the third gate electrode 124c. The semiconductor 154 has a thickness of, for example, about 1000 Å to about 2500 Å. For example, the semiconductor has a thickness of about 1700 Å. The oxide semiconductor may be, for example, a compound having a formula expressed in $A_xB_xO_x$ or $A_xB_xC_xO_x$, where A may be Zn or Cd, B may be Ga, Sn or In, and C may be Zn, Cd, Ga, In or Hf. X is not zero (0), and A, B and C are different from each other. In an embodiment, the oxide semiconductor may alternatively be a material selected from the group comprising, for example, indium zinc oxide (InZnO), indium gallium oxide (InGaO), indium tin oxide (InSnO), zinc tin oxide (ZnSnO), gallium tin oxide (GaSnO), gallium zinc oxide (GaZnO), gallium zinc tin oxide (GaZnSnO), gallium indium zinc oxide (GaInZnO), hafnium indium zinc oxide (HfInZnO), hafnium zinc tin oxide (HfZnSnO) and zinc oxide (ZnO). This oxide semiconductor is, for example, about 2 to 100 times higher than the hydrogenated amorphous silicon in terms of the effective mobility, contributing to the improvement in charging speed of the pixel electrode 191.

The linear ohmic contact member 165 is formed on the semiconductor 154. The linear ohmic contact member 165 has a thickness of, for example, about 200 Å to about 500 Å. First, second and third linear ohmic contact members 165h, 165l and 165c (not shown) are formed on the first, second and third semiconductors 154h, 154l and 154c, and not formed on a channel. The linear ohmic contact member 165 may include, for example, amorphous silicon doped with n-type or p-type impurities. Alternatively, the linear ohmic contact member 165 may include, for example, an oxide semiconductor layer. For example, the linear ohmic contact member 165 may include an oxide semiconductor layer that includes one or more of the following elements: induium (In), gallium (Ga), zinc (Zn), tin (Sn), germanium (Ge), hafnium (Hf), and arsenide (As). For example, the linear ohmic contact member 165 may include, for example, zinc oxide (ZnO), tin oxide ($SnO_2$), indium oxide ($In_2O_3$), zinc stannate ($Zn_2SnO_4$), gallium oxide ($Ga_2O_3$), and hafnium oxide ($HfO_2$) in the oxide semiconductor layer.

The data layer conductor, which becomes a data line 171, a first source electrode 173h, a first drain electrode 175h, a second source electrode 173l, a second drain electrode 175l, a third source electrode 173c and a third drain electrode 175c, is formed on the linear ohmic contact member 165. The data layer conductor may be formed of, for example, the same material as that of the gate layer conductor. In an embodiment, the data layer conductor may be formed of a different material than the gate layer conductor. To increase a charging ratio of the pixel electrode 191 and reduce the delay in transferring data voltages, the data layer conductor may be made of, for example, a low-resistance single-layer metal or a double or triple layer material with at least one layer being a metal. When the semiconductor 154 is made of an oxide semiconductor material, the data layer conductor may be formed right on the semiconductor 154 without forming of the linear ohmic contact member 165.

The data line 171 crosses the gate line 121 or the down gate line 123 with the gate insulating layer 140 intervening between them. The data line 171 is connected to the cup or U-shaped first source electrode 173h, and the cap or ∩-shaped second source electrode 173l. End portions of the first and second drain electrodes 175h and 175l are partially surrounded by the first and second source electrodes 173h and 173l, respectively. The other end portion of the second drain electrode 175l extends from the end portion partially surrounded by the second source electrode 173l, and is connected to the U-shaped third source electrode 173c. Exemplary embodiments of the present invention are not limited to the above mentioned shapes for the first, second and third source electrodes 173h, 173l, 173c but rather the first, second and third source electrodes 173h, 173l, 173c may be formed in various shapes. One end portion of the third drain electrode 175c is partially surrounded by the third source electrode 173c, and the other end portion 177c thereof overlaps the storage electrode line's extension portion 126, forming a down capacitor Cstd between them. The down capacitor Cstd varies in capacitance according to the size of the area where the other end portion 177c of the third drain electrode 175c overlaps the storage electrode line's extension portion 126. In accordance with an exemplary embodiment of the present invention, primary color pixels constituting a basic pixel group may have different capacitances of the down capacitor Cstd, respectively. FIG. 19B is an enlarged view of the portion A19 shown in FIG. 18 in each of red, green and blue pixels PX-R, PX-G and PX-B included in a basic pixel group, showing that the capacitances of the down capacitor Cstd are different in the respective pixels. The red, green and blue pixels PX-R, PX-G and PX-B are similar to each other, but they are different in size of the area AOL-B, AOL-G or AOL-R of the other end portion 177c of the third drain electrode 175c, which overlaps the storage electrode line's extension portion 126 in each of the pixels. The overlapping area may be adjusted to adjust a ratio of a voltage of a second liquid crystal capacitor Clcl to a voltage of a first liquid crystal capacitor Clch to about 0.6 to about 0.9:1. To reduce the below-described occurrence of a yellowish color, the ratio of a voltage of the second liquid crystal capacitor Clcl to a voltage of the first liquid crystal capacitor Clch may be changed according to the pixels constituting the basic pixel group PS. Therefore, to allow the pixels constituting the basic pixel group PS to have a different power ratio, the overlapping area between the other end portion 177c of the third drain electrode 175c and the storage electrode line's extension portion 126 may be adjusted. For example, to prevent the liquid crystal display device from having a yellowish color, a voltage ratio of the blue pixel B may be greater than or equal to a voltage ratio of the green pixel G and a voltage ratio of the green pixel G may be greater than or equal to a voltage ratio of the red pixel R in a basic pixel group PS including the red, green and blue pixels. The size of the overlapping area for reducing the voltage ratio in each of the pixels may be as follows.

$$AOL\text{-}B \leq AOL\text{-}G \leq AOL\text{-}R$$

where AOL-B, AOL-G and AOL-R represent the sizes of the overlapping area between the other end portion 177c of the third drain electrode 175c and the storage electrode line's extension portion 126 in the blue, green and red pixels B, G and R, respectively, as shown in FIG. 19B.

The first, second and third gate electrodes 124h, 124l and 124c, the first, second and third source electrodes 173h, 173l and 173c, and the first, second and third drain electrodes 175h, 175l and 175c constitute the first, second and third TFTs Qh, Ql and Qc, respectively, for operating one pixel PX together with the first, second and third semiconductors 154h, 154l and 154c. A channel layer through which charges move during operations of the TFTs Qh, Ql and Qc is formed in the semiconductors 154h, 154l and 154c between the source electrodes 173h, 173l and 173c and the drain electrodes 175h, 175*l*, 175*c*. When the semiconductors 154*h*, 154*l* and 154*c* and the data layer conductor are etched using the same mask, the data layer conductor may have the substantially same pattern as the semiconductor 154 and the linear ohmic contact members 161 and 165*h* formed thereunder, except for the channel region. However, according to the etching technique, a film of the semiconductor 154 may have portions which are uncovered by the data layer conductor and exposed to extend from both sidewalls of the data layer conductor by a predetermined distance of, for example, about 3 μm or less.

In accordance with an exemplary embodiment of the present invention, lines of the first and second drain electrodes 175*h* and 175*l* connected up to contact holes 185*h* and 185*l* are formed in the substantially same direction as that of micro branches in the channel, so the texture is reduced in the pixel region, contributing to an increase in brightness of the liquid crystal display device.

The first protection film 181 is formed on the data layer conductor. The first protection film 181 may be made of, for example, the above-described inorganic insulating material, organic insulating material, or organic/inorganic insulating material, which may constitute the gate insulating layer 140. The first protection film 181 made of an inorganic insulating material may have a thickness of, for example, about 300 Å to about 2000 Å. For example, the first protection film 181 made of an inorganic insulating material may have a thickness of, for example, about 500 Å. The first protection film 181 made of an organic insulating material or an organic/inorganic insulating material may have a thickness of, for example, about 25000 Å to about 35000 Å. The silicon nitride (SiNx), the silicon oxide (SiOx), the organic insulating material, or the organic/inorganic insulating material constituting the first protection film 181, used to increase the transmittance of the liquid crystal display device, may have a refractive index of, for example, about 1.6 to about 2.1, about 1.35 to about 1.65, about 1.5 to about 1.9 or about 1.5 to about 1.9, respectively. The silicon nitride (SiNx), the silicon oxide (SiOx), the organic insulating material, or the organic/inorganic insulating material constituting the first protection film 181, used to increase the transmittance of the liquid crystal display device, may have a refractive index of, for example, about 1.85, about 1.5, about 1.7 to about 1.8, or about 1.6, respectively. The color filter 230 is formed on the first protection film 181. The color filter 230 is formed in the pixel region PX where the light is not blocked. The color filter 230 has a thickness of, for example, about 1.5 μm to about 3 μm. The color filter 230 has a refractive index of, for example, about 1.3 to about 2.2. For example, the color filter 230 has a refractive index of about 1.6. The color filters 230 formed in each of the pixels PX may have one of the primary colors, for example, red, green, blue, cyan, magenta, yellow, and white. The three primary colors such as red, green and blue (or cyan, magenta and yellow) may be used as colors of the basic pixel group PS for forming the pixels PX. A white pixel may have no color filter. The white pixel may display the white color because the white external light passes through the white pixel region. The basic pixel group PS is a minimum set of pixels PX capable of representing color images. In an embodiment, the basic pixel group PS may alternatively include pixels PX each having four or more primary colors. As an example of this embodiment, four primary colors including the three colors of red, green and blue, and any one of cyan, magenta, yellow and white may be selected as colors of the basic pixel group PS. It will be understood by those of ordinary skill in the art that the primary colors of the basic pixel group PS are not limited to these colors and various other colors may be selected in order to increase the image quality of the liquid crystal display device. The color filter 230 may be formed in most of the area except for the color filter holes 233*h* and 233*l* formed in the place where the contact hole 185 is located. In contrast, to easily detect defects of the TFTs Qh, Ql and Qc, the color filter 230 may not be formed in the place where the TFTs Qh, Ql and Qc are located. The color filter 230 with the same color may be formed to longitudinally extend in the vertical direction along the neighboring data lines 171. The color filter 230 of an exemplary embodiment of the present invention may alternatively be formed between the light blocking member 220 and the overcoat 225 formed on the upper display panel 200.

The second protection film 182 is formed on the color filter 230 or the first protection film 181. The second protection film 182 may be made of, for example, the above-described inorganic insulating material, organic insulating material, or organic/inorganic insulating material, which may constitute the gate insulating layer 140. The second protection film 182 made of an inorganic insulating material may have a thickness of, for example, about 300 Å to about 1500 Å. For example, the second protection film 182 made of an inorganic insulating material may have a thickness of, for example, about 400 Å to about 900 Å. The second protection film 182 made of an organic insulating material or an organic/inorganic insulating material may have a thickness of, for example, about 25000 Å to about 35000 Å. The silicon nitride (SiNx), the silicon oxide (SiOx), the organic insulating material, or the organic/inorganic insulating material constituting the second protection film 182, used to increase the transmittance of the liquid crystal display device, may have a refractive index of, for example, about 1.6 to about 2.1, about 1.35 to about 1.65, about 1.5 to about 1.9, or about 1.4 to about 1.9, respectively. As the second protection film 182 is closer to the pixel electrode 191 in terms of the refractive index, the transmittance of the liquid crystal display device may be increased. The second protection film 182 may prevent the color filter 230 from being curled up and restraining the elution of an organic material such as a solvent from the color filter 230, thereby preventing the contamination of the liquid crystal layer 3 and thus increasing the afterimage of the liquid crystal display device. In addition, the second protection film 182 formed right on the first protection film 181 is formed relatively thick, serving as planarization. The contact holes 185*h* and 185*l* exposing end portions of the first and second drain electrodes 175*h* and 175*l*, respectively, are formed in contact portions of the first and second protection films 181 and 182. The area of the contact holes 185*h* and 185*l* may be, for example, less than that of the color filter holes 233*h* and 233*l*. Alternatively, in an embodiment, the area of the contact holes 185*h* and 185*l* may be, for example, greater than or equal to the area of the color filter holes 233*h* and 233*l*

A pixel electrode layer is formed on the second protection film 182 as shown in FIGS. 3 to 4C. The pixel electrode layer is a conductive layer including, for example, subpixel electrodes 191*h* and 191*l*, subpixel electrode contact portions 192*h* and 192*l*, cross-shaped branches 195*h* and 195*l*, and micro branches 197*h* and 197*l*, and micro slits 199*h* and 199*l* are the portions provided by removing the conductive layer from the pixel electrode layer. The pixel electrode 191 may have a thickness of, for example, about 300 Å to about 700 Å. For example, the pixel electrode 191 may have a thickness of, for example, about 550 Å. The pixel electrode 191 includes, for example, a first subpixel electrode 191*h* formed in an area of the first subpixel 190*h* and a second subpixel electrode 191*l* formed in an area of the second subpixel 190*l*. The pixel electrode 191 may be formed of, for example, a transparent conductive material such as indium-tin-oxide (ITO), indiumzinc-oxide (IZO), aluminum zinc oxide (AZO), cadmium tin oxide (CTO) silver nanowire (AgNW), gallium-doped zinc oxide (GZO), fluorine tin oxide (FTO), antimony-doped tin oxide (ATO), zirconium oxide (ZrO2), zinc oxide (ZnO) and combinations thereof. The pixel electrode 191 may have a refractive index of, for example, about 1.5 to about 2.5, and the ITO, and IZO may have a refractive index of, for example, about 1.8 to about 2.3 and about 1.7 to about 2.0, respectively. In an exemplary embodiment of the present invention, the pixel electrode 191 made of an ITO material to reduce the diffraction of the external light may be formed to have a thickness of, for example, about 400 Å. In addition, a micro branch electrode or a material having a similar refractive index to that of the main alignment films 33 and 34 may be further formed in between the below-described micro branches 197, e.g., in an area of the micro slits 199. The micro branch electrode 197 or the material having a similar refractive index to that of the main alignment films 33 and 34 may be, for example, $TiO_2$, polyphenylenevinylene (PPV) or polyfluorinated polyimides $TiO_2$ (PI-$TiO_2$). To reduce the external light that is diffracted or reflected from the surface of the pixel electrode 191, the surface of the pixel electrode 191 may undergo a plasma process in an atmosphere of a gas of, for example, argon (Ar), hydrogen ($H_2$), oxygen ($O_2$), helium (He) or chlorine ($Cl_2$), increasing the roughness thereof. The external light that is diffracted or reflected from the surface of the pixel electrode 191 may be minimized and the transmitted light may be maximized, by forming the pixel electrode 191 with a material having the similar refractive index to that of the material formed on or under the pixel electrode 191. The material of the transparent pixel electrode having the similar refractive index to that of its upper or lower film may be, for example, nanowire (NW), zinc oxide (ZnO), or conductive polymer. These materials may be used to form a pixel electrode having a refractive index of, for example, about 1.8 or less. For example, nanowire (NW) is needle-like conductive particles having a diameter of about $10^{-9}$ m to about $10^{-8}$ m and a length of about $10^{-7}$ m to about $10^{-6}$ m, and may be used to form a pixel electrode by being mixed with polymers. The nanowire (NW) may comprise silver (Ag), and a pixel electrode having the nanowire (NW) made of, for example, silver (Ag) may have a resistance of about 50 to 250 ohm ($\Omega$). The first and second subpixel electrodes 191h and 191l include first and second subpixel electrode contact portions 192h and 192l, cross-shaped branch portions 195h and 195l, vertical connection portions 193h and 193l surrounding the perimeter of the subpixel electrodes 191h and 191l, and horizontal connection portions 194h and 194l, respectively. Each of the cross-shaped branch portions 195h and 195l includes a horizontal branch portion and a vertical branch portion. The first and second subpixel electrode contact portions 192h and 192l are in contact with the drain electrodes 175h and 175l of the first and second TFTs Qh and Ql through the contact holes 185h and 185l of the first and second protection films 181 and 182, respectively.

A high-definition patterning process, e.g., a process of forming micro branches 197 or micro slits 199 to have a width of about 5 μm or less according to an exemplary embodiment of the present invention will be described in brief. A conductive metal forming the pixel electrode layer is deposited or coated on the lower layer. A photosensitive photoresist (PR) is coated on the conductive metal. The photosensitive photoresist has a similar pattern to that of the pixel electrode layer by the photo-lithography process. Because the micro branches 197 or micro slits 199 have a very small width, the formed pattern of the photoresist (PR) may have PR residues or some patterns may be defective. For example, to solve this difficulty, ashing or dry etching may be performed. Thereafter, the conductive metal is etched and the photoresist (PR) is removed, forming a pattern of the pixel electrode layer. In accordance with an exemplary embodiment of the present invention, to implement the high-definition pattern by ensuring good adhesion to the lower film, the photosensitive photoresist (PR) may include, for example, an adhesion promoter, e.g., bis(1,2,2,6,6-pentamethyl-4-piperidinyl)-[[3,5-bis(1,1-dimethylethyl)-4-hydroxyphenyl]methyl] butylmalonate. In other words, the photosensitive photoresist may be manufactured by dissolving a solid including, for example, about 15 wt % to about 25 wt %, more preferably about 20 wt % of a cresol novolac resin and about 3 wt % to about 7 wt %, more preferably about 5 wt % of photo-sensitizer as a matrix, and about 0.1 wt % to about 10 wt % of bis(1,2,2,6,6-pentamethyl-4-piperidinyl)-[[3,5-bis(1,1-dimethylethyl)-4-hydroxyphenyl]methyl]butylmalonate as an adhesion promoter in a solvent, e.g., about 65 wt % to about 74.95 wt % of poly(2-glycidyl methacrylate) (PGMEA). For example, in an embodiment, the photoresist may be manufactured by dissolving a solid including, for example, about 20 wt % of a cresol novolac resin, about 5 wt % of photo-sensitizer as a matrix, and about 0.1 wt % to about 10 wt % of bis(1,2,2,6,6-pentamethyl-4-piperidinyl)-[[3,5-bis(1,1-dimethylethyl)-4-hydroxyphenyl]methyl]butylmalonate as an adhesion promoter in a solvent, e.g., about 65 wt % to about 74.95 wt % of poly(2-glycidyl methacrylate) (PGMEA). The cresol novolac resin may have, for example, about 7,000 weight-average molecular weight to about 9,000 weight-average molecular weight, and may be manufactured by performing condensation reaction on cresol monomer in which meta-cresol and para-cresol are mixed at a ratio of, for example, about 6:4 and formaldehyde under an oxalic acid catalyst. The photo-sensitizer may be, for example, a compound manufactured by performing condensation reaction on a compound of 2,3,4,4'-tetrhydroxybenzophenone and naphthoquinone 1.2-diazide-5-sulfonylchloride, or a compound manufactured by performing condensation reaction on a compound of 4,4',4,"-ethylidene tris phenol and naphthoquinone 1.2-diazide-5-sulfonylchloride. Because the photoresist (PR) having this composition has good adhesion to the lower film, high-definition patterns may be formed in the photo-lithography process.

In an embodiment, the pixel electrode 191 may alternatively be formed on the layer of the color filter 230 or the layer of the first protection film 181 without forming of the second protection film 182, and may have three or more subpixel electrodes.

A lower-plate alignment film 291 is formed on the pixel electrode 191. The lower-plate alignment film 291 is substantially the same as that of the upper-plate alignment film 292, so a description thereof will be omitted for convenience of description.

The spacer 250 for maintaining a pair of display panels 100 and 200 at a predetermined distance, e.g., a cell gap, and the liquid crystal layer 3 are formed between the lower and upper display panels 100 and 200. The liquid crystals constituting the liquid crystal layer 3 may have a refractive index of, for example, about 1.3 to about 1.6. For example, in an embodiment, the liquid crystals constituting the liquid crystal layer 3 may have a refractive index of, for example, about 1.48.

To improve the transmittance of the liquid crystal display device, when the color filter 230 is formed on the lower display panel 100, the total thickness of the silicon nitride (SiN x) formed in the pixel electrode area of the lower display panel 100 may be, for example, about 3500 Å to about 4000 Å, and when the color filter 230 is formed on the upper display panel 200, the total thickness of the silicon nitride (SiNx) formed in the pixel electrode area of the lower display panel 100 may be, for example, about 4000 Å to about 5000 Å. The total thickness of the silicon nitride (SiNx) is a sum of the thicknesses of the silicon nitrides (SiNx) constituting the gate insulating layer and the protection films.

For example, in an exemplary embodiment of the present invention, the lower substrate, the gate insulating layer made of silicon nitrides (SiNx), the first protection film made of silicon nitrides (SiNx), the second protection film made of an organic insulating material or organic/inorganic insulating material, and the pixel electrode made of IZO or ITO may have a refractive index of about 1.5, about 1.9, about 1.9, about 1.65 to about 1.9, and about 1.9, respectively, and the liquid crystal display device having these elements may increase its transmittance by, for example, about 2% compared with the conventional liquid crystal display device. An average refractive index of the liquid crystal molecules may be, for example, 1.7 or more.

For example, in an embodiment of the present invention, the lower substrate, the gate insulating layer made of an organic insulating material or organic/inorganic insulating material, the first protection film made of an organic insulating material or organic/inorganic insulating material, and the pixel electrode made of IZO and ITO may have a refractive index of about 1.5, about 1.55, about 1.55 to about 1.9, and about 1.9, respectively, and the liquid crystal display device having these elements may improve its transmittance by about 4% compared with the conventional liquid crystal display device.

Shapes of the pixel electrode 191 according to an exemplary embodiment of the present invention will be described in detail below with reference to FIGS. 3, 5A, 5B, 16A to 16G, and 17A to 17G. FIG. 5A is an enlarged plan view of the central part A5 of the second subpixel electrode 191*l* shown in FIG. 3. FIGS. 5B and 17A to 17G are enlarged plan views illustrating other examples of the subpixel electrode shown in FIG. 5A. FIGS. 16A to 16G illustrate basic shapes of the micro branches 197 and the micro slits 199.

To increase the side visibility and brightness of the liquid crystal display device, various parameters should be considered, such as, for example, outer shapes of the pixel electrode 191 and the subpixel electrodes 191*h* and 191*l* formed in each pixel region PX, an area ratio of subpixel electrodes, a shape of the pixel electrode, width and distribution of the micro branches 197 and micro slits 199, and a direction of the micro branches 197. The figures presented below are illustrative, and may be subject to change according to the factors such as a cell gap of the liquid crystal layer 3, a type of liquid crystal, and characteristics of an alignment film.

Outer Shapes of Pixel Electrode and Subpixel Electrodes

The pixel electrode 191 is separated into, for example, the first and second subpixel electrodes 191*h* and 191*l*. The separated first and second subpixel electrodes 191*h* and 191*l* have, for example, first and second liquid crystal capacitors Clch and Clcl, respectively, and the first and second liquid crystal capacitors Clch and Clcl may have different sizes. The pixel electrode 191 and its subpixel electrodes 191*h* and 191*l* have, for example, square outer shapes. In an embodiment, the pixel electrode 191 and its subpixel electrodes 191*h* and 191*l* may have, for example, zigzag, radial or diamond outer shapes. Exemplary embodiments of the present invention are not limited to the above shapes but rather the pixel electrode 191 and its subpixel electrodes 191*h* and 191*l* may have various shapes. The first and second subpixel electrodes 191*h* and 191*l* are, for example, spaced apart from each other in the vertical direction and are spaced apart from the gate line 121, thereby reducing the unnecessary parasitic capacitive coupling and decreasing a kickback voltage Vkb. In an embodiment, the pixel PX may alternatively include three or more subpixels. In an embodiment, the first subpixel electrode 191*h* may alternatively be substantially surrounded by the second subpixel electrode 191*l*.

Area Ratio of Subpixel Electrodes

To increase the side visibility of the liquid crystal display device and to reduce the brightness loss thereof, the area of the second subpixel electrode 191*l* should be, for example, about 1 to 3 times the area of the first subpixel electrode 191*h*. For example, in an embodiment, the area of the second subpixel electrode 191*l* is about 1.5 to 2 times the area of the first subpixel electrode 191*h*. The area of the second subpixel 190*l* shown in FIG. 3 is about 1.75 times the area of the first subpixel 190*h*. The side visibility refers to the visibility of the liquid crystal display device, which is determined according to the viewing angle at a side. As the quality of an image viewed at a side is closer to the quality of an image viewed in the front, the side visibility is better.

Shape of Pixel Electrode

Referring to FIG. 3, the first and second subpixel electrodes 191*h* and 191*l* have, for example, the cross-shaped branch portions 195*h* and 195*l*, respectively, and each of the subpixel electrodes 191*h* and 191*l* has four domains divided by the cross-shaped branch portions 195*h* and 195*l*. Each domain has, for example, multiple micro branches 197*h* and 197*l* that obliquely extend outwardly from the cross-shaped branch portions 195*h* and 195*l*. Referring to FIGS. 5A and 5B, the micro branches 197*h* and 197*l* have, for example, a linear or zigzag shape. The micro slits 199*h* and 199*l* existing between the neighboring micro branches 197*h* and 197*l* are alternately arranged with respect to the micro branches 197*h* and 197*l*. Each of the micro branches 197*h* and 197*l* may be formed symmetrically with respect to at least one selected from a horizontal branch portion 195*a* and a vertical branch portion 195*v* of the cross-shaped branch portions 195*h* and 195*l*. In an embodiment, each of the micro branches 197*h* and 197*l* may alternatively be formed in a portion where the horizontal branch portion 195*a* and the vertical branch portion 195*v* of the cross-shaped branch portion meet each other, so as to move, for example, about 2 μm to about 5 μm from the position where at least one of the horizontal branch portion 195*a* and the vertical branch portion 195*v* crosses the other branch portion, and a concave or convex bend may be formed on the horizontal or vertical branch portion 195*a* or 195*v* of the cross-shaped branch portion. Because of the shape of each of the micro branches 197*h* and 197*l* moving away from the position where the horizontal and vertical branch portions 195*a* and 195*v* cross each other, and of the bend formed on the horizontal or vertical branch portion 195*a* or 195*v*, an arrangement of liquid crystal molecules formed in each of the domains does not interfere with arrangements of liquid crystal molecules in other domains, reducing textures in the pixel regions.

FIG. 5A is an enlarged view of the central part A5 of the second subpixel electrode shown in FIG. 3. Stripe-shaped micro branches 197 and micro slits 199 are shown. In the central part A5 of the second subpixel electrode, the micro branches have a width S and the micro slits have a width W as shown in the drawing. The micro slits 199 and the micro branches 197 are alternately arranged. In other words, the micro slits 199 are interposed between the micro branches 197. The widths W of the micro slits 199 are gradually changed. A detailed description thereof will be given below.

Zigzag-shaped micro branches 197 and micro slits 199 will be described below with reference to FIG. 5B. Because the micro branches 197*h* and 197*l* and the micro slits 199*h* and 199*l* are substantially the same in shape, the shape of only the micro branches 197*h* and 197*l* will be described in detail for convenience of description. To prevent the external light applied the liquid crystal display device from being reflected on the pixel electrode 191 causing occurrence of rainbow-colored stains, the pixel electrodes 191 may be formed to have the micro branches 197 formed in the shape of, for example, zigzag as shown in FIG. 5B. The zigzag shape may have repetitive and periodic peaks and valleys.

The reason why the rainbow stains occur in the liquid crystal display device will be described in brief below. The visible light applied to the liquid crystal display device is diffracted by elements (e.g., micro branches) serving as diffraction gratings in the liquid crystal display device, and then the liquid crystal display device may output reflected light by the diffracted light. Because the visible light includes different wavelengths, the diffracted reflected light may have diffraction patterns with different diffraction angles. Therefore, when the fluorescent light is input to the liquid crystal display device, the diffraction patterns may have rainbow colors, so rainbow stains may be viewed in the liquid crystal display device. The diffraction of the visible light may occur mainly by the difference in refractive index between the materials upon which the visible light is incident, and the structure of the pixel electrodes serving as the diffraction gratings. Accordingly, it was discovered by the inventors that if the difference in refractive index among the pixel electrodes, liquid crystals, alignment films, and insulating materials constituting the liquid crystal display device is reduced, the diffraction of the visible light may be reduced, contributing to a reduction in the rainbow stain. In addition, it was discovered by the inventors that if the structure of the pixel electrodes serving as the diffraction gratings is adjusted, the diffraction of the visible light is scattered, contributing to a reduction in the rainbow stain.

Figure 16A:
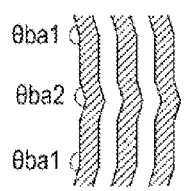
FIGS. 16A to 16G illustrate basic shapes of micro branches and micro slits.
Figure 16B:
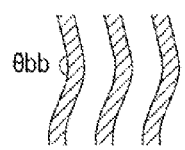
Figure 16B:
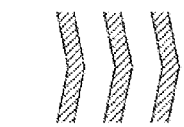
Figure 16C:
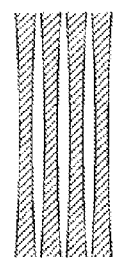
Figure 16D:
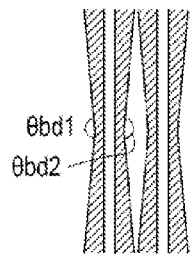
Figure 16E:
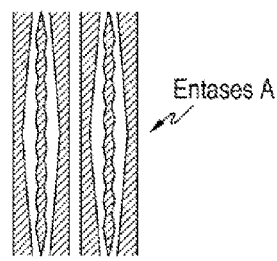
Figure 16F:
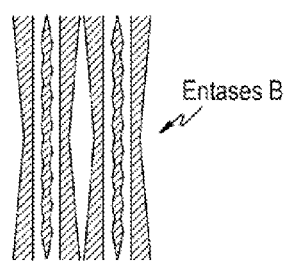
Figure 16G:
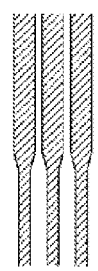

Therefore, to prevent the micro branch electrodes from serving as diffraction gratings, the pixel electrodes should be formed as randomly as possible. To make the pixel electrode's structure random, the micro branch electrodes should be formed to have random directions, widths, periods, shapes, gaps, etc. The micro branch electrodes may be formed to have, for example, two or more directions in each domain, or to have different directions among different domains. The micro branch electrodes may be formed such that their widths may be gradually changed to be different from the widths of adjacent micro branch electrodes. The micro branch electrodes may be periodically arranged such that in one domain, multiple micro branch electrodes having a predetermined period of width may be formed in one group and multiple groups having different periods may be formed. Referring to FIGS. 5A, 5B and 16A to 16G, the micro branches 197 or the micro slits 199 may have shapes of, for example, stripes, bats, zigzags, multi-broken zigzags, waves, entases, paired entases, combined entases A, or combined entases B. Each of the shapes shown in FIGS. 16A to 16G may be a basic unit of the micro branches 197 or the micro slits 199 having a cyclic form, and is a shape of the basic unit pixel electrode. The micro branches 197 or the micro slits 199 may be formed by each or a combination of the shapes of the basic unit pixel electrodes. The shapes of the basic unit pixel electrodes may have a basic unit length of, for example, about 4 μm to about 25 μm, and may have a width of about 1.5 μm or more. FIG. 16A illustrates multi-broken zigzag shapes broken at angles of $\theta ba1$ and $\theta ba2$. The angles of $\theta ba1$ and $\theta ba2$ may be different from each other. FIG. 16B illustrates wave shapes bent at an angle of $\theta bb$. FIG. 16C illustrates entasis shapes whose central portion is smaller in thickness than both end portions. The entasis shapes may be applied to the micro branches 197 or the micro slits 199. FIG. 16D illustrates paired entasis shapes, which include pairs of a shape consisting of a straight line bent at an angle of $\theta bd1$ and $\theta bd2$ and a non-bent straight line and its symmetrical shape. In an embodiment of the present invention, the angles of $\theta bd1$ and $\theta bd2$ may instead be different from each other. FIG. 16E illustrates shapes of combined entases A, a basic unit of which has a shape in which diamonds are connected between two bent straight lines in the paired entasis shapes. FIG. 16F illustrates shapes of combined entases B, in which diamonds are connected between two non-bent straight lines in the paired entasis shapes. FIG. 16G illustrates bat shapes consisting of stripes having different widths at different portions. The bat shapes may be stripe shapes in which two or more widths, e.g., widths of about 1.8 μm, about 3.2 μm and about 4.5 μm, are repeatedly connected. The stripe-shaped basic unit pixel electrodes have already been described with reference to FIG. 5A, and the zigzag-shaped basic unit pixel electrodes will be described below with reference to FIG. 5B. In accordance with an exemplary embodiment of the present invention, micro branches 197 or micro slits 199 may be constructed by each or a combination of the shapes of basic unit pixel electrodes. In addition, micro branches 197 or micro slits 199 may be constructed, in which basic units with different lengths are combined by each or a combination of the shapes of basic unit pixel electrodes. In the following description, the pixel electrodes are formed using the shapes of the basic unit pixel electrodes.

In accordance with an exemplary embodiment of the present invention, the micro branch electrodes formed in the shapes of basic unit pixel electrodes may be different in gaps from adjacent micro branch electrodes.

Since a lot of a external visible light is incident if the color filter 230 is formed on the lower display panel 100, the color filter 230 may be formed on the upper display panel 200 to reduce the incidence of the external visible light.

The micro branches 197*l* formed in a zigzag shape to reduce the rainbow stains will now be described in brief with reference to FIG. 5B. The zigzag-shaped micro branches 197*l* are constructed to have a zigzag unit length P5 and a zigzag angle $\theta 5$. As to the zigzag unit length P5, each of the micro branches 197*h* and 197*l* has a straight length, which is, for example, about 3 μm to about 25 μm. In an embodiment, each of the micro branches 197*h* and 197*l* has a straight length, which is, for example, about 4 μm to about 10 μm. The main direction of the micro branches 197 formed in each domain is the direction in which a straight line connecting peaks PK1 and PK2 shown in FIG. 5B extends. The peaks PK1 and PK2 are adjacent points in one period in one micro branch 197. The zigzag angle $\theta 5$ is a bending angle between the main-direction line of the micro branch 197 and the line corresponding to the zigzag unit length P5, and the zigzag angle $\theta 5$ is, for example, about 0° to about ±40°. In an embodiment, the zigzag angle $\theta 5$ is, for example, about ±12° to about ±20°. The diffraction light being diffracted by a pixel electrode having a large zigzag angle $\theta 5$ or various zigzag angles $\theta 5$ is dispersed, contributing to a reduction in rainbow stains on the liquid crystal display device. The zigzag-shaped micro branches 197*l* extend from the vicinity of the horizontal branch portion 195*a* and the vertical branch portion 195*v* of the cross-shaped branch portion up to the edge of each of the subpixel electrodes 191*h* and 191*l*. An increase in the number of zigzag shapes constituting the micro branch 197 leads to an increase in the number of diffraction spots of light being diffracted by the zigzag shapes, thereby facilitating a reduction in rainbow stains on the liquid crystal display device. As the light reflected on the micro branches 197l of the pixel electrode 191 differs in interference effect according to wavelength, the micro branches 197 formed on the pixel electrodes 191 associated with the color filters of the primary colors may have different zigzag unit lengths P5 and different zigzag angles θ5. In this manner, if the micro branches 197l having different zigzag shapes are formed on the pixel electrode 191 according to the pixels of the primary colors, the rainbow stains of the liquid crystal display device may be reduced.

In an embodiment, one micro branch 197 constituting the pixel electrode 191 may alternatively have zigzag unit lengths P5 of different sizes. As the micro branch 197 formed in this way has a high irregularity, the diffraction light diffracted by the micro branch 197 is dispersed, leading to a reduction in rainbow stains on the liquid crystal display device. In an embodiment, one micro branch 197h or 197l constituting the pixel electrode 191 may be constructed, for example, in a mixed shape of straight lines and zigzags. In an embodiment, mixed micro branch electrodes of straight line-shaped micro branches 197h and 197l and zigzag-shaped micro branches 197h and 197l may be constructed in one domain.

Shapes of micro branches 197 and micro slits 199 according to an embodiment of the present invention will now be described with reference to FIGS. 17A to 17G. As the micro branches 197 and micro slits 199 are substantially similar in shape, a detailed description of the shapes will be focused on the shapes of the micro branches 197 for convenience of description. Micro branches 197 and micro slits 199 shown in FIGS. 17A, 17B, 17C and 17E have zigzag shapes. A width S of each of the micro branches 197 and a width W of each of the micro slits 199 have been described above with reference to FIG. 3 or 5A.

Figure 17A:
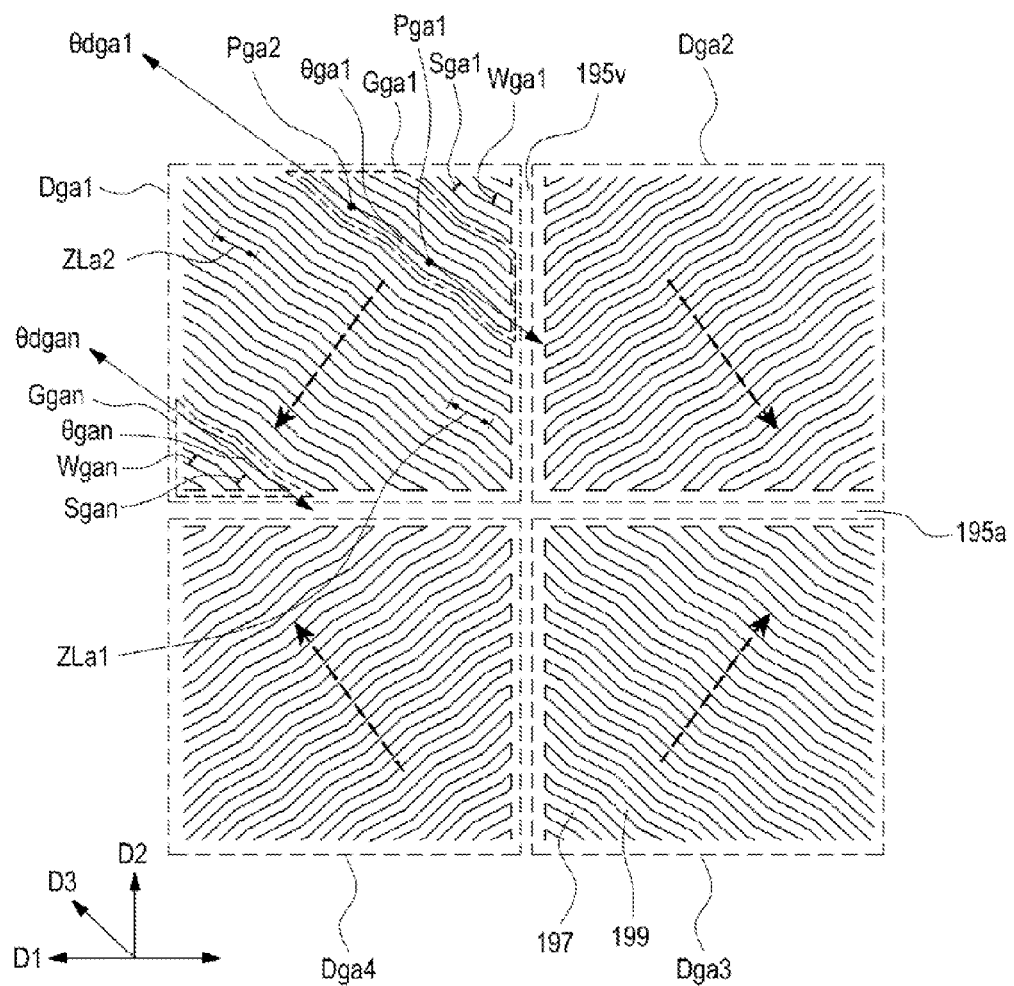
FIGS. 17A to 17G illustrate other examples of the subpixel electrode shown in FIGS. 5A and 5B.

In the plan view of a pixel electrode shown in FIG. 17A, micro branches 197 or micro slits 199 gradually change in width according to an exemplary embodiment of the present invention. FIG. 17A is a plan view of a pixel electrode including four domains Dga1, Dga2, Dga3, and Dga4. The four domains have micro branches 197 extending in different directions, and these domains are separated by a cross-shaped branch 195 and connected to the cross-shaped branch 195. Structures (e.g., shapes, lengths, widths and/or directions) of the micro branches 197 constituting each domain are symmetrical about a horizontal branch portion 195a and a vertical branch portion 195v of the cross-shaped branch 195. Alternatively, the micro branches 197 constituting the domains may have different structures according to the domains, for example, they may be designed to be asymmetrical about the horizontal branch portion 195a and the vertical branch portion 195v of the cross-shaped branch 195.

As illustrated, the domain Dga1 includes, for example, a plurality of subdomains Gga1~Ggan including a plurality of micro branches 197 and a plurality of micro slits 199. The plurality of subdomains may be distinguished from other subdomains by widths and zigzag angles of the micro branches 197 and micro slits 199, and main directions θdga1 and θdgan and zigzag unit lengths ZLa1 and ZLan of the subdomains. In accordance with an exemplary embodiment of the present invention, the subdomains are distinguished by the widths of the micro branches 197 and micro slits 199. In other words, micro branches 197 or micro slits 199 constituting a first subdomain Gga1 may be the same in width, but different in width from micro branches 197 or micro slits 199 constituting an n-th subdomain Ggan. Micro branches 197 or micro slits 199 in the other domains Dga2, Dga3, and Dga4 may be equal in structure to those in the domain Dga1.

In accordance with an exemplary embodiment of the present invention, widths S and W of micro branches 197 and micro slits 199 constituting the domains Dga1, Dga2, Dga3, and Dga4 may be, for example, about 2.0 μm to about 6 μm, and may gradually increase along the dotted arrows. In the start portion of a dotted arrow, e.g., in the first subdomain Gga1 shown in the domain Dga1, widths Sga1 and Wga1 of micro branches 197 and micro slits 199 may be, for example, about 2.5 μm, and in the end portion of the dotted arrow, e.g., in the n-th subdomain Ggan shown in the domain Dga1, widths Sgan and Wgan of micro branches 197 and micro slits 199 may be, for example, about 5 μm. In a subdomain corresponding to the central portion where the dotted arrow passes by, widths of micro branches 197 and micro slits 199 may fall within a range of, for example, about 2.5 μm to about 5 μm. The widths of micro branches 197 and micro slits 199 may gradually increase along the dotted arrow up to, for example, about 0.25 μm.

Lengths Pga1 and Pgan (not shown) of zigzag units constituting each of domains Dga1, Dga2, Dga3, and Dga4 and shown therein may be, for example, about 5 μm to about 20 μm. The zigzag unit lengths may gradually increase in a direction away from the horizontal branch portion 195a and the vertical branch portion 195v of the cross-shaped branch 195.

A main direction angle for a main direction θdga of micro branches 197 or micro slits 199 constituting the domains Dga1, Dga2, Dga3, and Dga4 may be, for example, about ±30° to about ±60° with respect to the direction D1. For example, in an embodiment, the main direction angle for a main direction θdga of micro branches 197 or micro slits 199 constituting the domains Dga1, Dga2, Dga3, and Dga4 may be, for example, about ±40° to about ±50° with respect to a direction D1. The main direction θdga1 of micro branches 197 is a direction of a straight line connecting peaks Pga1 and Pga2 of a micro branch, shown in the domain Dga1. Zigzag angles θga1 and θgan shown in the domain Dga1 may be, for example, about 0° to about ±40° with respect to the main direction of micro branches 197 or micro slits 199. For example, zigzag angles θga1 and θgan shown in the domain Dga1 may be, for example, about 0° to about ±30° with respect to the main direction of micro branches 197 or micro slits 199. Absolute values of the zigzag angles shown in FIG. 17A may gradually increase along the dotted arrow by a value within a range off, for example, about 2° to about 5°. A first zigzag angle θga1 formed in the first subdomain Gga1 may be, for example, about 0°, and an n-th zigzag angle θgan formed in the n-th subdomain Ggan may be, for example, about +30° or about −30°. A main direction of micro branches 197 or micro slits 199 may be determined as described in connection with FIG. 5B, e.g., determined by a direction of a straight line connecting peaks of a zigzag shape. The formed pixel electrode has an irregular structure, contributing to a significant reduction in rainbow stains on the liquid crystal display device.

Figure 17B:
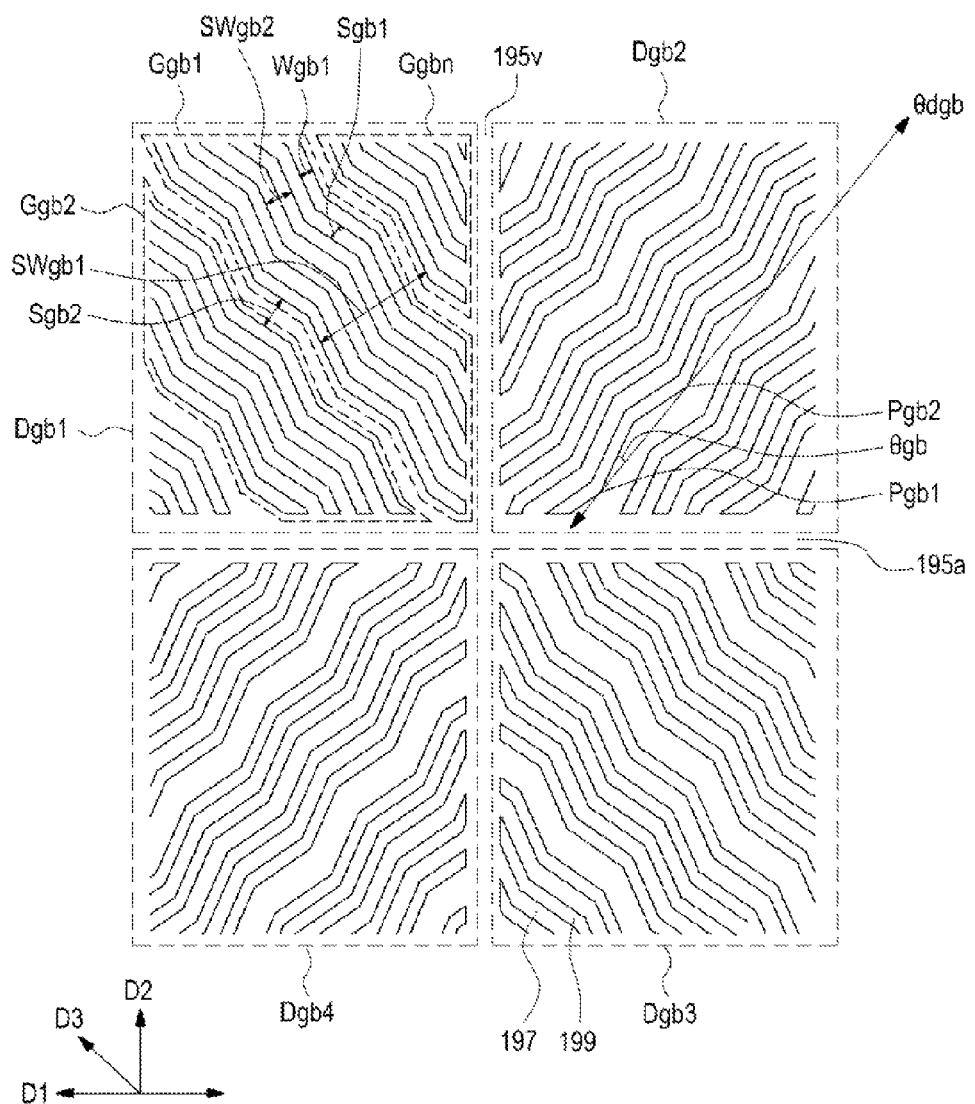

In the following description of FIGS. 17B to 17G, the corresponding description which has already been made with reference to FIGS. 5A, 5B and 17A is omitted, and only the different features in FIGS. 17B to 17G are described in detail. Referring to FIG. 17B, each of four domains Dgb1, Dgb2, Dgb3, and Dgb4 has a plurality of first to n-th subdomains Ggb1~Ggbn. Micro branches 197 and micro slits 199 in the domains Dgb1, Dgb2, Dgb3, and Dgb4 are formed asymmetrically about a cross-shaped branch 195.

In the plan view of a pixel electrode shown in FIG. 17B, widths of micro branches 197 and micro slits 199 have various periods according to an exemplary embodiment of the present invention. Micro branches 197 or micro slits 199 forming the four domains Dgb1, Dgb2, Dgb3, and Dgb4 are formed asymmetrically about the cross-shaped branch 195. In a domain Dgb2, a main direction angle θdgb of micro slits 199 or micro branches 197, determined by connecting peaks of each micro slit 199 or micro branch 197, is, for example, about ±45°, and a zigzag angle θgb thereof may be, for example, about ±7° to about ±20°. For example, the zigzag angle θgb may be about ±10° or about ±15°. The domains Dgb1, Dgb2, Dgb3, and Dgb4 have, for example, the same main direction angles and zigzag angles θgb of micro branches 197. Each of the subdomains Ggb1, and Ggb2~Ggbn includes a predetermined number of micro branches and micro slits interposed therebetween. Micro subdomains SWgb2 including adjacent micro branch-micro slit pairs may be formed in subdomains periodically. Widths Wgb1 and Sgb1 of micro slits and micro branches constituting micro branch-micro slit pairs may be, for example, about 3 μm. Therefore, widths of micro subdomains SWgb2 may be, for example, about 6 μm. In an exemplary embodiment of the present invention, if each of the subdomains has four micro branches 197 and four micro slits 199, a width of each subdomain SWgb1 may be, for example, about 26 μm. Therefore, as illustrated in FIG. 17B, each of domains Dgb1, Dgb2, Dgb3, and Dgb4 has subdomains Ggb1, and Ggb2~Ggbn, which may have the same widths of micro subdomains. However, widths Sgb2 of micro branches between adjacent subdomains in each domain may be different from widths of micro branches in each subdomain. For example, widths of micro branches in each subdomain may be about 3 μm, while the widths Sgb2 of micro branches may be about 5 μm. In conclusion, widths of micro branches 197 between adjacent subdomains in each domain are different from widths of micro branches 197 in each subdomain, and micro branches and micro slits formed in domains are asymmetrical about the cross-shaped branch, increasing irregularity of the pixel electrode structure, dispersing diffraction spots of the light diffracted thereby, and thus contributing to a significant reduction in rainbow stains on the liquid crystal display device. The number of subdomains in each of the aforementioned domains is subject to change according to the size of the pixel electrode.

Figure 17C:
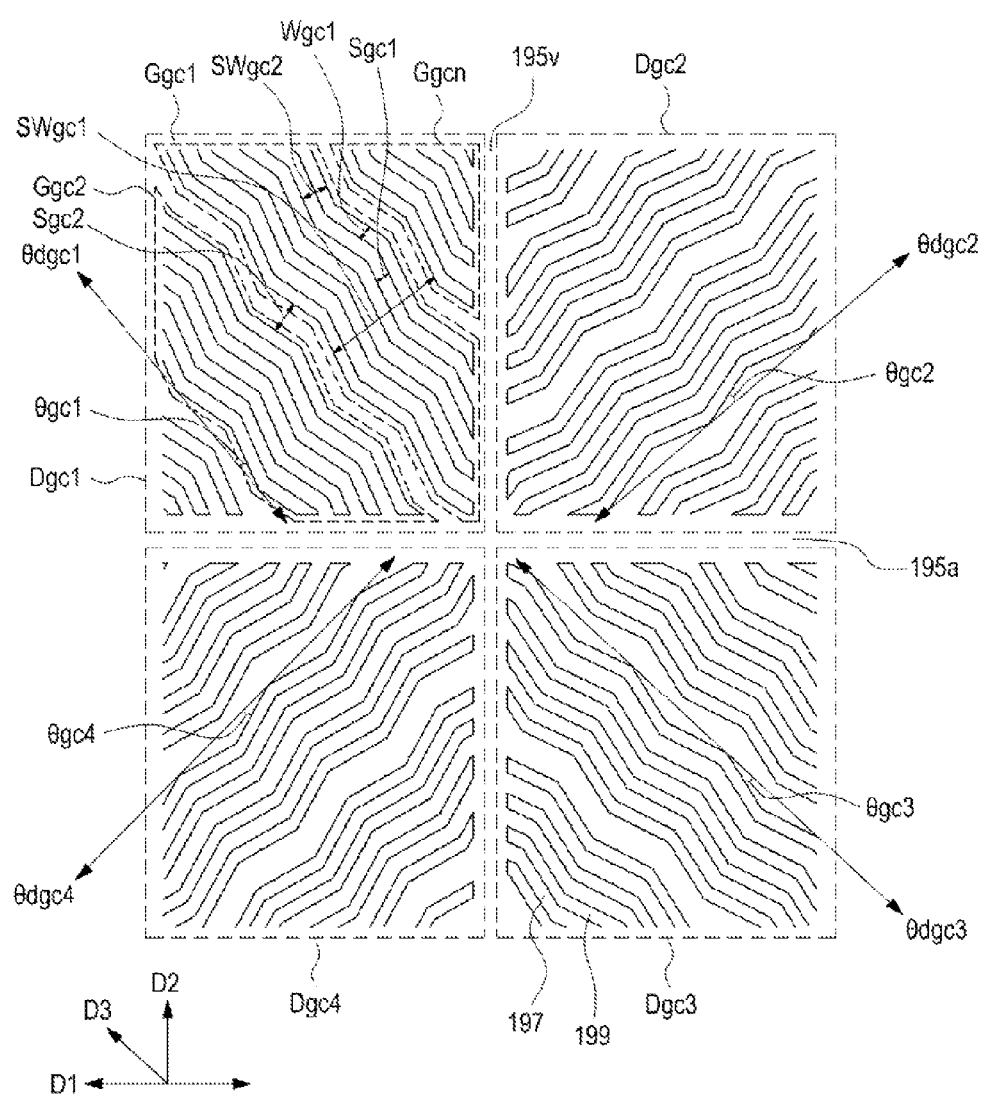

In the plan view of a pixel electrode shown in FIG. 17C, micro branches 197 constituting domains have different main directions according to an exemplary embodiment of the present invention. The pixel electrode includes, for example, four domains Dgc1, Dgc2, Dgc3, and Dgc4. The domains Dgc1, Dgc2, Dgc3, and Dgc4 have different main directions θdgc1, θdgc2, θdgc3, and θdgc4 of micro branches 197, determined by connecting peaks of each of the micro branches 197. Main direction angles of the main directions θdgc1, θdgc2, θdgc3, and θdgc4 of micro branches or micro slits forming domains may be, for example, different from each other within about 30° to about 60°. For example, main direction angles for the main directions θdgc1, θdgc2, θdgc3 and θdgc4 may be about 50°, about 41.3°, about 40°, and about 48.7°, respectively. In these main directions of micro branches 197, zigzag angles θgc1, θgc2, θgc3, and θgc4 of micro branches 197 may fall within a range of, for example, about ±5° to about ±30°. For example, the zigzag angles θgc1, θgc2, θgc3, and θgc4 of micro branches 197 may be, for example, about ±10° to about ±15°. In accordance with an exemplary embodiment of the present invention, zigzag angles of micro branches 197 formed in each domain may be different from each other and may gradually increase along a specific direction. A difference between zigzag angles of adjacent micro branches 197 may be, for example, about 0.5° to about 5°. For example, the difference between zigzag angles of adjacent micro branches 197 may be about 2° to about 3°. In accordance with another exemplary embodiment of the present invention, zigzag angles of micro branches 197 formed in one domain may be, for example, the same as those of micro branches formed in the same subdomain, and different from those of micro branches formed in other subdomains. A difference in zigzag angles between subdomains may be, for example, about 0.5° to about 5°. For example, a difference in zigzag angles between subdomains may be about 2° to about 3°. On the other hand, zigzag angles of micro branches 197 formed in one domain may be, for example, different from those of micro branches formed in the same subdomain, and symmetrical to those of micro branches formed in other subdomains. Symmetry between domains Dgc1, Dgc2, Dgc3, and Dgc4, symmetry between subdomains Ggc1, and Ggc2~Ggcn, widths Sgc1, Sgc2, and Wgc1 of micro branches 197 and micro slits 199 constituting subdomains Ggc1, and Ggc2~Ggcn in each domain, and periodicity and widths SWgc1 of subdomains Ggc1, and Ggc2~Ggcn are largely similar to those described in connection with FIG. 17B. In this way, main directions and zigzag angles of micro branches 197 in two different domains among the domains are formed different from each other, thereby increasing irregularity of the pixel electrode structure, dispersing diffraction spots of the light diffracted thereby, and thus contributing to a significant reduction in rainbow stains on the liquid crystal display device. Alternatively, for example, main directions θdgc1, θdgc2, θdgc3, and θdgc4 of the domains may be symmetrically paired.

Figure 17D:
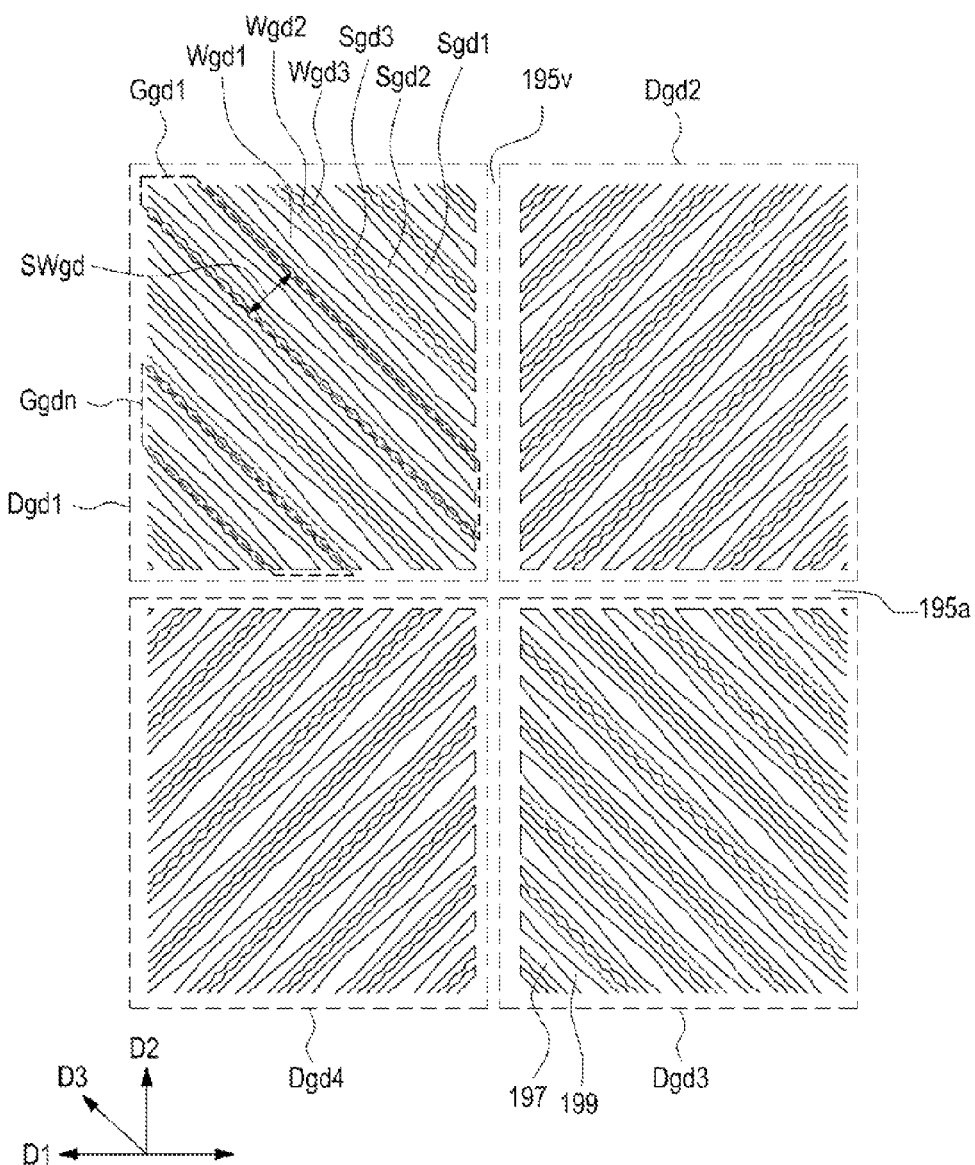

In the plan view of a pixel electrode shown in FIG. 17D, shapes of micro branches Sgd1, Sgd2, and Sgd3 and micro slits Wgd1, Wgd2, and Wgd3 constituting subdomains Ggd1~Ggdn are combined according to an exemplary embodiment of the present invention. The pixel electrode includes, for example, four domains Dgd1, Dgd2, Dgd3, and Dgd4. Each of the domains Dgd1, Dgd2, Dgd3, and Dgd4 includes, for example, subdomains Ggd1~Ggdn which are periodically repeated. Each of the subdomains Ggd1~Ggdn includes, for example, a plurality of micro branches Sgd1, Sgd2, and Sgd3, and micro slits Wgd1, Wgd2, and Wgd3. Micro branches 197 and micro slits 199 have shapes similar to the above-described combined entases A (see FIG. 16E) or combined entases B (see FIG. 16F). The micro branches 197 may be formed as Sgd1, Sgd2 and Sgd3. A micro branch Sgd1 has, for example, a shape formed in a combination of a straight line and a zigzag. A micro branch Sgd2 has, for example, a shape symmetrical to the micro branch Sgd1. A micro branch Sgd3 has, for example, a rhombus or diamond-connected shape. The shapes of micro branches 197 may be applied to micro slits 199. The micro slits 199 may be formed as Wgd1, Wgd2 and Wgd3. A micro slit Wgd1 has, for example, a shape formed in a combination of two zigzags. A micro slit Wgd2 has, for example, a shape formed by a straight line and a zigzag which is smaller than the zigzags of the micro slit Wgd1. A micro slit Wgd3 has, for example, a shape symmetrical to the micro slit Wgd2. For example, widths SWgd of subdomains may be about 10 μm to about 40 μm, and widths of micro branches Sgd1, Sgd2, and Sgd3, and micro slits Wgd1, Wgd2, and Wgd3 may be about 2 μm to about 10 μm. The shapes of micro slits 199 may be applied to the micro branches 197. Micro branches 197 and micro slits 199 constituting four domains Dgd1, Dgd2, Dgd3, and Dgd4, and main directions of the micro branches 197 may be formed, for example, symmetrically about a cross-shaped branch 195. Any one of the main directions of micro branches 197 may be, for example, about 30° to about 60°. For example, any one of the main directions of micro branches 197 may be about 45°. While it has been described that micro slits and micro branches in domains are symmetrical about the cross-shaped branch 195 in accordance with an exemplary embodiment of the present invention, the micro slits and micro branches in domains may be formed asymmetrically, and main directions of micro branches 197 in domains may also be asymmetrical. In this manner, micro branches 197 constituting subdomains are diverse in shape and width, thereby increasing irregularity of the pixel electrode structure, dispersing diffraction spots of the light diffracted thereby, and thus contributing to a significant reduction in rainbow stains on the liquid crystal display device.

Figure 17E:
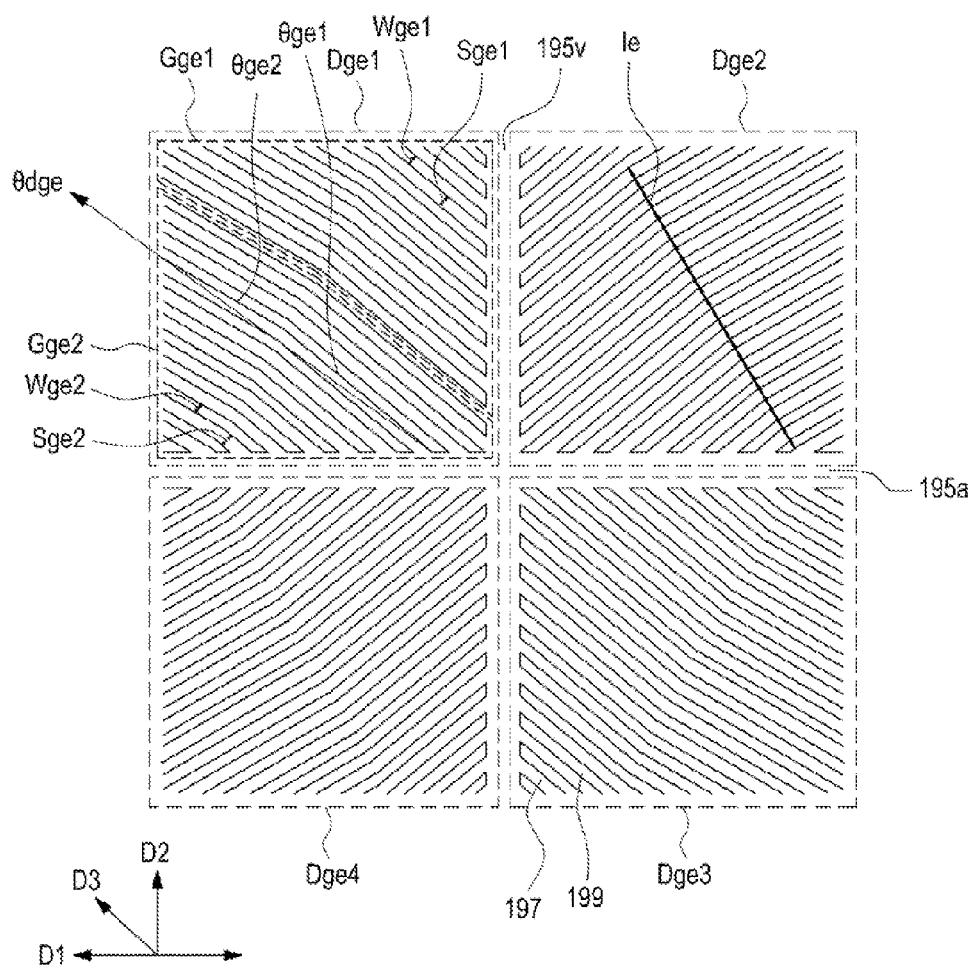

In the plan view of a pixel electrode shown in FIG. 17E, micro slits 199 having two different directions are provided diagonally in each of four domains Dge1, Dge2, Dge3, and Dge4 according to an exemplary embodiment of the present invention. The pixel electrode includes, for example, four domains Dge1, Dge2, Dge3, and Dge4. Domain Dge1 includes, for example, subdomains Gge1 and Gge2. Subdomain Gge1 has, for example, micro branches 197 and micro slits 199, whose widths are Sge1 and Wge1, respectively. Subdomain Gge2 has, for example, micro branches 197 and micro slits 199, whose widths are Sge2 and Wge2, respectively. For example, in accordance with an exemplary embodiment of the present invention, the widths Sge1 and Sge2 of micro branches may be different, and the widths Wge1 and Wge2 of micro slits may also be different. For example, the width Sge2 of micro branches may be greater than the width Sge1 of micro branches, or the width Wge2 of micro slits may be greater than the width Wge1 of micro slits. In accordance with an exemplary embodiment of the present invention, a sum of a micro branch's width Sge1 and its adjacent micro slit's width Wge1 formed in the subdomain Gge1 may be different from a sum of a micro branch's width Sge2 and its adjacent micro slit's width Wge2 formed in the subdomain Gge2. For example, a sum (e.g., about 5.4 μm to about 10 μm) of a micro branch's width Sge2 and a width Wge2 of its adjacent micro slit 199 formed in the subdomain Gge2 may be greater than a sum (e.g., about 4 μm to about 8 μm) of a micro branch's width Sge1 and a width Wge1 of its adjacent micro slit 199 formed in the subdomain Gge1. Between the subdomains Gge1 and Gge2 may be another subdomain in which widths of micro branches 197 or micro slits 199 may gradually change. Subdomains Gge1 and Gge2 have micro branches 197 having two directions θge1 and θge2 different from their main direction θdge. In other words, subdomains each have a region including micro branches 197 in a direction θge1 and another region including micro branches 197 in a direction θge2. Angles between the directions θge1 and θge2 of micro branches and a direction D1 may be any value within a range of, for example, about 40° to about 50° and any value within a range of, for example, about 30° to about 39°. For example, angles between the directions θge1 and θge2 of micro branches and the direction D1 may be, for example, about 42° and about 37°, respectively. Main direction angles for main directions θdge of micro branches 197 may be any value within a range of, for example, about 30° to about 60°. For example, the main direction angle may be, for example, about 45°. As illustrated in the domain Dge2, a straight line Ie connecting points at which micro branches 197 change from a direction θge1 to a direction θge2, may be, for example, an arc of an ellipse, or a straight line. The above-described structure of micro branches 197 may also be applied to a structure of micro slits 199. The structure formed in the domain Dge1 may also be applied to other domains Dge2, Dge3, and Dge4, and the pixel electrode's structures formed in the domains may be, for example, symmetrical about a horizontal portion 195a or a vertical portion 195v of the cross-shaped branch 195. The pixel electrode formed in this manner may change the strength of an electric field within a liquid crystal layer, thereby increasing side visibility of the liquid crystal display device. In addition, irregularity of the pixel electrode structure increases, thereby dispersing diffraction spots of external light and contributing to a noticeable decrease in rainbow stains on the liquid crystal display device.

In accordance with another exemplary embodiment of the present invention, micro branches 197 having a direction θge2 may be closer to a data wiring than micro branches 197 having a direction θge1, and an angle between a data line 171 and the direction θge2 may be greater than an angle between the data line 171 and the direction θge1. Since the micro branches 197 close to the data line 171 and having the direction θge2 are more perpendicular to the data line 171 than the micro branches 197 having the direction θge1, the major axes or principal axes of liquid crystal molecules adjacent to the data line 171 are arranged more perpendicularly to the data line 171 than those of liquid crystal molecules adjacent to a cross-shaped branch. Therefore, the major axes or principal axes of liquid crystal molecules arranged approximately perpendicular to the data line 171 may increase side visibility representing visibility in a direction perpendicular to the data line 171. In addition, the micro branches 197 having the direction θge1 are arranged more parallel to the data line 171 than the micro branches 197 having the direction θge2, thereby increasing side visibility representing visibility in a direction parallel to the data line 171 due to the micro branches 197 having the direction θge1. The pixel electrode having micro branches 197 arranged in two or more directions may increase side visibility of the liquid crystal display device.

Figure 17F:
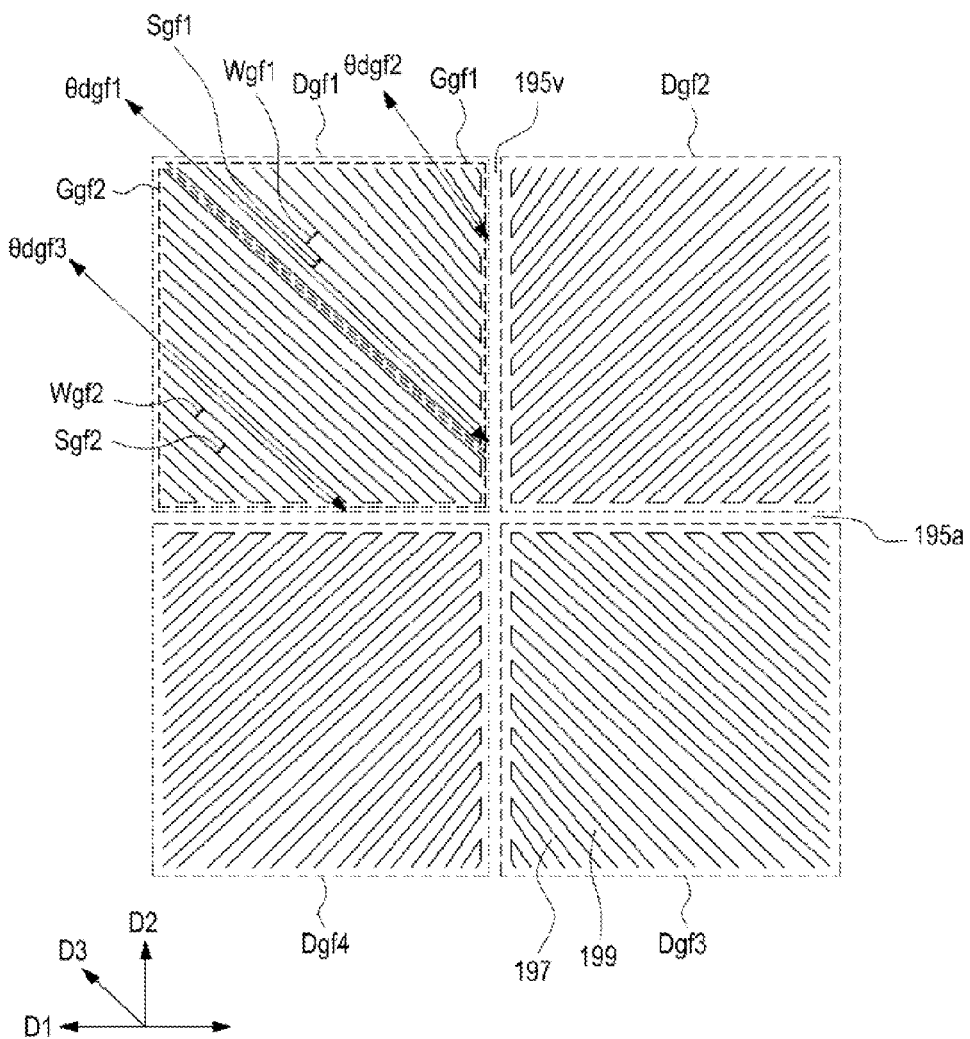
Figure 17G:
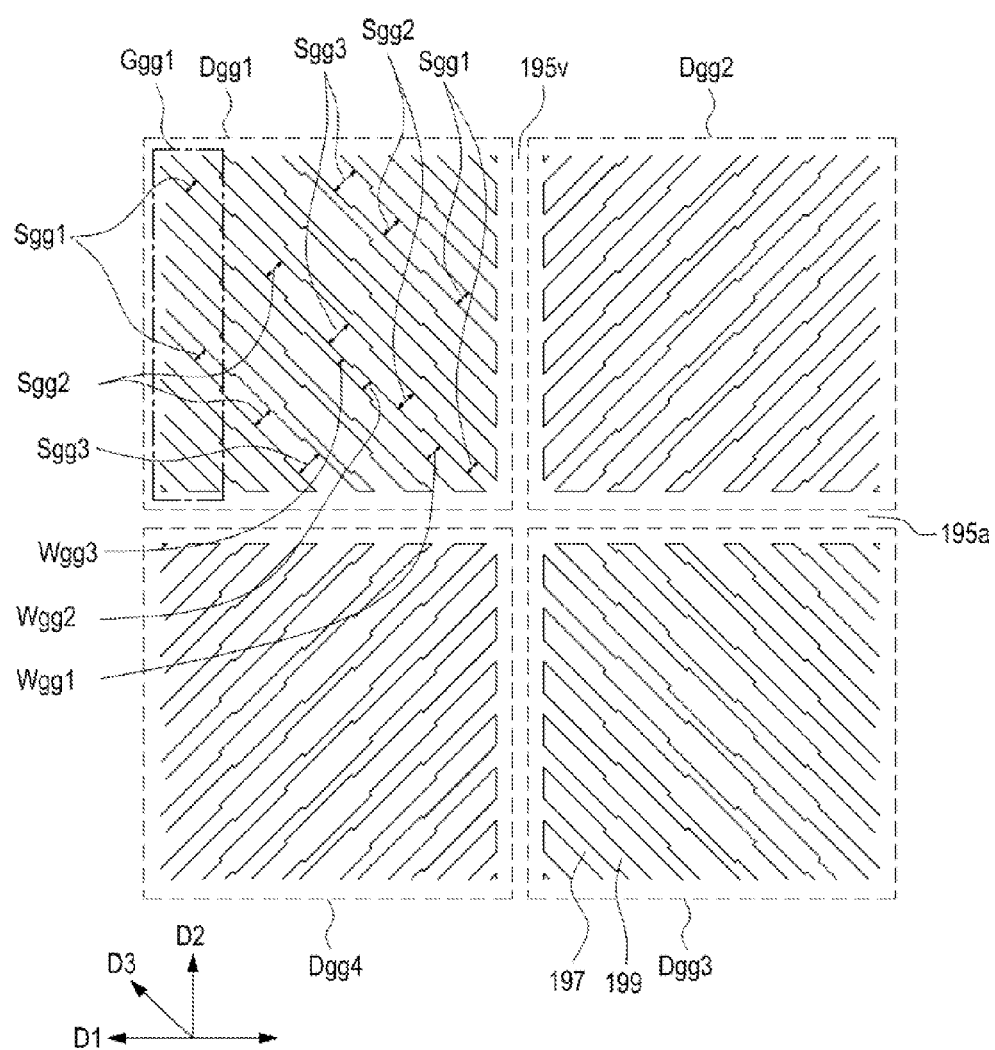

Micro branches 197 and micro slits 199 shown in FIGS. 17F and 17G have, for example, stripe shapes. Widths S and W of micro branches 197 and micro slits 199 have been described in conjunction with FIGS. 3 and 5A. In the plan view of a pixel electrode shown in FIG. 17F, widths of micro slits 199 gradually increase as they go from a horizontal portion 195a or a vertical portion 195v of a cross-shaped branch 195 toward the edge of the pixel electrode, e.g., toward a vertical connection portion 193 or a horizontal connection portion 194, according to an exemplary embodiment of the present invention. In other words, as micro slits 199 extend to the edge of the pixel electrode, their widths gradually increase. The pixel electrode has, for example, four domains Dgf1, Dgf2, Dgf3, and Dgf4. Domain Dgf1 includes, for example, subdomains Ggf1 and Ggf2. Subdomain Ggf1 has micro branches 197 and micro slits 199 having micro branch's width Sgf1 and micro slit's width Wgf1, respectively, which change along their extension direction. In addition, the subdomain Ggf1 has, for example, micro slits 199 or micro branches 197 having main direction angles θdgf1 and θdgf2. The main direction angle of micro slits or micro branches means an angle between a straight line connecting central points of widths of micro slits or micro branches and a polarization axis of a polarizer, or a direction D1. Widths Wgf1 of micro slits 199 constituting the subdomain Ggf1 gradually increase as they go from a horizontal portion 195a or a vertical portion 195v of a cross-shaped branch 195 toward the edge of the pixel electrode, e.g., toward a vertical connection portion 193 or a horizontal connection portion 194. Widths Sgf1 of micro branches 197 may be constant, or may gradually increase as they go from the horizontal portion 195a or the vertical portion 195v of the cross-shaped branch 195 toward the edge of the pixel electrode, or toward the vertical connection portion 193 or the horizontal connection portion 194 of the pixel electrode.

In accordance with another exemplary embodiment of the present invention, the main directions θdgf1 and θdgf2 of micro slits 199, shown in the subdomain Ggf1, may be, for example, different from each other. In the subdomain Ggf1, main direction angles for main directions θdgf1 of micro slits 199 adjacent to a subdomain Ggf2 may be, for example, smaller than main direction angles for main directions θdgf2 of other micro slits 199 in the subdomain Ggf2, and the main direction angles of micro slits 199 may gradually increase from the main direction angle θdgf1 to the main direction angle θdgf2. In accordance with an exemplary embodiment of the present invention, main direction angles for main directions θdgf1 and θdgf2 of micro slits 199 may be, for example, about 30° to about 55°. Main direction angles of micro branches 197 are substantially similar to the main direction angles of micro slits 199. Any one of main direction angles for main directions θdgf1 and θdgf2 of micro slits 199, shown in the subdomain Ggf1, may be, for example, greater than main direction angles of micro slits 199, shown in the subdomain Ggf2. The subdomain Ggf2 has micro branches 197 and micro slits 199 having micro branch's width Sgf2 and micro slit's width Wgf2, respectively, which are constant along their extension direction. The micro branch's width Sgf2 and micro slit's width Wgf2 may be, for example, substantially equal in values. On the other hand, the micro branch's width Sgf2 and micro slit's width Wgf2 may be, for example, different to adjust the strength of an electric field being applied to a liquid crystal layer. Main directions of micro slits 199 or micro branches 197, shown in the subdomain Ggf2, are, for example, substantially the same. For example, the pixel electrode structure formed in the domain Dgf1 may be applied to the other domains Dgf2, Dgf3, and Dgf4, and the structures of a pixel electrode, formed in the domains, may be symmetrical about the horizontal portion 195a or the vertical portion 195v of the cross-shape branch 195. The pixel electrode including the micro branches 197 and micro slits 199 formed in this manner can adjust the strength of an electric field formed in a liquid crystal layer according to the subdomains, thereby increasing side visibility of the liquid crystal display device or significantly reducing rainbow stains of the liquid crystal display device.

In the plan view of a pixel electrode shown in FIG. 17G, a plurality of micro branches 197 and a plurality of micro slits 199 have two or more discontinuous widths according to an exemplary embodiment of the present invention. The pixel electrode shown in FIG. 17G includes, for example, four domains Dgg1, Dgg2, Dgg3, and Dgg4. A domain Dgg1 has, for example, micro branches 197 and micro slits 199 in a stair shape. In other words, the micro branches 197 and micro slits 199 have various discontinuous widths. As illustrated in FIG. 17G, each micro branch 197 has widths Sgg1, Sgg2 and Sgg3, and the widths of each micro branch 197 may discontinuously increase in an order of widths Sgg1, Sgg2 and Sgg3 as they go from a horizontal portion 195a or a vertical portion 195v of a cross-shaped branch 195 to the edge of the pixel electrode. Each of the micro branch widths Sgg1, Sgg2 and Sgg3 may have any value within, for example, a range of about 2.0 μm to about 6 μm. In accordance with an exemplary embodiment of the present invention, micro branch widths Sgg1, Sgg2 and Sgg3 may be, for example, about 1.8 μm, about 3.2 μm and about 4.5 μm, respectively. Micro slit widths adjacent to the micro branch widths Sgg1, Sgg2 and Sgg3 may be Wgg1, Wgg2 and Wgg3, respectively. The micro slit widths Wgg1, Wgg2 and Wgg3 may have any value within a range of, for example, about 2.0 μm to about 6 μm. In accordance with an exemplary embodiment of the present invention, the micro slit widths Wgg1, Wgg2 and Wgg3 may be, for example, about 4.5 μm, about 3.2 μm and about 1.8 μm, respectively. In each of adjacent micro branch-micro slit pairs, a sum of a micro branch width and a micro slit width may have, for example, two or more values. In accordance with an exemplary embodiment of the present invention, for at least one micro branch 197 situated diagonally in the domains, micro branch widths Sgg1, Sgg2, Sgg3, Sgg2, and Sgg1 may, for example, discontinuously increase and decrease as they extend from the central portion of the pixel electrode, or the horizontal portion 195a or the vertical portion 195v of the cross-shaped branch 195, to the edge of the pixel electrode. In an exemplary embodiment of the present invention, at least one micro branch 197 may, for example, increase in discontinuous widths as it goes from the horizontal portion 195a or vertical portion 195v of the cross-shaped branch 195 to the central portion of the domain, and may decrease in discontinuous widths as it goes from the central portion of the domain to a vertical connection portion 193 or a horizontal connection portion 194 of the pixel electrode, or to the edge of the pixel electrode. Other micro branches 197 may, for example, increase in discontinuous micro branch widths as they go from the horizontal portion 195a or vertical portion 195v of the cross-shaped branch 195 to the edge of the pixel electrode, and the other remaining micro branches 197 may decrease in discontinuous micro branch widths as they go from the horizontal portion 195a or vertical portion 195v of the cross-shaped branch 195 to the edge of the pixel electrode. Micro branches 197 in a subdomain Ggg1 of the domain Dgg1 may have the same micro branch width Sgg1. The subdomain Ggg1 may be formed in, for example, a portion adjacent to the vertical connection portion 193 or horizontal connection portion 194 of the pixel electrode, or the edge of the pixel electrode. A main direction of each of the micro branches 197 or micro slits 199 formed in the domain Dgg1 is, for example, a direction of a straight line connecting central points of widths of the micro branches 197 or micro slits 199, and main directions of the micro branches or micro slits are parallel to each other. The pixel electrode structure formed in the domain Dgg1 may also be applied to, for example, other domains Dgg2, Dgg3, and Dgg4, and pixel electrode structures formed in the domains may be symmetrical about the horizontal portion 195a or vertical portion 195v of the cross-shaped branch 195. The pixel electrode including the micro branches 197 and micro slits 199 formed in this manner may tilt liquid crystal molecules in a liquid crystal layer at various angles, thereby increasing side visibility of the liquid crystal display device or significantly reducing rainbow stains of the liquid crystal display device.

The pixel electrode according to an exemplary embodiment may have, for example, at least one V-shaped notch. In other words, a V-shaped notch may be, for example, engraved or embossed on an electrode with the micro branches 197 or the cross-shaped branch portions 195. If the notch is formed on the pixel electrode, a response speed of the liquid crystal display may increase and the luminance thereof may increase.

Referring to FIG. 3, the first and second subpixel electrodes 191h and 191l have the vertical connection portions 193h and 193l both on the left and right, respectively. The vertical connection portions 193h and 193l block parasitic capacitive coupling occurring between the data line 171 and the subpixel electrodes 191h and 191l. Referring to FIGS. 4B and 4C, in adjacent pixels, the vertical connection portions 193h of the first subpixel electrode 191h overlap the vertical portions 128 of the storage electrode line by OLL1 and OLR1, respectively. Each of OLL1 and OLR1 may be a value selected from, for example, about 0.5 μm to about 3 μm. In adjacent pixels, the vertical connection portions 193*l* of the second subpixel electrode 191*l* overlap the vertical portions 128 of the storage electrode line by OLL2 and OLR2, respectively. OLL2 and OLR2 may be values selected from, for example, about 1 μm to about 3 μm, respectively. To reduce a change in capacitance of the second liquid crystal capacitor Clcl formed on the second subpixel electrode 191*l*, OLL2 and OLR2 may be, for example, greater than or equal to OLL1 and OLR1, respectively. The light blocking member 220 formed on the upper display panel 200 overlaps the vertical portions 128 of the storage electrode line formed in the portion of the first subpixel electrode 191*h* by OBL1 and OBR1, respectively. Each of OBL1 and OBR1 may be, for example, about 0.5 μm to about 3 μm. In addition, the light blocking member 220 formed on the upper display panel 200 overlaps the vertical portions 128 of the storage electrode line formed in the region of the second subpixel electrode 191*l* by OBL2 and OBR2, respectively. Each of OBL2 and OBR2 may be, for example, about 0.5 μm to about 3 μm. The light leakage of the liquid crystal display device may be increased by matching values of OBL1, OBR1, OBL2 and OBR2 with process conditions and the cell gap.

Widths and Distributions of Micro Branches and Micro Slits

To increase the transmittance and side visibility of the liquid crystal display device and reduce occurrence of rainbow stains, the widths S of the micro branches 197 and the widths W of the micro slits 199 (shown in FIG. 5A) may be determined in different ways according to the parameters such as, for example, the thickness of the liquid crystal layer 3, the type of the liquid crystal molecules 31, the maximum data voltage, and the voltage ratio and area ratio of the first subpixel electrode 191*h* and the second subpixel electrode 191*l*.

Each of the widths S of the micro branches 197 and the width W of the micro slits 199 according to an exemplary embodiment of the present invention is, for example, about 2 μm to about 6 μm. For example, each of the widths S of the micro branches 197 and the width W of the micro slits 199 may be, for example, about 2.5 μm to about 4 μm. Alternatively, for example, if micro branches 197 are greater than micro slits 199 in area, an electric field between the pixel electrode and the common electrode may increase, contributing to an increase in response speed and transmittance of the liquid crystal display device. Therefore, the micro branch widths S may not be limited to what is shown in the figures. Referring to FIG. 3, S and W are constant in the first subpixel electrode 191*h*, and respective domains of the second subpixel electrode 191*l* have first to third regions HA, LA and MA according to the S and W and the distributions of the micro branches and micro slits. In the first region HA, the width S of the micro branches 197 and the width W of the micro slits 199 are defined as S1 and W1, respectively, and S1 and W1 are, for example, the same. In the second region LA, the width S of the micro branches 197 and the width W of the micro slits 199 are defined as S2 and W2, respectively, and W2 is, for example, greater than S2. In the third region MA, the width S of the micro branches 197 and the width W of the micro slits 199 are defined as S3 and W3, respectively, and, for example, S3 is constant but W3 gradually changes. In the third region MA, W3 gradually increases as it gets close to the second region LA from the first region HA. S and W of the first subpixel electrode 191*h* according to an exemplary embodiment are, for example, about 3 μm and about 3 μm, respectively. For example, S1 and W1, S2 and W2 and S3 and W3 of the second subpixel electrode 191*l* are about 3 μm and about 3 μm, about 3 μm and about 4 μm, about 3 μm and about 3 μm to about 4 μm, respectively. The step, by which the width W3 of the second subpixel electrode 199*l* gradually changes, is, for example, about 0.15 μm to about 0.5 μm. For example, the step, by which the width W3 of the second subpixel electrode 199*l* gradually changes, may be about 0.2 μm. On the other hand, for example, each of S3 and W3 in the third region MA may gradually change, and S2 and W2 in the second region LA may be greater than S1 and W1 in the first region HA, respectively. The area of the first region HA formed in each domain of the second subpixel electrode 191*l* is, for example, greater than the area of the second region LA. For example, in an exemplary embodiment of the present invention, of the area of the entire region in each domain, each subpixel, or each pixel, e.g., of the combined area of the HA region, the LA region and the MA region, the area of the first region HA is about 50% to about 80%, and the combined area of the second region LA and the third region MA is about 20% to about 50%. For example, the area of the first region HA may be about 60% to about 70% and the combined area the second region LA and the third region MA may be about 30% to about 40%. The areas of the first to third regions HA, LA and MA may have, for example, different distributions (sizes) in each domain. The first to third regions HA, LA and MA may be formed, for example, symmetrically about at least a selected one of the horizontal branch portion and the vertical branch portion of each of the cross-shaped branch portions 195*h* and 195*l*. Alternatively, for example, the first to third regions HA, LA and MA may be formed even in the first subpixel electrode 191*h*.

Directions of Micro Branches

Because the major axis of the liquid crystal molecules 31 is tilted in a direction parallel to the micro branches 197*h* and 197*l* by the electric field formed in the liquid crystal layer 3, the liquid crystal display device having the micro branches 197*h* and 197*l* extending in the direction of about 45° with respect to the polarization axis of the polarizer has the maximum transmittance. Therefore, depending on the directions of the micro branches 197*h* and 197*l* of the subpixel electrodes 191*h* and 191*l*, the luminance and side visibility of the liquid crystal display device may vary based on the change in transmittance of light passing through regions of the subpixels 190*h* and 190*l*.

In each domain, directions of the micro branches 197 and the micro slits 199 may be, for example, about 0° to about 45° with respect to at least a selected one of a first direction D1 and a second direction D2. For example, in each domain, the directions of the micro branches 197 and the micro slits 199 may be about 30° to about 45°, with respect to at least a selected one of a first direction D1 and a second direction D2 The first direction D1 and the second direction D2 may be a direction of a polarization axis of a polarizer attached to the lower display panel 100 or the upper display panel 200. Referring to FIG. 3, the micro branches 197 are formed in directions of θ1 and θ2 with respect to the polarization axis of the polarizer in the first subpixel electrode 191*h* and the second subpixel electrode 191*l*, respectively, and θ1 and θ2 are, for example, about 40° and about 45°, respectively. In an exemplary embodiment, the θ1 can be, for example, different from θ2 by about 20° or less. Directions of the micro branches 197*h* and 197*l* may be, for example, about 30° to about 45° with respect to the direction of the horizontal portion 195*a* or vertical portion 195*v* of the cross-shaped branch 195, or the gate line 121. The direction of the gate line 121 may be, for example, a direction of a virtual line passing by between the first subpixel electrode 191*h* and the second subpixel electrode 191*l* constituting the pixel electrode. In the case of the zigzag-shaped micro branches 197 having a period of peaks PK1 and PK2 shown in FIG. 5B, the direction in which the line connecting the peaks PK1 and PK2 extends is the main direction of the micro branches 197. The micro branches 197*h* and 197*l* may have different directions according to the domains, the pixels, or the subpixel electrodes 191*h* and 191*l*.

A liquid crystal display panel assembly 300 according to an exemplary embodiment of the present invention will be described in detail below with reference to FIGS. 18 to 21B. The liquid crystal display panel assembly 300 has patterns of a pixel electrode layer shown in FIGS. 18 to 21B according to exemplary embodiments of the present invention, thereby increasing visibility of the liquid crystal display device and reducing stains and defects thereof.

Figure 18:
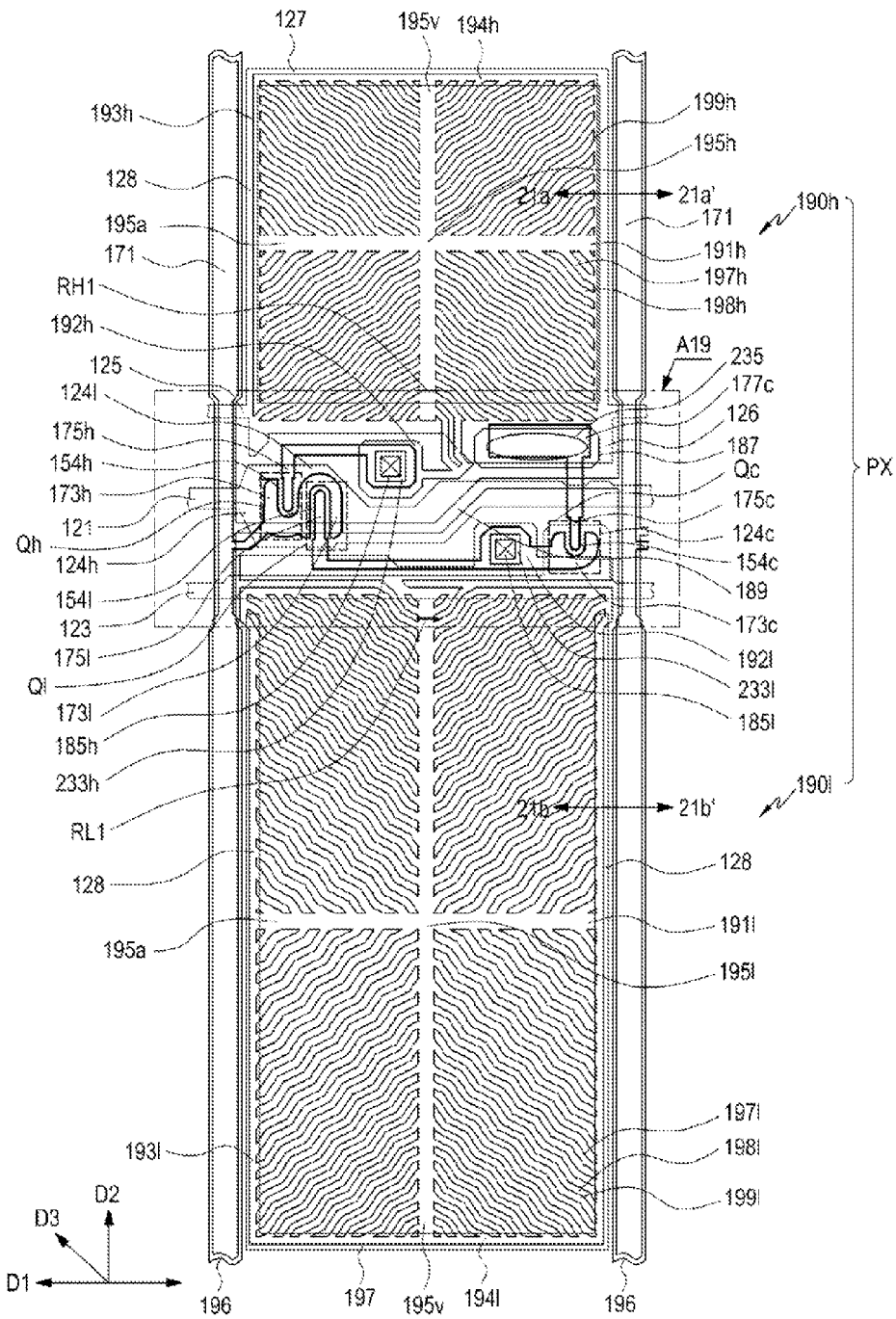
FIG. 18 is a schematic layout of one pixel according to an exemplary embodiment of the present invention.
Figure 19A:
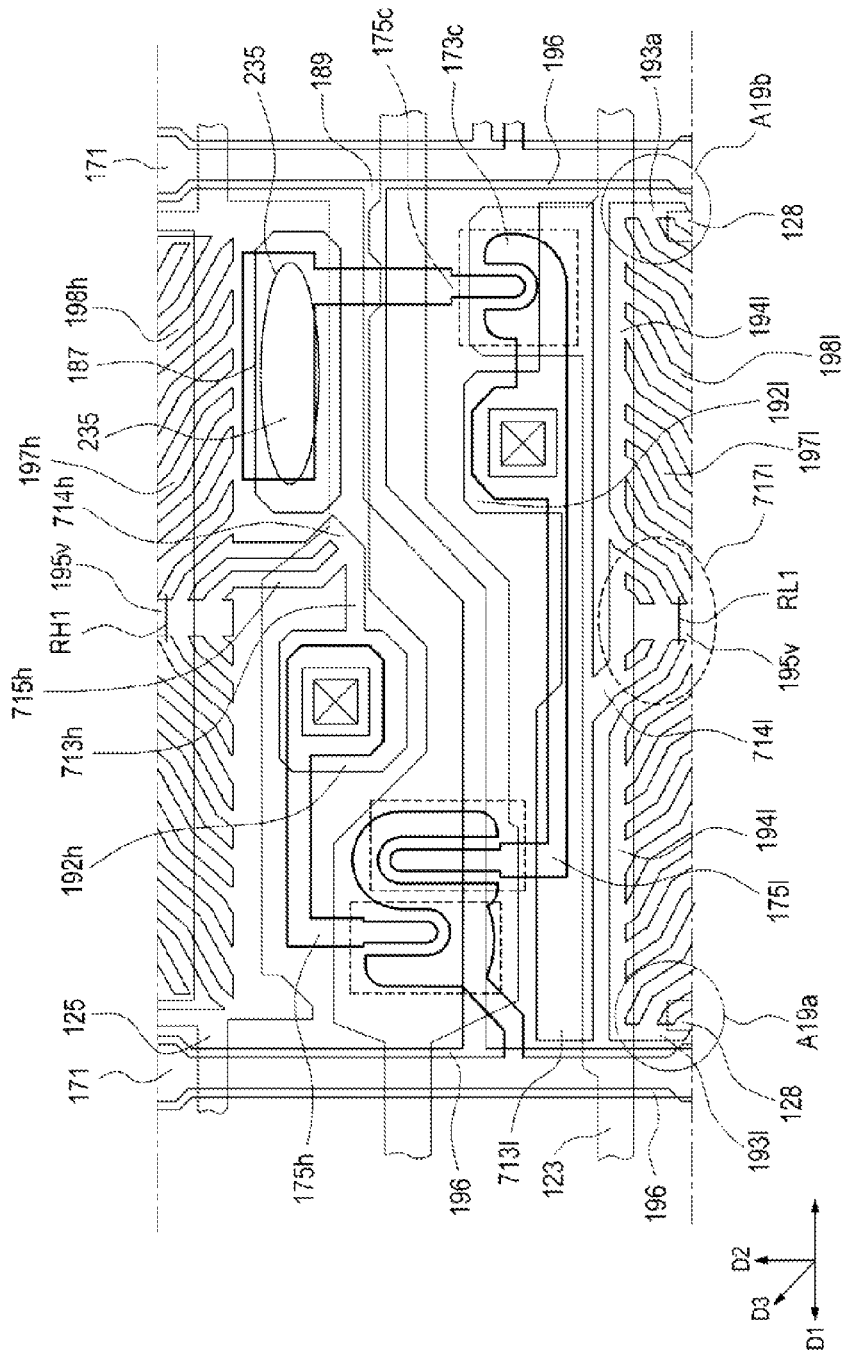
FIG. 19A is an enlarged view of the central part A19 of the pixel shown in FIG. 18.
Figure 19B:
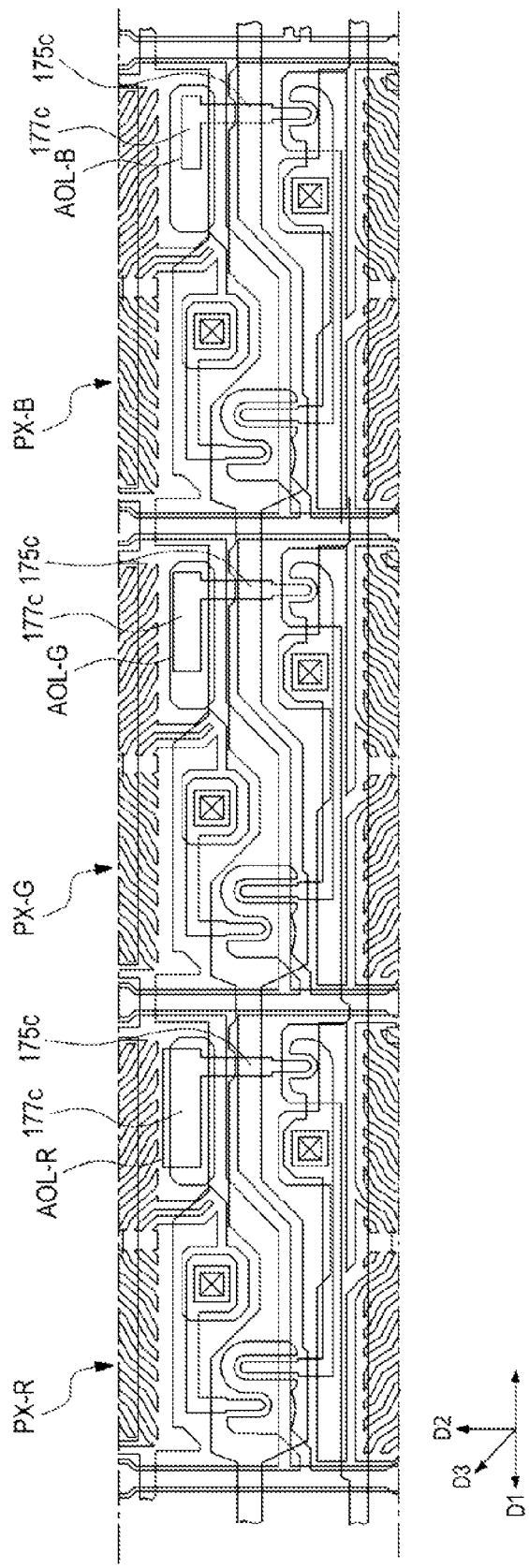
FIG. 19B is an enlarge view of the portion A19 shown in FIG. 18 in each of the pixels in a basic pixel group.
Figure 20A:
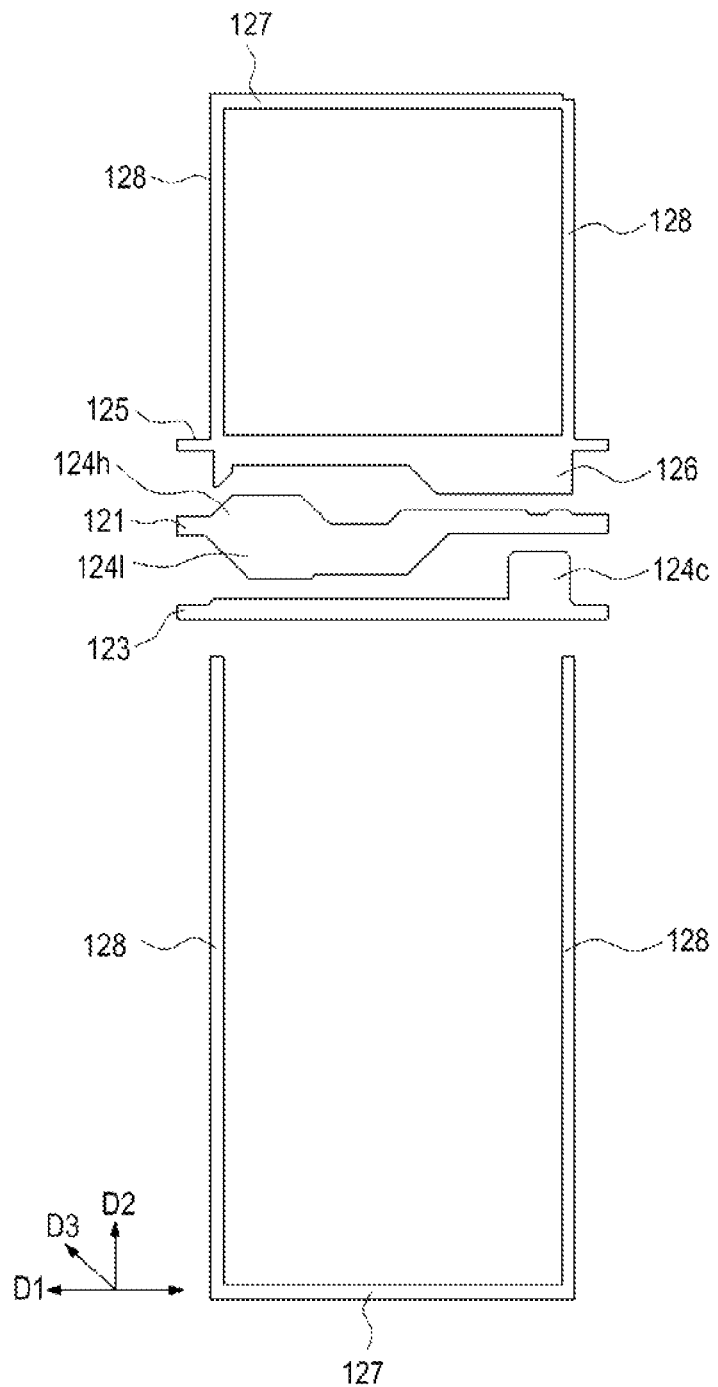
Figure 20B:
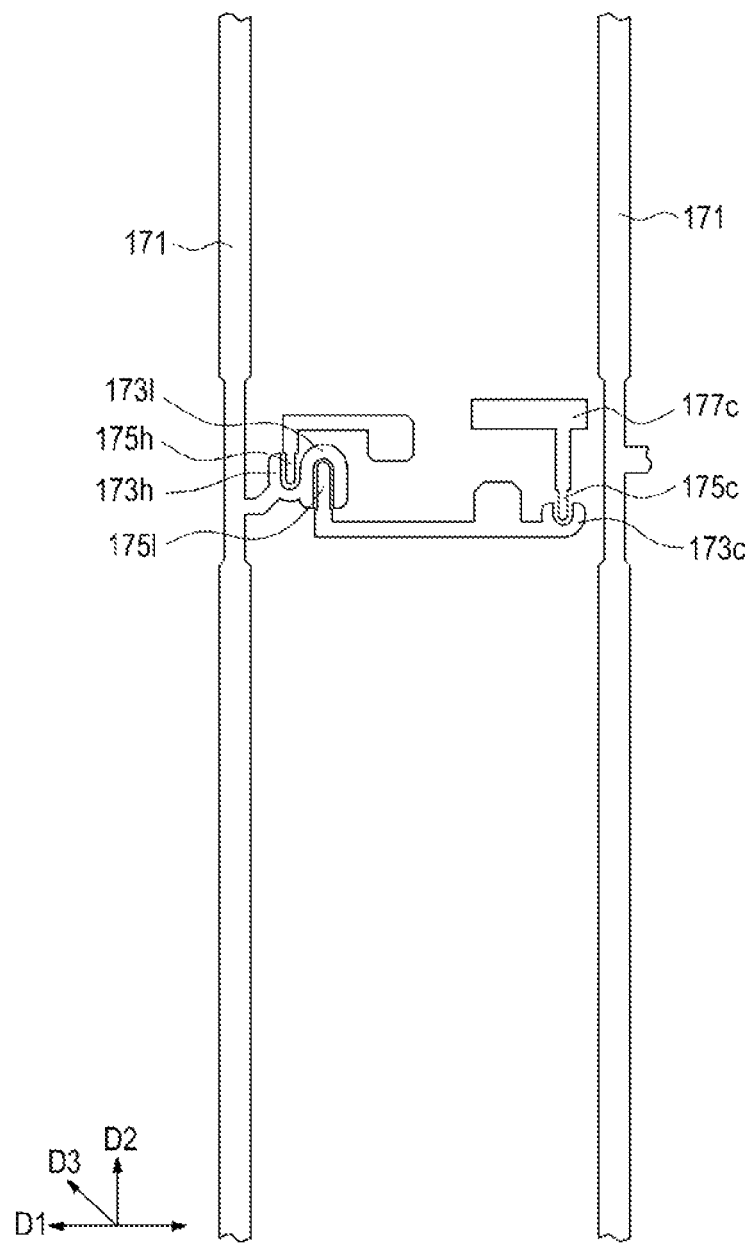
Figure 20C:
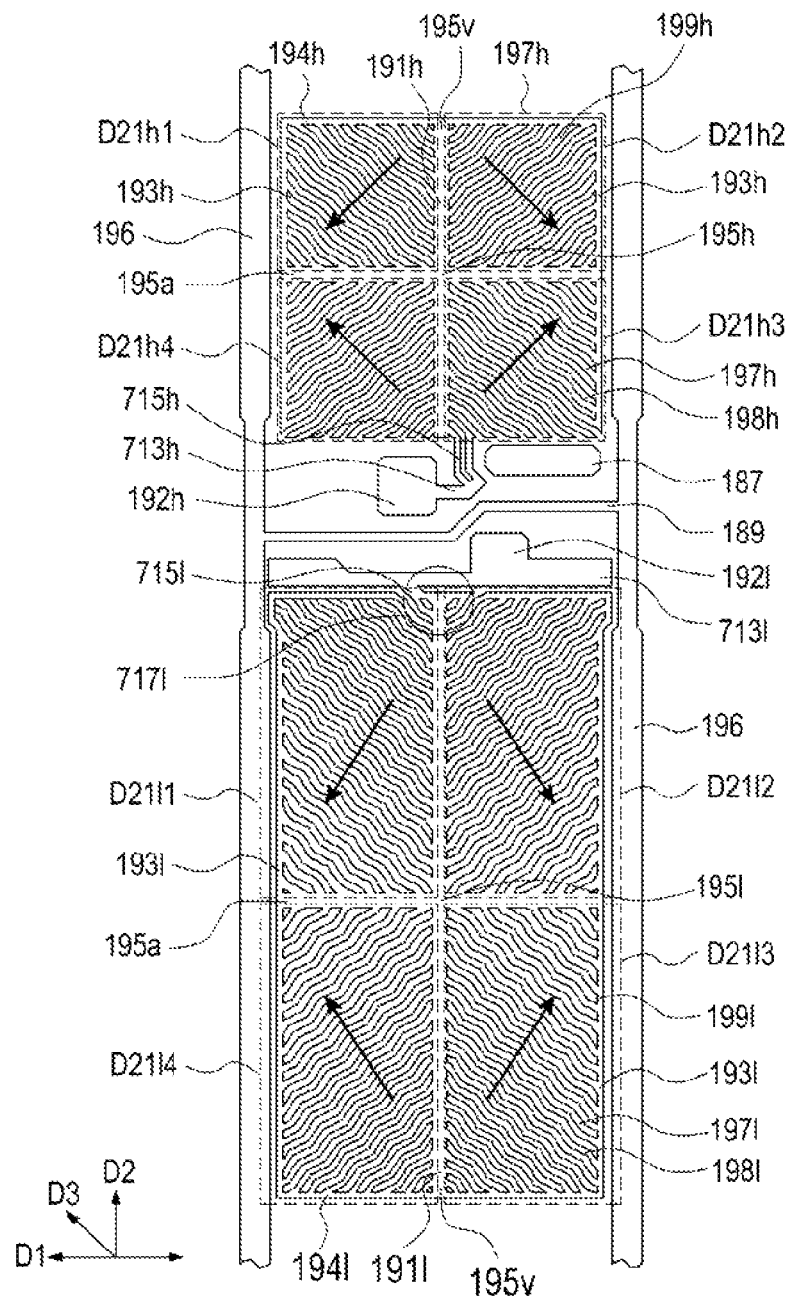
Figure 20D:
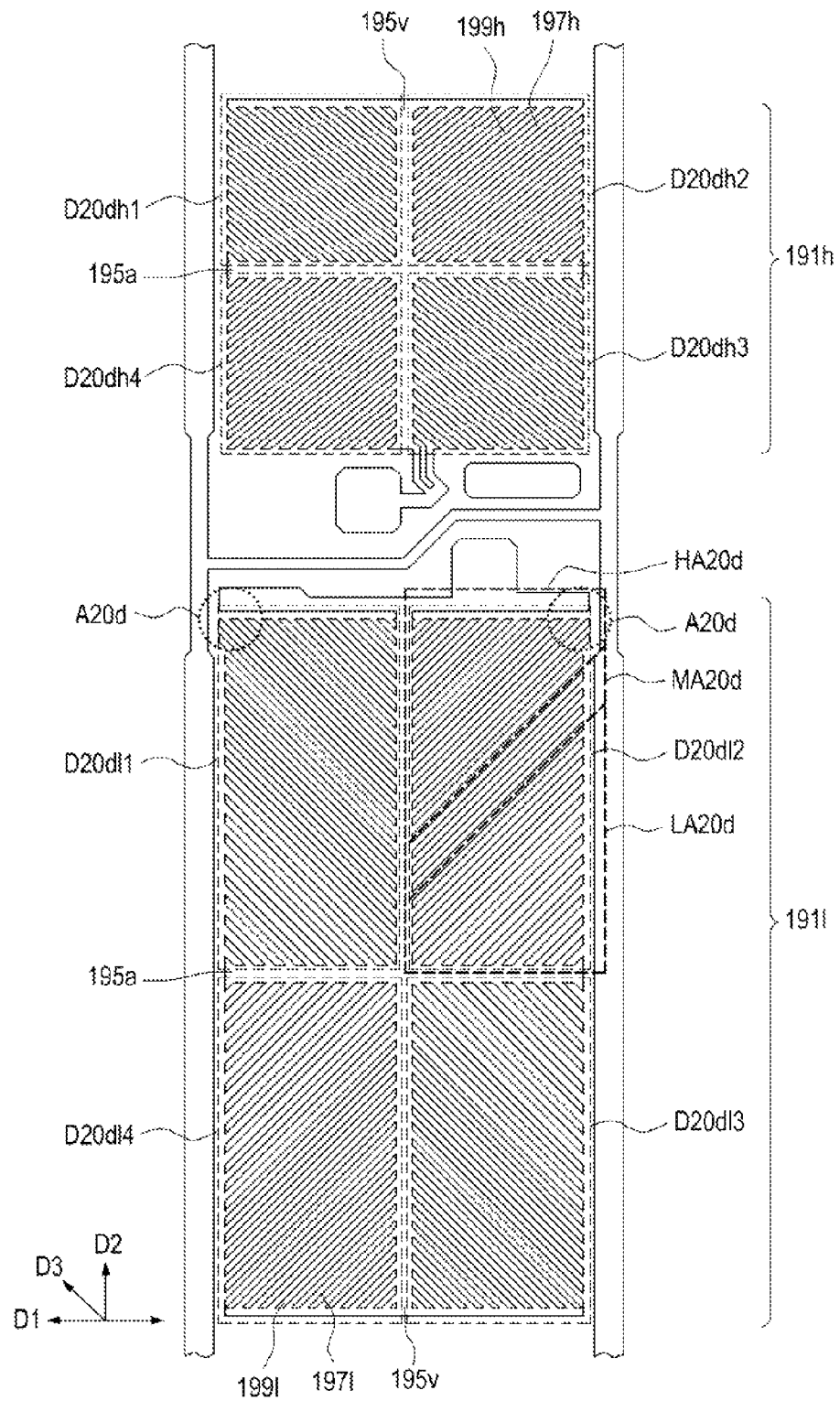
FIGS. 20D and 20E illustrate other examples of the pattern of the pixel electrode layer shown in FIGS. 18 and 20C, respectively.

FIG. 18 illustrates a schematic layout of a unit pixel of a liquid crystal display panel assembly 300 according to an exemplary embodiment of the present invention. FIG. 19A is an enlarged view of a central part A19 of the pixel layout shown in FIG. 18. FIGS. 20A to 20D illustrate patterns for major layers of the pixel structure shown in FIG. 18, according to an exemplary embodiment of the present invention. For example, FIG. 20A illustrates a pattern of a gate layer conductor, FIG. 20B illustrates a pattern of a data layer conductor, and FIG. 20C illustrates a pattern of a pixel electrode layer. FIG. 20D illustrates another pattern of the pixel electrode layer shown in FIG. 18, according to an exemplary embodiment of the present invention. Therefore, the patterns of the gate layer conductor, the data layer conductor and the pixel electrode layer shown in FIGS. 20A to 20D should be construed to be the same as the corresponding layers shown in FIG. 18. FIGS. 21A and 21B are cross-sectional views taken along lines 21*a*-21*a*' and 21*b*-21*b*' of the pixel layout shown in FIG. 18. The cross-sectional views shown in FIGS. 21A and 21B further disclose patterns of several other layers not shown in FIG. 18. As to the cross-sectional views of the liquid crystal display panel assembly 300 shown in FIGS. 21A and 21B, cross sections along the directions 21*a*' and 21*b*' are cross sections that are formed along the cutting-plane lines shown in FIG. 18 when the pixel electrode of FIG. 18 is repeatedly arranged in the form of a matrix consisting of rows and columns. The pixel structures shown in FIGS. 18 to 21B are similar to those described in connection with FIGS. 3 to 4C, so duplicate descriptions of similar parts will be omitted. In addition, reference numerals of the pixel structure shown in FIG. 3 may be used in FIGS. 18, and 19A to 20D.

As described above, a liquid crystal display panel assembly 300 includes, for example, a lower display panel 100, an upper display panel 200, a liquid crystal layer 3 between these display panels, and polarizers situated on an inner or outer side of the display panels 100 and 200. A stacked structure of the lower display panel 100 and upper display panel 200 of the liquid crystal display panel assembly 300 will be described in detail below.

1) Stacked Structure

Figure 21A:
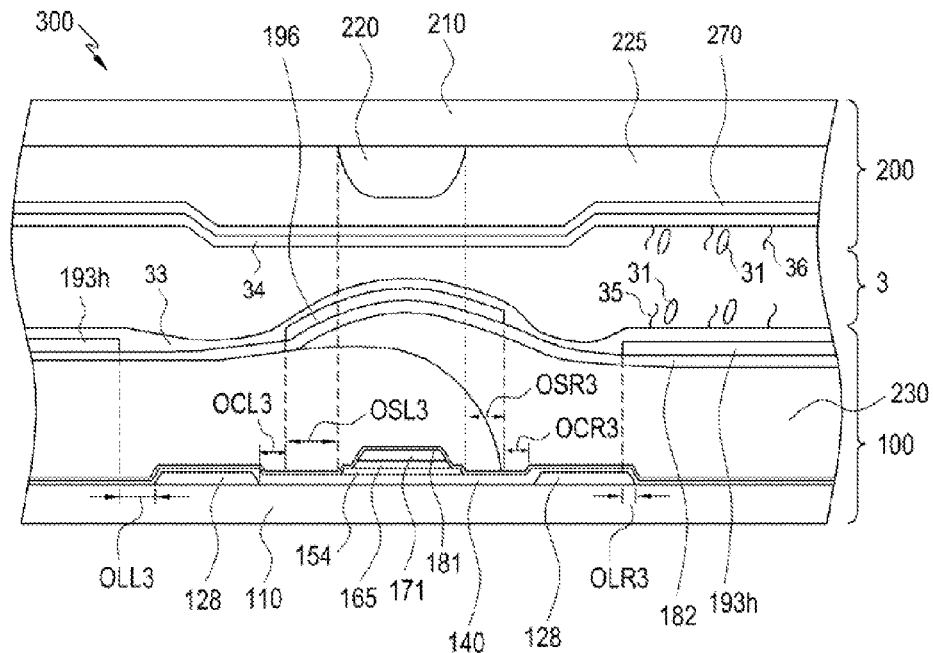
FIGS. 21A and 21B are cross-sectional views taken along lines 21a-21a' and 21b-21b' of the pixel shown in FIG. 18, respectively.
Figure 21B:
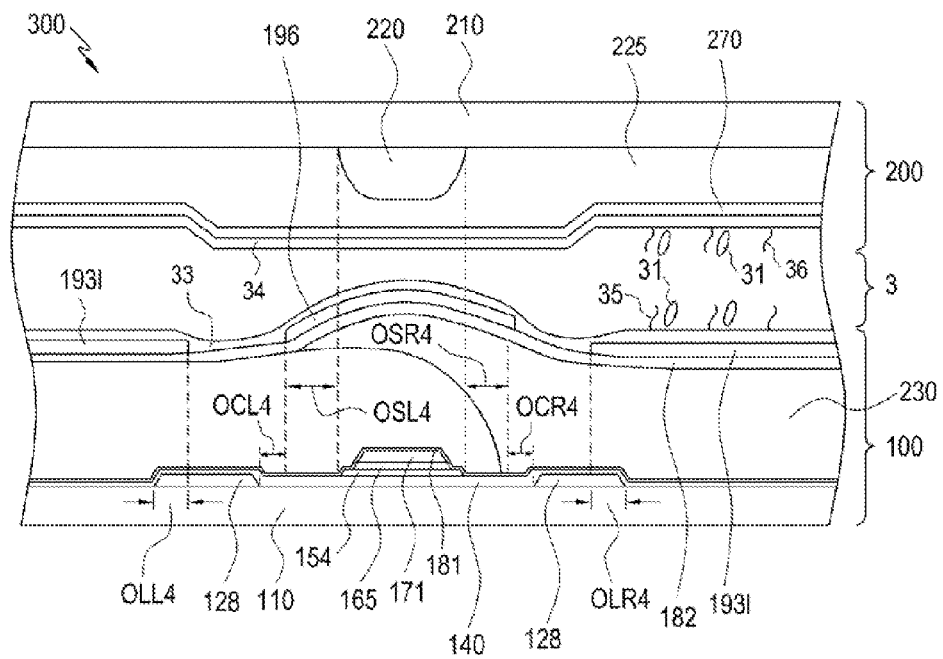
Figure 22A:
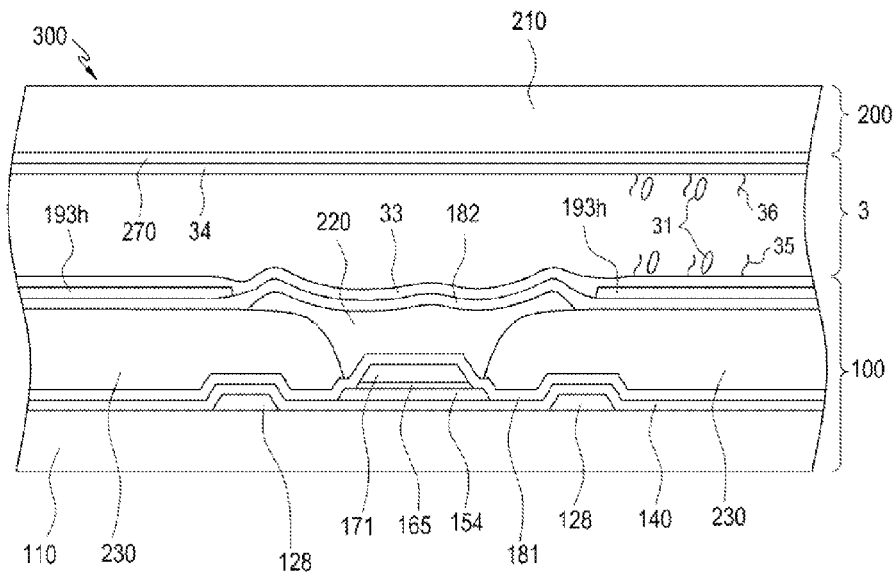
FIGS. 22A to 22H are cross-sectional views of a liquid crystal display panel assembly according to an exemplary embodiment of the present invention, respectively, when they are taken along line 21a-21a' of the pixel shown in FIG. 18.
Figure 22B:
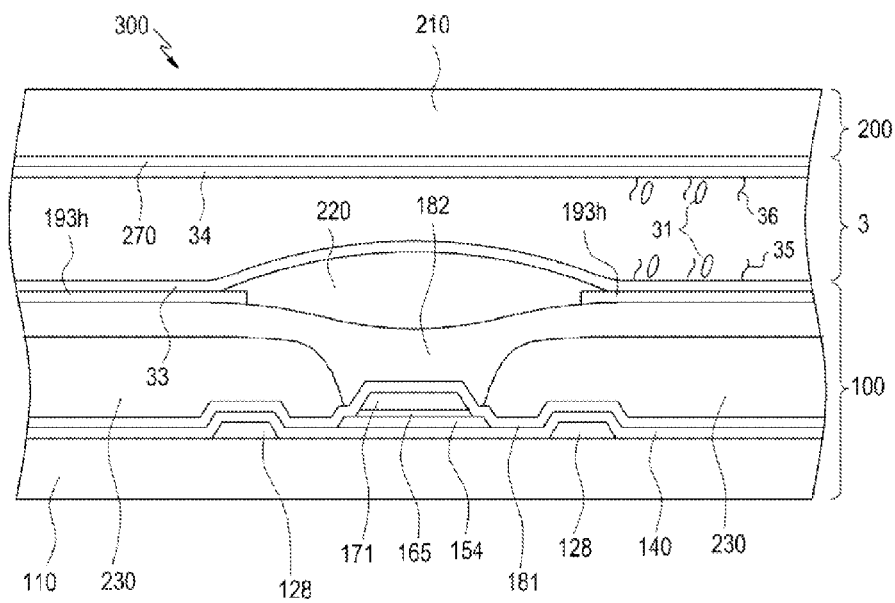

As illustrated in FIGS. 21A and 21B, an upper display panel 200 has a structure, for example, in which a light blocking member 220, an overcoat 225, a common electrode 270, a spacer 250 (not shown), and an upper-plate alignment film 292 (e.g., 34 and 36) are stacked on an upper substrate 210 in sequence. The light blocking member 220, the overcoat 225, the common electrode 270, the spacer 250, and the upper-plate alignment film 292 may be formed by the manufacturing methods and materials described in connection with, for example, FIGS. 4A to 4C. The light blocking member 220 may overlap a data line 171. The light blocking member 220 may be, for example, equal to the data line 171 in width, or may be as wide as, for example, about 0.5 μm to about 2 μm. In accordance with an exemplary embodiment of the present invention, instead of being formed on the upper display panel 200, the light blocking member 220 may be formed, for example, between a color filter 230 and a second protection layer 182 on a lower display panel 100 as illustrated in FIGS. 22A and 22B. In accordance with an exemplary embodiment of the present invention, the upper display panel 200 may not have the overcoat 225 to simplify a manufacturing process thereof. In accordance with an exemplary embodiment of the present invention, to reduce the height of the spacer 250 and uniformize the cell gap, the spacer 250 may be formed on, for example, the upper display panel 200 or the lower display panel 100 so as to overlap the light blocking member 220, a TFT, an outgassing color filter hole 235, or an outgassing hole cover 187.

The lower display panel 100 shown in FIGS. 18 to 21B may have, for example, a structure in which a lower substrate 110, gate layer conductors 121, 123, 124*h*, 124*l*, 124*c*, 125, 126, 127, and 128, a gate insulating layer 140, semiconductors 154*h*, 154*l*, and 154*c*, a linear ohmic contact member 165, data layer conductors 171, 173*h*, 173*l*, 173*c*, 175*h*, 175*l*, 175*c*, and 177*c*, a first protection layer 181, a color filter 230, a second protection layer 182, pixel electrode layers 187, 189, 191*h*, 191*l*, 192*h*, 192*l*, 193*h*, 193*l*, 194*h*, 194*l*, 195*h*, 195*l*, 196, 197*h*, 197*l*, 198*h*, 198*l*, 713*h*, 713*l*, 715*h*, 715*l* (not shown), 717*h*, and 717*l*, and a lower-plate alignment film 291 (e.g., 33 and 35) are stacked in sequence. These elements may be formed by the manufacturing methods and materials described in connection with, for example, FIGS. 4A to 4C.

A gate layer conductor is formed and patterned on the lower substrate 110. The gate layer conductor may include, for example, a plurality of gate lines 121, a plurality of down gate lines 123, a plurality of gate electrodes 124, a plurality of storage electrode lines 125, a plurality of storage electrode line's extension portions 126, a plurality of storage electrode line's horizontal portions 127, and a plurality of storage electrode line's vertical portions 128. Components of the gate layer conductor may be formed of, for example, the above-described corresponding materials. The gate insulating layer 140 is formed and patterned on the gate layer conductor. The gate insulating layer 140 may be formed of, for example, the above-described materials and in the above-described structures corresponding thereto. The semiconductor 154 is formed and patterned on the gate insulating layer 140. The semiconductor 154 has first, second and third semiconductors 154*h*, 154*l*, and 154*c*. The semiconductors 154 may be separated from each other on the gate electrodes 124 as described above. The semiconductor 154 may be formed of, for example, the above-described materials and in the above-described structures corresponding thereto. The linear ohmic contact member 165 is formed and patterned on the semiconductor 154. The linear ohmic contact member 165 has first, second and third linear ohmic contact members, which are formed under a first source electrode 173*h*, a first drain electrode 175*h*, a second source electrode 173*l*, a second drain electrode 175*l*, a third source electrode 173*c* and a third drain electrode 175*c*, respectively. In an exemplary embodiment of the present invention, the linear ohmic contact member 165 may be formed under the data line 171. The linear ohmic contact member 165 may be formed of, for example, the above-described materials and in the above-described structures corresponding thereto. A data layer conductor is formed and patterned on the linear ohmic contact member 165. The data layer conductor has one end portion 177*c* of the third drain electrode 175*c*, which overlaps the data line 171, the first source electrode 173*h*, the second source electrode 173*l*, the third source electrode 173c, the first drain electrode 175h, the second drain electrode 175l, the third drain electrode 175c, and the storage electrode line's extension portion 126. These elements may be formed of, for example, the above-described materials and in the above-described structures corresponding thereto. First, second and third TFTs Qh, Ql, and Qc are formed in the above-described structure corresponding thereto and operate in the above-described method to drive a pixel PX. The first protection layer 181 is formed and patterned on the data layer conductor. The first protection layer 181 may be formed of, for example, the above-described materials and in the above-described structures, and performs the aforementioned functions corresponding thereto. The color filter 230 is formed and patterned on the first protection layer 181. No color filter is formed in the outgassing color filter hole 235. The outgassing color filter hole 235 is a hole through which debris or gases can be discharged, which have been generated in a process of forming a color filter. The outgassing color filter hole 235 may be formed on the pattern of a TFT, a gate layer conductor, or a data layer conductor. After the color filter process is completed, the outgassing color filter hole 235 is covered by a material forming a protection layer or a pixel electrode layer. The color filter 230 may be formed of, for example, the above-described materials and in the above-described structures corresponding thereto. The second protection layer 182 is formed and patterned on the color filter 230 or the first protection layer 181. The second protection layer 182 may be formed of, for example, the above-described materials and in the above-described structures corresponding thereto.

A pixel electrode layer is formed and patterned on the second protection layer 182. The pixel electrode layer may have, for example, first and second subpixel electrodes 191h and 191l, first and second subpixel electrode contact portions 192h and 192l, vertical connection portions 193h and 193l, horizontal connection portions 194h and 194l, cross-shaped branch portions 195h and 195l, micro branches 197h and 197l, zigzag micro branches 198h and 198l, first and second pixel electrode's horizontal connection portions 713h and 713l, first and second pixel electrode's vertical connection portions 715h and 715l, first and second pixel electrode's oblique connection portions 714h and 714l, and first and second pixel electrode connection portion coupling points 717h and 717l, which are formed on first and second subpixels 190h and 190l, respectively, and may also have an outgassing hole cover 187, a shield common electrode 196, and a shield common electrode connection portion 189. Referring to FIGS. 18, 21A and 21B, the shield common electrode 196 overlaps the data line 171. The shield common electrode 196 may prevent an upper-plate common voltage from being distorted by the voltage being applied to the data line 171, or may reduce parasitic capacitive coupling occurring between the data line 171 and the subpixel electrodes 191h and 191l. Shield common electrodes may stay in an equipotential state by being connected to each other by shield common electrode connection portions 189. A width of the shield common electrode 196 may be, for example, greater than a width of the data line 171 by distances OSL3 and OSR3 from both edges of the data line 171 in a first subpixel region, and may be, for example, greater than the width of the data line 171 by distances OSL4 and OSR4 from both edges of the data line 171 in a second subpixel region. The distances OSL3, OSR3, OSL4 and OSR4 may fall within a range of, for example, about 0.5 µm to about 2 µm. The shield common electrode 196 may be spaced apart from edges of storage electrode line's vertical portions 128 situated on the left and right sides of the data line 171 by distances OCL3 and OCR3 in the first subpixel region, and may be spaced apart from edges of storage electrode line's vertical portions 128 situated in the left and right sides of the data line 171 by distances OCL4 and OCR4 in the second subpixel region. The distances OCL3, OCR3, OCL4 and OCR4 may fall within a range of, for example, about 0.5 µm to about 3 µm. The shield common electrode 196 may be floated so as not to receive a voltage, or may receive a predetermined voltage. The predetermined voltage may be, for example, a common voltage, an upper-plate common voltage, or a voltage applied to a storage electrode line. The shield common electrode 196 may overlap light blocking members 220h (corresponding to 220 of 190h) and 220l (corresponding to 220 of 190l). The outgassing hole cover 187 may be formed to, for example, completely cover the outgassing color filter hole 235. The outgassing hole cover 187 prevents the gases generated in the color filter 230 or lower layers from being discharged via the outgassing color filter hole 235. Other components constituting the pixel electrode layer, except a structure of the pixel electrode, are substantially similar to those described above, so a detailed description thereof is omitted. The structure of the pixel electrode is described in detail below. The lower-plate alignment film 291 is formed on the pixel electrode layer. The lower-plate alignment film 291 may be formed of, for example, the above/below-described materials and in the above/below-described methods, and may perform the above/below-described functions corresponding thereto.

2) Structure of Pixel Electrode

A structure of a pixel electrode layer and a cross-sectional view of a peripheral portion of a data line 171 will be described in detail below with reference to FIGS. 18 to 21B. The first subpixel electrode 191h is formed in a region of the first subpixel 190h, and the second subpixel electrode 191l is formed in a region of the second subpixel 190l. Cross-shaped branch portions 195h and 195l of the first and second subpixel electrodes 191h and 191l, and vertical and horizontal connection portions 193h, 194h, 193l, and 194l surrounding the vertical and horizontal edges of the first and second subpixel electrodes 191h and 191l will now be described in detail.

The vertical connection portions 193h and 193l of the pixel electrode will be described in detail with reference to FIGS. 18, 20C, 21A and 21B. In each of the first and second subpixel electrodes 191h and 191l, the vertical connection portions connect end portions of micro branches 197, and isolate micro slits 199 with the pixel electrode removed. The vertical connection portions 193h and 193l of the pixel electrode, formed in this way, may reduce parasitic capacitive coupling. In the first subpixel electrode 191h, the vertical connection portions 193h are spaced apart from storage electrode line's vertical portions 128 by a distance OLL3 without overlapping the storage electrode line's vertical portions 128 on the left side of the data line 171, but overlap the storage electrode line's vertical portions 128 by the distance OLR3 on the right side of the data line 171. Values of OLL3 and OLR3 may fall within a range of, for example, about 0.5 µm to about 2 µm. By asymmetrically forming the vertical connection portions 193h about the data line 171 in this manner, image degradation occurring due to mis-alignment with other layers may be reduced. The image degradation may occur due to mis-alignment with other layers in a first subpixel region rather than in a second subpixel region. Referring to FIG. 21B, in the second subpixel electrode 191l, vertical connection portions 193l overlap the storage electrode line's vertical portions 128 by OLL4 and OLR4 on the left and right sides of the data line 171, respectively. OLL4 and OLR4 may fall within a range of, for example, about 0.5 µm to about 2 µm.

Referring to FIGS. 18 and 19A, an upper end of the first subpixel electrode 191h and a lower end of the second subpixel electrode 191l have horizontal connection portions 194h and 194l, respectively. The horizontal connection portions 194h and 194l connect end portions of micro branches 197 of the pixel electrode, and isolate micro slits 199 with the pixel electrode removed. The horizontal connection portions 194h and 194l overlap the storage electrode line's horizontal portions 127. As the horizontal connection portions 194h are not formed on a lower end of the first subpixel electrode 191h, micro branches 197 formed in this portion are not connected to each other, but micro slits 199 are connected to each other. Micro branches 197h situated on the lower end of the first subpixel electrode 191h may overlap the storage electrode line 125. Micro branches 197 situated on the lower end of the second subpixel electrode 191l are connected to each other to have horizontal connection portions 194l, and micro slits 199 are not connected to each other. On the other hand, micro branches 197l situated in the upper end of the second subpixel electrode 191l may overlap a down gate line 123. The micro branches 197 and micro slits 199 formed in this way may increase a response speed of the liquid crystal display device and reduce textures. In the alternative, for example, micro branches 197 situated on the lower end of the first pixel electrode 191h may be connected to each other, and micro slits 199 may not be connected to each other. Further, micro branches 197 on the upper end of the second subpixel electrode 191l may be, for example, isolated by micro slits 199, and the micro slits 199 may be connected to each other.

As illustrated in FIGS. 18 and 20C, first and second subpixel electrodes 191h and 191l each have, for example, four domains including zigzag-shaped micro branches 198h and 198l. In other words, the first subpixel electrode 191h has, for example, four domains D21h1, D21h2, D21h3 and D21h4, and the second subpixel electrode 191l has four domains D21l1, D21l2, D21l3 and D21l4. The domains D21h1, D21h2, D21h3, D21h4, D21l1, D21l2, D21l3 and D21l4 have main directions $\theta d21h1$, $\theta d21h2$, $\theta d21h3$, $\theta d21h4$, $\theta d21l1$, $\theta d21l2$, $\theta d21l3$ and $\theta d21l4$ (not shown) of micro branches 197, respectively, defined by directions of straight lines connecting peaks of the micro branches 197. Main direction angles of main directions of micro branches in the domains may fall within a range of, for example, about 30° to about 60° with respect to the direction D1. Main directions of micro branches in domains facing a cross-shaped branch's vertical portion 195v may be, for example, symmetrical about the cross-shaped branch's vertical portion 195v. Main direction angles of the main directions $\theta d21l1$, $\theta d21l2$, $\theta d21l3$ and $\theta d21l4$ of micro branches may be, for example, greater than main direction angles of the main directions $\theta d21h1$, $\theta d21h2$, $\theta d21h3$ and $\theta d21h4$ of micro branches. In accordance with an exemplary embodiment of the present invention, main direction angles of the main directions $\theta d21h1$, $\theta d21h2$, $\theta d21h3$, $\theta d21h4$, $\theta d21l1$, $\theta d21l2$, $\theta d21l3$ and $\theta d21l4$ of micro branches may be, for example, about 40.8°, about 40.8°, about 39.2°, about 39.2°, about 42°, about 42°, about 41.3° and about 41.3°, respectively. In accordance with an exemplary embodiment of the present invention, micro branches 197 and micro slits 199 formed in the domains have patterns which are, for example, symmetrical about the cross-shaped branch's vertical portion 195v. In the domains D21h1, D21h2, D21h3, D21h4, D21l1, D21l2, D21l3 and D21l4, zigzag angles $\theta 21h1$, $\theta 21h2$, $\theta 21h3$, $\theta 21h4$, $\theta 21l1$, $\theta 21l2$, $\theta 21l3$ and $\theta 21l4$ (not shown) of micro branches 197 may fall within a range of, for example, about ±7° to about ±30°. For example, in the domains D21h1, D21h2, D21h3, D21h4, D21l1, D21l2, D21l3 and D21l4, zigzag angles $\theta 21h1$, $\theta 21h2$, $\theta 21h3$, $\theta 21h4$, $\theta 21l1$, $\theta 21l2$, $\theta 21l3$ and $\theta 21l4$ of micro branches 197 may fall within a range of about ±10° or about ±15°. Zigzag angles of micro branches 197 formed in domains of the second subpixel electrode 191l may be, for example, greater than zigzag angles of micro branches 197 formed in domains of the first subpixel electrode 191h. In accordance with an exemplary embodiment of the present invention, values of $\theta 21h1$, $\theta 21h2$, $\theta 21h3$ and $\theta 21h4$ may be, for example, about 10°, while values of $\theta 21l1$, $\theta 21l2$, $\theta 21l3$ and $\theta 21l4$ may be, for example, about 15°. It should be noted that as described above, the zigzag angles of micro branches 197 mean angles between main directions of micro branches 197 and zigzag directions thereof.

The micro branches 197 and micro slits 199 of a pixel electrode shown in FIGS. 18 and 20C have, for example, zigzag shapes. Zigzag unit lengths formed in the pixel electrode may fall within a range of, for example, about 5 µm to about 20 µm. In accordance with an exemplary embodiment of the present invention, zigzag unit lengths formed in the first and second subpixel electrodes 191h and 191l may be, for example, about 14 µm and about 10 µm, respectively. Widths of micro branches 197 and micro slits 199 formed in the domains of the pixel electrode may fall within a range of, for example, about 2 µm to about 5 µm. Widths of micro branches 197 and micro slits 199 included in domains may be, for example, different according to the domains. Widths of micro branches 197h and micro slits 199h in the domains D21h1, D21h2, D21h3 and D21h4 may fall within a range of, for example, about 2.8 µm to about 3.7 µm, and widths of micro branches 197 and micro slits 199 may gradually increase along the arrows shown in the domains. In accordance with an exemplary embodiment of the present invention, widths of micro branches 197 and micro slits 199 may be, for example, about 2.8 µm in start portions of the arrows in the domains, while widths of micro branches 197 and micro slits 199 may be, for example, about 3.3 µm in end portions of the arrows. In accordance with an exemplary embodiment of the present invention, widths of micro branches 197 and micro slits 199 may be, for example, about 3.3 µm in start portions of the arrows in the domains, while widths of micro branches 197 and micro slits 199 may be, for example, about 3.7 µm in end portions of the arrows. Widths of micro branches 197l and micro slits 199l included in the domains D21l1, D21l2, D21l3 and D21l4 may fall within a range of, for example, about 2.8 µm to about 3.9 µm, and widths of micro branches 197 and micro slits 199 may gradually increase along the arrows shown in the domains. In accordance with an exemplary embodiment of the present invention, widths of micro branches 197 and micro slits 199 may be, for example, about 2.8 µm in start portions of the arrows in the domains, while widths of micro branches 197 and micro slits 199 may be, for example, about 3.9 µm in end portions of the arrows. Widths of micro branches 197 and micro slits 199 in the domains D21h1, D21h2, D21h3, D21h4, D21l1, D21l2, D21l3, and D21l4 may gradually increase by a value within a range of, for example, about 0.2 µm to about 1 µm.

A pixel electrode structure with a pixel electrode layer according to exemplary embodiments of the present invention will be described in detail below with reference to FIGS. 20D to 20J. Patterns of a pixel electrode layer shown in FIGS. 20D to 20J are other examples of the patterns of a pixel electrode layer shown in FIGS. 18 and 20C. Therefore, other layers except for the pixel electrode layer are similar to those described in FIGS. 18 to 20C, so a duplicate description thereof will be omitted. Subpixel electrodes formed in first and second subpixels 190h and 190l shown in FIG. 20D have a structure in which end portions of micro branches 197 adjacent to a data line 171 are not connected to each other according to an exemplary embodiment of the present invention. In other words, subpixel electrodes formed in first and second subpixels 190h and 190l shown in FIG. 20D may not have the vertical connection portions 193h and 193l of the pixel electrode shown in FIG. 20C. By not having the vertical connection portions 193h and 193l, the subpixel electrodes may be spaced apart farther from the data line 171, reducing textures occurring in the subpixel electrodes adjacent to the data line 171. In accordance with an exemplary embodiment of the present invention, the distance from end portions of micro branches 197 adjacent to the data line 171 up to the data line 171 adjacent thereto may be, for example, greater than or equal to widths of micro branches 197 or micro slits 199. As illustrated in regions A20d of FIG. 20D, vertical ends of micro branches 197 further project in upper corner regions of the second subpixel, compared with vertical ends of their lower micro branches 197. The micro branches 197 projecting in the upper corner regions A20d can reduce textures occurring in subpixel regions adjacent to the data line 171 by blocking an electric field occurring in a peripheral portion. Micro branches 197 projecting in the corners may be formed in corners of first or second subpixel 190h or 190l.

The pixel electrode shown in FIG. 20D has, for example, two subpixel electrodes 191h and 191l, each of which has four domains. A first subpixel electrode 191h has, for example, fourth domains D20dh1, D20dh2, D20dh3, and D20dh4, and a second subpixel electrode 191l has four domains D20dl1, D20dl2, D20dl3, and D20dl4. Micro branches 197 and micro slits 199 are, for example, symmetrical about a cross-shaped branch 195. Micro branches 197 and micro slits 199, whose widths gradually change, are formed in regions MA20d formed in the four domains of the second subpixel electrode 191l. Micro branches 197 constituting the pixel electrode have, for example, a stripe shape. Widths of micro branches 197 and micro slits 199 formed in first and second subpixels 190h and 190l may fall within a range of, for example, about 2 μm to about 5 μm. For example, widths of micro branches 197 and micro slits 199 formed in first and second subpixels 190h and 190l may fall within a range of about 2.5 μm to about 3.5 μm. When micro branches 197 and micro slits 199 are in the shape of stripes, an electric field formed in a liquid crystal layer may be high in strength, thereby increasing transmittance of the liquid crystal display device. When the entire region of micro branches 197 distributed over the pixel electrode is greater than the entire region of micro slits 199, for example, when widths of micro branches 197 are greater and when widths of micro slits 199 are less, an electric field between the pixel electrode and the common electrode may be high in strength, thereby increasing a response speed of the liquid crystal display device and increasing transmittance thereof.

In accordance with an exemplary embodiment of the present invention, widths of micro branches 197 and micro slits 199 formed in the first subpixel 190h shown in FIG. 20D may be, for example, about 2.6 μm and about 2.4 μm, respectively. In addition, widths of micro branches 197 and micro slits 199 formed in the second subpixel 190l may be, for example, about 2.8 μm and about 3.4 μm in regions LA20d, respectively, may fall within a range of about 2.6 μm to about 2.8 μm and a range of about 2.4 μm to about 3.4 μm in regions MA20d, respectively and may be about 2.6 μm and about 2.4 μm in regions HA20d, respectively. In the regions MA20d, widths of micro branches 197 and micro slits 199 may gradually increase by, for example, about 0.25 μm, and may fall within a range of, for example, about 5 μm to about 10 μm. For example, in the regions MA20d, widths of micro branches 197 and micro slits 199 may fall within a range of about 6.2 μm to about 10 μm. In the region of the second subpixel 190l, an area of a sum of the regions LA20d and MA20d, and an area of the region HA20d may be, for example, about 45% and about 55%, respectively. For example, directions of micro branches 197 and micro slits 199 formed in this manner may be about 40° with respect to a polarization axis of a polarizer in a first subpixel region, and about 45° with respect to a polarization axis of a polarizer in a second subpixel region. An area ratio of the first subpixel region to the second subpixel region may be, for example, about 1:2. A sum of areas of domains D20dl1 and D20dl2 formed in the region of the second subpixel 190l may be, for example, greater than a sum of areas of domains D20dl3 and D20dl4.

In accordance with an exemplary embodiment of the present invention, widths of micro branches 197 and micro slits 199 formed in the first subpixel 190h shown in FIG. 20D may be, for example, about 2.6 μm and about 3.1 μm, respectively. In addition, for example, widths of micro branches 197 and micro slits 199 formed in the second subpixel 190l may be about 2.8 μm and about 3.4 μm in regions LA20d, respectively, may fall within a range of about 2.6 μm to about 2.8 μm and a range of about 2.4 μm to about 3.4 μm in regions MA20d, respectively and may be about 2.6 μm and about 2.4 μm in regions HA20d, respectively. Other elements may be formed as correspondingly done, for example, in exemplary embodiments described above. If widths of micro branches 197 are large, transmittance of the liquid crystal display device may increase and a response speed thereof may increase. However, if widths of micro slits 199 are small or about 0, it may not be easy to form a pre-tilt angle of liquid crystal molecules. Thus, it may be required to appropriately combine widths of micro branches 197 and micro slits 199.

Figure 20E:
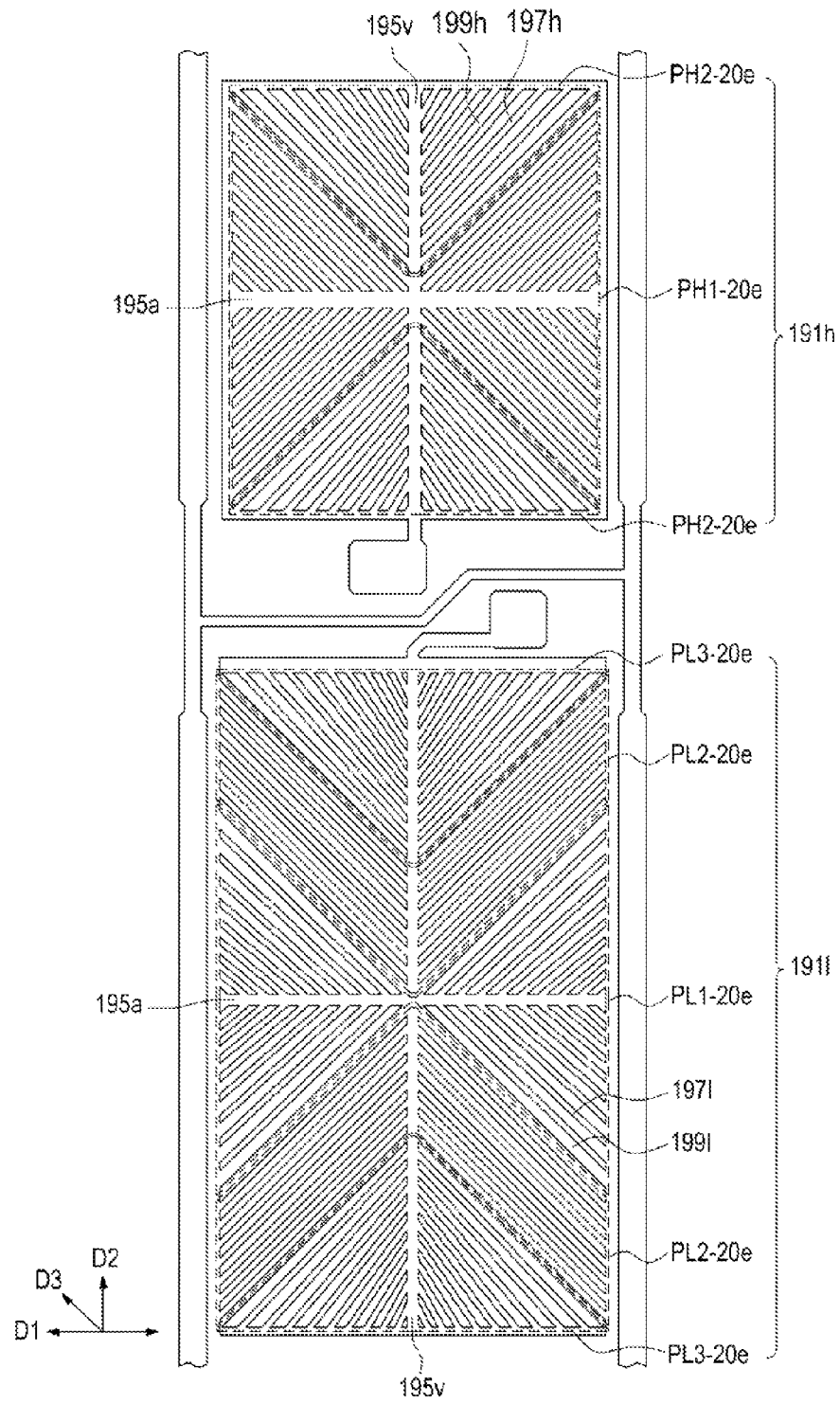

FIG. 20E is a plan view of a pixel electrode according to an exemplary embodiment of the present invention. In accordance with an exemplary embodiment of the present invention, a pixel electrode illustrated in FIG. 20E is divided into five regions according to structures of micro branches 197 and micro slits 199, and in one or more regions, micro slits 199 gradually increase in width as they extend from a cross-shaped branch to the edge of the pixel electrode. The pixel electrode formed in this manner reduces a curvature of a luminance ratio curve of the liquid crystal display device, thereby visibility of the liquid crystal display device. The luminance ratio curve represents changes in luminance ratio of the vertical axis with respect to a gray level of the horizontal axis as described below with reference to FIGS. 13A and 13B.

Each of first and second subpixel electrodes 191h and 191l is divided into, for example, four domains by a cross-shaped branch. Micro branches 197 and micro slits 199 formed in the domains may be symmetrical about the cross-shaped branch. The subpixel electrodes have micro branches 197 and micro slits 199 in, for example, a stripe shape. The first subpixel electrode 191h has, for example, two different regions PH1-20e and PH2-20e according to the distribution of widths of micro branches 197 and micro slits 199. In the region PH1-20e, micro branches 197 and micro slits 199 are, for example, substantially constant in width along their extension direction, and their widths may fall within a range of about 1.5 μm to about 4.5 μm. For example, in the region PH1-20e, micro branches 197 and micro slits 199 may have a width of about 3 μm. Main directions of extension directions of micro branches 197 and micro slits 199 may fall within a range of, for example, about 30° to about 45° or a range of about 135° to about 150° with respect to the direction D1 shown in FIG. 20E or the gate line 121. For example, main directions of extension directions of micro branches 197 and micro slits 199 may fall within a range of about 38° or about 142° with respect to the direction D1 shown in FIG. 20E or the gate line 121. For example, in the region PH2-20e, widths of micro branches 197 are uniform along the extension direction of micro branches 197, and widths of micro slits 199 gradually increase along the extension direction of micro slits 199 as they go away from the cross-shaped branch or go from the center to the edge of the subpixel electrode. The central line of the subpixel electrode may be a cross line separating the subpixel electrode into domains, for example, a cross-shaped branch. Widths of micro branches 197 may fall within a range of, for example, about 1.5 µm to about 5 µm. For example, widths of micro branches 197 may fall within a range of about 2.5 µm to about 3.5 µm. Extension directions of micro branches 197 and micro slits 199 are, for example, similar to the extension directions of micro branches 197 and micro slits 199 of the region PH1-20e in a boundary portion with the region PH2-20e, and main direction angles of the extension directions of micro branches 197 and micro slits 199 gradually increase as they go away from the boundary portion with the region PH2-20e. The extension direction of micro branches or micro slits means a direction of a straight line connecting central points of widths of micro branches or micro slits, and it should be noted that an angle between the straight light and the direction D1 is an extension direction angle (or main direction angle) of micro branches or micro slits.

The second subpixel electrode 191*l* has, for example, three different regions PL1-20e, PL2-20e, and PL3-20e according to the distribution of widths of micro branches 197 and micro slits 199. In region PL1-20e, micro branches 197 are, for example, uniform in width along their extension direction, and micro slits 199*l* gradually increase in width W along their extension directions as they go away from a cross-shaped branch or go from the center to the edge of the subpixel electrode. Widths of micro branches 197 may fall within a range of, for example, about 1.5 µm to about 5 µm. Main direction angles of micro branches 197 and micro slits 199, for example, gradually increase as they go from a horizontal portion 195*a* of the cross-shaped branch 195 to a boundary portion with the region PL2-20e. For example, in region PL2-20e, micro branches 197 and micro slits 199 are substantially uniform in width along their extension direction, and their widths may fall within a range of about 1.5 µm to about 4.5 µm. For example, in region PL2-20e, widths of micro branches 197 and micro slits 199 may be about 3 µm. Main direction angles of micro branches 197 and micro slits 199 may fall within a range of, for example, about 30° to about 45° or a range of about 135° to about 150° with respect to the direction D1 or a direction of the gate line 121. For example, main direction angles of micro branches 197 and micro slits 199 may be about 38° or about 142° with respect to the direction D1 or a direction of the gate line 121. In a region PL3-20e, micro branches 197 are, for example, constant in width along their extension direction, and micro slits 199*l* gradually increase in width along their extension direction as they go away from the cross-shaped branch 195. For example, widths of micro branches 197 may fall within a range of, about 1.5 µm to about 5 µm, and widths of micro slits 199 may be greater than or equal to widths of adjacent micro branches 197. Main direction angles of extension directions of micro branches 197 and micro slits 199 are, for example, similar to the main direction angles of extension directions of micro branches 197 and micro slits 199 of the region PL2-20e in a boundary portion with the region PL2-20e, and gradually increase as they go away from a boundary portion with the region PL2-20e. The maximum main direction angle of micro branches 197 and micro slits 199 in the region PL1-20e may be, for example, less than or equal to the main direction angle in the region PL2-20e, and the minimum main direction angle of micro branches 197 and micro slits 199 in the region PL3-20e may be, for example, greater than or equal to the main direction angle in the region PL2-20e. The maximum width of micro branches 197 in the regions PL1-20e and PL3-20e may be, for example, greater than or equal to widths of micro branches 197 in the region PL2-20e. Widths of micro branches 197 may be, for example, substantially similar in the regions PL1-20e, PL2-20e and PL3-20e. In the pixel electrode structure formed in this manner, the pixel electrode formed in the regions PH2-20e and PL3-20e may reduce luminance visible at the side, and the pixel electrode formed in the regions PH1-20e and PL1-20e may increase luminance visible at the side, thereby resulting in a reduction in curvature of the luminance ratio curve. The reduction in curvature of the luminance ratio curve may decrease a change in visible luminance with respect to each gray level, thereby increasing visibility of the liquid crystal display device. The luminance ratio curve represents changes in luminance ratio of the vertical axis with respect to a gray level of the horizontal axis as described with reference to FIGS. 13A and 13B.

Figure 20F:
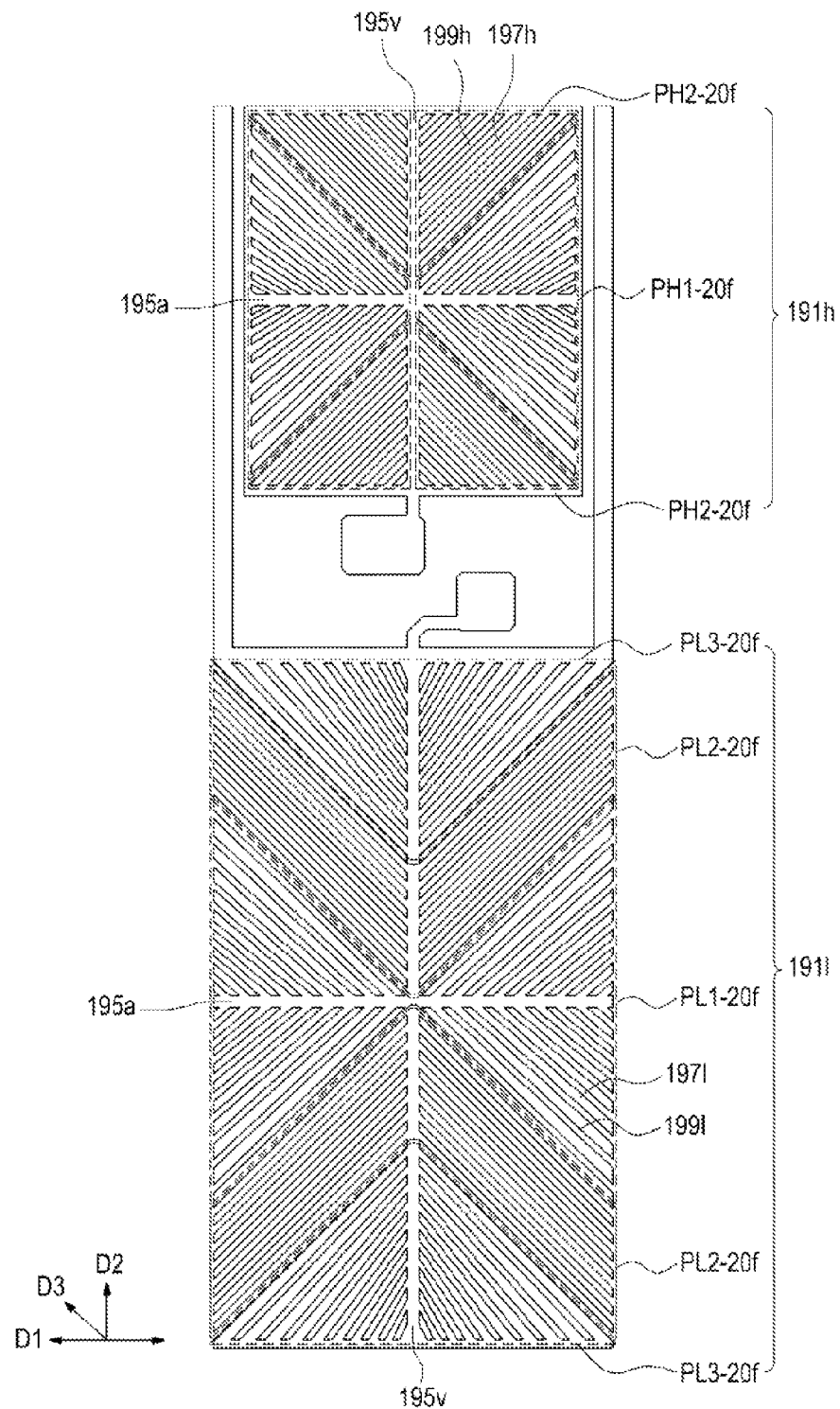
FIGS. 20F to 20J are plan views of pixel electrodes according to an exemplary embodiment of the present invention.

FIG. 20F is a plan view of a pixel electrode according to an exemplary embodiment of the present invention. In accordance with an exemplary embodiment of the present invention, a pixel electrode shown in FIG. 20F has five different regions according to the structure of micro branches 197 and micro slits 199, and in one or more regions, micro branches 197 gradually increase in width as they go away from a cross-shaped branch 195 or go from the central line to the edge of a subpixel electrode. A liquid crystal display device with such a pixel electrode has the characteristics described in connection with FIG. 20E. To avoid the duplicate description, the two-subpixel electrode structures, the domain structures, the shapes of micro branches 197 or micro slits 199, the widths of micro branches 197 and micro slits 199, and the directions of micro branches 197 and micro slits 199, which have been described above or described with reference to FIG. 20E, will be omitted or done in brief.

A first subpixel electrode 191*h* has, for example, two different regions PH1-20f and PH2-20f according to the distribution of widths of micro branches 197 and micro slits 199. In the region PH1-20f, widths of micro slits 199 are, for example, substantially uniform along with extension directions of the micro slits 199, and widths of micro branches 197 gradually increase along extension directions of the micro branches 197 as they go away from the cross-shaped branch 195 or go from the central line of the subpixel electrode to the edge of the subpixel electrode. Main direction angles of micro branches 197 and micro slits 199 in the region PH1-20f, for example, gradually increase as they get closer to a boundary portion with a region PH2-20f. In the region PH2-20f, micro branches 197 and micro slits 199 are, for example, substantially uniform in width along their extension direction. In this region, main direction angles of micro branches 197 and micro slits 199 may fall within a range of, for example, about 30° to about 45° or a range of about 135° to about 150° with respect to the direction D1 or the gate line 121. For example, main direction angles of micro branches 197 and micro slits 199 may be about 38° or about 142° with respect to the direction D1 or the gate line 121. The maximum width of micro branches 197 in the region PH1-20f may be, for example, greater than or equal to widths of micro branches 197 in the region PH2-20f. Widths of micro slits 199 in the region PH1-20f and widths of micro slits 199 in the region PH2-20f may be, for example, substantially similar.

A second subpixel electrode 191l has three different regions PL1-20f, PL2-20f, and PL3-20f according to the distribution of widths of micro branches 197 and micro slits 199. In the region PL1-20f, widths of micro slits 199 are, for example, constant along extension directions of the micro slits 199, and widths of micro branches 197 gradually increase along extension directions of the micro branches 197 as they go away from the cross-shaped branch 195 or go from the center to the edge of the subpixel electrode. Widths of micro branches 197 may be, for example, greater than or equal to widths of their adjacent micro slits 199. Main direction angles for directions of micro branches 197 and micro slits 199 may, for example, gradually increase as they get closer to a boundary portion with the region PL2-20f. In the region PL2-20f, widths of micro branches 197 and micro slits 199 are, for example, substantially uniform along extension directions of micro branches 197 and micro slits 199. Main direction angles of micro branches 197 and micro slits 199 may fall within a range of, for example, about 30° to about 45° or a range of about 135° to about 150° with respect to the direction D1 or the direction of the gate line 121. For example, main direction angles of micro branches 197 and micro slits 199 may be about 38° or about 142° with respect to the direction D1 or the direction of the gate line 121. In the region PL3-20f, widths of micro slits 199 are, for example, constant along extension directions of the micro slits 199, and widths of micro branches 197 gradually increase along extension directions of the micro branches 197 as they go away from the cross-shaped branch 195. Micro branches 197 may be, for example, greater than or equal to their adjacent micro slits 199 in width. Main direction angles of micro branches 197 and micro slits 199 are, for example, similar to the main direction angles of micro branches 197 and micro slits 199 formed in the region PL2-20f in a boundary portion with the region PL2-20f, and gradually increase as they go away from the boundary portion with the region PL2-20f. The maximum direction angle of micro branches 197 and micro slits 199 in the region PL1-20f may be, for example, less than or equal to the main direction angles in the region PL2-20f, and the minimum direction angles of micro branches 197 and micro slits 199 in the region PL3-20f may be, for example, greater than or equal to the main direction angles of micro branches 197 and micro slits 199 in the region PL2-20f. The maximum width of micro branches 197 in the regions PL1-20f and PL3-20f may be, for example, greater than or equal to the widths of micro branches 197 in the region PL2-20f. Widths of micro slits 199 may be, for example, substantially similar in the regions PL1-20f, PL2-20f and PL3-20f. The pixel electrode formed in this manner may increase side visibility of the liquid crystal display device as described above.

Figure 20G:
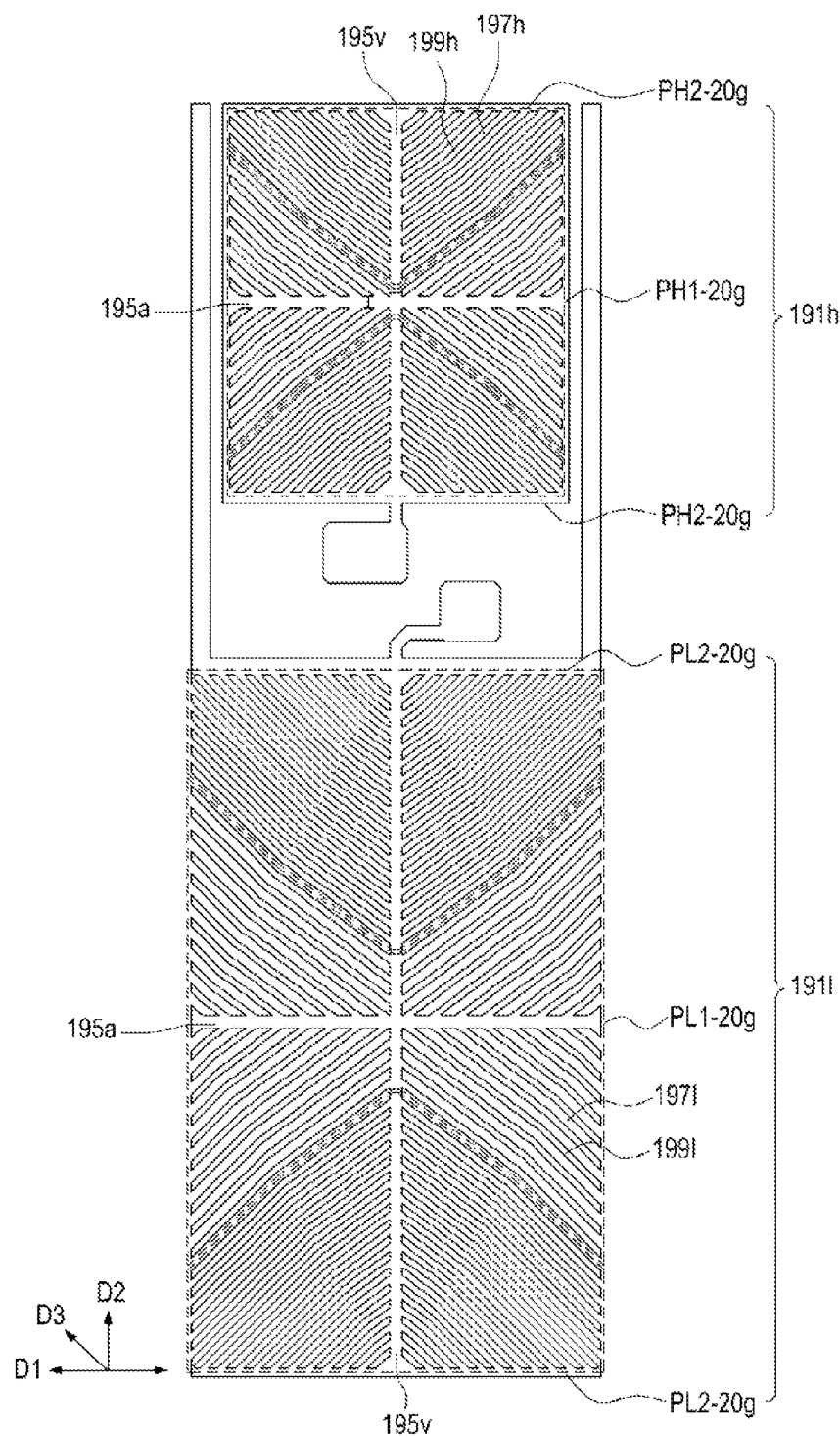

FIG. 20G is a plan view of a pixel electrode according to an exemplary embodiment of the present invention. In accordance with an exemplary embodiment of the present invention, a pixel electrode shown in FIG. 20G has four different regions according to the structure of micro branches 197 and micro slits 199, and in each of the regions, micro branches 197 or micro slits 199 are broken (e.g., bent) once. The micro branches 197 formed in this manner generally do not reduce the strength of an electric field formed in a liquid crystal layer, avoiding a reduction in transmittance of the liquid crystal display device and increasing visibility of the liquid crystal display device. The features of the current exemplary embodiment of the present invention will be described in detail below; however, those features overlapping with the embodiments described above are omitted. Micro branches 197 and micro slits 199 formed in regions of first and second subpixel electrodes 191h and 191l have, for example, constant widths along their extension directions. Micro branches 197 in domains of the subpixel electrodes 191h and 191l have, for example, a bifurcated stripe shape broken (e.g., bent) once. Micro branches 197 with a bifurcated stripe shape extend, for example, in two different directions. Micro branches 197 of the first and second subpixel electrodes 191h and 191l include, for example, micro branches 197 with a first stripe shape and micro branches 197 with a second stripe shape. Micro branches 197 with the first stripe shape are micro branches 197 connected to a cross-shaped branch 195, and micro branches 197 with the second stripe shape are micro branches 197 connected to micro branches 197 with the first stripe shape. In the first subpixel electrode 191h, direction angles of micro branches 197 having the first stripe shape with respect to the direction D1 or a direction of the gate line 121 may fall within a range of, for example, about 30° to about 39° and direction angles of micro branches 197 having the second stripe shape with respect to the direction D1 or a direction of the gate line 121 may fall within a range of about 40° to about 50°. For example, n the first subpixel electrode 191h, direction angles of micro branches 197 having the first stripe shape with respect to the direction D1 or a direction of the gate line 121 may be about 37° and direction angles of micro branches 197 having the second stripe shape with respect to the direction D1 or a direction of the gate line 121 may be about 42°. In the second subpixel electrode 191l, direction angles of micro branches 197 having the first stripe shape with respect to the direction D1 or a direction of the gate line 121 may fall within a range of, for example, about 30° to about 39°, and direction angles of micro branches 197 in the second stripe shape with respect to the direction D1 or a direction of the gate line 121 may fall within a range of about 40° to about 50°. For example, in the second subpixel electrode 191l, direction angles of micro branches 197 having the first stripe shape with respect to the direction D1 or a direction of the gate line 121 may be about 37° and direction angles of micro branches 197 in the second stripe shape with respect to the direction D1 or a direction of the gate line 121 may be about 42°.

The first subpixel electrode 191h has, for example, two different regions PH1-20g and PH2-20g according to the widths of micro branches 197 and micro slits 199. In each of the regions PH1-20g and PH2-20g, widths of micro branches 197 and micro slits 199 are uniform. In the region PH1-20g, micro branches 197 may be, for example, greater than micro slits 199 in width. In the region PH2-20g, widths of micro branches 197 are, for example, substantially equal to widths of micro slits 199. Widths of micro branches 197 in the region PH1-20g may be, for example, greater than widths of micro branches 197 in the region PH2-20g. Widths of micro slits 199 may be, for example, substantially the same in the regions PH1-20g and PH2-20g. The second subpixel electrode 191l has, for example, two different regions PL1-20g and PL2-20g according to the widths of micro branches 197 and micro slits 199. In the region PL1-20g, micro slits 199 may be, for example, greater than micro branches 197 in width. In the region PL2-20g, widths of micro branches 197 are, for example, substantially equal to widths of micro slits 199. Widths of micro slits 199 in the region PL1-20g may be, for example, greater than widths of micro slits 199 in the region PL2-20g. Widths of micro branches 197 in the region PL1-20g may be, for example, substantially equal to widths of micro branches 197 in the region PL2-20g. Widths of micro branches 197 in the region PL1-20g may be, for example, greater than widths of micro branches 197 in the region PL2-

20g. The pixel electrode formed in this manner can increase side visibility of the liquid crystal display device without reducing transmittance thereof.

Figure 20H:
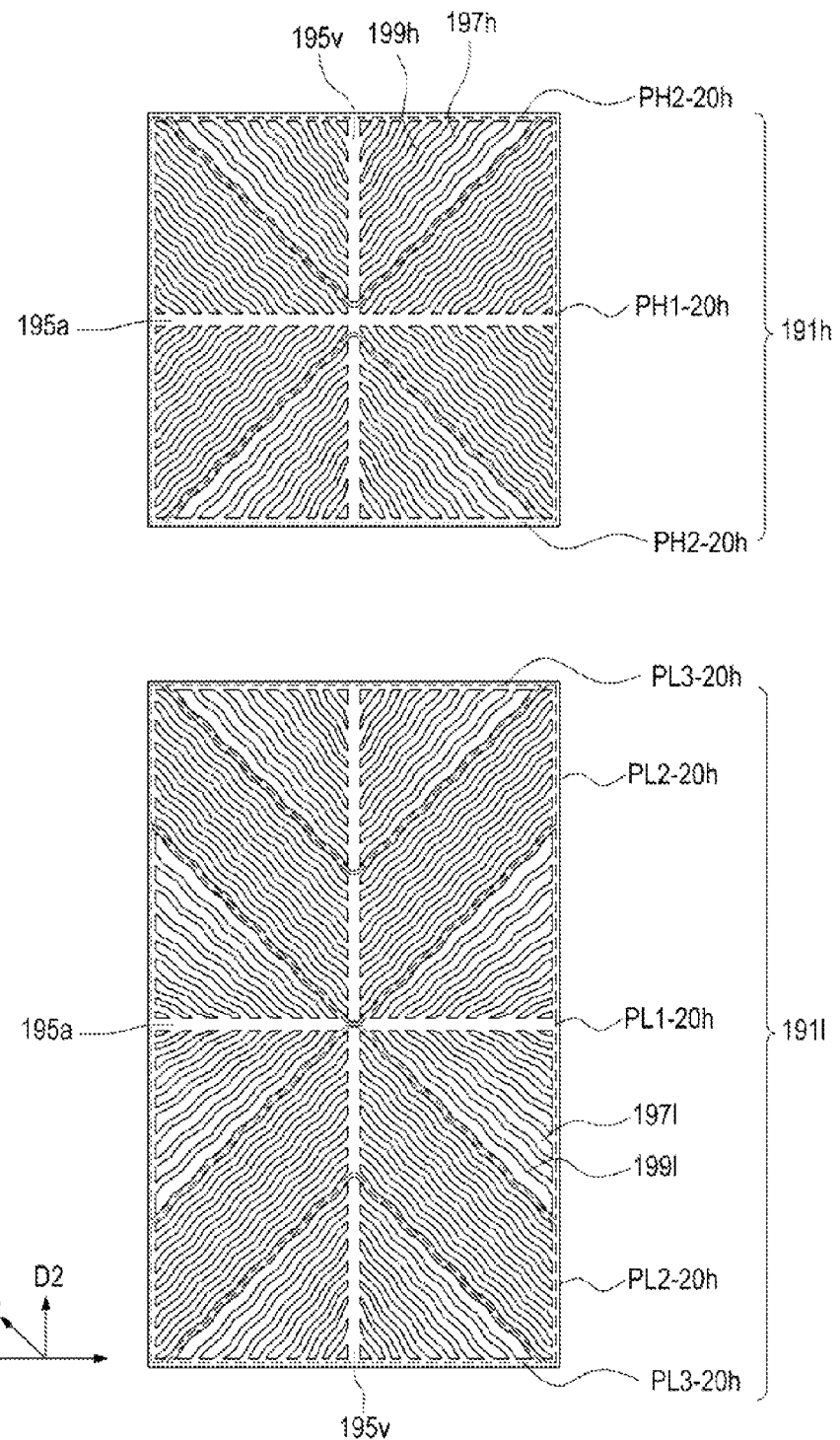

FIG. 20H is a plan view of a pixel electrode according to an exemplary embodiment of the present invention. A pixel electrode illustrated in FIG. 20H is substantially equal in structure to the pixel electrode described in connection with FIG. 20E, except for micro branches 197 having a zigzag shape and horizontal and vertical connection portions 193*l* and 194*l* formed in a second subpixel electrode 191*l*. For simplicity, the duplicate description will be omitted. Micro branches 197 illustrated in FIG. 20H have a zigzag shape to reduce rainbow stains of the liquid crystal display device as described above. The pixel electrode has five different regions PH1-20h, PH2-20h, PL1-20h, PL2-20h, and PL3-20h according to the structures of micro branches 197 and micro slits 199, and micro slits 199 gradually increase in width as they go from a cross-shaped branch 195 to the edge of the pixel electrode. Each of the first and second subpixel electrodes 191*h* and 191*l* is divided into, for example, four domains by the cross-shaped branch 195. Widths of micro branches 197 and micro slits 199, and main direction angles of micro branches 197 and micro slits 199 in regions PH1-20h, PH2-20h, PL1-20h, PL2-20h, and PL3-20h have been described with reference to FIG. 20E. The pixel electrode formed in this manner can increase visibility of the liquid crystal display device and reduce rainbow stains.

Figure 20I:
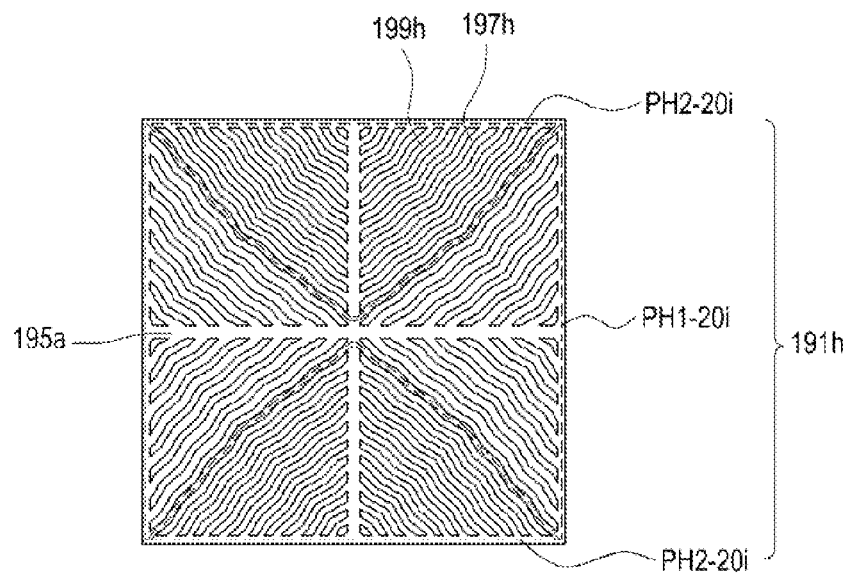
Figure 20I:
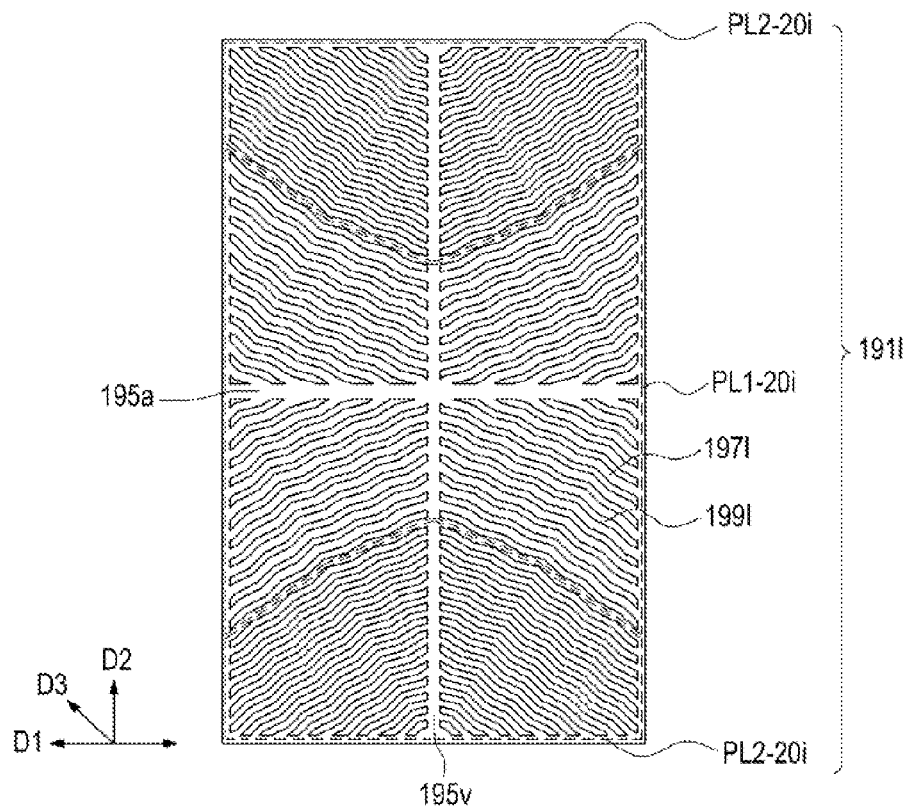

FIG. 20I is a plan view of a pixel electrode according to an exemplary embodiment of the present invention. A pixel electrode illustrated in FIG. 20I is substantially equal in structure to the pixel electrode described in conjunction with FIG. 20G, except for micro branches 197 having a zigzag shape, horizontal and vertical connection portions 193*l* and 194*l* formed in a second subpixel electrode 191*l*, and widths of micro branches 197 and micro slits 199 formed in a region PL1-20i. For simplicity, the duplicate description will be omitted. Micro branches 197 illustrated in FIG. 20I have, for example, a zigzag shape to reduce rainbow stains of the liquid crystal display device as described above. In the region PL1-20i of the second subpixel electrode 191*l*, widths of micro branches 197 may be, for example, greater than widths of micro slits 199. In a region PL2-20i, widths of micro branches 197 are, for example, substantially equal to widths of micro slits 199. Widths of micro branches 197 in the region PL1-20i may be, for example, greater than widths of micro branches 197 in the region PL2-20i. Widths of micro slits 199 in the region PL1-20i may be, for example, substantially equal to widths of micro slits 199 in the region PL2-20i. The pixel electrode has, for example, four different regions PH1-20i, PH2-20i, PL1-20i, and PL2-20i according to the structures of micro branches 197 and micro slits 199. Micro branches 197 and micro slits 199 are, for example, constant in width along their extension directions, and each of first and second subpixel electrodes 191*h* and 191*l* is, for example, divided into four domains by a cross-shaped branch 195. Except for widths of micro branches 197 and micro slits 199 formed in the region PL1-20i, widths of micro branches 197 and micro slits 199 in the regions PH1-20i, PH2-20i, and PL2-20i and main direction angles of micro branches 197 and micro slits 199 in the regions PH1-20i, PH2-20i, PL1-20i, and PL2-20i, are, for example, similar to those described in conjunction with FIG. 20G. The pixel electrode formed in this manner can increase visibility of the liquid crystal display device and reduce rainbow stains.

Figure 20J:
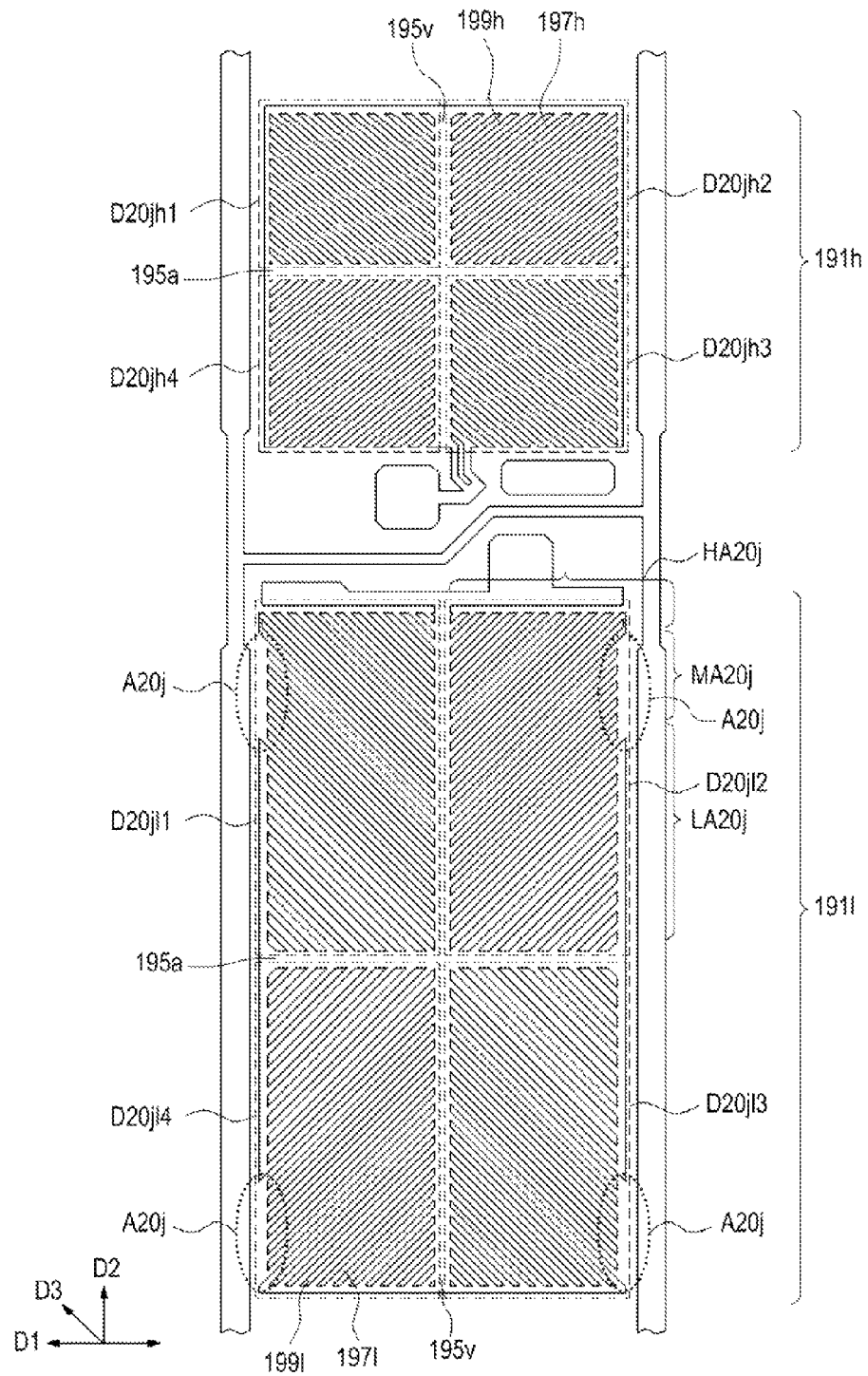

FIG. 20J is a plan view of a pixel electrode according to an exemplary embodiment of the present invention. A pixel electrode illustrated in FIG. 20J is, for example, substantially similar in structure to the pixel electrode described in connection with FIG. 3, except that the vertical connection portions 193 do not exist in a third region, or a region MA20j. For simplicity, the duplicate description will be omitted. The region MA20j is similar to the region MA described in connection with FIG. 3, in which widths of micro branches 197 or micro slits 199 gradually change. In the region MA, e.g., the MA-LA boundary region or the MA-HA boundary region of the pixel electrode illustrated in FIG. 3, since widths of micro branches 197 or micro slits 199 change, the balance between the strength of an electric field formed by vertical connection portions 193 of the pixel electrode and the strength of an electric field formed by micro branches 197 or micro slits 199 may be broken. Due to the broken balance, in these regions, liquid crystal molecules may be arranged irregularly, generating textures. To correct this, the pixel electrode may not have the vertical connection portions 193 in the region MA20j adjacent to the data line 171 as illustrated in FIG. 20J. In other words, in the region MA20j adjacent to the data line 171, micro slits 199 are connected and ends of micro branches 197 may be closed (or isolated). In the region MA20j where the vertical connection portions 193 do not exist, which are formed in other regions HA20j and LA20j, an electric field formed by the vertical connection portions 193 may not exist or is very weak. Therefore, in the region MA20j adjacent to the data line 171, as liquid crystal molecules may be significantly influenced by the electric field formed by micro branches 197 or micro slits 199, the liquid crystal molecules may be arranged in the direction of the micro branches 197. The pixel electrode formed in this manner can reduce textures in the region MA20j, and increase transmittance of the liquid crystal display device.

Structures of a liquid crystal display panel assembly 300 according to other exemplary embodiments of the present invention will be described in detail below with reference to FIGS. 22A to 22H. Liquid crystal display panel assemblies 300 illustrated in FIGS. 22A to 22H have different stacked structures according to an exemplary embodiment of the present invention. These stacked structures may enable uniform formation of photo hardening layers 35 and 36 or reduce a non-hardened light hardener in the below-described process for manufacturing liquid crystal display panel assemblies of certain modes. Main alignment films 33 and 34 and photo hardening layers 35 and 36 constituting alignment films included in the upper or lower display panel 200 or 100 are formed on a flat lower layer, thus increasing display quality of the liquid crystal display device. FIGS. 22A to 22H are cross-sectional views taken along line 21*a*-21*a'* of the pixel layout shown in FIG. 18. The liquid crystal display panel assemblies 300 illustrated in FIGS. 22A to 22H are similar to those described in connection with FIGS. 3 to 4C and 18 to 21B, except for the stacked structures. Thus, duplicate descriptions will be omitted. Therefore, the liquid crystal display panel assemblies 300 having the structures of FIGS. 22A to 22H may have above/below-described patterns of a pixel electrode layer.

The liquid crystal display panel assemblies 300 illustrated in FIGS. 22A to 22D have a light blocking member 220 formed on a lower display panel 100. First, a method of manufacturing a liquid crystal display panel assembly 300 according to an exemplary embodiment of the present invention and a structure thereof will be described in brief with reference to FIG. 22A. An upper display panel 200 has, for example, an upper substrate 210, a common electrode 270 and an upper-plate alignment film 292 (shown as 34 and 36). The common electrode 270 is formed on the upper substrate 210 by, for example, the above-described method corresponding thereto, and the upper-plate alignment film 292 is formed on the common electrode 270 by a corresponding technique to be described below with regard to a liquid crystal display panel assembly of a certain mode. The upper-plate alignment film 292 may include, for example, a main alignment film 34 and a photo hardening layer 36.

The lower display panel 100 is manufactured as described below. On a lower substrate 110 is formed a gate layer conductor including storage electrode line's vertical portions 128. The gate layer conductor may have, for example, the above-described patterns 121, 123, 124h, 124l, 124c, 125, 126, and 127. A gate insulating layer 140 is formed on the gate layer conductor. A semiconductor 154 is formed on the gate insulating layer 140. The semiconductor 154 may have, for example, the above-described patterns 154h, 154l, and 154c. A linear ohmic contact member 165 is formed on the semiconductor 154. The linear ohmic contact member 165 may have, for example, the above-described patterns corresponding thereto. On the linear ohmic contact member 165 is formed a data layer conductor including a data line 171. The data layer conductor may have, for example, the above-described patterns 173h, 173l, 173c, 175h, 175l, 175c, and 177c. A first protection layer 181 is formed on the data layer conductor. For example, the first protection layer 181 may be the above-described inorganic insulating material such as, silicon nitride (SiNx), silicon oxide (SiOx), titanium oxide ($TiO_2$), alumina ($Al_2O_3$) or zirconia ($ZrO_2$). Color filters 230 are formed on the first protection layer 181. The color filters 230 may overlap, for example, the data line 171, a storage electrode line adjacent to the data line 171, or the light blocking member 220 formed on the color filters 230. As illustrated in FIG. 22A, for example, the light blocking member 220 is formed to overlap at least sidewalls of the color filters 230 overlapping the storage electrode line's vertical portions 128 situated on both sides of the data line 171 interposed between two adjacent unit pixels, and to overlap the data line 171 between the sidewalls. The color filters 230 may have, for example, red (R), green (G) and blue (B) components, or may have red, green, blue, and yellow components. The light blocking member 220 is formed on the color filters 230. The light blocking member 220 may, for example, completely cover the data line 171, or may overlap vertical connection portions 193h situated on both sides of the data line 171. The light blocking member 220 may be formed on, for example, a channel of a TFT. The light blocking member 220 may not be formed, for example, under contact holes 185h and 185l. A second protection layer 182 is formed on the light blocking member 220. For example, the second protection layer 182 may be an inorganic insulating material such as silicon nitride (SiNx), silicon oxide (SiOx), titanium oxide ($TiO_2$), alumina ($Al_2O_3$) or zirconia ($ZrO_2$). A pixel electrode layer is formed on the second protection layer 182. The pixel electrode layer may have, for example, the above/below-described patterns 187, 189, 191h, 191l, 192h, 192l, 193l, 194h, 194l, 195h, 195l, 196, 197h, 197l, 198h, 198l, 713h, 713l, 715h, 715l, 717h, and 717l, including vertical connection portions 193h, and a pixel electrode structure. The vertical connection portions 193h formed on both sides of the data line 171 may, for example, overlap at least one portion of the storage electrode line's vertical portions 128. A spacer 250 (not shown) is formed on the pixel electrode layer. The spacer 250 may include, for example, a pigment constituting color filters, and may be made of a colored substance. In accordance with an exemplary embodiment of the present invention, the spacer 250 may have, for example, a black color. In accordance with an exemplary embodiment of the present invention, both a spacer 250 and a light blocking pattern may be formed in an inner region and an outer region of the lower display panel 100, respectively. The spacer 250 and the light blocking pattern may be, for example, black, and the light blocking pattern may block light which is leaked in the outer region. A lower-plate alignment film 291 is disposed on the spacer 250 as will be explained in at least one of the below-described modes of a liquid crystal display panel assembly. The lower-plate alignment film 291 may include, for example, a main alignment film 33 and a photo hardening layer 35. A liquid crystal layer 3 is formed between the upper and lower display panels 200 and 100. The lower display panel 100 manufactured in this way includes, for example, an opaque film or the light blocking member 220. In other words, on the lower display panel 100 are formed layers blocking or absorbing light, for example, the protection layers 181 and 182, the color filters 230, or the light blocking member 220. However, the upper display panel 200 does not generally include materials blocking or absorbing light. As the upper display panel 200 manufactured in this way has a lesser number of materials blocking or absorbing light, the light incident upon the upper display panel 200 in a process for manufacturing a liquid crystal display panel assembly of a certain mode may be uniformly incident upon the materials forming the lower-plate alignment film 291 and the upper-plate alignment film 292. To form uniform lower-plate and upper-plate alignment films 291 and 292, the light which is irradiated in an electric-field or fluorescent lithography process may be, for example, uniformly irradiated to the materials forming alignment films. To reduce a non-hardened light hardener, there may be no region to which light is not irradiated. By doing so, the lower-plate and upper-plate alignment films 291 and 292 are uniformly formed, and the non-hardened light hardener may be significantly reduced. Because the upper display panel 200 has mostly flat layers, liquid crystal molecules may be uniformly aligned, thereby increasing the display quality of the liquid crystal display device.

A method of manufacturing a liquid crystal display panel assembly 300 according to an exemplary embodiment of the present invention and a structure thereof will be described below in brief with reference to FIG. 22B. A liquid crystal display panel assembly 300 illustrated in FIG. 22B is manufactured by a process in which a light blocking member 220 and a spacer (not shown) are simultaneously formed on a pixel electrode layer according to an exemplary embodiment of the present invention. An upper display panel 200 is manufactured as described with reference to FIG. 22A. A lower display panel 100 is manufactured as described below. A gate layer conductor, a gate insulating layer 140, a semiconductor 154, a linear ohmic contact member 165, a data layer conductor, a first protection layer 181 and color filters 230 are formed as described with reference to FIG. 22A. A second protection layer 182 is formed on the color filters 230. For example, the second protection layer 182 may be made of an organic insulating material to planarize the upside of the color filters 230. A pixel electrode layer is formed on the second protection layer 182. The pixel electrode layer may be formed, for example, as described with reference to FIG. 22A. A light blocking member 220 and a spacer 250 are, for example, simultaneously formed on the pixel electrode layer. As the light blocking member 220 and the spacer 250 are simultaneously formed of the same material, the process may be simplified. The spacer 250 may be colored, for example, as described above with reference to FIG. 22A. In accordance with an exemplary embodiment of the present invention, the light blocking member 220 and the spacer 250 may be, for example, black. A lower-plate alignment film 291 (shown as 33 and 35) is formed on the spacer 250 (not shown) by the below-described methods. The lower and upper display panels 100 and 200 formed in this way may have, for example, the characteristics described with reference to FIG. 22A.

Figure 22C:
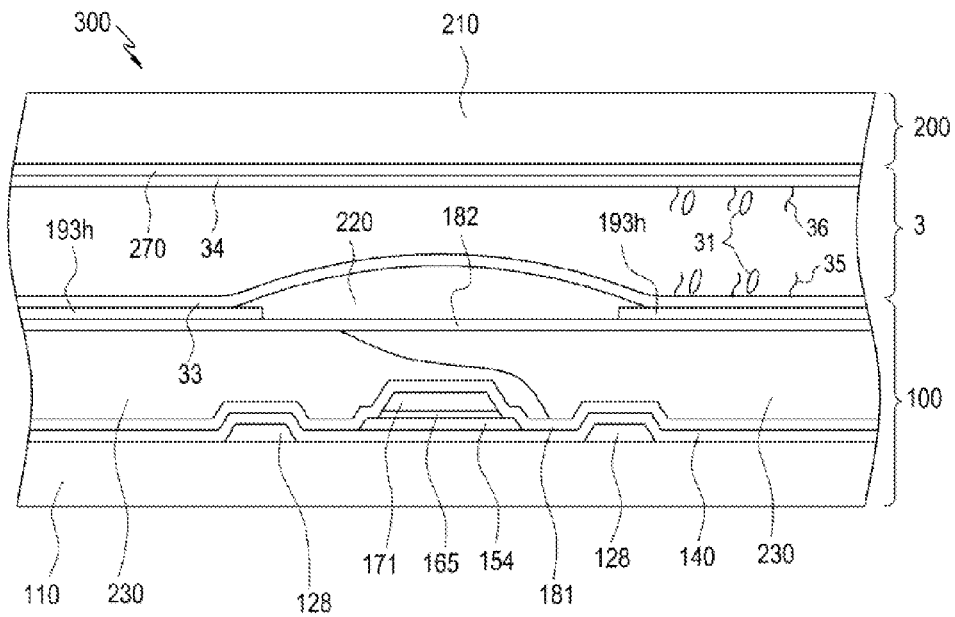

A method of manufacturing a liquid crystal display panel assembly 300 according to an exemplary embodiment of the present invention and a structure thereof will be described below in brief with reference to FIG. 22C. In a liquid crystal display panel assembly 300 illustrated in FIG. 22C, one lower color filter among overlapping color filters has, for example, a concave cross section according to an exemplary embodiment of the present invention. In addition, an overlapping portion of one color filter overlapping a side of another color filter is provided on a data line, and a light blocking member is formed on the overlapping portion. The upper display panel 200 is manufactured as described with reference to FIG. 22A. A lower display panel 100 is manufactured as described below. For example, gate layer conductor, a gate insulating layer 140, a semiconductor 154, a linear ohmic contact member 165, a data layer conductor, and a first protection layer 181 are formed as described with reference to FIG. 22A. Color filters 230 are formed on the first protection layer 181. For example, among the primary color components constituting the color filters 230, two or more color components may overlap on the data line 171. To prevent the upside of the color filters 230 from becoming convex due to the overlapping of primary color components of the color filters 230, one of the overlapping color filters 230 may be formed, for example, concave by a photo-lithography process. The color filter layers formed to be flat in this way ensure excellent spread of liquid crystal molecules or light hardeners. A second protection layer 182 is formed on the color filters 230. For example, the second protection layer 182 may include the above-described inorganic insulating material. After the second protection layer 182 is formed, a pixel electrode layer, a light blocking member 220, a spacer 250 (not shown) and a lower-plate alignment film 291 are formed, for example, as described with reference to FIG. 22B. The lower and upper display panels 100 and 200 formed in this manner may have, for example, the characteristics described with reference to FIG. 22A.

Figure 22D:
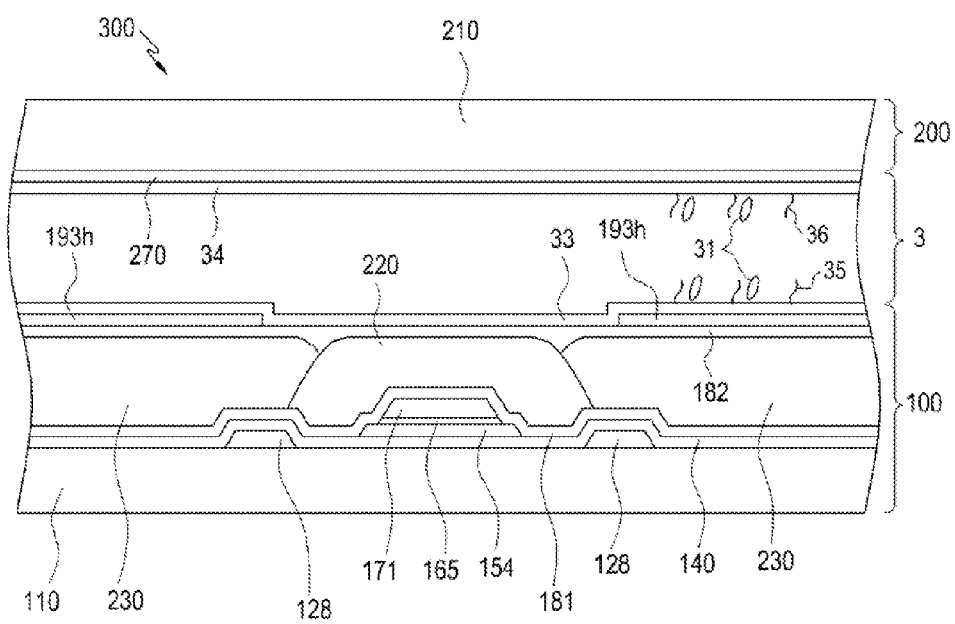

A method of manufacturing a liquid crystal display panel assembly 300 according to an exemplary embodiment of the present invention and a structure thereof will be described below in brief with reference to FIG. 22D. A liquid crystal display panel assembly 300 illustrated in FIG. 22D is manufactured by including a process in which boundaries of pixels are surrounded by a light blocking member 220, and liquid materials for the color filters 230 are applied onto the inside of the pixels surrounded by the light blocking member 220 according to an exemplary embodiment of the present invention. The upper display panel 200 is manufactured, for example, as described with reference to FIG. 22A. A lower display panel 100 is manufactured as described below. For example, a gate layer conductor, a gate insulating layer 140, a semiconductor 154, a linear ohmic contact member 165, a data layer conductor, and a first protection layer 181 are formed as described with reference to FIG. 22A. A light blocking member 220 is formed on the first protection layer 181. The light blocking member 220 may be formed to completely surround one pixel along boundaries of pixels, for example, a data line 171 or a gate layer 121. By forming the light blocking member 220 in this manner, liquid materials for the color filters 230 may be applied onto the inside of the light blocking member 220 in the succeeding process. The liquid materials for the color filters 230 are applied onto the inside of the pixel surrounded by the light blocking member 220. The liquid materials for the color filters 230 may be applied and formed by, for example, the above-described inkjet method. Forming the color filters 230 using the inkjet method can simplify a process for manufacturing patterns of the color filters 230. A second protection layer 182 is formed on the color filters 230. For example, the second protection layer 182 may be made of an organic insulating material to planarize the upside of the color filters 230. For example, a pixel electrode layer is formed on the second protection layer 182, a spacer 250 (not shown) is formed on the pixel electrode layer, and a lower-plate alignment film 291 is formed on the spacer 250. The pixel electrode layer, the spacer 250, and the lower-plate alignment film 291 may be formed, for example, as described with reference to FIG. 22A. The lower and upper display panels 100 and 200 formed in this manner can have, for example, the characteristics described with reference to FIG. 22A.

Liquid crystal display panel assemblies 300 illustrated in FIGS. 22E to 22H have a light blocking member 220 formed on an upper display panel 200 according to an exemplary embodiment of the present invention. A method of manufacturing a liquid crystal display panel assembly 300 according to an exemplary embodiment of the present invention and a structure thereof will be described below in brief with reference to FIG. 22E. An upper display panel 200 has, for example, an upper substrate 210, a light blocking member 220, color filters 230, an overcoat 225, a common electrode 270, a spacer 250 (not shown), and an upper-plate alignment film 292 (shown as 34 and 36). The light blocking member 220 is formed on the upper substrate 210 by, for example, the above-described method corresponding thereto. The light blocking member 220 may, for example, completely cover a data line 171, and may overlap some parts of vertical connection portions 193*h* situated on both sides of the data line 171. The light blocking member 220 may be formed, for example, to overlap a channel of a TFT. The color filters 230 are formed on the light blocking member 220 by, for example, the above-described method corresponding thereto. The color filters 230 may, for example, overlap the data line 171, an opaque film adjacent to the data line 171, or the light blocking member 220 formed after the formation of the color filters 230. The color filters 230 may include, for example, R, G and B components, or may include red, green, blue and yellow components. The overcoat 225 is formed on the color filters 230 to planarize a lower layer. The common electrode 270 is formed, for example, on the overcoat 225 by the above-described method corresponding thereto. The spacer 250 may be formed, for example, on the common electrode 270. The spacer 250 includes, for example, a pigment constituting color filters, and may be made of a colored substance. The spacer 250 may be, for example, black in color. On the other hand, the spacer 250 may be formed, for example, under a lower-plate substrate film 291 (shown as 33 and 35) on the lower display panel 100. The upper-plate alignment film 292 is formed on the spacer 250 by, for example, the below-described methods of making a liquid crystal display panel assembly of a certain mode. The upper-plate alignment film 292 may include, for example, a main alignment film 34 and a photo hardening layer 36.

The lower display panel 100 is formed as described below. On a lower substrate 110 is formed a gate layer conductor including storage electrode line's vertical portions 128. The gate layer conductor may have, for example, the above-described patterns 121, 123, 124*h*, 124*l*, 124*c*, 125, 126, and 127. A gate insulating layer 140 is formed on the gate layer conductor. A semiconductor 154 is formed on the gate insulating layer 140. The semiconductor 154 may have, for example, the above-described patterns 154*h*, 154*l*, and 154*c*.

A linear ohmic contact member 165 is formed on the semiconductor 154. The linear ohmic contact member 165 may have, for example, the above-described patterns corresponding thereto. On the linear ohmic contact member 165 is formed a data layer conductor including the data line 171. The data layer conductor may have, for example, the above-described patterns 173h, 173l, 173c, 175h, 175l, 175c, and 177c. A first protection layer 181 is formed on the data layer conductor. For example, the first protection layer 181 may be made of the above-described inorganic material. A pixel electrode layer is formed on the first protection layer 181. The pixel electrode layer may have, for example, the above/below-described patterns 187, 189, 191h, 191l, 192h, 192l, 193l, 194h, 194l, 195h, 195l, 196, 197h, 197l, 198h, 198l, 713h, 713l, 715h, 715l, 717h, and 717l, including vertical connection portions 193h, and a pixel electrode structure. The vertical connection portions 193h formed on both sides of the data line 171 may, for example, overlap storage electrode line's vertical portions 128. The lower-plate alignment film 291 is formed on the pixel electrode layer by, for example, the below-described methods. The lower-plate alignment film 291 may include, for example, a main alignment film 33 and a photo hardening layer 35. A liquid crystal layer 3 is formed between the upper and lower display panels 200 and 100. The upper and lower display panels 200 and 100 manufactured in this manner can have, for example, the characteristics described in FIG. 22A. In other words, the upper display panel 200 includes layers 220, 230, and 225 blocking or absorbing light, and the lower display panel 100 does not substantially include materials blocking light. The light irradiated in the electric-field or fluorescent lithography process to form the lower-plate and upper-plate alignment films 291 and 292 may be incident upon the lower display panel 100. As a result, the lower-plate and upper-plate alignment films 291 and 292 may be uniformly formed, and the non-hardened light hardener may be reduced significantly, contributing to an increase in the display quality of the liquid crystal display device.

Figure 22E:
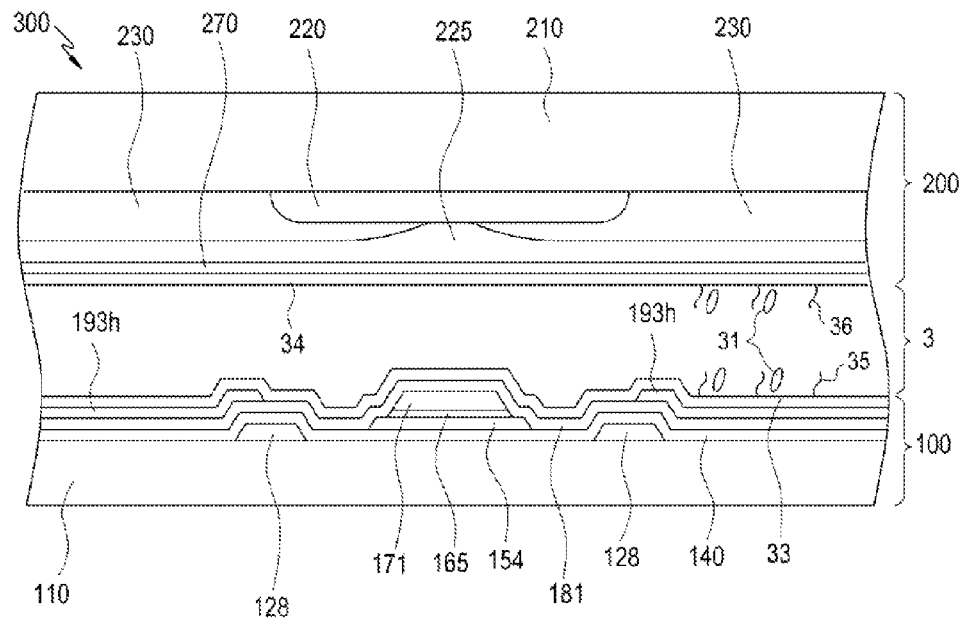
Figure 22F:
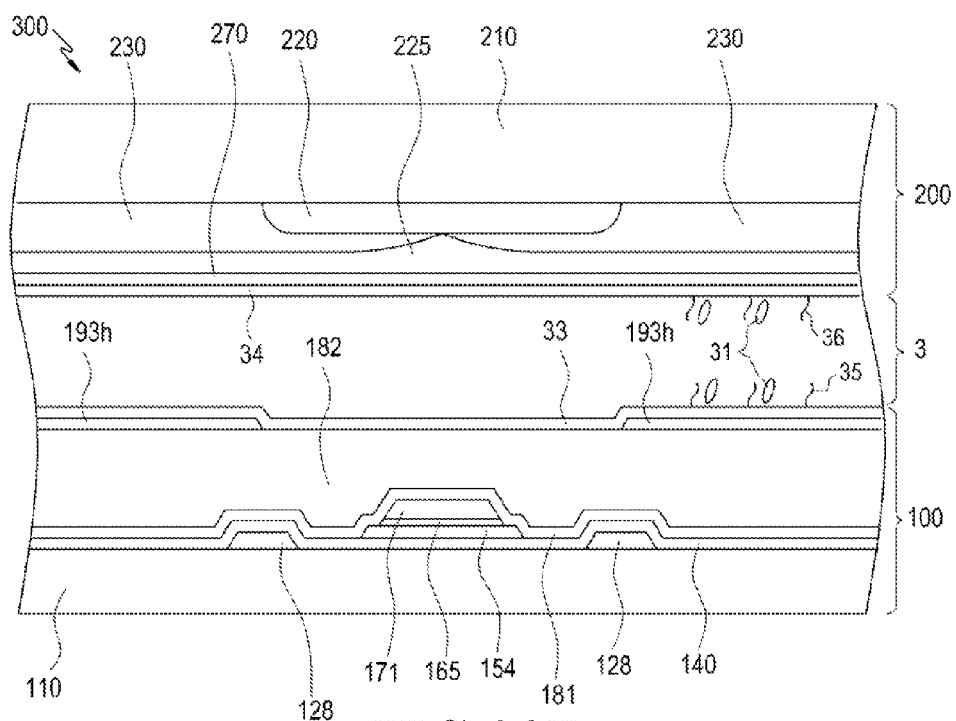

A liquid crystal display panel assembly 300 illustrated in FIG. 22F is substantially similar to that described in FIG. 22E except that a second protection layer 182 is formed between a pixel electrode layer and a first protection layer 181. The second protection layer 182 may be made of, for example, an organic material to planarize a lower layer.

Figure 22G:
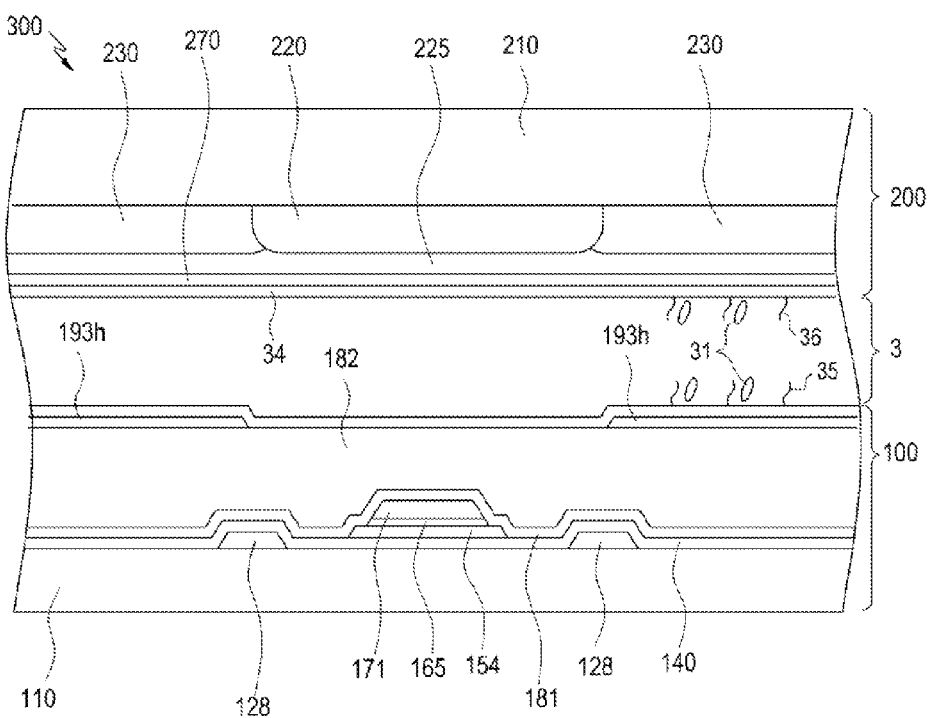

A liquid crystal display panel assembly 300 illustrated in FIG. 22G is substantially similar to that described in FIG. 22F except how color filters 230 are formed. The color filters on an upper display panel shown in FIG. 22G may be formed by, for example, the inkjet method that has already been described with reference to FIG. 22D.

Figure 22H:
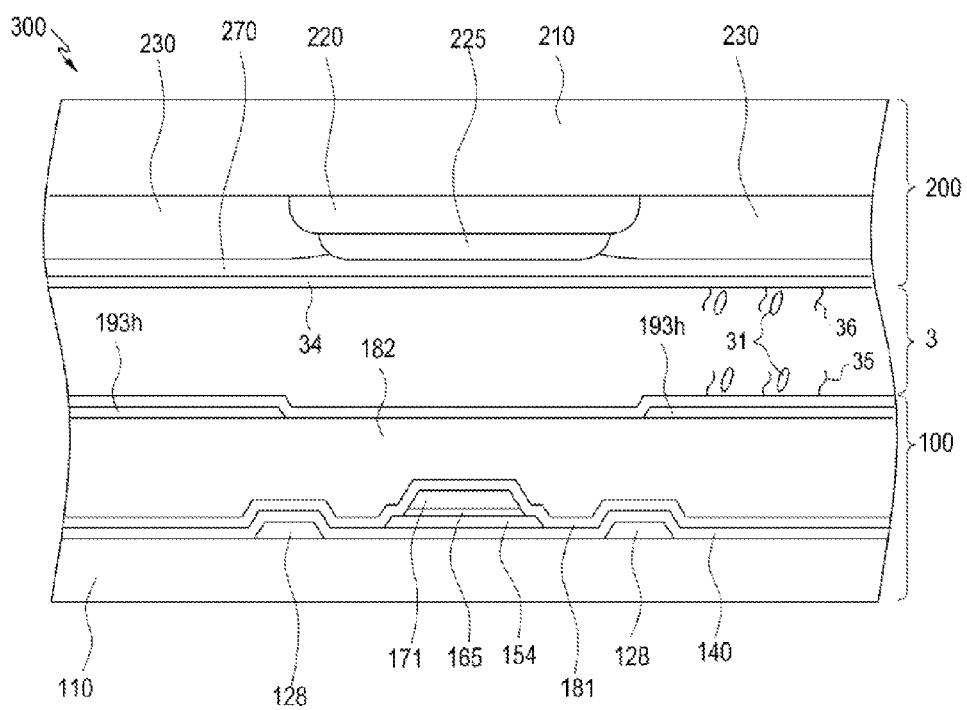

A liquid crystal display panel assembly 300 illustrated in FIG. 22H has, for example, an overcoat 225 formed on a light blocking member 220 for barrier or planarization, compared with the liquid crystal display panel assembly 300 illustrated in FIG. 22G. After the overcoat 225 is formed, a layer of color filters 230 may be formed, for example, within sidewalls of the light blocking member 220 and overcoat 225 by the inkjet method. The barrier may be formed in a portion where colors of color filters formed in one pixel are identified. The lower and upper display panels 100 and 200 with the structures illustrated in FIGS. 22A to 22H can increase the display quality of the liquid crystal display device.

In accordance with an exemplary embodiment of the present invention, the overcoat 225 illustrated in FIGS. 21A and 21B, and FIGS. 22A to 22H may include, for example, an acrylic material. The acrylic material included in the overcoat 225 may be, for example, hardened in a process of forming the overcoat 225. The overcoat 225 including the hardened acrylic material may, for example, transmit the short-wavelength UV at high transmittance, thereby increasing the energy or intensity of the light being incident on the light hardener or reactive mesogen and thus as a result increasing the cross-linking rate of the light hardener or reactive mesogen.

3) Enlarged View of Region A19 Shown in FIG. 18

A structure of the region A19 shown in FIG. 18 will be described below in detail with reference to FIGS. 18, 19A and 19B. FIG. 19A is an enlarged view of the region A19 shown in FIG. 18. Patterns of each layer formed in the region A19, for example, patterns of first and second subpixel electrode contact portions 192h and 192l and first and second pixel electrode junction connection portions can increase unrestoration and light leakage defects of the liquid crystal display device. Patterns illustrated in FIGS. 23A to 23F and 24A to 24T are different examples for increasing unrestoration and light leakage defects of the liquid crystal display device.

The unrestoration and light leakage phenomena of a liquid crystal display device are described below. Unrestoration refers to a phenomenon in which transition of liquid crystal molecules from any arrangement, for example, a stable arrangement, to another arrangement is delayed. If a display unit of a liquid crystal display device is pressed or impacted from the outside while the liquid crystal display device is in use, liquid crystal molecules in a liquid crystal layer are rearranged. The rearranged liquid crystal molecules may remain in the rearranged state for a predetermined time without returning to their original state. In addition, even though a data voltage is applied to a pixel electrode and an electric field is formed in a liquid crystal layer, liquid crystal molecules arranged in a stable state may continuously maintain the previous arrangement state, for example, a stable state in some regions without moving in an electric field formed on the pixel electrode. This phenomenon is called unrestoration of liquid crystal molecules, which may cause texture defects. In the pixel electrode structure illustrated in FIGS. 18 and 19A, the unrestoration phenomenon may occur due to the characteristics that in a region of a cross-shaped branch 195 of a first or second subpixel and a boundary region A19 between first and second subpixels, liquid crystal molecules are equal in arrangement direction and thus maintain the stable state. When the display unit is not pressed or impacted from the outside, liquid crystal molecules in the region of the cross-shaped branch 195 and the boundary region A19 remain independent, whereas if the display unit is impacted, liquid crystal molecules in these regions may be rearranged in a stable arrangement in the same direction. To address the unrestoration, e.g., to prevent liquid crystal molecules from being rearranged in a stable state, the strength and direction of an electric field may be adjusted in the region A19 and its adjacent regions shown in FIG. 18.

Light leakage refers to a phenomenon in which external light (not shown) passes through a liquid crystal display panel assembly 300 by a liquid crystal layer which is not controlled by a data voltage. For example, when an alignment of liquid crystal molecules in lower and upper display panels 100 and 200 is distorted by the external impact, the light incident on the liquid crystal display panel assembly 300 may pass through the liquid crystal display panel assembly 300 without being controlled by the liquid crystal display device. The light leakage phenomenon may occur even when the liquid crystal display device is not driven. In addition, when the lower and upper display panels 100 and 200 are twisted, light leakage may occur as a light blocking member deviates from its normal alignment or an electric field formed in a liquid crystal layer is distorted. Because of the light leakage, the liquid crystal display device may have, for example, texture, stain, reddish or greenish defects. The texture or stain defects caused by the light leakage may occur, for example, in boundary regions between pixel electrodes. The reddish defects caused by the light leakage may make the liquid crystal display device display reddish-dominant images, thereby causing light leakage of a red color to be more visible than light leakage of other colors. Like the reddish defects, defects of a greenish color or other colors constituting a basic pixel group may cause light of any one or more colors to be more visible than light of other colors. Tapping light leakage, a kind of light leakage, may occur when the liquid crystal display device is, for example, tapped or patted. When the liquid crystal display device is tapped, the lower and upper display panels 100 and 200 may deviate from the normal alignment by a value within a range of, for example, about 10 µm to about 15 µm, and the tapping light leakage may occur due to misalignment of layers formed in the lower and upper display panels 100 and 200.

Patterns of the first and second subpixel electrode contact portions 192h and 192l, first and second pixel electrode junction connection portions, a pixel electrode, and other layers, illustrated in FIG. 19A, are patterns that improve the unrestoration and light leakage defects. The first and second subpixel electrode contact portions 192/1 and 192l electrically connect first and second drain electrodes 175h and 175l to the first and second pixel electrode junction connection portions, respectively. The first and second pixel electrode junction connection portions serve to electrically connect the first and second subpixel electrode contact portions 192h and 192l to the first and second subpixel electrodes 191h and 191l, respectively. The first and second subpixel electrodes 191h and 191l receive data signals by the first and second subpixel electrode contact portions 192h and 192l and the first and second pixel electrode junction connection portions, respectively. The first subpixel electrode contact portion 192h and the first pixel electrode junction connection portion may have, for example, a concave shape formed therein.

The first pixel electrode junction connection portion may include, for example, a first pixel electrode's horizontal connection portion 713h, a first pixel electrode connection portion coupling point, and a first pixel electrode's vertical connection portion 715h. The first pixel electrode's vertical connection portion 715h may include, for example, two bifurcated branches, which are slanted from the first pixel electrode's oblique connection portion 714h connected to a first pixel electrode's horizontal connection portion 713h and extend in a substantially vertical direction, and the first pixel electrode's vertical connection portion 715h is connected to first pixel electrode's central micro branches 197, more preferably to the micro branches 197 to the right of a cross-shaped branch's vertical portion 195v. In accordance with an exemplary embodiment of the present invention, a wiring of the first pixel electrode connection portion coupling point may be the first pixel electrode's oblique connection portion 714h, which is formed to be oblique as illustrated in FIGS. 18 and 19A. The first pixel electrode's oblique connection portion 714h may be, for example, slanted with respect to a wiring of the first pixel electrode's horizontal connection portion 713h, a polarization axis of a polarizer, or the above-described direction D1 by a value within a range of about 30° to about 60°. The first pixel electrode's horizontal connection portion 713h extends, for example, in a substantially horizontal direction, and electrically connects the first subpixel electrode contact portion 192h to the first pixel electrode's oblique connection portion 714h. The first pixel electrode's horizontal connection portion 713h and the first pixel electrode's oblique connection portion 714h are connected at an obtuse angle, while the first pixel electrode's horizontal connection portion 713h and the slanted bifurcated branches are connected at an acute angle. The first pixel electrode junction connection portion formed in this way may disperse an electric field occurring in a region between the first and second subpixels 191h and 191l, or prevent the electric field occurring in this region from affecting the first subpixel region, thereby increasing the liquid crystal molecule's unrestoration and light leakage defects, which may occur in the first subpixel region.

In accordance with an exemplary embodiment of the present invention, the number of micro branches 197 connected to the first pixel electrode's vertical connection portion 715h may be one or more. In accordance with an exemplary embodiment of the present invention, the number of wirings 713h, 714h, and 715h constituting the first pixel electrode junction connection portion may be, for example, one, or two or more, and their widths may fall within a range of about 2 µm to about 7 µm. A width of the first pixel electrode's horizontal connection portion 713h may be, for example, greater than a width of the first pixel electrode's oblique connection portion 714h. In accordance with an exemplary embodiment of the present invention, the first pixel electrode junction connection portion may be constructed to facilitate easy repair of the pixel electrode. Therefore, a line RH1 may be, for example, fused by laser to repair manufacturing defects of the first subpixel 191h.

A second pixel electrode junction connection portion may include, for example, a second pixel electrode's horizontal connection portion 713l, a second pixel electrode connection portion coupling point or a second pixel electrode's oblique connection portion 714l, and a second pixel electrode connection portion 717l. The second pixel electrode connection portion coupling point is connected to the second pixel electrode's horizontal connection portion 713l extending in a horizontal direction, and the second pixel electrode connection portion 717l. In accordance with an exemplary embodiment of the present invention, a wiring of the second pixel electrode connection portion coupling point may be, for example, the second pixel electrode's oblique connection portion 714l, which is formed to be oblique as illustrated in FIGS. 18 and 19A. The second pixel electrode's horizontal connection portion 713l overlaps, for example, a portion of a down gate line 123 along a longitudinal direction of the down gate line 123. The overlapping second pixel electrode's horizontal connection portion 713l blocks an electric field existing in a peripheral portion of the down gate line 123. In addition, the second pixel electrode's horizontal connection portion 713l may overlap, for example, a wiring that connects a second drain electrode 175l to a third source electrode 173c. A longitudinal length of the second pixel electrode's horizontal connection portion 713l is, for example, substantially similar to a longitudinal length of the second pixel electrode 191l. The second pixel electrode's oblique connection portion 714l is formed by, for example, a wiring slanted with respect to the second pixel electrode's horizontal connection portion 713l, and electrically connects the second pixel electrode's horizontal connection portion 713l to the second pixel electrode connection portion 717l. The second pixel electrode's oblique connection portion 714l is connected to micro branches 197 to the left of a vertical portion 195v of the cross-shaped branch 195. A tilt angle between the second pixel electrode's oblique connection portion 714l and the second pixel electrode's horizontal connection portion 713l may fall within a range of, for example, about 30° to about 60°. A line width of the second pixel electrode's oblique connection portion 714*l* may fall within a range of, for example, about 2 µm to about 7 µm, and may be greater than a width of the second pixel electrode's micro branches 197. The second pixel electrode connection portion 717*l* electrically connects the second pixel electrode's oblique connection portion 714*l* to the second pixel electrode 191*l*. The second pixel electrode connection portion 717*l* is formed in a central portion of a second pixel electrode 191*l* to electrically connect the second pixel electrode's oblique connection portion 714*l* to two micro branches 197 on one end of the cross-shaped branch's vertical portion 195*v*. The second pixel electrode connection portion 717*l* has, for example, a hanger shape. In accordance with an exemplary embodiment of the present invention, the number of micro branches 197 connected to the second pixel electrode's vertical connection portion 715*l* may be one or more.

In accordance with an exemplary embodiment of the present invention, a second pixel electrode's horizontal connection portion 194*l* adjacent to the second pixel electrode's horizontal connection portion 713*l* is formed, for example, on both sides of the second pixel electrode connection portion 717*l*. The second pixel electrode's horizontal connection portion 194*l* connects second pixel electrode's micro branches 197*l*. The second pixel electrode's horizontal connection portion 194*l* formed, for example, on both sides of the second pixel electrode connection portion 717*l* overlaps a portion of the down gate line 123 along an extension direction of the down gate line 123. The overlapping second pixel electrode's horizontal connection portion 194*l* blocks an electric field existing in a peripheral portion of the down gate line 123. By doing so, the second pixel electrode junction connection portion or second pixel electrode's horizontal connection portion 194*l* may disperse the electric field occurring in a region between the first and second subpixels 190*h* and 190*l*, or prevent the electric field occurring in this region from affecting the second subpixel region, thereby increasing the liquid crystal molecule's unrestoration and light leakage defects, which may occur in the second subpixel region.

In accordance with another exemplary embodiment of the present invention, the second subpixel 190*l* may have regions A19a and A19b illustrated in FIG. 19A. In the region A19a, a second pixel electrode's vertical connection portion 193*l* extends in, for example, a stair shape, overlapping a portion of a storage electrode line's vertical portion 128 (see FIG. 21B). A projection 193*a* of the second pixel electrode's vertical connection portion 193*l* may be formed in a portion where a line width of a data line 171 or a shield common electrode 196 reduces. The region A19b is substantially similar in structure to the region A19a, so its detailed description is omitted. The structures formed in this way contribute to blocking an electric field occurring in the regions A19a and A19b, and reducing light leakage defects in these regions.

In accordance with an exemplary embodiment of the present invention, the second pixel electrode connection portion 717*l* may be constructed to facilitate easy repair of the pixel electrode. Therefore, the line RL1 may be, for example, fused by laser spot to repair manufacturing defects of the second subpixel 190*l*.

Various examples for increasing liquid crystal molecule's unrestoration and light leakage defects will be described below with reference to FIGS. 23A to 23F and 24A to 24T. While micro branches 197 constituting a pixel electrode, illustrated in FIGS. 23A to 23F and 24A to 24T, have a zigzag shape, micro branches 197 may have, for example, the above-described stripe shape or a basic unit pixel electrode shape according to an exemplary embodiment of the present invention. In FIGS. 23A to 23F, patterns of some layers, for example, a gate layer conductor, a data layer conductor, and a pixel electrode layer, are only illustrated.

Figure 23A:
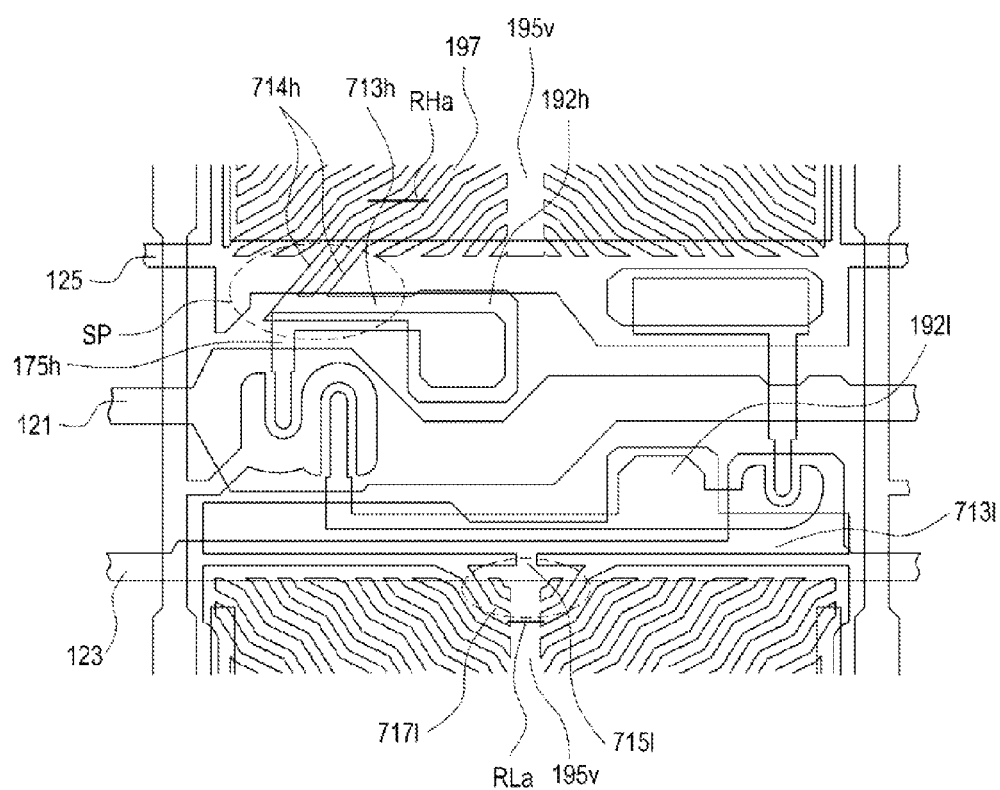
FIGS. 23A to 23F are plan views of a lower display panel for improving unrestoration and light leakage defects of a liquid crystal display device according to an exemplary embodiment of the present invention.

Referring to FIG. 23A, a first pixel electrode junction connection portion includes a first pixel electrode's horizontal connection portion 713*h* and a first pixel electrode's oblique connection portion 714*h*. The connection portions 713*h* and 714*h*, or a pixel electrode's horizontal connection portion 713, a pixel electrode's oblique connection portion 714, and a pixel electrode's vertical connection portion 715, which are to be described in connection with FIGS. 23B to 23F and 24A to 24T, may be constructed by at least one wiring, and widths thereof may fall within a range of, for example, about 2 µm to about 7 µm. The first pixel electrode's oblique connection portion 714*h* has, for example, branches bifurcated at an end of the first pixel electrode's horizontal connection portion 713*h*, and the bifurcated branches have a straight line or stripe shape, and are connected to first pixel electrode's micro branches extending from a central portion of a bottom end of a domain to the left of a cross-shaped branch's vertical portion 195*v*, thereby dispersing an electric field that causes unrestoration of liquid crystal molecules. An angle between the first pixel electrode's oblique connection portion 714*h* and the first pixel electrode's horizontal connection portion 713*h* may fall within a range of, for example, about 30° to about 60°. The first pixel electrode's horizontal connection portion 713*h* may have, for example, a wedge shape making an acute angle with the first pixel electrode's oblique connection portion 714*h*. The wedge-shaped first pixel electrode's horizontal connection portion 713*h* may disperse an electric field by forming a singular point. The singular point is a region where an electric field gathers or does not substantially exist, for example, a region SP illustrated in FIG. 23A. A wiring of the first pixel electrode's horizontal connection portion 713*h* may, for example, overlap a first drain electrode 175*h*. In case of manufacturing defects of the first subpixel 190*h*, the first subpixel 190*h* may be repaired by, for example, fusing micro branches connected to the first pixel electrode's oblique connection portion 714*h*, along a line RHa. The first pixel electrode junction connection portion formed in this manner ensures easy repair of the first subpixel electrode 191*h*, and can increase liquid crystal molecule's unrestoration and light leakage defects, which may occur in the first subpixel region due to the above-described reasons. In accordance with an exemplary embodiment of the present invention, the first pixel electrode's horizontal connection portion 713*h* may be, for example, greater in wiring width than the first pixel electrode's oblique connection portion 714*h*.

A second pixel electrode junction connection portion includes, for example, a second pixel electrode's horizontal connection portion 713*l*, a second pixel electrode's vertical connection portion 715*l*, and a second pixel electrode connection portion 717*l*. The second pixel electrode's vertical connection portion 715*l* is connected to a central portion of a vertical portion 195*v* of, for example, a cross-shaped branch 195, thereby preventing an electric field from being distorted to one side. In accordance with an exemplary embodiment of the present invention, the second subpixel 190*l* can be repaired by, for example, fusing the second subpixel electrode 191*l* along a line RLa. The second pixel electrode junction connection portion formed in this way ensures easy repair of the subpixel electrode 190*l*, and can increase liquid crystal molecule's unrestoration and light leakage defects, which may occur in the second subpixel region due to the above-described reasons. Other elements and their structures are the same as those described with reference to FIG. 19A, so a description thereof is omitted. Lines RHb, RLb, RHc, RLc1, RLc2, RHd, RLd, RHe, RLe, RHf, RLf, R24a, R24b, R24c, R24d, R24f, R24g, R24h, R24i, R24j, R24k, R24l, R24m, R24n, R24o, R24p, R24q, R24r and R24s illustrated in FIGS. 23B to 23F and 24A to 24T may be fused by the above-described laser spot to repair the first and second subpixels 190h and 190l.

Figure 23B:
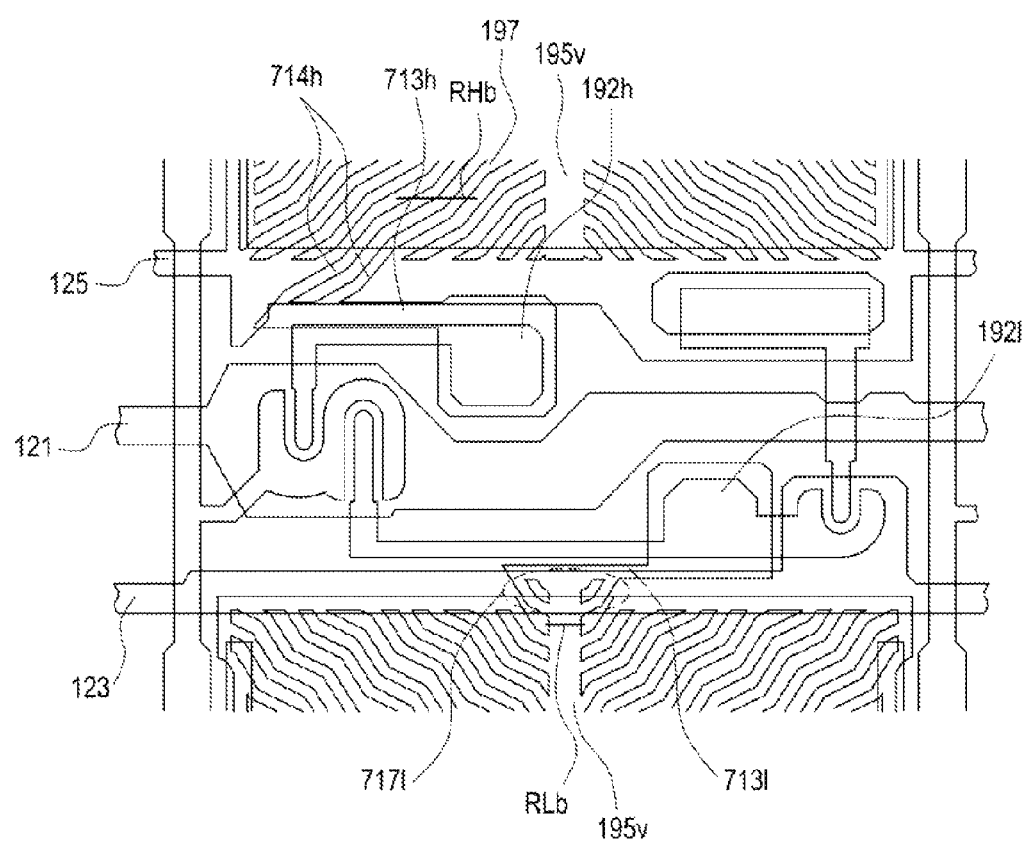

Referring to FIG. 23B, a first pixel electrode junction connection portion includes a first pixel electrode's horizontal connection portion 713h and a first pixel electrode's oblique connection portion 714h. The first pixel electrode junction connection portion is substantially similar to that described in FIG. 23A except that a wiring of the first pixel electrode's oblique connection portion 714h is in a zigzag shape, so a detailed description of other details about the first pixel electrode junction connection portion will be omitted. A second pixel electrode junction connection portion includes, for example, a second pixel electrode's horizontal connection portion 713l and a second pixel electrode connection portion 717l. The second pixel electrode connection portion 717l extends, for example, in a vertical direction to a down gate line 123, overlapping the down gate line 123, and is electrically connected to a second pixel electrode's horizontal connection portion 713l connected to a second subpixel electrode contact portion 192l. As the second pixel electrode connection portion 717l extends and is connected to the second pixel electrode's horizontal connection portion 713l, an electric field formed in the second subpixel electrode contact portion 192l and the pixel electrode region can be dispersed. Other details about the second pixel electrode junction connection portion have been described with reference to FIG. 23A.

Figure 23C:
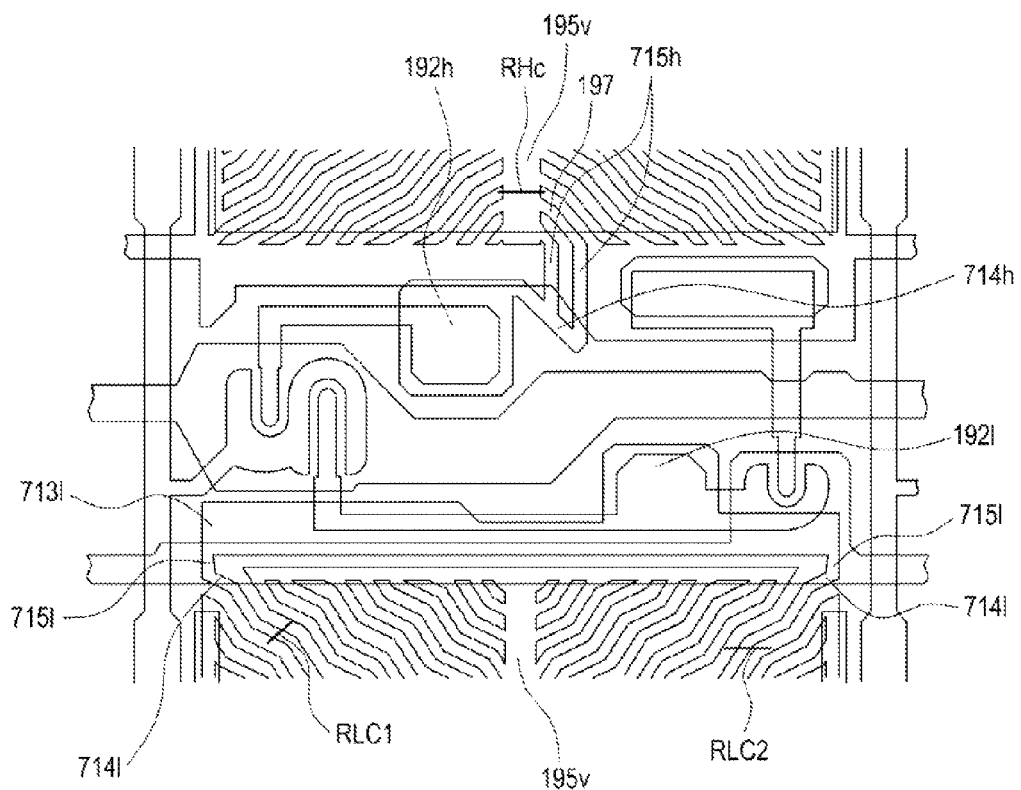

Referring to FIG. 23C, a first pixel electrode junction connection portion includes, for example, a first pixel electrode's oblique connection portion 714h and a first pixel electrode's vertical connection portion 715h. In a right bottom end of a cross-shaped branch's vertical portion 195v, the first pixel electrode's vertical connection portion 715h and first pixel electrode's micro branches 197 are electrically connected. Micro branches 197 connected to the first pixel electrode's vertical connection portion 715h may be, for example, micro branches 197 on a lower end of the cross-shaped branch's vertical portion 195v among the micro branches 197 connected to the cross-shaped branch's vertical portion 195v. The first pixel electrode's oblique connection portion 714h extends, for example, obliquely to electrically connect the first pixel electrode's vertical connection portion 715h to the top of a first subpixel electrode contact portion 192h. The first pixel electrode's oblique connection portion 714h may be, for example, slanted against the first pixel electrode's vertical connection portion 715h by a value within a range of about 30° to about 60°. The first pixel electrode junction connection portion formed in this manner ensures easy repair of the first subpixel electrode 191h, and may increase liquid crystal molecule's unrestoration and light leakage defects, which may occur in the first subpixel region due to the above-described reasons.

A second pixel electrode junction connection portion includes, for example, a second pixel electrode's horizontal connection portion 713l and second pixel electrode's vertical connection portions 715l. For example, the second pixel electrode's horizontal connection portion 713l extending in the horizontal direction is electrically connected to ends of the second pixel electrode's vertical connection portions 715l at both ends of the second pixel electrode's horizontal connection portion 713l, and other ends of the second pixel electrode's vertical connection portions 715l are connected to second pixel electrode's micro branches 197 extending from edges of two domains adjacent to a data line. As the second pixel electrode junction connection portion is formed in both end portions of the second subpixel electrode 191l in this way, an electric field formed in the second subpixel electrode contact portion 192l and the pixel electrode region can be dispersed widely, thereby increasing the liquid crystal molecule's unrestoration and light leakage defects, which may occur in the second subpixel region.

Figure 23D:
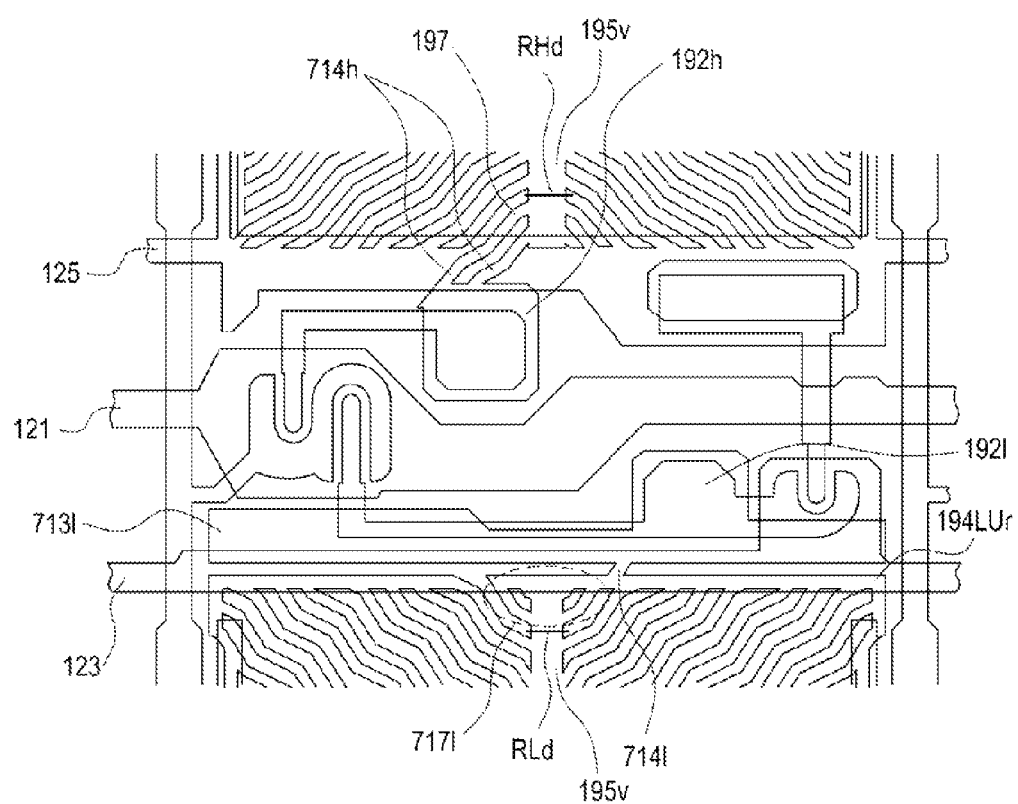

Referring to FIG. 23D, a first pixel electrode junction connection portion includes, for example, a first pixel electrode's oblique connection portion 714h. Micro branches 197 on the left bottom of a cross-shaped branch's vertical portion 195v are electrically connected to the first pixel electrode's oblique connection portion 714h, and the first pixel electrode's oblique connection portion 714h is connected to a subpixel electrode contact portion 192h. The first pixel electrode's oblique connection portion 714h may be, for example, zigzag branches extending from the first pixel electrode's oblique connection portion 714h. The first pixel electrode junction connection portion formed in this manner has the above-described characteristics. A second pixel electrode junction connection portion includes, for example, a second pixel electrode's horizontal connection portion 713l, a second pixel electrode's oblique connection portion 714l, and a second pixel electrode connection portion 717l. The second pixel electrode connection portion 717l is connected, for example, to a cross-shaped branch's vertical portion 195v of the second subpixel, a right end of the second pixel electrode connection portion 717l is connected to a horizontal connection portion 194LUR connected to micro branches on the right top of the second subpixel 190l, and the horizontal connection portion 194LUR is connected to the second subpixel electrode's horizontal connection portion 713l obliquely extending in the horizontal direction. Other details, except for the just-discussed structures, are similar to those described in connection with FIG. 19A.

Figure 23E:
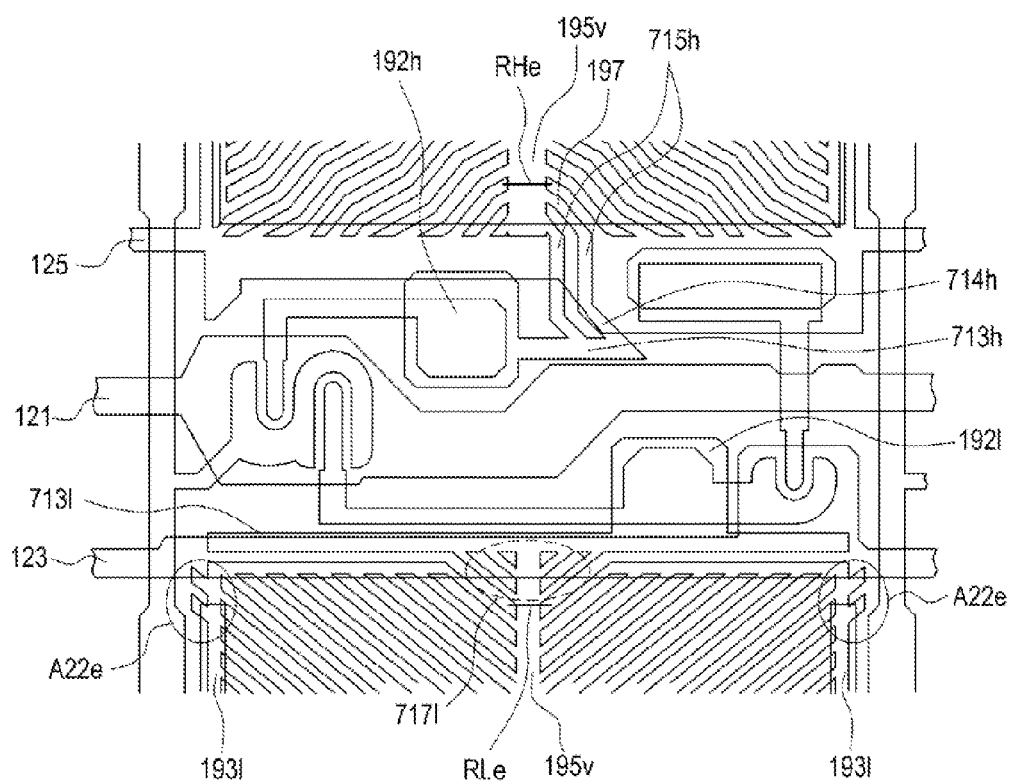

Referring to FIG. 23E, a first pixel electrode junction connection portion includes, for example, a first pixel electrode's oblique connection portion 714h, a first pixel electrode's vertical connection portion 715h, and a first subpixel electrode contact portion 192h. The first pixel electrode junction connection portion illustrated in FIG. 23E is similar to that described with reference to FIG. 19A, except that a portion where the first pixel electrode's oblique connection portion 714h and a first pixel electrode's horizontal connection portion 713h are connected, has, for example, a wedge shape. A second pixel electrode junction connection portion includes, for example, a second pixel electrode's horizontal connection portion 713l, a second pixel electrode connection portion 717l, and a second subpixel electrode contact portion 192l. The second pixel electrode's horizontal connection portion 713l in the horizontal direction is, for example, electrically connected to the second subpixel electrode contact portion 192l and the second pixel electrode connection portion 717l. The second pixel electrode junction connection portion is similar to that described with reference to FIG. 23B, except that micro branches constituting the second subpixel electrode 191l and the second pixel electrode connection portion 717l have, for example, a stripe shape. In regions A22e, micro branches 197 project by extending from a second pixel electrode's vertical connection portion 193l to be adjacent to a data line. The projecting micro branches may disperse or block electric fields formed by a down gate line 123, a storage electrode line's vertical portion 128, and the data line 171. The projecting micro branches in regions A22e may be formed, for example, near the edge of the first or second pixel electrode 191h or 191l adjacent to the data line 171. The structure of the second pixel electrode's horizontal connection portion 713*l* and the characteristics of the second pixel electrode junction connection portion are substantially similar to those described in FIG. 19A.

Figure 23F:
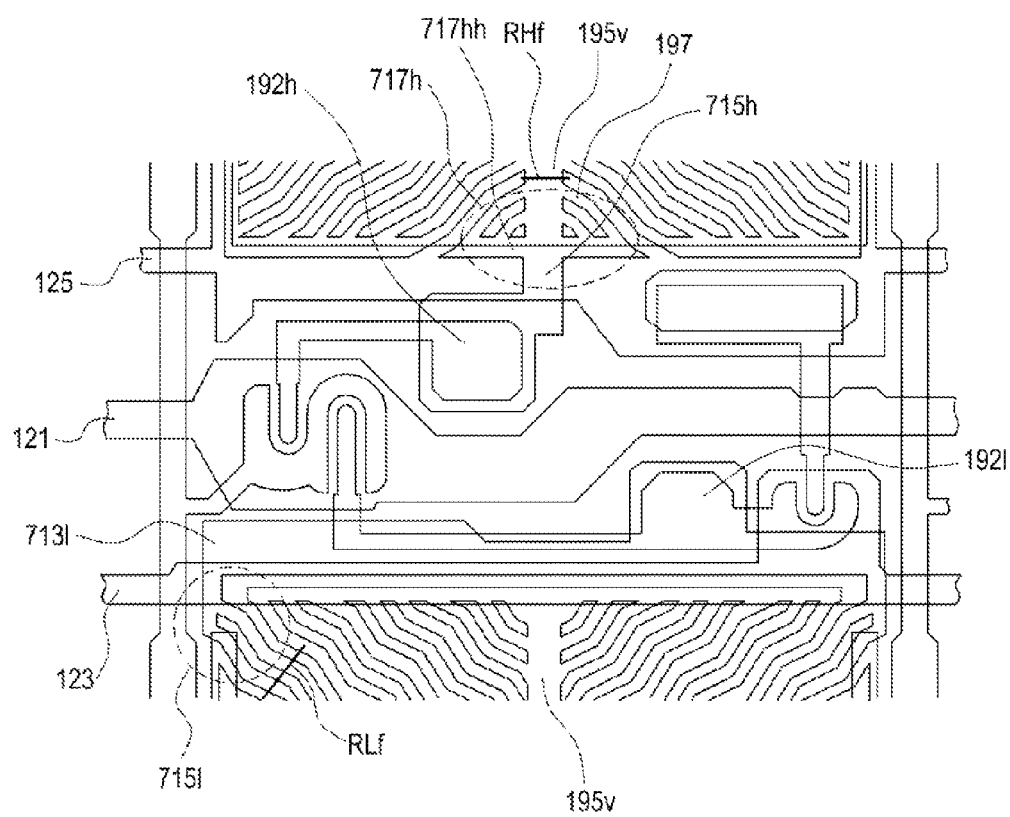

Referring to FIG. 23F, a first pixel electrode junction connection portion includes, for example, a first pixel electrode's vertical connection portion 715*h*, a first pixel electrode connection portion 717*h*, and a first subpixel electrode contact portion 192*h*. The first pixel electrode connection portion 717*h* is formed, for example, on the bottom of a cross-shaped branch's vertical portion 195*v*, and electrically connects the first subpixel electrode contact portion 192*h* connected to the first pixel electrode's vertical connection portion 715*h*, to the first subpixel electrode 191*h*. A horizontal connection portion 717*hh* formed in the first pixel electrode connection portion 717*h* in, for example, a hanger shape is connected to micro branches 197 on the bottom of the vertical portion 195*v* on both sides of the vertical portion 195*v*. The first pixel electrode connection portion 717*h* may have the above-described characteristics. A second pixel electrode junction connection portion includes, for example, a second pixel electrode's horizontal connection portion 713*l*, a second pixel electrode's vertical connection portion 715*l*, and a second subpixel electrode contact portion 192*l*. The second pixel electrode's horizontal connection portion 713*l* extending, for example, in the horizontal direction electrically connects the second subpixel electrode contact portion 192*l* to the second pixel electrode's vertical connection portion 715*l*. The second pixel electrode's vertical connection portion 715*l* is connected to, for example, a plurality of micro branches projecting in the direction of a data line 171. Arrangements of other elements are similar to those described in connection with FIG. 23C. The characteristics of the second pixel electrode junction connection portion are the same as described above.

Figure 24A:
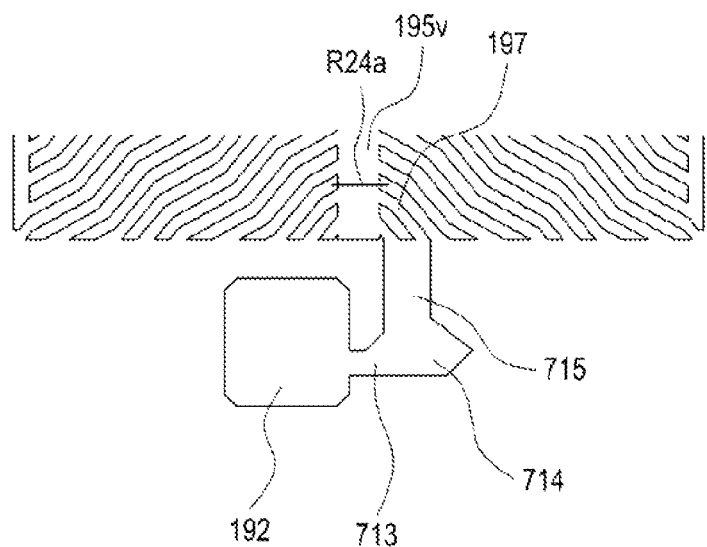
FIGS. 24A to 24T are plan views showing a part of a pixel electrode layer for improving unrestoration and light leakage defects of a liquid crystal display device according to an exemplary embodiments of the present invention.

Various examples for increasing liquid crystal molecule's unrestoration and light leakage defects will be described below with reference to FIGS. 24A to 24T. FIGS. 24A to 24T illustrate partial patterns of a pixel electrode layer in a portion of a pixel electrode and a boundary region between subpixel electrodes. Structures illustrated in FIGS. 24A to 24T may be applied to pixel electrode junction connection portions of first and second subpixel electrodes. Referring to FIG. 24A, a pixel electrode junction connection portion includes, for example, a subpixel electrode contact portion 192, a pixel electrode's horizontal connection portion 713, a pixel electrode's oblique connection portion 714, and a pixel electrode's vertical connection portion 715. A plurality of micro branches 197 to the right of a cross-shaped branch's vertical portion 195*v* are connected to the pixel electrode's vertical connection portion 715. The pixel electrode's vertical connection portion 715 joins two or more micro branches 197 in common, and is connected to the pixel electrode's oblique connection portion 714. The pixel electrode's oblique connection portion 714 is connected to the subpixel electrode contact portion 192 via the pixel electrode's horizontal connection portion 713. The lines of the pixel electrode's horizontal connection portion 713 connected to the right bottom of the subpixel electrode contact portion 192 are connected to, for example, two oblique lines of the pixel electrode's oblique connection portion 714 at an angle falling within a range of about 120° to about 150°. The pixel electrode junction connection portion formed in this way may increase the liquid crystal molecule's unrestoration and light leakage defects.

Figure 24B:
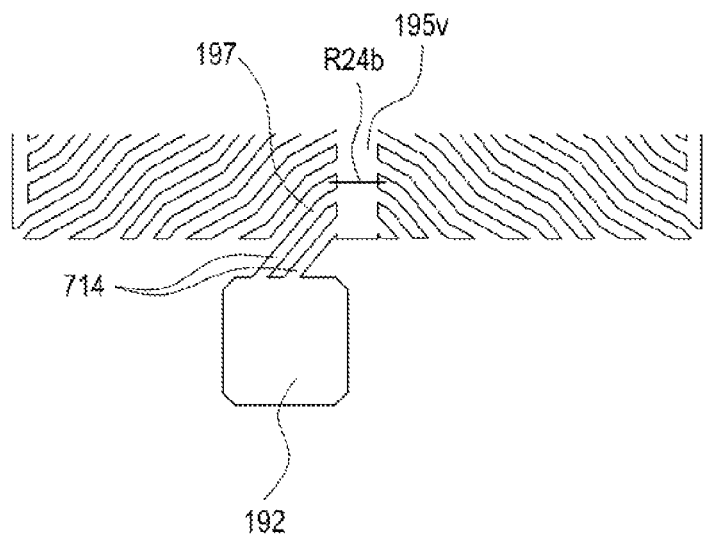

Referring to FIG. 24B, a pixel electrode junction connection portion includes a pixel electrode's oblique connection portion 714. For example, a plurality of micro branches 197 extending from the left bottom of a cross-shaped branch's vertical portion 195*v* are connected to the pixel electrode's oblique connection portion 714, and the pixel electrode's oblique connection portion 714 is obliquely connected to the top of a subpixel electrode contact portion 192, and its tilt angle may be determined by the extending micro branches 197.

Figure 24C:
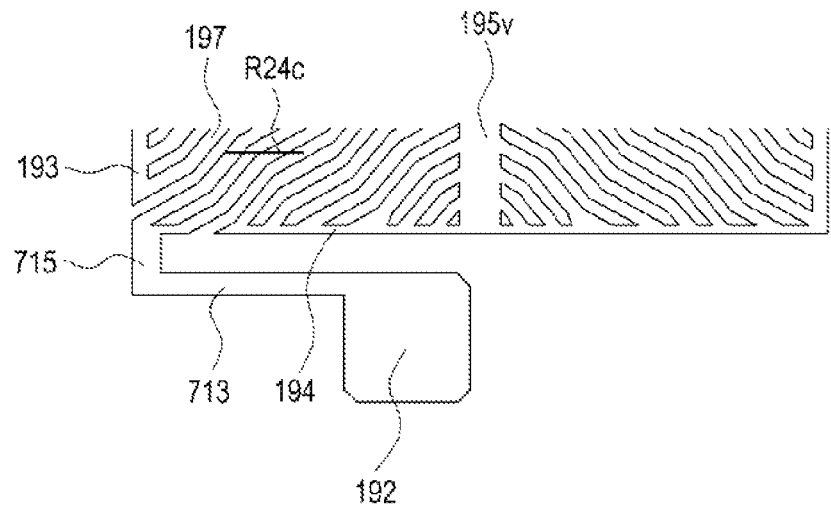

Referring to FIG. 24C, a pixel electrode junction connection portion includes, for example, a pixel electrode's horizontal connection portion 713 and a pixel electrode's vertical connection portion 715. A plurality of micro branches 197 on the pixel electrode's corner in a region adjacent to a data line 171 (not shown) are connected to the pixel electrode's vertical connection portion 715. This connection portion 715 is, for example, separated from a horizontal connection portion 194 and a vertical connection portion 193 of the subpixel electrode. It is to be noted that the micro branches connected to the horizontal connection portion 194 of the pixel electrode and vertical connection portion 193 of the pixel electrode, and the pixel electrode's vertical connection portion 715, the pixel electrode's horizontal connection portion 713 and a subpixel electrode contact portion 192 are made of, for example, the same material in an integrated layer.

Figure 24D:
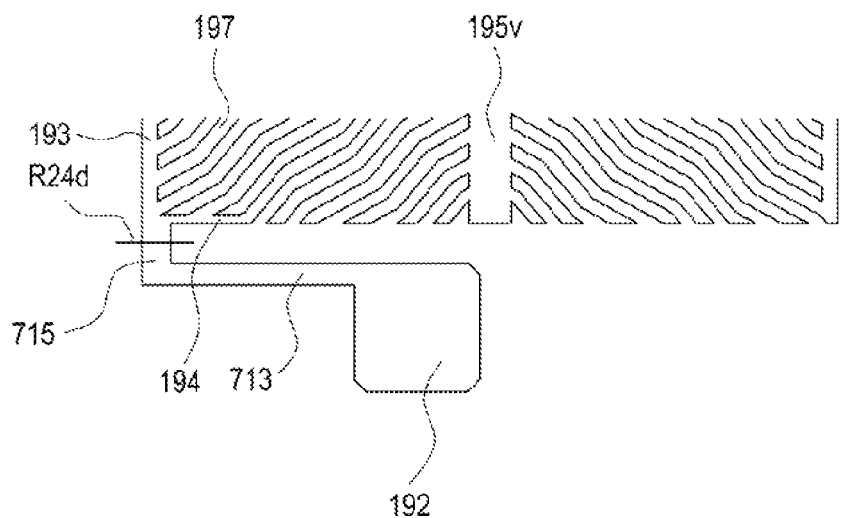

Referring to FIG. 24D, a pixel electrode junction connection portion includes, for example, a pixel electrode's horizontal connection portion 713 and a pixel electrode's vertical connection portion 715, provided to connect micro branches 197 of the subpixel electrode to a subpixel electrode contact portion 192. Other elements of the pixel electrode junction connection portion are similar in structure to those described in conjunction with FIG. 24C, except that the pixel electrode's vertical connection portion 715 is connected to a pixel electrode's vertical connection portion 193 and a part of a horizontal connection portion 194 of the pixel electrode. All of the patterns illustrated in FIGS. 24A to 24T, e.g., patterns including micro branches 197 of the pixel electrode, a pixel electrode junction connection portion for connecting micro branches 197 to a subpixel electrode contact portion 192, and the subpixel electrode contact portion 192 constitute an integrated layer made of the same material.

Figure 24E:
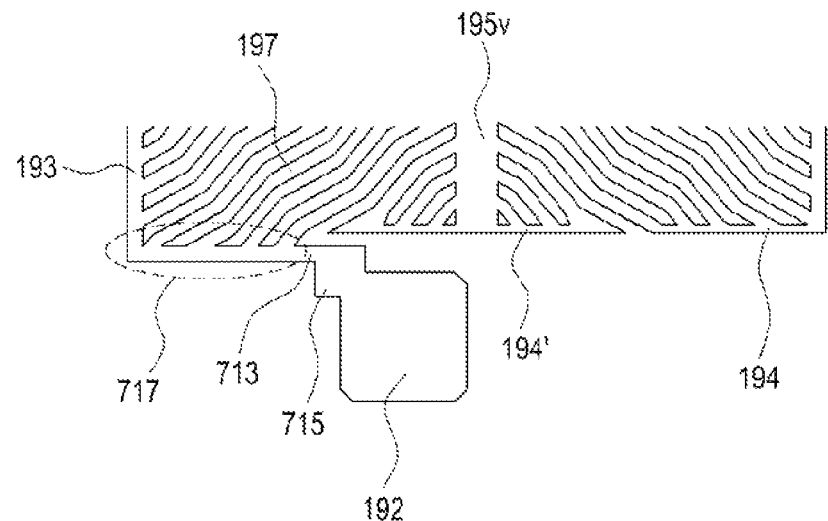

Referring to FIG. 24E, a pixel electrode junction connection portion includes, for example, a pixel electrode's horizontal connection portion 713, a pixel electrode's vertical connection portion 715, and a pixel electrode connection portion 717. The pixel electrode connection portion 717 includes, for example, a vertical connection portion 193 of the pixel electrode and the pixel electrode's horizontal connection portion 713 connected thereto, which are connected to a plurality of micro branches 197 to the left of a cross-shaped branch's vertical portion 195*v*. The pixel electrode's horizontal connection portion 713 extends, for example, from the bottom of a pixel electrode's first horizontal connection portion 194 in the horizontal direction, and is connected to a plurality of extending micro branches 197, and to the pixel electrode's vertical connection portion 715 connected to the top of a subpixel electrode contact portion 192. A width of the pixel electrode's vertical connection portion 715 may be, for example, greater than a wiring width of the pixel electrode's horizontal connection portion 713. To disperse an electric field, micro branches 197 formed on the bottom of the cross-shaped branch's vertical portion 195*v* have, for example, a hanger shape extending to be connected to a pixel electrode's second horizontal connection portion 194' separated from the pixel electrode's first horizontal connection portion 194.

Figure 24F:
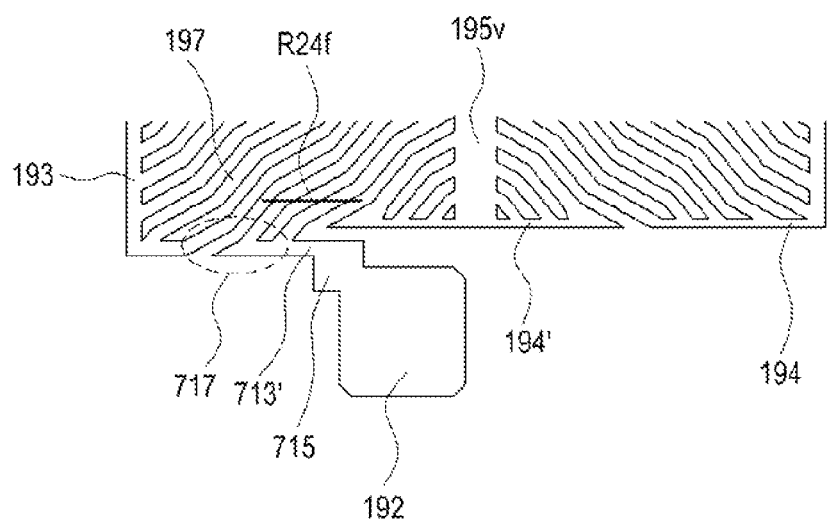

Referring to FIG. 24F, a pixel electrode junction connection portion includes, for example, a pixel electrode's horizontal connection portion 713', a pixel electrode's vertical connection portion 715, and a pixel electrode connection portion 717. The pixel electrode junction connection portion is similar in structure to that of FIG. 24E, except that the pixel electrode's horizontal connection portion 713' is, for example, bifurcated, unlike the pixel electrode's horizontal connection portion 713 illustrated in FIG. 24E.

Figure 24G:
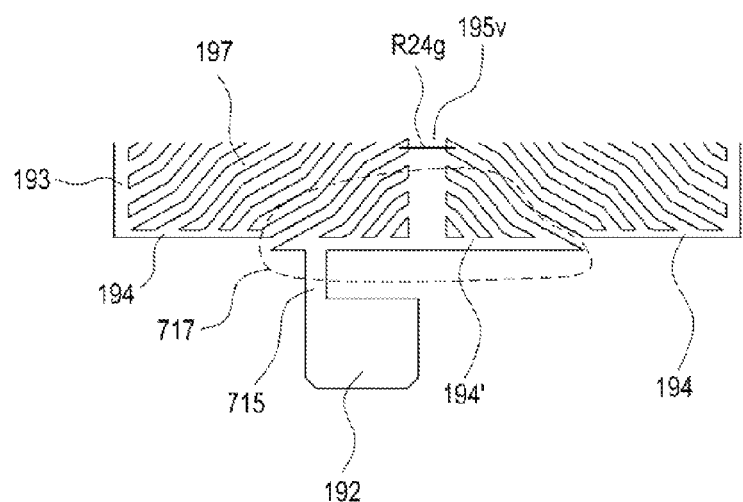
Figure 24H:
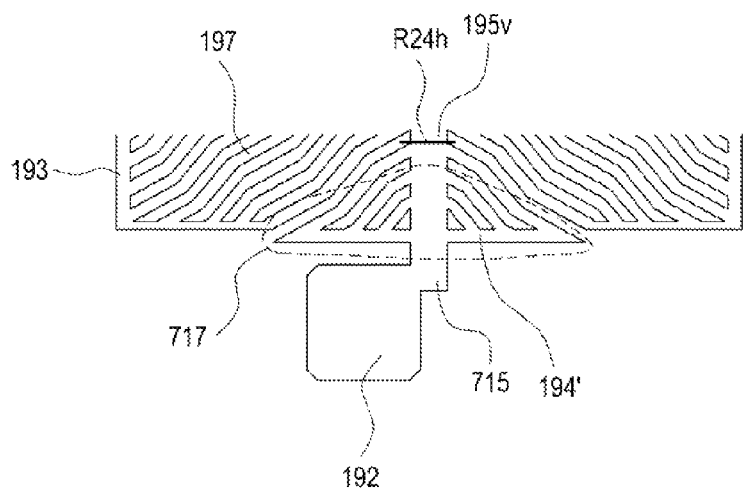

Referring to FIGS. 24G and 24H, a pixel electrode junction connection portion includes, for example, a pixel electrode's vertical connection portion 715 and a pixel electrode connection portion 717. The pixel electrode connection portion 717 has, for example, the above-described hanger shape situated in the bottom of a cross-shaped branch's vertical portion 195v. To disperse an electric field, the pixel electrode connection portion 717 is separated from a pixel electrode's horizontal connection portion 194 formed on both sides thereof. In addition, the pixel electrode connection portion 717 has, for example, a second horizontal connection portion 194' projecting beyond the pixel electrode's horizontal connection portions 194 at both sides thereof. One end of the pixel electrode's vertical connection portion 715 formed in FIG. 24G is, for example, connected to one end of the second horizontal connection portion 194' of the pixel electrode connection portion 717, and another end thereof is connected to a subpixel electrode contact portion 192. The pixel electrode's vertical connection portion 715 shown in FIG. 24H is connected to, for example, a central portion of the pixel electrode connection portion 717 extending from the cross-shaped branch's vertical portion 195v.

Figure 24I:
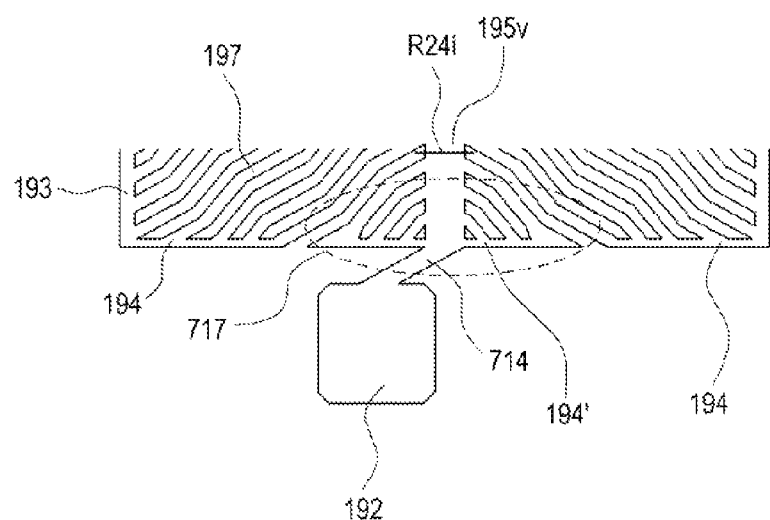

Referring to FIG. 24I, a pixel electrode junction connection portion includes, for example, a pixel electrode's oblique connection portion 714 and a pixel electrode connection portion 717. The pixel electrode connection portion 717 has, for example, a hanger shape as described above, and its second horizontal connection portion 194' is on the same line as a pixel electrode's horizontal connection portion 194 connected to a vertical connection portion 193. The pixel electrode's oblique connection portion 714 extends, for example, to be slanted with respect to a central portion of the second horizontal connection portion 194' at an angle falling within a range of about 30° to about 60°, and is connected to the top of a subpixel electrode contact portion 192.

Figure 24J:
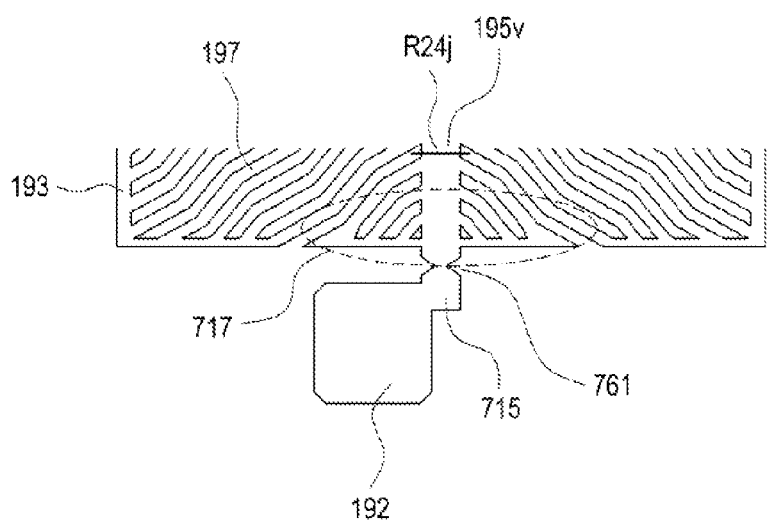
Figure 24K:
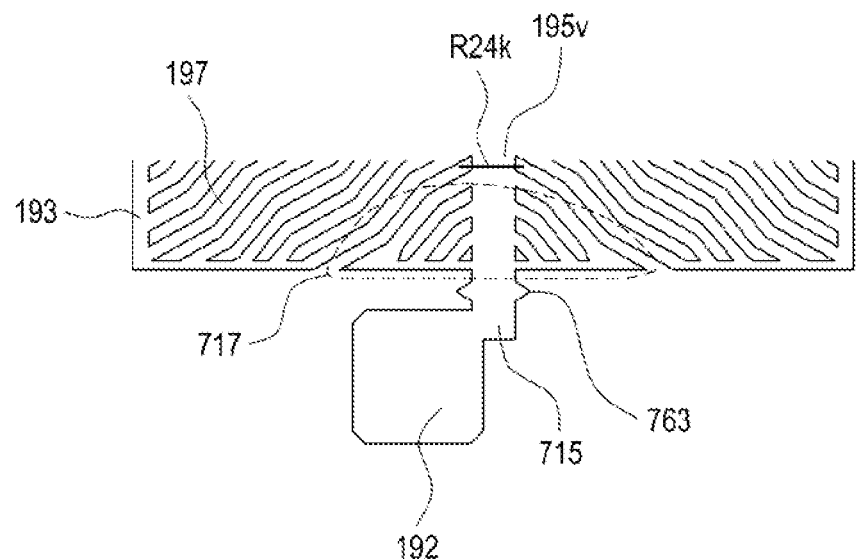
Figure 24L:
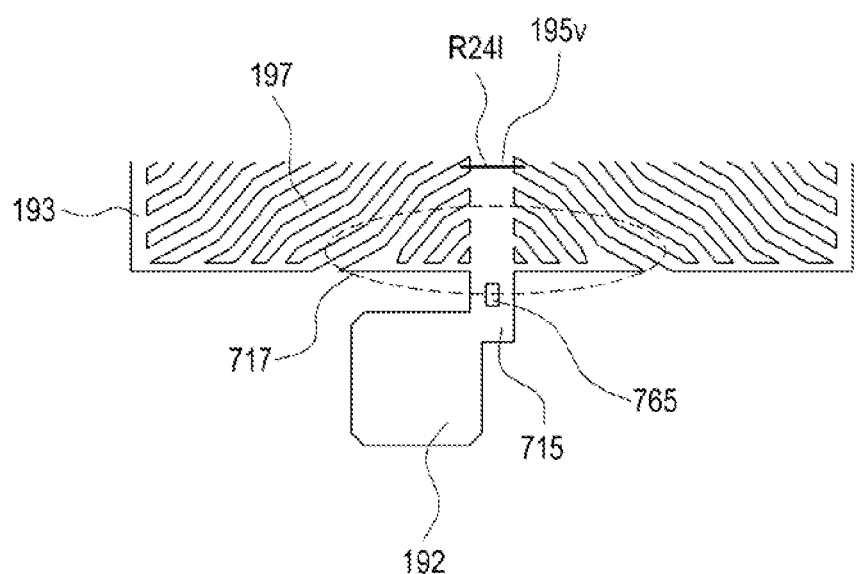
Figure 24M:
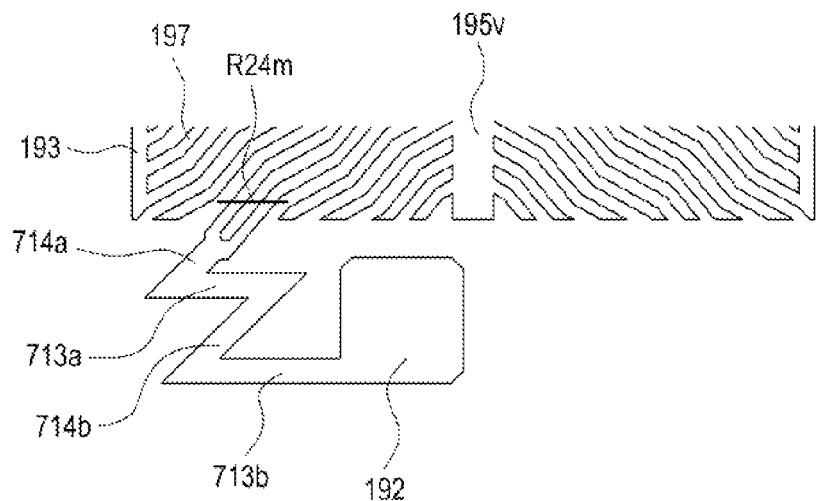

Referring to FIGS. 24J, 24K and 24L, a pixel electrode junction connection portion includes, for example, a pixel electrode's vertical connection portion 715 and a pixel electrode connection portion 717. The pixel electrode connection portion 717 is connected to a subpixel electrode contact portion 192 by, for example, the pixel electrode's vertical connection portion 715. The pixel electrode's vertical connection portion 715 illustrated in FIGS. 24J and 24K may have, for example, a notch shape. The vertical connection portion 715 illustrated in FIG. 24J has, for example, concave notches 761, a depth of which may fall within a range of about 2.0 µm to about 5 µm. A wiring of the vertical connection portion 715 illustrated in FIG. 24K has, for example, convex notches 763, a height of which may fall within a range of about 2.0 µm to about 5 µm. The pixel electrode's vertical connection portion 715 illustrated in FIG. 24L has, for example, a groove 765 formed therein, and this groove may serve as a singular point.

Referring to FIGS. 24M to 24Q, a pixel electrode junction connection portion has, for example, a Z-shaped wiring to disperse an electric field. The Z-shaped wiring includes, for example, first and second pixel electrode's horizontal connection portions 713a and 713b, and a second pixel electrode's oblique connection portion 714b. The first pixel electrode's horizontal connection portion 713a may, for example, overlap a drain electrode line of a TFT, and the second pixel electrode's horizontal connection portion 713b may overlap a drain electrode and a source electrode of the TFT. The horizontal connection portion 713b of, for example, the Z shape is connected to the bottom of a subpixel electrode contact portion 192. A first pixel electrode's oblique connection portion 714a illustrated in FIGS. 24M to 24O has, for example, a bifurcated shape having at least two micro branches extending from micro branches 197 at the left bottom of a domain to the left of a cross-shaped branch's vertical portion 195v, and is slanted with respect to the first pixel electrode's horizontal connection portion 713a. The second pixel electrode's oblique connection portion 714b connects the first and second pixel electrode's horizontal connection portions 713a and 713b extending in the horizontal direction, to the first pixel electrode's oblique connection portion 714a substantially in parallel, and the second pixel electrode's horizontal connection portion 713b is connected to the bottom of the subpixel electrode contact portion 192.

Figure 24N:
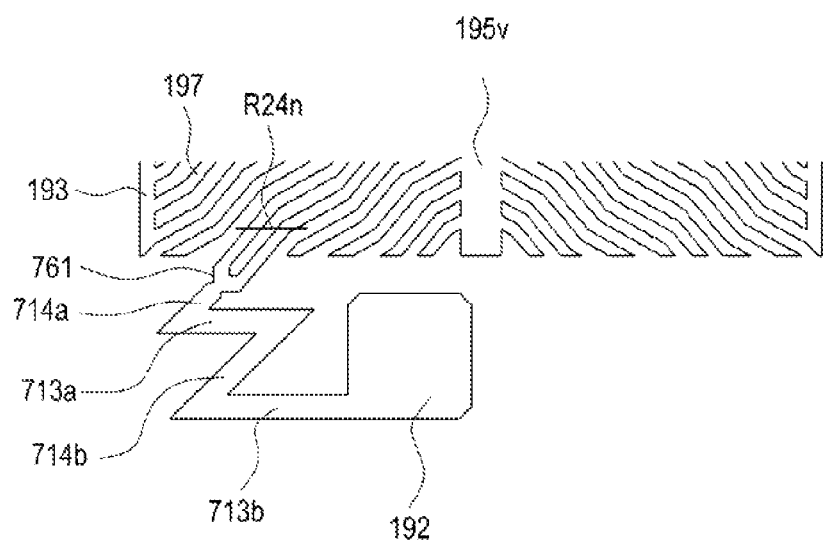
Figure 24O:
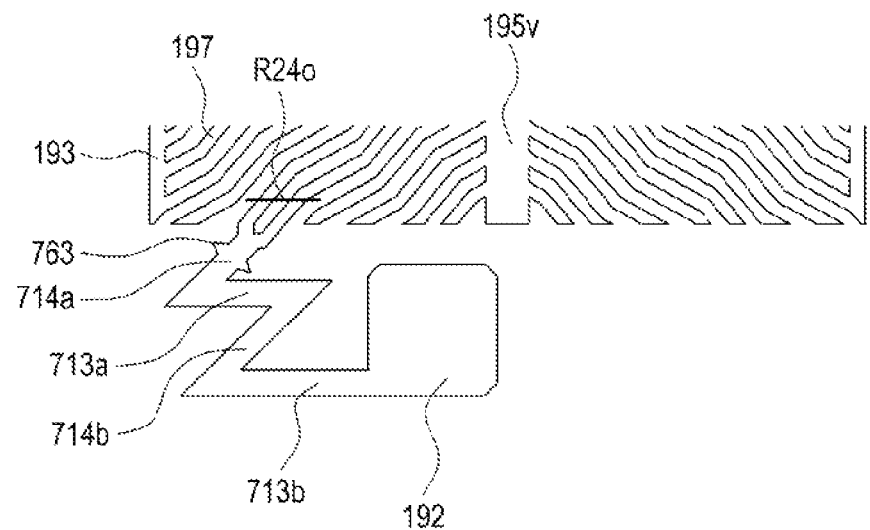
Figure 24P:
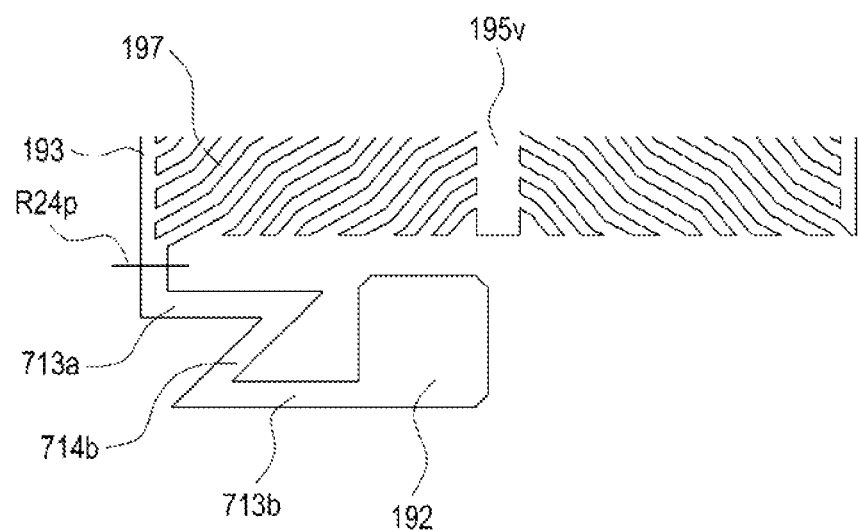
Figure 24Q:
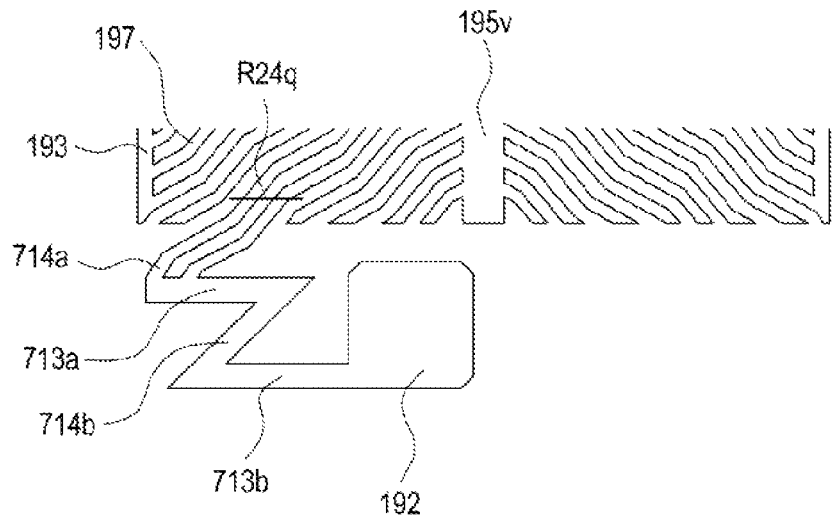

The first pixel electrode's oblique connection portion 714a illustrated in FIG. 24N has, for example, a concave notch 761. The first pixel electrode's oblique connection portion 714a illustrated in FIG. 24O has, for example, a convex notch 763. A size of the notches may be the same as those just described above. A Z-shaped wiring illustrated in FIG. 24P is similar to the above-described ones of FIGS. 24M to 24O except that it has a first pixel electrode's horizontal connection portion 713a extending to and connecting with a pixel electrode's vertical connection portion 193 to which micro branches 197 are connected. A Z-shaped wiring illustrated in FIG. 24Q is similar to the above-described ones of FIGS. 24M to 24O except, for example, that a plurality of branches of a first pixel electrode's oblique connection portion 714a, extending from the left bottom of a domain to the left of a cross-shaped branch's vertical portion 195v, are connected to a first pixel electrode's horizontal connection portion 713a.

Figure 24R:
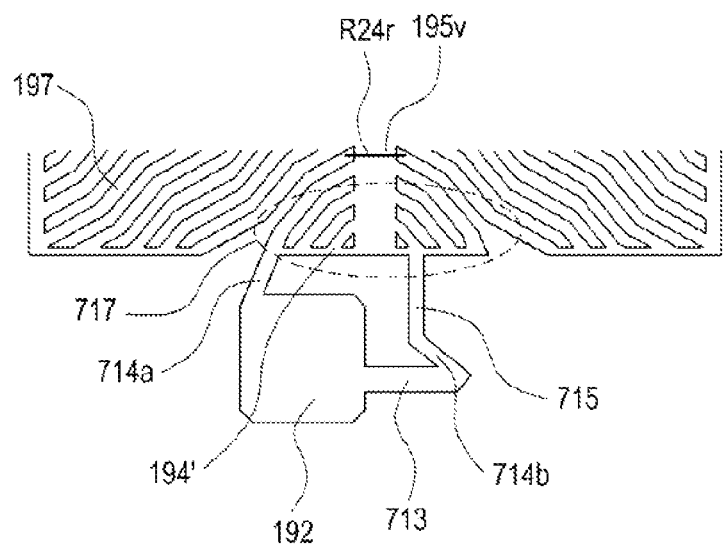

Referring to FIG. 24R, a pixel electrode junction connection portion includes, for example, a pixel electrode's horizontal connection portion 713, first and second pixel electrode's oblique connection portions 714a and 714b, a pixel electrode's vertical connection portion 715, and a pixel electrode connection portion 717. The pixel electrode connection portion 717 has, for example, the above-described hanger shape. One end of a second horizontal connection portion 194' of the pixel electrode connection portion 717 is, for example, obliquely connected to one end of a subpixel electrode contact portion 192 by the first pixel electrode's oblique connection portion 714a, and another portion of the second horizontal connection portion 194' is connected to the right bottom of the subpixel electrode contact portion 192 through the pixel electrode's vertical connection portion 715, the second pixel electrode's oblique connection portion 714b, and the pixel electrode's horizontal connection portion 713. An angle made between the pixel electrode's horizontal connection portion 713 and the second pixel electrode's oblique connection portion 714b may fall within a range of, for example, about 30° to about 60°.

Figure 24S:
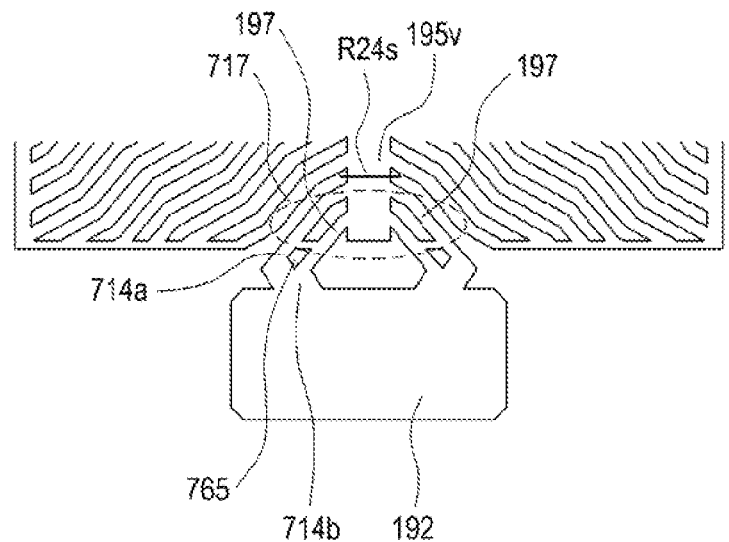
Figure 24T:
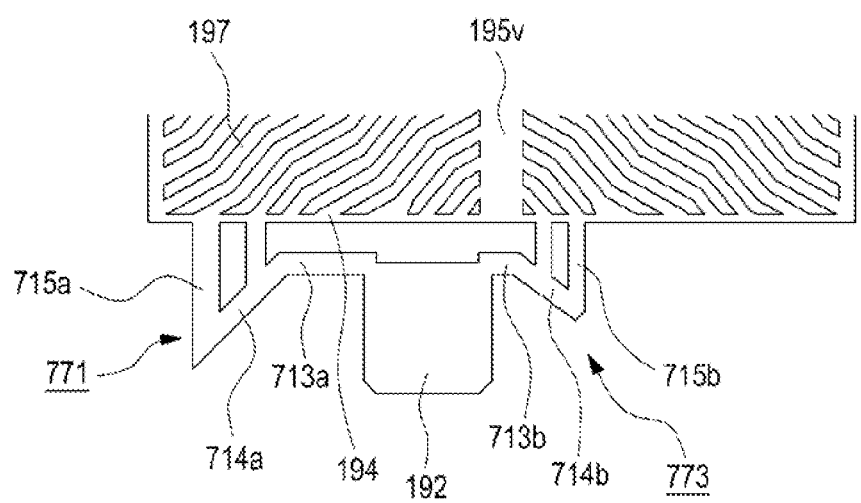

Referring to FIG. 24S, a pixel electrode junction connection portion includes, for example, first and second pixel electrode's oblique connection portions 714a and 714b, and a pixel electrode connection portion 717. The pixel electrode connection portion 717 includes, for example, a plurality of micro branches 197 which are symmetrical about a cross-shaped branch's vertical portion 195v. The first pixel electrode's oblique connection portion 714a is connected to a plurality of the micro branches 197 and to the second pixel electrode's oblique connection portion 714b which is obliquely connected to the top of a subpixel electrode contact portion 192. The first and second pixel electrode's oblique connection portions 714a and 714b are connected, for example, at a right angle, and a groove 765 may be formed in the first pixel electrode's oblique connection portion 714a. The pixel electrode's oblique connection portions 714a and 714b are, for example, symmetrical about the cross-shaped branch's vertical portion 195v.

Referring to FIG. 24T, a pixel electrode junction connection portion includes, for example, first and second pixel electrode junction connection portions 771 and 773. The first pixel electrode junction connection portion 771 includes, for example, a first pixel electrode's horizontal connection portion 713a, a first pixel electrode's oblique connection portion 714a, and a first pixel electrode's vertical connection portion 715a. The first pixel electrode's vertical connection portion 715a connects, for example, a pixel electrode's horizontal connection portion 194 formed at the left bottom of a domain to the left of a cross-shaped branch's vertical portion 195v, to the first pixel electrode's oblique connection portion 714a. The first pixel electrode's vertical connection portion 715a may include, for example, two branches. The first pixel electrode's oblique connection portion 714a may be, for example, substantially similar in tilt angle to micro branches 197 formed on the pixel electrode. The first pixel electrode's oblique connection portion 714a may be, for example, slanted with respect to the first pixel electrode's vertical connection portion 715a at an angle falling within a range of about 30° to about 60°. The first pixel electrode's horizontal connection portion 713a connects the first pixel electrode's oblique connection portion 714a to the top of a subpixel electrode contact portion 192. The second pixel electrode junction connection portion 773 includes, for example, a second pixel electrode's horizontal connection portion 713b, a second pixel electrode's oblique connection portion 714b, and a second pixel electrode's vertical connection portion 715b. The second pixel electrode's vertical connection portion 715b connects a pixel electrode's horizontal connection portion 194 formed at the right bottom domain of the cross-shaped branch's vertical portion 195v adjacent to the domain to which the first pixel electrode junction connection portion 771 is connected, to the second pixel electrode's oblique connection portion 714b. The second pixel electrode's vertical connection portion 715b may have, for example, two branches. The second pixel electrode's oblique connection portion 714b may be substantially similar in tilt angle to the micro branches 197 formed on the pixel electrode. The second pixel electrode's oblique connection portion 714b may be, for example, slanted with respect to the second pixel electrode's vertical connection portion 715b at an angle falling within a range of about 30° to about 60°. The second pixel electrode's horizontal connection portion 713b connects the second pixel electrode's oblique connection portion 714b to the top of the subpixel electrode contact portion 192. The pixel electrode junction connection portion formed in this manner can increase the liquid crystal molecule's unrestoration and light leakage defects.

In an exemplary embodiment of the present invention that can increase the unrestoration of liquid crystal molecules, an electric field formed in a domain region and an electric field formed in a non-domain region may be, for example, substantially symmetrical about a straight light that is perpendicular to lower and upper display panels. The domain region may be a region in which micro branches 197 are formed, in the region A19 illustrated in FIG. 19A, and the non-domain region may be a region in which micro branches 197 are not formed, or a region in which a light blocking member 220 is formed. A tilt direction of an alignment film, made between the domain region and the non-domain region, may be, for example, substantially perpendicular to the direction of liquid crystal molecules, formed in the domain region.

Figure 25:
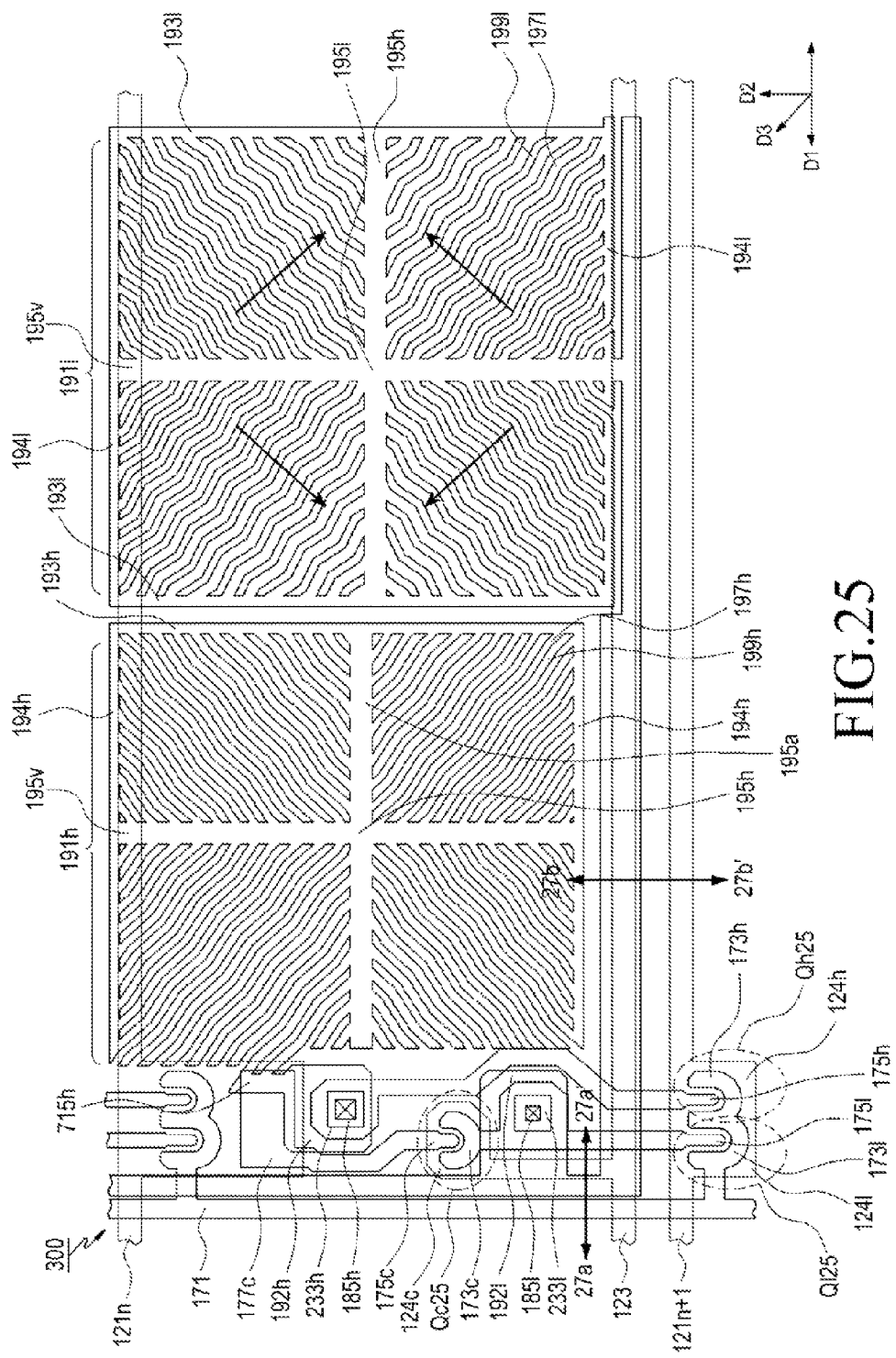
FIG. 25 illustrates a schematic layout of one pixel according to an exemplary embodiment of the present invention.
Figure 26A:
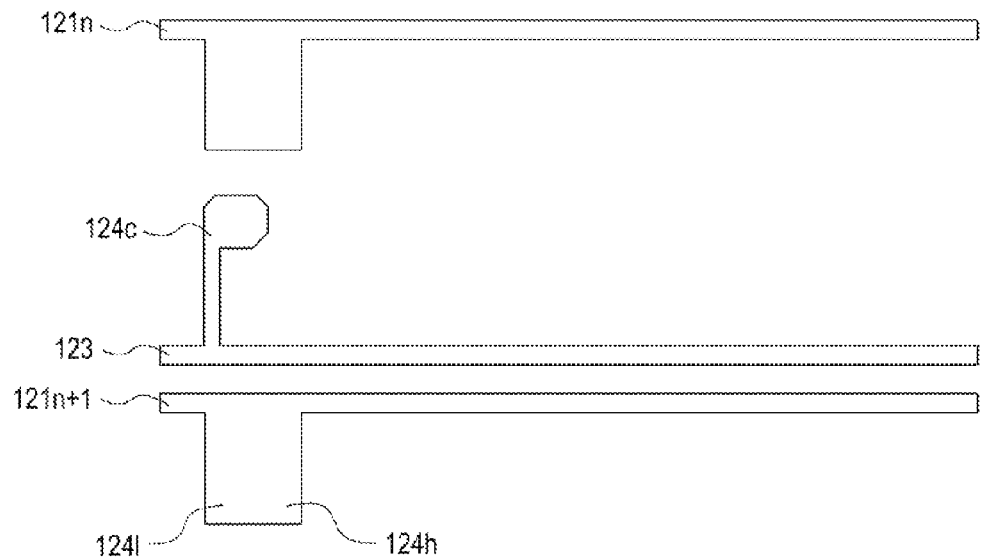
Figure 26B:
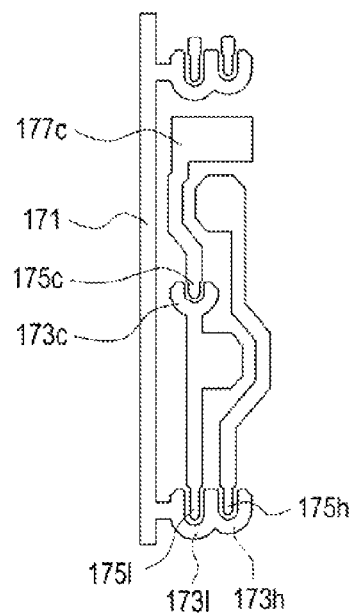
Figure 26C:
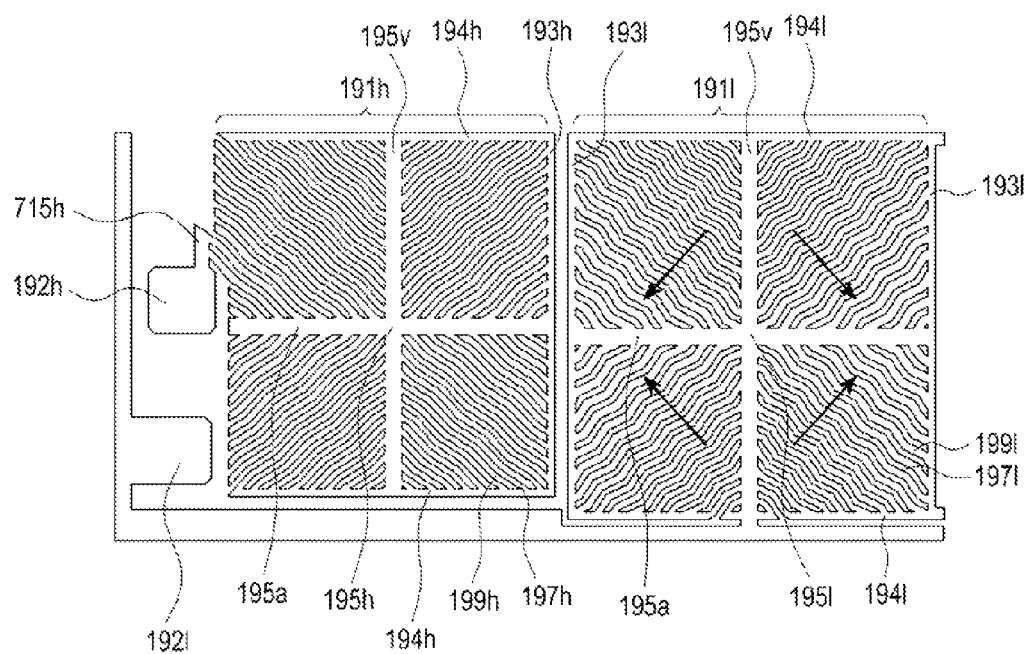
Figure 27A:
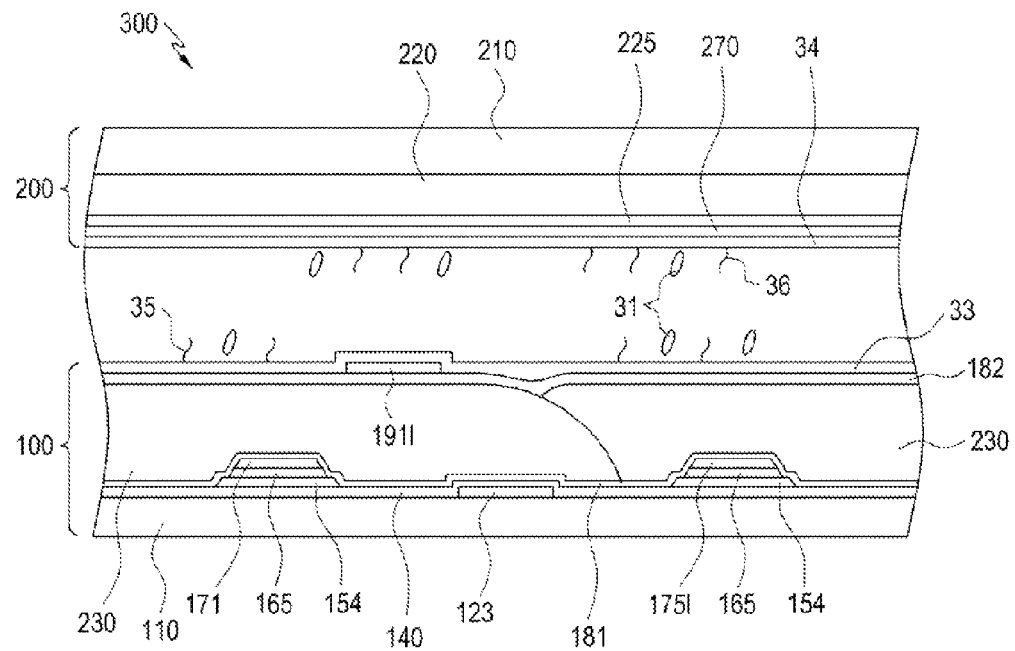
FIGS. 27A and 27B are cross-sectional views taken along lines 27a-27a' and 27b-27b' of the pixel shown in FIG. 25, respectively.
Figure 27B:
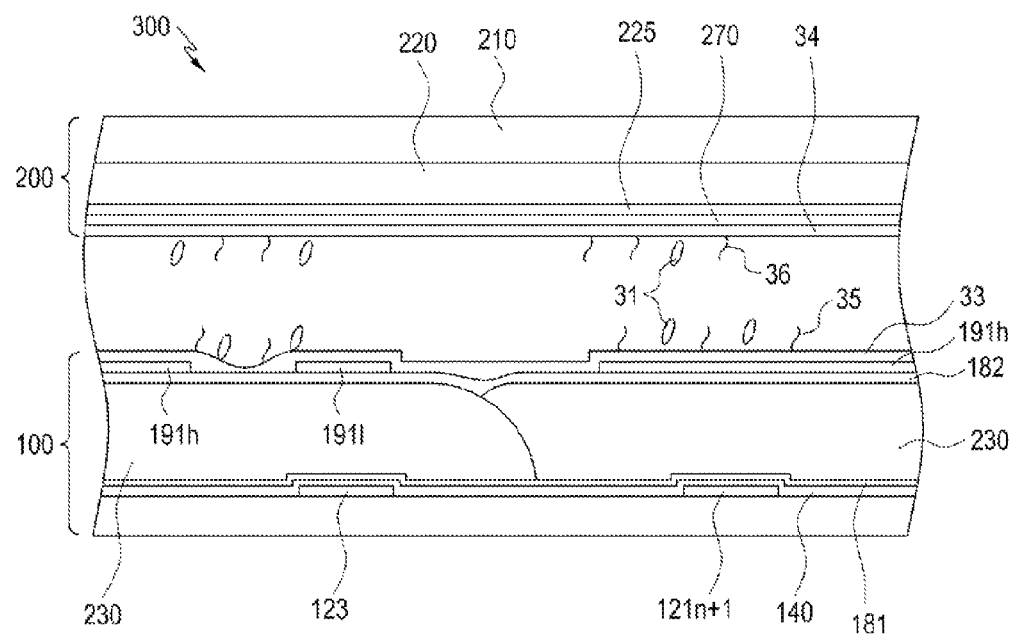

A liquid crystal display panel assembly 300 according to an exemplary embodiment of the present invention will be described in detail below with reference to FIGS. 25 to 27B. In the liquid crystal display panel assembly 300, gate lines are arranged in parallel to longer sides of a unit pixel electrode according to an exemplary embodiment of the present invention, to reduce the number of drive Integrated Circuits (ICs) constituting a data driver 500. By doing so, the liquid crystal display panel assembly 300 configured in this manner and the rest thereof having any of the above-described liquid crystal display panel assemblies' structures and pixel electrode layers' patterns, makes it possible to further increase the display quality of the liquid crystal display device and reduce the manufacturing cost. FIG. 25 is a diagram illustrating a schematic layout of a pixel of a liquid crystal display panel assembly 300 according to an exemplary embodiment of the present invention. To express a pixel structure in brief, patterns of a gate layer conductor, a data layer conductor, contact holes 185, and a pixel electrode layer are selectively arranged in the layout of the pixel illustrated in FIG. 25. FIGS. 26A to 26C illustrate patterns for major layers of the pixel structure illustrated in FIG. 25. Specifically, FIGS. 26A to 26C illustrate a gate layer conductor pattern, a data layer conductor pattern, and a pixel electrode layer pattern including a pixel electrode in the pixel layout illustrated in FIG. 25, respectively. FIGS. 27A and 27B are cross-sectional views taken along lines 27a-27a' and 27b-27b' of the pixel layout illustrated in FIG. 25, respectively. The cross-sectional views illustrated in FIGS. 27A and 27B additionally show several layers omitted in FIG. 25. In the cross-sectional views of the liquid crystal display panel assembly 300, illustrated in FIGS. 27A and 27B, cross sections along the directions 27a and 27b are cross sections taken along the cutting-plane lines shown in FIG. 25 when the pixel structure of FIG. 25 is arranged in the form of a matrix consisting of rows and columns. In the following description made with reference to FIGS. 25 to 27B, as the stacking order for lower and upper display panels 100 and 200 has been described with reference to FIGS. 3 to 4C, a detailed description thereof is omitted. In addition, a duplicate description for similar elements made in connection with FIGS. 3 to 4C and 18 to 21B will be omitted.

A layout of lower and upper display panels 100 and 200 of a liquid crystal display panel assembly 300 will be described in detail below with reference to FIGS. 25 to 27B. A gate layer conductor is formed on a lower substrate 110, and includes, for example, a plurality of gate lines 121n and 121n+1, a down gate line 123, and a plurality of gate electrodes 124h, 124l, and 124c. A data layer conductor is formed on a linear ohmic contact member 165, and includes, for example, a data line 171, a first source electrode 173h, a second source electrode 173l, a third source electrode 173c, a first drain electrode 175h, a second drain electrode 175l, a third drain electrode 175c, and a third drain electrode's extension portion 177c. A pixel electrode layer is formed on a second protection layer 182, and includes, for example, first and second subpixel electrodes 191h and 191l, first and second subpixel electrode contact portions 192h and 192l, vertical connection portions 193h and 193l, horizontal connection portions 194h and 194l, cross-shaped branch portions 195h and 195l, micro branches 197h and 197l, first and second pixel electrode's vertical connection portions 715h and 715l (not shown), and an outgassing hole cover 187 (not shown).

The first and second subpixel electrodes 191h and 191l receive data voltages from the data line 171 through TFTs Qh25 and Ql25 connected to an (n+1)-th gate line 121n+1.

The first subpixel electrode 191h receives a pixel or gray level voltage from the first subpixel electrode contact portion 192h by means of the shape of the pixel electrode junction connection portion illustrated in FIG. 23B. The second subpixel electrode 191l is connected to the second subpixel electrode contact portion 192l and receives a pixel or gray level voltage by means of a wiring or a line extending in the direction of the down gate line 123. A wiring connecting the second subpixel electrode 191l to the second subpixel electrode contact portion 192l, may cover the down gate line 123 on the whole, and may extend in the direction of the data line 171. The upper horizontal connection portions 194h and 194l of the first and second subpixel electrodes 191h and 191l, for example, overlap an n-th gate line 121n, while the lower horizontal connection portion 194l of the second subpixel electrode 191l overlaps the down gate line 123. Gate electrodes 124h and 124l constituting first and second TFTs Qh25 and Ql25 extend in the direction of the data line 171, overlapping the third drain electrode's extension portion 177c. The first and second subpixel electrodes 191h and 191l are adjacent to each other, and micro branches 197h and 197l, and micro slits 199h and 199l formed on these electrodes have, for example, a zigzag shape. Widths of micro branches 197h and micro slits 199h formed on the first subpixel electrode 191h may fall within a range of, for example, about 5 μm to about 6 μm, and the widths may gradually change from about 5 μm to about 6 μm. Unit lengths of zigzag micro branches 197 or micro slits 199 may be, for example, about 14 μm. For example, main directions of micro branches 197 or micro slits 199 may be about ±40° with respect to a direction of a cross-shaped branch 195, and zigzag angles thereof may also be about ±7°. Widths of micro branches 197l and micro slits 199l formed on the second subpixel electrode 191l may fall within a range of, for example, about 5 μm to about 7 μm. In accordance with an exemplary embodiment of the present invention, widths of micro slits 199l may be uniform, while widths of micro branches 197l may gradually increase by, for example, about 5 μm to about 7 μm along the arrow shown in FIGS. 25 and 26C. On the other hand, widths of micro slits 199l may gradually increase along the arrow. Unit lengths of zigzag micro branches 197 or micro slits 199 may be, for example, about 10 μm. Main directions of micro branches 197 or micro slits 199 may be, for example, about ±45° with respect to the direction of the cross-shaped branch 195, and zigzag angles thereof may be, for example, about ±15°.

Referring to FIGS. 27A and 27B, a light blocking member 220 formed on the upper display panel 200 is formed, for example, between pixels, and overlaps the down gate line 123 and the gate line 121. For example, one end of the light blocking member 220 substantially meets with one end of the down gate line 123 adjacent to the pixel electrode, and another end thereof substantially meets with an end of the gate line 121 adjacent to the pixel electrode. In the pixel structure formed in this way, unlike in the pixel structure illustrated in FIGS. 3 and 18, a longer side of the pixel electrode is formed in parallel to the gate line 121 according to an exemplary embodiment of the present invention. In other words, a gate line 121 along one side of a pixel electrode is long, while its associated data line 171, which is along the perpendicular side of the pixel electrode, is short. Therefore, a liquid crystal display device having this pixel structure may operate with a less number of data drive ICs, for example, with about ⅓ of the number of data drive ICs constituting part of a conventional liquid crystal display device, thereby reducing its manufacturing cost and improving its display quality.

Figure 32:
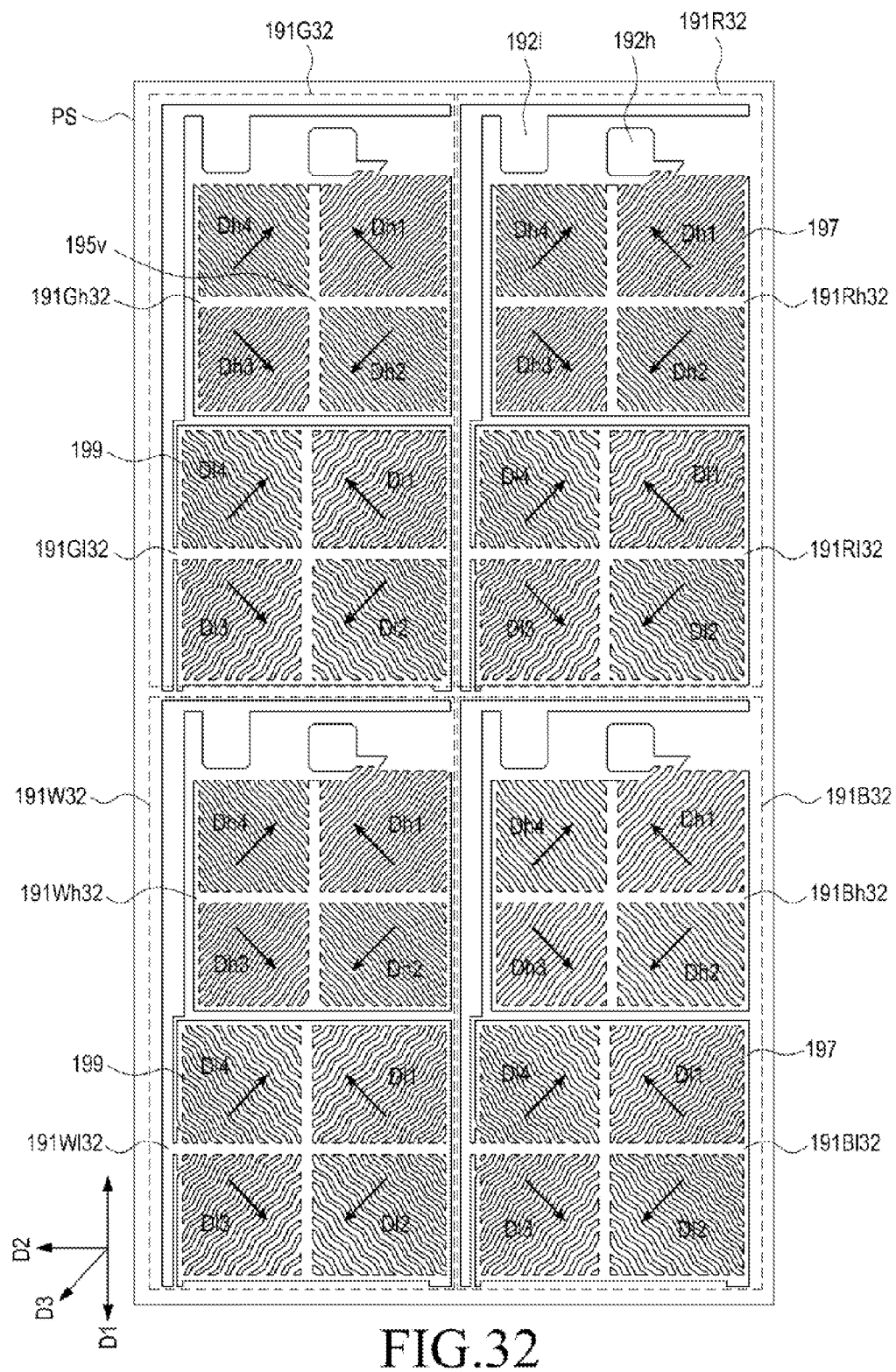
FIG. 32 is a plan view of pixel electrodes in a basic pixel group of a liquid crystal display device according to an exemplary embodiment of the present invention.

In accordance with another exemplary embodiment of the present invention, color filters of primary colors, formed in a basic pixel group, may be repeatedly and periodically formed in the direction of the data line 171. In other words, a group of color filters consisting of primary colors may be repeatedly and consecutively arranged in the direction of the data line 171. On the other hand, four different colors may be arranged in a basic pixel group as illustrated in FIG. 32. A structure of the basic pixel group illustrated in FIG. 32 will be described below.

Modes of Liquid Crystal Display Panel Assembly

Figure 6A:
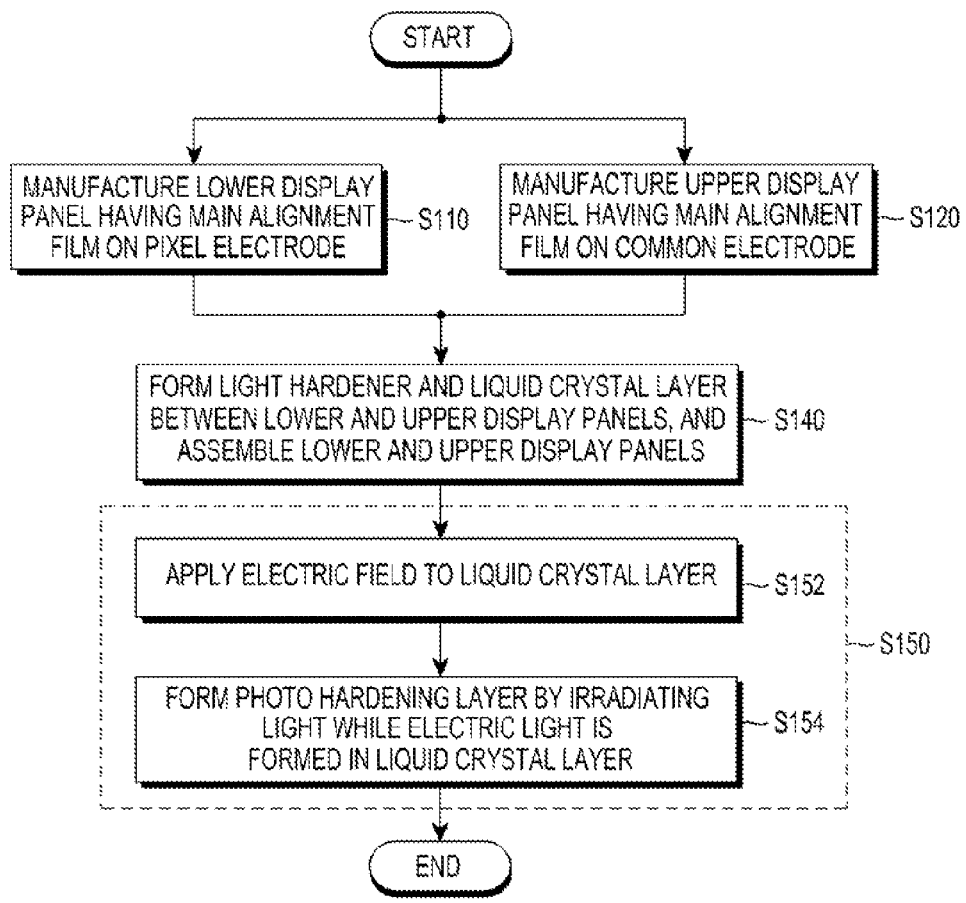
FIG. 6A is a flowchart illustrating a method for manufacturing a liquid crystal display panel assembly based on the SVA mode using lower and upper display panels manufactured in accordance with FIGS. 1 to 5B.
Figure 6B:
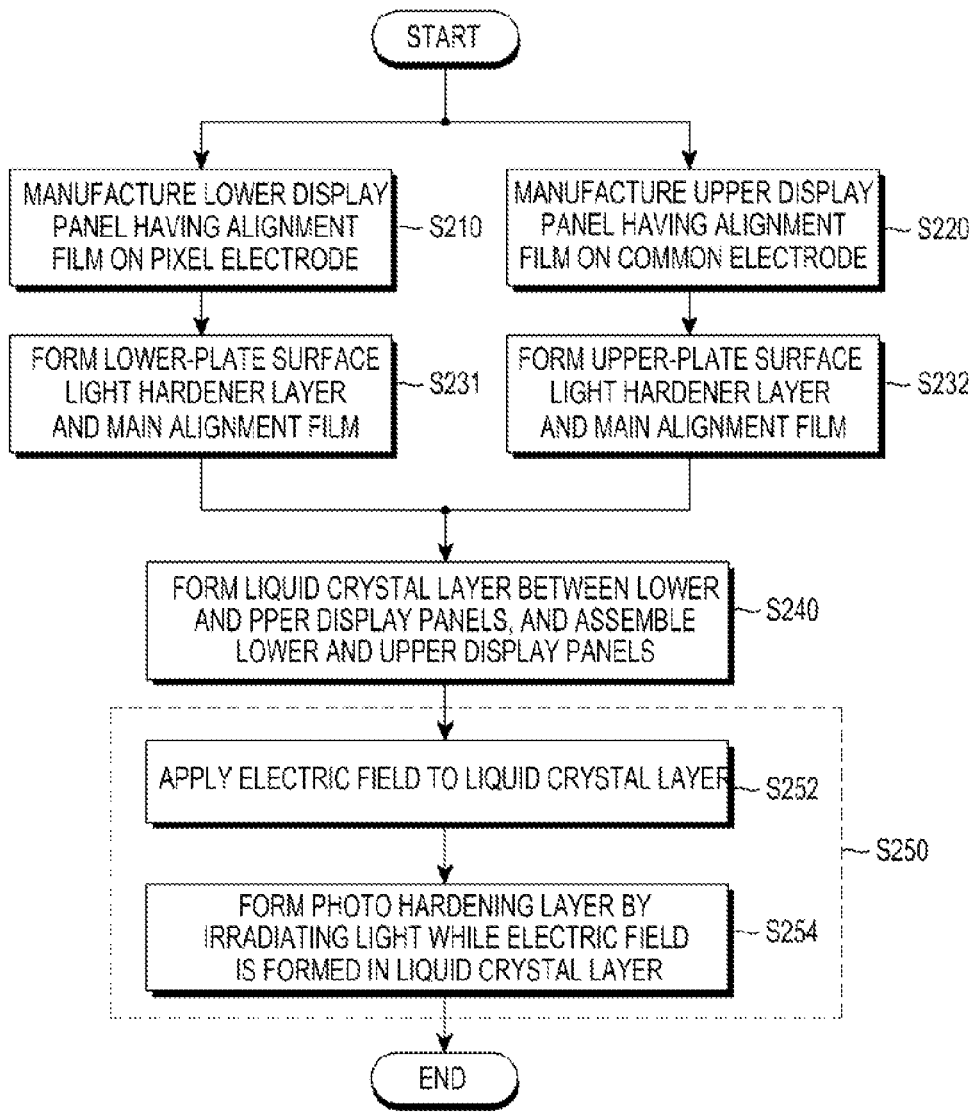
FIG. 6B is a flowchart illustrating a method for manufacturing a liquid crystal display panel assembly based on a Surface-Controlled Vertical Alignment (SC-VA) mode using lower and upper display panels manufactured in accordance with FIGS. 1 to 5B.
Figure 6C:
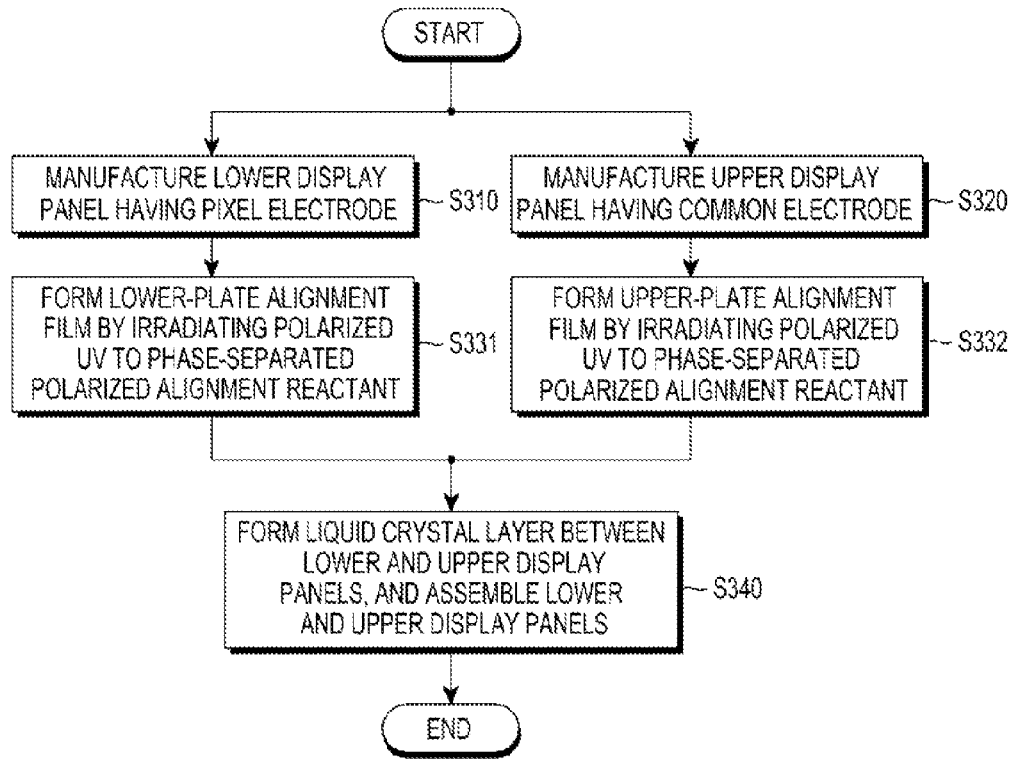
FIG. 6C is a flowchart illustrating a method for manufacturing a liquid crystal display panel assembly based on a polarized Ultra-Violet Vertical-Alignment (UV-VA) mode using lower and upper display panels manufactured in accordance with FIGS. 1 to 5B.

The liquid crystal display panel assembly 300, which can be manufactured in various ways using the display panels 100 and 200 manufactured by the above-described methods, will be described in detail below. FIGS. 6A, 6B and 6C are schematic flowcharts illustrating methods, according to exemplary embodiments of the present invention, for manufacturing the liquid crystal display panel assembly 300 based on a Super Vertical Alignment (SVA) mode, a Surface-Controlled Vertical Alignment (SC-VA) mode, and a polarized Ultra-Violet Vertical-Alignment (UV-VA) mode, respectively, using the lower and upper display panels 100 and 200 manufactured in accordance with FIGS. 1 to 5B. A process of forming the lower-plate alignment film 291 and a process of forming the upper-plate alignment film 292 is substantially the same in each of the modes. Therefore, to avoid duplicate descriptions, the process of forming the lower-plate alignment film 291 will be described in detail below.

SVA Mode

First, a method for manufacturing the liquid crystal display panel assembly 300 based on the SVA mode will be described in detail with reference to FIG. 6A. In first steps S110 and S120, the lower display panel 100 with the pixel electrode 191 and the upper display panel 200 with the common electrode 270 are manufactured using the methods described in conjunction with FIGS. 1 to 5B, respectively. A main alignment material (not shown) is applied onto the pixel electrode 191 and the common electrode 270 by, for example, inkjet or roll printing. The main alignment material is formed on inner regions of the lower and upper display panels 100 and 200, and may, for example, be partially applied onto outer regions of the lower and upper display panels 100 and 200. The outer region of the lower display panel 100 is a region where pixels are not formed, to which a data voltage is applied, and the inner region thereof is a region where pixels are formed, to which a data voltage is applied. The outer and inner regions of the upper display panel 200 are regions corresponding to the outer and inner regions of the lower display panel 100, respectively, when the lower and upper display panels 100 and 200 are assembled. The outer region may include circuit elements that generate or transfer signals applying voltages to pixel electrodes. In accordance with an exemplary embodiment of the present invention, a main alignment material may be applied, for example, to make a direct contact with a spacer, color filters or an insulating layer in some regions.

According to an exemplary embodiment of the present invention, main alignment materials can include, for example, light absorbents bonded to the side chain, for example, a photo-sensitizer. As the photo-sensitizer included in the main alignment materials absorbs the UV with a wavelength of, for example, about 300 nm to about 400 nm in the process that will be described hereinafter with reference to step S154, a lower layer of the main alignment materials, for example, an insulating layer of organic materials, is not damaged by a ray of light incident thereon. A photo-sensitizer may be, for example, a 2-hydroxyphenyl 2H-benzotriazole derivative. The UV with a wavelength of about 300 nm to about 400 nm may be readily absorbed by hydrogen-bonding of nitrogen atoms in benzotriazole group at ortho position with hydroxyl group of benzene ring which constitutes 2-hydroxyphenyl 2H-benzotriazole derivative. A 2-hydroxyphenyl 2H-benzotriazole derivative may be, for example, 2,4-[di(2H-benzotriazole-2-yl)]-1,3-dihydroxybenzene or 2,4-[di(2H-benzotriazole-2-yl)]-1,3,5-trihydroxy benzene. The structure of 2-hydroxyphenyl 2H-benzotriazole derivative may be, for example, any one of the following formulas: PS-B1 to PS-B7.

Formula PS-B1
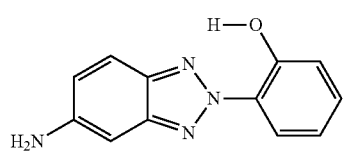

Formula PS-B2
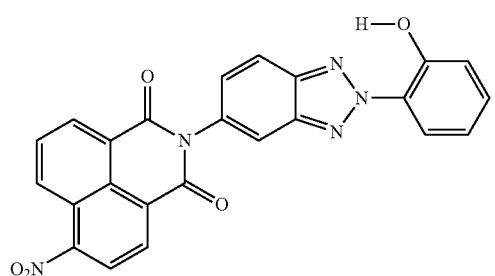

Formula PS-B3
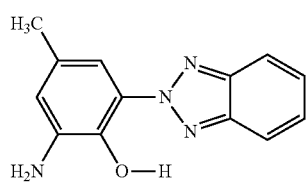

Formula PS-B4
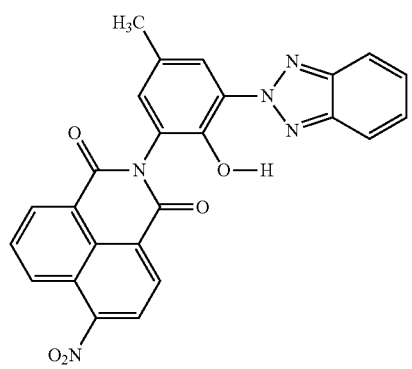

Formula PS-B5
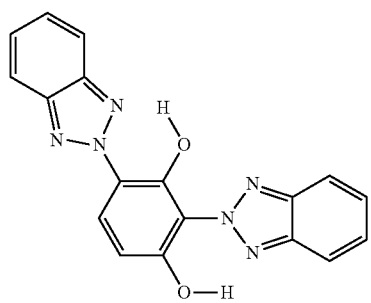

Formula PS-B6
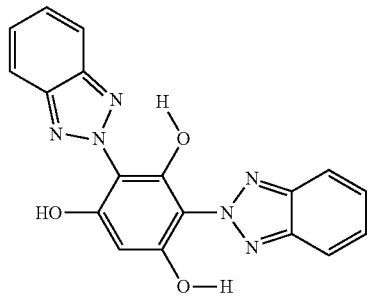

Formula PS-B7
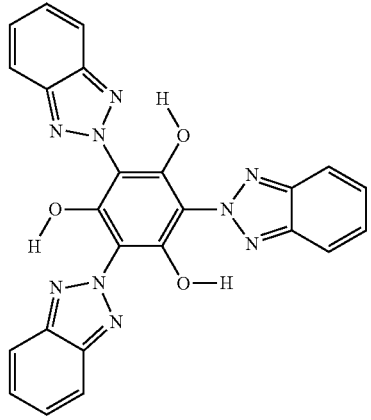

A photo-sensitizer may include, for example, the following formulas PS-A1 and PS-A2 having an amino functional group. As the side chain which can be polyimidated is formed by an amino group included in the photo-sensitizer, the photo-sensitizer having an amino group can reduce the drawback of a low molecular weight photo-sensitizer. The low molecular weight photo-sensitizer is included in the main alignment materials as a component, and thus gas can be generated during the process, causing a decrease in the coating uniformity of the main alignment materials.

Formula PS-A1
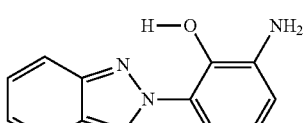

Formula PS-A2
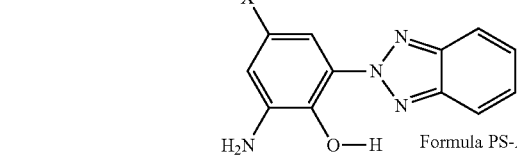

where X may be H, O or (CH2)n, where n is an integer of 1 to 10. In addition, R1 to R5 may be hydrogen or alkyl group.

The main alignment materials including a photo-absorbent according to the exemplary embodiments of the present invention can be represented by, for example, the following formula PI-A1, and can be manufactured as follows. A mixture of, for example, 20 moles of TCAAH (2,3,5-tricarboxy-cyclopentyl acetic dianhydride), 12 moles of p-phenyl diamine, 2 mole of cholestric diamine and 2 mole of 2-hydroxybenzotriazole diamine (formula PS-A1) is admixed with DMAc (N,N-dimethyl acetamide) solvent under nitrogen atmosphere at the room temperature to 100° C. for 48 hours. The resultant stirred intermediate product is, for example, admixed with ethanol with a purity of about 95% or more to obtain the precipitated polyamic acid. Then, main alignment materials having the following formula PI-A1 can be prepared by, for example, mixing about 4 wt % to about 10 wt % of polyamic acid, about 0.1 wt % to about 40 wt % of heat-hardener and about 80 wt % to about 95 wt % of solvent. The heat-hardener may be, for example, a low molecular weight compound of series of epoxy, and the solvent may be a mixed one having the ratio of about 4:about 3:about 3 of butyl lacton, NVP (N-vinylpyrrolidone) and butyl cellulose.

Formula PI-A1

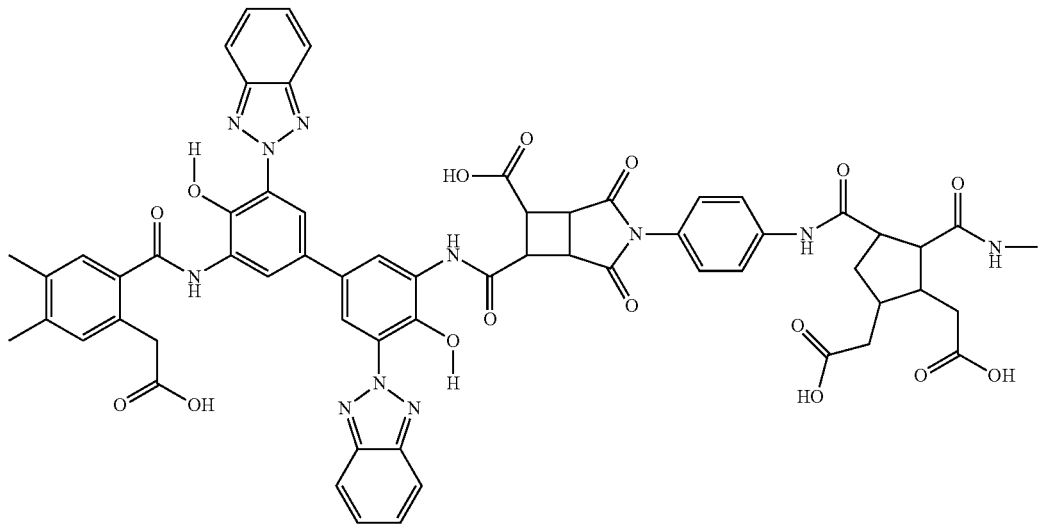

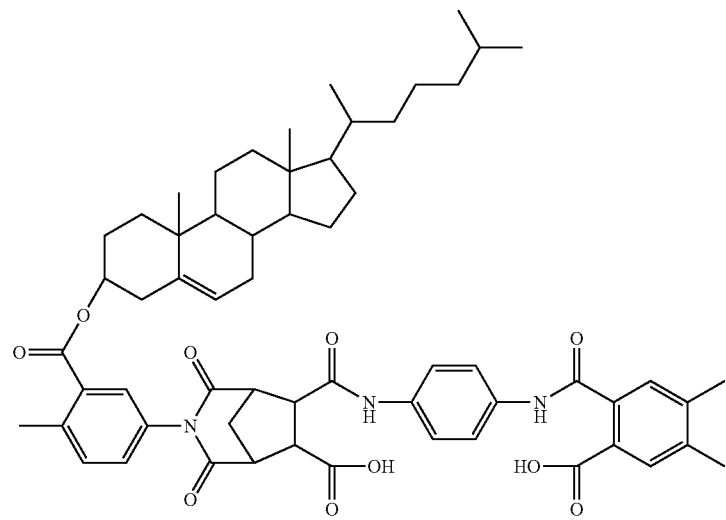

The main alignment materials are hardened by the below-describe process, for example, using light or heat to be a main alignment film 33. It can be easily understood by those skilled in the art that main alignment materials according to other exemplary embodiments of the present invention may be one of materials which can be generally used in VA mode or TN mode.

In step S140 after steps S110, S120, a liquid crystal layer 3 which includes liquid crystal molecules 31 and a photo-hardener (not shown) is formed between an alignment film 292 of an upper display panel 200 and main alignment films 34 and 33 of a lower display panel 100, and the lower and upper display panels 100 and 200 are sealed by a sealant to be assembled. A below-described upper-plate common voltage applying point (not shown) may be formed between the lower and upper display panels 100 and 200. A sealant is hardened by, for example, heat-hardening, visible light or UV. A light hardener is, for example, about 1.0 wt % or less, with respect to the liquid crystal layer 3. For example, the light hardener may be about 0.5 wt % or less, with respect to the liquid crystal layer 3.

According to an exemplary embodiment of the present invention, liquid crystal molecules constituting the liquid crystal layer 3 may be a mixture having monomers which is comprised of, for example, three benzene rings pursuant to the characteristics of the present invention. LC-A monomer constituting the mixture may be, for example, about 19 wt % to about 29 wt % (e.g., about 24 wt %), LC-B monomer may be about 2 wt % to about 8 wt % (e.g., about 5 wt %), LC-C monomer may be about 1 wt % to about 5 wt % (e.g., about 3 wt %), LC-D monomer may be about 19 wt % to about 29 wt % (e.g, about 24 wt %), LC-E monomer may be about 23 wt % to about 33 wt % (e.g., about 28 wt %), LC-F monomer may be about 5 wt % to about 11 wt % (e.g., about 8 wt %), and LC-G monomer may be about 5 wt % to about 11 wt % (e.g. about 8 wt %). The structural formula of LC-A monomer is, for example,

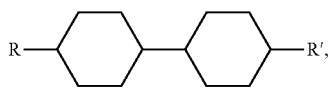

the structural formula of LC-B monomer is, for example,

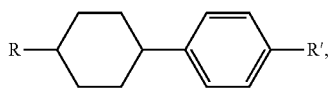

the structural formula of LC-C monomer is, for example,

the structural formula of LC-D monomer is, for example,

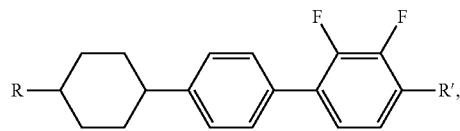

the structural formula of LC-E monomer is, for example,

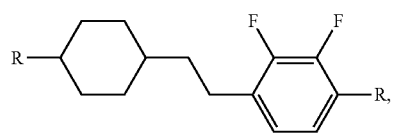

the structural formula of LC-F monomer is, for example,

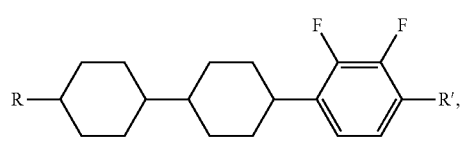

and the structural formula of LC-G monomer is, for example,

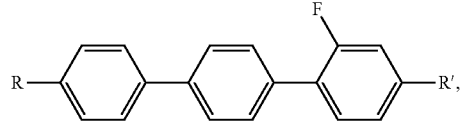

where R and R' may be an alkyl group or an alkoxy group. This mixture may have a rotational viscosity of, for example, about 80 to about 110 mPs*s, a refractive index of, for example, about 0.088 to about 0.1080, a dielectric constant of, for example, about −2.5 to about −3.7 and liquid crystal-line-isotropic phase transition temperature (Tni) of, for example, about 70° C. to about 90° C. The liquid crystal molecules comprised of the above mixtures do not include four benzene rings, and thus have a good restoring force. Therefore, the light-leakage defect which occurs due to the slow restoring of liquid crystal molecules may be reduced. Liquid crystal molecules comprised of this mixture may be applied to below-described SC-VA mode and polarized UV-VA mode.

The light hardener according to an exemplary embodiment of the present invention may be, for example, a reactive mesogen. The term "mesogen" refers to a photo-crosslinkable low-molecular or high-molecular copolymer including a mesogen group of liquid crystalline properties. A reactive mesogen may be comprised of, for example, acrylate, methacrylate, epoxy, oxetane, vinyl-ether, styrene, or thiolene groups and the like, and may be materials included in a reactive mesogen as discussed above for forming an upper alignment film. A reactive mesogen may be a material having a rod-like, banana-like, board-like, or disc-like structure. In addition, the above-described photo-initiator (not shown) may be additionally included in the liquid crystal layer 3. The amount of a photo initiator included in a liquid crystal layer 3 is, for example, about 0.01 wt % to about 1 wt % with respect to the total weight of light hardener. A photo initiator absorbs UV with a long wavelength, and decomposes to produce radicals which promote the photo-polymerization of a photo-hardener. A photo initiator may be materials which absorb the light having a wavelength of, for example, about 300 nm to about 400 nm.

In accordance with an embodiment of the present invention, a novel RM-liquid crystalline mixture in which a reactive mesogen is mixed with liquid crystal molecules, e.g., a ZSM-7160 mixture will be described below. The host liquid crystal molecules which constitute the ZSM-7160 mixture comprise, for example, a dicyclohexyl group monomer and a cyclohexyl-fluorinated terphenyl group monomer or a fluorinated terphenyl group monomer according to the characteristics of the present invention. The ZSM-7160 mixture is a mixture of liquid crystal molecules with a reactive mesogen, and the reactive mesogen may be mixed into the mixture in an amount of, for example, about 0.1 wt % to about 1 wt % (e.g., about 0.2 wt % to about 0.5 wt %) with respect to the total weight of host liquid crystal molecules. For example, the host liquid crystal molecules may comprise a dicyclohexyl group monomer in an amount of about 20 wt % to about 30 wt %, a cyclohexyl-phenylene group monomer in an amount of about 0 wt % to about 10 wt %, a dicyclohexyl-phenylene group monomer in an amount of about 0 wt % to about 10 wt %, a cyclohexyl-phenylene-difluorinated phenylene group monomer in an amount of about 20 wt % to about 30 wt %, a cyclohexyl-ethyl-difluorinated phenylene group monomer in an amount of about 20 wt % to about 30 wt %, a dicyclohexyl-difluorinated phenylene group monomer in an amount of about 5 wt % to about 10 wt %, and a cyclohexyl-fluorinated terphenyl group or fluorinated terphenyl group monomer in an amount of about 0 wt % to about 10 wt %. A percentage by weight (wt %) of respective monomers which constitute host liquid crystal molecules is, for example, a percentage based on the weight of host liquid crystal molecule except for solvent. The refractive index of the host liquid crystal molecule may be, for example, about 0.08 to about 0.13.

The structural formula of a dicyclohexyl group monomer may be, for example, represented by the following formula LC-A1.

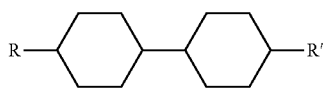

Formula LC-A1

The structural formula of a cyclohexyl-phenylene group monomer may be represented by, for example, the following formula LC-A2.

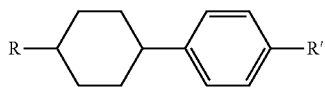

Formula LC-A2

The structural formula of a dicyclohexyl-phenylene group monomer may be represented by, for example, the following formula LC-A3.

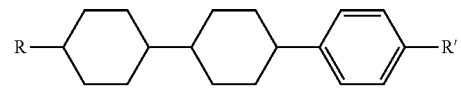

Formula LC-A3

The structural formula of a cyclohexyl-phenylene-difluorinated phenylene group monomer may be represented by, for example, the following formula LC-A4.

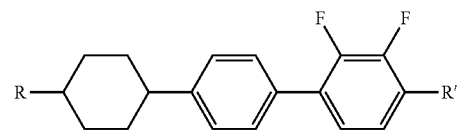

Formula LC-A4

The structural formula of a cyclohexyl-ethyl-difluorinated phenylene group monomer may be represented by, for example, the following formula LC-A5, and adjust the dielectric anisotropy and the rotational viscosity of the host liquid crystal molecule.

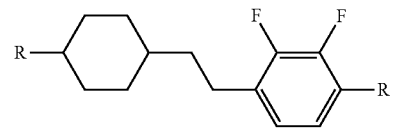

Formula LC-A5

The structural formula of a dicyclohexyl-difluorinated phenylene group monomer may be represented by, for example, the following formula LC-A6, and adjust the dielectric anisotropy and the rotational viscosity of the host liquid crystal molecule.

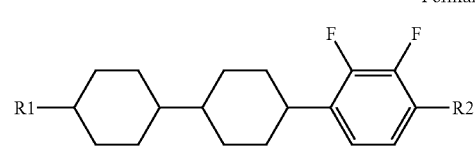

Formula LC-A6

The structural formulas of a cyclohexyl-fluorinated terphenyl group monomer or a fluorinated terphenyl group monomer may be represented by, for example, the following formulas LC-A7-1 and LC-A7-2, respectively, and adjust the dielectric anisotropy and the rotational viscosity of the host liquid crystal molecule.

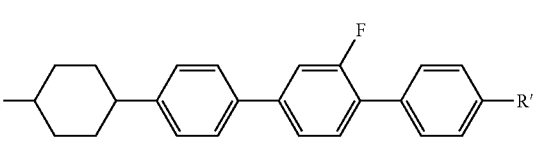

Formula LC-A7-1

-continued

Formula LC-A7-2

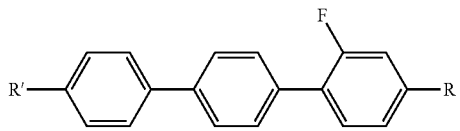

where R and R' each may be an alkyl group having 1 to 10 carbon atoms, —O—, —CH=CH—, —CO—, —OCO— or —COO—.

A reactive mesogen may be a fluorinated biphenyl dimethacrylate monomer represented by, for example, the following formula RM-A1.

Formula RM-A1

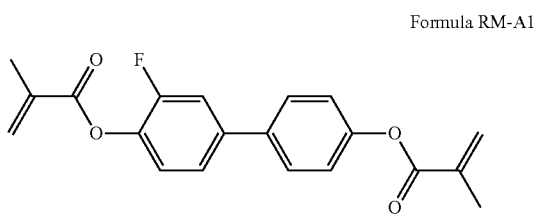 [SMILES: C=C(C)C(=O)Oc1ccc(-c2ccc(OC(=O)C(=C)C)c(F)c2)cc1]

ZSM-7160 mixture comprised of mixtures of a host liquid crystal molecule and a reactive mesogen may include a photo initiator of, for example, about 0 wt % to about 1.0 wt % with respect to the total weight of a reactive mesogen. The ZSM-7160 mixture has equal properties to those of the conventional RM-liquid crystalline mixture, making materials of RM-liquid crystalline mixture diverse and inhibiting the price rise of the RM-liquid crystalline mixture by manufacturers.

In accordance with an exemplary embodiment of the present invention, a novel RM-liquid crystalline mixture in which a reactive mesogen is mixed with liquid crystal molecules, e.g., DS-09-9301 mixture will be described below. The host liquid crystal molecules which constitute DS-09-9301 mixture comprise a biphenyl group monomer and a quinone derivative according to the characteristics of an exemplary embodiment of the present invention. A liquid crystal display device including DS-09-9301 mixture may have fast response speed characteristics. DS-09-9301 mixture is a mixture of liquid crystal molecules with a reactive mesogen, and the reactive mesogen may be mixed into the mixture in an amount of, for example, about 0.1 wt % to about 1 wt % (e.g., about 0.2 wt % to about 0.4 wt %) with respect to the total weight of host liquid crystal molecules. For example, the host liquid crystal molecules may comprise a biphenyl group monomer in an amount of about 10 wt % to about 20 wt %, a cyclohexyl-phenylene group monomer in an amount of about 0 wt % to about 10 wt %, a dicyclohexyl-phenylene group monomer in an amount of about 5 wt % to about 10 wt %, a cyclohexyl-phenylene-difluorinated phenylene group monomer in an amount of about 15 wt % to about 30 wt %, a quinone derivative in an amount of about 15 wt % to about 30 wt %, a dicyclohexyl-difluorinated phenylene group monomer in an amount of about 0 wt % to about 5 wt % and a cyclohexyl-ethyl-difluorinated phenylene group monomer in an amount of about 0 wt % to about 10 wt %. A percentage by weight (wt %) of respective monomers which constitute host liquid crystal molecules is a percentage based on the weight of host liquid crystal molecule except for solvent. The refractive index of host liquid crystal molecule may be, for example, about 0.08 to about 0.13.

The structural formula of a biphenyl group monomer may be represented by, for example, the following formulas LC-B1-1 or LC-B1-2, and have high refractive index features due to the phenyl group included therein.

Formula LC-B1-1

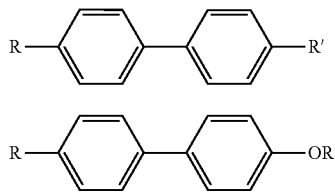

Formula LC-B1-2

The structural formula of a quinone derivative may be represented by, for example, the following formulas LC-B7-1 or LC-B7-2, and adjust the dielectric anisotropy and the rotational viscosity of the host liquid crystal molecule. In addition, polymers of formula LC-B7-1 or LC-B7-2 have high polarity, and thus the response speed of the host liquid molecule including them can be higher.

Formula LC-B7-1

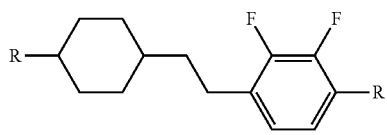

Formula LC-B7-2

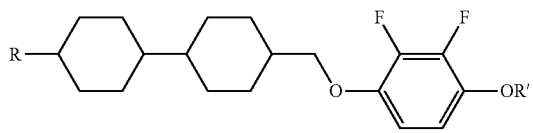

where R, R' or OR' each may be an alkyl group having 1 to 10 carbon atoms, —O—, —CH=CH—, —CO—, —OCO— or —COO—.

The structural formula of a cyclohexyl-phenylene group monomer may be represented by, for example, formula LC-A2. The structural formula of a dicyclohexyl-phenylene group monomer may be represented by, for example, formula LC-A3. The structural formula of a cyclohexyl-phenylene-difluorinated phenylene group monomer may be formula LC-A4. The structural formula of a dicyclohexyl-difluorinated phenylene group monomer may be represented by, for example, formula LC-A6. The structural formula of a cyclohexyl-ethyl-difluorinated phenylene group monomer may be represented by, for example, formula LC-A5. A reactive mesogen may be a monomer represented by, for example, formula RM-A1. DS-09-9301 mixture comprised of mixtures of a host liquid crystal molecule and a reactive mesogen may include, for example, a photo initiator of about 0 wt % to 1.0 wt % with respect to the total weight of a reactive mesogen. A liquid crystal display device including the DS-09-9301 mixture may have fast response speed characteristics.

In accordance with an exemplary embodiment of the present invention, host liquid crystal molecules constituting a novel RM-liquid crystal mixture may comprise, for example, an alkenyl group monomer having a carbon double bond and a monomer of the following formula LC-C9. As an alkenyl group monomer having a carbon double bond is a kind of low viscosity monomer, a RM-liquid crystal mixture comprising this monomer has low viscosity feature, and likewise a liquid crystal display device including it may have fast response speed characteristics. An alkenyl group monomer having, for example, a carbon double bond may be a monomer represented by the following formulas LC-C8-1 or LC-C8-2, and having a carbon double bond to increase the rotational viscosity of a host liquid crystal molecule. An alkenyl group monomer having a carbon double bond may be included in, for example, a RM-liquid crystalline mixture in an amount of about 1 wt % to about 60 wt % with respect to the total host liquid crystal molecules except for a solvent.

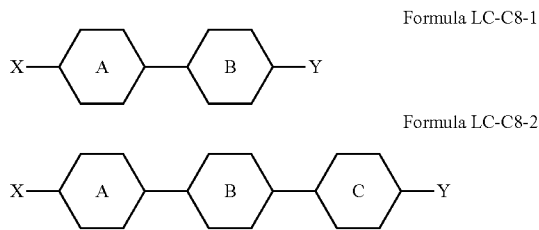

Formula LC-C8-1

Formula LC-C8-2 where A, B and C each may be a structure of benzene ring or cyclohexane ring. At least one of X and Y has a carbon double bond of a type of

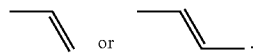

The external hydrogen atoms of each ring constituting A, B and C may be substituted by F, Cl, and the like.

A monomer of formula LC-C9 may prevent an alkenyl group monomer from linking to a reactive mesogen in a RM-liquid crystalline mixture. A reactive mesogen may not be hardened by bonding a π bond of a double bond constituting an alkenyl group monomer with a methacrylate radical of a reactive mesogen. As a result, a liquid crystal display device including them may have afterimage defects caused by the uncured reactive mesogen. For example, a monomer represented by formula LC-C9 may be included in a RM-liquid crystalline mixture in an amount of about 5 wt % or less with respect to the total host liquid crystal molecules except for a solvent.

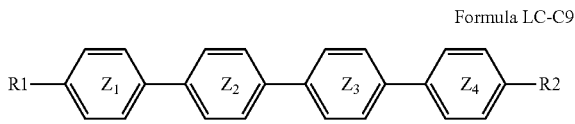

Formula LC-C9 where each of $Z_1$ to $Z_4$ may have a structure of benzene ring or cyclohexane ring, more preferably all of $Z_1$ to $Z_4$ may be a benzene ring. R and R' each may be an alkyl group having 1 to 10 carbon atoms, —O—, —CH=CH—, —CO—, —OCO—, —COO—, F or Cl. The external hydrogen atoms of $Z_1$ to $Z_4$ may be substituted by a polar atom such as F, Cl and the like.

A reactive mesogen may be mixed with host liquid crystal molecules in an amount of, for example, about 0.05 wt % to about 1 wt % (e.g., about 0.2 wt % to about 0.4 wt %) with respect to the total host liquid molecules except for a solvent. A reactive mesogen may be one of materials as described above or below. Such an RM-liquid crystalline mixture including an alkenyl group monomer and a monomer represented by formula LC-C9 exhibited lower rotational viscosity property of, for example, about 90 mPa·s to about 108 mPa·s than that of the conventional mixture. A liquid crystal display device including this mixture had an uncured reactive mesogen in a less amount of, for example, about 25 ppm to about 35 ppm than that of the conventional mixture, and had a black afterimage in a level of, for example, about 3 or less.

Now, processes performed in step S140 are described in detail. For example, the main alignment material applied in steps S110 and S120 is primarily heated for about 100 seconds to about 140 seconds at about 80° C. to about 110° C. (e.g., about 120 seconds at about 95° C.) in step S140. During the primary heating, a solvent of the main alignment material is, for example, vaporized, and imidized monomers having vertical alignment properties are aligned perpendicularly to a lower layer, forming the main alignment film.

After the primary heating, the main alignment material is, for example, secondarily heated for about 1000 seconds to about 1400 seconds at about 200° C. to about 240° C. (e.g., about 1200 seconds at about 220° C.). During the secondary heating, the main alignment material is hardened or cured, forming the main alignment film.

After the secondary heating, the main alignment film is cleaned by, for example, DeIonized Water (DIW), and may be further cleaned by isopropyl alcohol (IPA). After the cleaning, the main alignment film is dried. After the drying, a liquid crystal layer is formed on a lower or upper display panel 100 or 200. The liquid crystal layer may have a mixture comprising the above-described liquid crystal molecules and the above-described light hardeners, the ZSM-7160 mixture, the DS-09-9301 mixture, or a compound of liquid crystal molecules and the above-described light hardeners. The lower and upper display panels 100 and 200 are assembled by a sealant, with liquid crystal molecules and a light hardener included therein.

After the assembly, to increase spread properties and uniformity of liquid crystal molecules, the lower and upper display panels 100 and 200 may be annealed in a chamber at a temperature of, for example, about 100° C. to about 120° C. for about 60 minutes to about 80 minutes.

In the next step S150, after the assembly, the light hardener hardened by light becomes a photo hardening layer 35. The photo hardening layer 35 and the main alignment film 33 constitute the lower-plate alignment film 291.

In step S152 of step S150, an electric field is formed in the liquid crystal layer 3 before the hardened lower-plate photo hardening layer 35 is formed, and then, for example, a lithography process is undertaken. These will now be described in detail. If voltages are supplied to the pixel electrode 191 on the lower display panel 100 and the common electrode 270 on the upper display panel 200, an electric field is formed in the liquid crystal layer 3.

Now, a description will be made of methods for forming an electric field in the liquid crystal layer 3 according to exemplary embodiments of the present invention. These methods include a method for supplying a Direct Current (DC) voltage and a method for supplying a multi-step voltage. First, a method for supplying a DC voltage to the liquid crystal display panel assembly 300 will be described with reference to FIG. 7A. If a predetermined first voltage V1 is supplied to the gate lines 121 and the data lines 171 of the liquid crystal display panel assembly 300 for a 'TA1' period, the subpixel electrodes 191h and 191l are provided with the first voltage V1. At this time, a ground voltage or a voltage of, for example, about a zero volt (0V) is supplied to the common electrode 270. The 'TA1' period is, for example, about 1 second to about 300 seconds (e.g., about 100 seconds). The first voltage V1 is, for example, about 5V to about 20V (e.g., about 7V to about 15V).

Now, a detailed description will be made of the movement of the liquid crystal molecules 31 aligned by the electric field that is generated in the liquid crystal layer 3 for the 'TA1' period. The 'TA1' period is a period in which the liquid crystal molecules 31 are aligned in the direction of a fringe electric field. An electric field is generated in the liquid crystal layer 3 by a difference between the voltage supplied to the subpixel electrodes 191h and 191l and the voltage supplied to the common electrode 270, and the liquid crystal molecules 31 having refractive-index anisotropy are aligned by the electric field. As the edges of the pixel electrodes 191h and 191l include the micro branches 197h and 197l, micro slits 199h and 199l, vertical connection portions 193h and 193l and horizontal connection portions 194h and 194l, as shown in FIG. 3, the pixel electrode edges distort the electric field, and a fringe electric field is formed in the liquid crystal layer 3. Due to the fringe electric field, major axes of the liquid crystal molecules 31 tend to be tilted in, for example, a direction perpendicular to the edges of the micro branches 197. Next, because directions of horizontal components of the fringe electric fields generated by the edges of the neighboring micro branches 197h and 197l are opposed to each other, and the gap W between the micro branches 197h and 197l, e.g., the width W of the micro slits 199h and 199l, is narrow, the liquid crystal molecules 31 tend to be tilted in the direction of the electric field by the horizontal components. However, as the fringe electric field by the edges of the vertical connection portions 193h and 193l and the edges the horizontal connection portions 194h and 194l of the pixel electrode 191 is greater in strength than the fringe electric field by the edges of the micro branches 197h and 197l, the liquid crystal molecules 31 are eventually tilted in parallel with the longitudinal direction of the micro branches 197h and 197l. In other words, the liquid crystal molecules 31 are tilted in parallel with the normal direction of the relatively large fringe electric field, e.g., the longitudinal direction of the micro branches 197h and 197l. The liquid crystal molecules 31 in the region where the parallel micro branches 197 are located make a tilt angle in the same direction, forming one domain. As the micro branches 197 extend in 4 different directions in the first subpixel 190h or the second subpixel 190l of FIG. 3, the liquid crystal molecules 31 near the pixel electrode 191 are tilted in 4 different directions, and each of the subpixel electrodes 191h and 191l has four domains. If one pixel PX has a large number of domains, the side visibility of the liquid crystal display device may be excellent.

Thereafter, a predetermined exposure voltage is supplied for a 'TD1' period in which light is irradiated to the liquid crystal display panel assembly 300, whereby the liquid crystal molecules 31 are aligned in a stable state, during which the electric-field lithography process is performed. The exposure voltage may be the same as the first voltage V1 in the 'TA1' period. The 'TD1' period is, for example, about 50 seconds to about 150 seconds (e.g., about 90 seconds).

In an exemplary embodiment, the pixel electrode 191 may be provided with, for example, the ground voltage or a voltage of about 0V, and the common electrode 270 may be provided with the first voltage V1 or the exposure voltage.

A method for supplying a multi-step voltage to the liquid crystal display panel assembly 300 according to another exemplary embodiment of the present invention will be described in detail with reference to FIG. 7B. As the movement of the liquid crystal molecules 31 caused by the electric field generated in the liquid crystal layer 3 has been described in detail in the description of the 'TA1' period in FIG. 7A, a description thereof will be omitted.

If a predetermined second voltage is supplied to the gate lines 121 and the data lines 171 for a 'TA2' period, the second voltage is supplied to the subpixel electrodes 191h and 191l. At this point, the ground voltage or a voltage of, for example, about a zero volt (0V) is supplied to the common electrode 270. The second voltage is a voltage in the 'TA2' period, and consists of a low voltage and a high voltage V2. The second voltage is alternately supplied to the subpixel electrodes 191h and 191l, and has a frequency of, for example, about 0.1 Hz to about 120 Hz. The low voltage may be, for example, the ground voltage or 0V, and the high voltage V2 may be higher than, for example, the maximum operating voltage of the liquid crystal display device. The high voltage V2 is, for example, about 5V to about 60V (e.g., about 30V to about 50V). The 'TA2' period is, for example, about 1 second to about 300 seconds (e.g., about 60 seconds). The time for which the low voltage or the high voltage V2 is maintained in the 'TA2' period is, for example, about 1 second. As stated above, because of the difference between the voltage supplied to the subpixel electrodes 191h and 191l and the voltage supplied to the common electrode 270, an electric field is formed in the liquid crystal layer 3. If the electric field is formed in the liquid crystal layer 3, the liquid crystal molecules 31 are tilted in a direction parallel to the longitudinal direction of the micro branches 197h and 197l, and if no electric field is formed, the liquid crystal molecules 31 are aligned in a direction perpendicular to the upper or lower display panel 100 or 200. Because alternately supplying the low voltage and the high voltage V2 to the subpixel electrodes 191h and 191l switches on and off the electric field applied to the liquid crystal molecules 31 in the liquid crystal layer 3, the liquid crystal molecules 31, which are vertically aligned in the initial state, may be uniformly aligned in a desired tilt direction.

Subsequently, a voltage that gradually increases from the low voltage to the high voltage V2 is supplied for a 'TB2' period, whereby the liquid crystal molecules 31 are sequentially aligned. The 'TB2' period may be, for example, about 1 second to about 100 seconds (e.g., about 30 seconds). Because in the 'TB2' period, the liquid crystal molecules 31 sequentially lie down (or are tilted) in a direction parallel to the longitudinal direction of the micro branches 197 of the pixel electrode 191 in the vertically aligned state with the passage of time, irregular movement of the liquid crystal molecules 31 may be prevented, which may occur when an abrupt electric field is formed in the liquid crystal layer 3.

In the next 'TC2' period, the liquid crystal molecules 31 are tilted in a direction parallel to the longitudinal direction of the micro branches 197 of the pixel electrode 191 and then the arrangement of the liquid crystal molecules 31 is stabilized. The 'TC2' period is, for example, about 1 second to about 600 seconds (e.g., about 40 seconds). During the 'TC2' period, the high voltage V2 is consistently supplied.

Thereafter, in a 'TD2' period for which light is irradiated to the liquid crystal display panel assembly 300, a predetermined exposure voltage is supplied, whereby the liquid crystal molecules 31 are aligned in a stable state, during which the electric-field lithography process is performed. The 'TD2' period is, for example, about 80 seconds to about 200 seconds (e.g., about 150 seconds). The exposure voltage may be the same as the final voltage of the second voltage. The exposure voltage is, for example, about 5V to about 60V (, e.g., about 30V to about 50V). For example, in an exemplary embodiment of the present invention, if the thickness of the liquid crystal layer 3 is about 3.6 μm, the exposure voltage may be about 20V to about 40V, and if the thickness of the liquid crystal layer 3 is about 3.2 μm, the exposure voltage may be about 10V to about 30V.

In an exemplary embodiment of the present invention, the ground voltage or a voltage of, for example, about 0V may be supplied to the subpixel electrodes 191*h* and 191*l*, and a predetermined second voltage (e.g., 0V and V2) may be supplied to the common electrode 270.

In the next step S154, the DC or multi-step voltage is supplied to the lower and upper display panels 100 and 200, and then light is irradiated to the liquid crystal layer 3 or the lower or upper display panel 100 or 200 having a surface alignment reactant while a predetermined electric field is formed in the liquid crystal layer 3, e.g., during the TD1 or TD2 period, eventually forming a photo hardening layer. As to the light irradiated to the liquid crystal layer 3, it may be irradiated in any one or both directions of the lower and upper substrates 110 and 210. For example, to reduce a non-hardened light hardener and uniformly form a photo hardening layer, light may be incident in the direction of any one of the substrate 110 of the lower display panel 100 and the substrate 210 of the upper display panel 200, which has fewer layers absorbing or blocking the light.

Now, a method will be described in detail, in which the lower-plate photo hardening layer 35 is formed by a process of irradiating light to the liquid crystal layer 3 in which an electric field is formed, e.g., by the electric-field lithography process. With an electric field existing in the liquid crystal layer 3, the liquid crystal molecules 31 near the main alignment film 33 are aligned to be tilted in parallel with the direction of the micro branches 197. A light hardener existing in the liquid crystal layer 3 is hardened by the irradiated light at substantially the same tilt angle as those of the liquid crystal molecules 31 on the main alignment film 33, thus forming the photo hardening layer 35. The photo hardening layer 35 is formed on the main alignment film 33. Even after removal of the electric field formed in the liquid crystal layer 3, a side chain polymer of the photo hardening layer 35 maintains the intact directionality of adjacent liquid crystal molecules 31. The mesogen according to an exemplary embodiment of the present invention is a light hardener, and can maintain the intact directionality of the adjacent liquid crystal molecules 31 by, for example, UV or by inducing anisotropy of the mesogen at a specific temperature.

The 'TD1' or 'TD2' period has been described above. The light irradiated to the liquid crystal layer 3 may be, for example, collimated UV, polarized UV, or non-polarized UV. A UV wavelength may be, for example, about 300 nm to about 400 nm. Light energy is, for example, about 0.5 J/cm$^2$ to about 40 J/cm$^2$ (e.g., about 5 J/cm$^2$). The lights hardening the light hardener and the sealant may be different in wavelength and energy.

In this way, if the liquid crystal molecules 31 maintain the pre-tilt angle in a direction parallel to the longitudinal direction of the micro branches 197 by the polymer of the photo hardening layer 35, the liquid crystal molecules 31 are rapidly tilted when an electric field is formed to change the direction of the liquid crystal molecules 31, ensuring a fast Response Time (RT) of the liquid crystal display device. The liquid crystal molecules 31 near the side chain of the photo hardening layer 35 have a slightly constant pre-tilt angle with respect to the vertical direction of the lower display panel 100, but the liquid crystal molecules 31, as they move from the photo hardening layer 35 to the center of the liquid crystal layer 3, may not have a constant pre-tilt angle. To increase the contrast ratio of the liquid crystal display device and prevent light leakage in a no-electric field state, the liquid crystal molecules 31 in the center of the liquid crystal layer 3 may not have the pre-tilt angle, unlike the liquid crystal molecules 31 adjacent to the photo hardening layer 35.

In an exemplary embodiment of the present invention, as the non-hardened light hardener remaining in the liquid crystal layer 3 may cause afterimages or image sticking, to remove the non-hardened light hardener existing in the liquid crystal layer 3 or to stabilize the photo hardening layers 35 and 36 having the pre-tilt angle, a process in which light is irradiated to the liquid crystal layer 3, e.g., the fluorescent lithography process may be performed, with no electric field formed in the liquid crystal layer 3. In accordance with an exemplary embodiment of the present invention, in the fluorescent lithography process, light may be irradiated for, for example, about 20 minutes to about 80 minutes (e.g., about 40 minutes). The irradiated light may be UV which is, for example, about 300 nm to about 390 nm in wavelength, and an illumination of which may be, for example, about 0.05 mW/cm$^2$ to about 0.4 mW/cm$^2$ at a wavelength of 310 nm.

In an exemplary embodiment, the lower-plate or upper-plate photo hardening layer 35 or 36 may be formed, which has side chains of various pre-tilt angles, based on the strength of an electric field formed in the liquid crystal layer 3, the level of a pixel voltage, the time of a voltage supplied to pixels PX, the light energy, the amount of light irradiation, the light irradiation time, or a combination thereof. In an exemplary embodiment, in the state where different exposure voltages are supplied to the subpixel electrodes 191*h* and 191*l*, the first and second subpixels 190*h* and 190*l* having the photo hardening layers 35 and 36 of different pre-tilt angles may be formed by electric-field lithography. In an exemplary embodiment, different exposure voltages or different electric-field lithography processes may be applied according to the pixels so that at least one pixel, e.g., a blue pixel, among the primary color pixels constituting a basic pixel group PS may have a photo hardening layer having a pre-tilt angle different from those of the other pixels.

Polarizers (not shown) are attached to the lower and upper display panels 100 and 200 assembled by a sealant. The liquid crystal display panel assembly 300 that was assembled, with a light hardener included in the liquid crystal layer 3, has characteristics of the SVA mode.

Now, a method for manufacturing the liquid crystal display panel assembly 300 based on the SC-VA mode will be described in detail with reference to FIGS. 6B, 8A to 8E, and 9A and 9B. A redundant description of the method for manufacturing the liquid crystal display panel assembly 300 based on the SVA mode will be omitted. A method for manufacturing the liquid crystal display panel assembly 300 based on the SC-VA mode will now be described in detail.

Figure 8A:
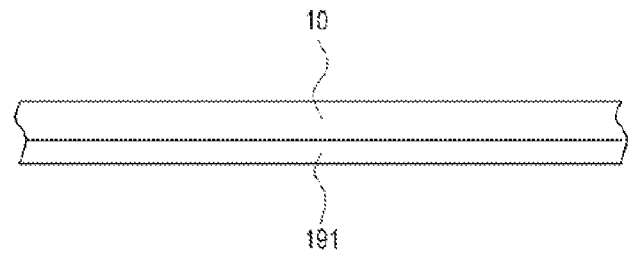
FIGS. 8A to 8E sequentially illustrate a process of forming a surface photo hardener layer and a main alignment film of a liquid crystal display panel assembly based on the SC-VA mode in accordance with an exemplary embodiment of the present invention.

FIG. 6B is a flowchart illustrating a method for manufacturing the liquid crystal display panel assembly 300 based on the SC-VA mode using the lower and upper display panels 100 and 200 manufactured in conjunction with FIGS. 1 to 5B. FIGS. 8A to 8E are cross-sectional views illustrating a sequential process of forming the lower-plate alignment film 291 of the liquid crystal display panel assembly 300 based on the SC-VA mode according to an exemplary embodiment of the present invention. FIGS. 9A and 9B are diagrams schematically illustrating a step of hardening a surface light hardener to form the photo hardening layer 35, according to an exemplary embodiment of the present invention.

Manufacturing of the lower display panel 100 with the pixel electrode 191 and the upper display panel 200 with the common electrode 270 in first steps S210 and S220 has been described with reference to FIGS. 1 to 5B.

In the next steps S231 and S232, a surface light hardener layer 35a and the main alignment film 33 are formed on the pixel electrode 191 and the common electrode 270, respectively.

A process of forming the lower-plate main alignment film 33 and the surface light hardener layer 35a will be described in detail with reference to FIGS. 8A to 8E. Referring to FIG. 8A, a surface alignment reactant 10 made of a surface light hardener (not shown) and a surface main alignment material (not shown) is formed on the pixel electrode 191 by, for example, inkjet printing or roll printing. For example, the surface alignment reactant 10 is formed on inner regions of the lower and upper display panels 100 and 200, and may be partially applied onto outer regions thereof. The surface alignment reactant 10 may be formed in the outer region to prevent circuit elements formed on the outer region from being damaged by the thermal stress occurring in a process of manufacturing the liquid crystal display device. Other lower layers of the pixel electrode 191 and the common electrode 270 have been described above. In other words, the surface alignment reactant 10 is, for example, a mixture or a compound of a surface light hardener and a surface main alignment material. The surface main alignment material is, for example, a vertical alignment material that aligns the liquid crystal molecules 31 perpendicularly to the plane of a substrate or the pixel electrode 191. The surface light hardener is, for example, a functional material that is hardened to pre-tilt the liquid crystal molecules 31 in a specific tilt direction with respect to the plane of the substrate or the pixel electrode 191. Materials of the surface main alignment material and the surface light hardener will be described later.

Figure 8B:
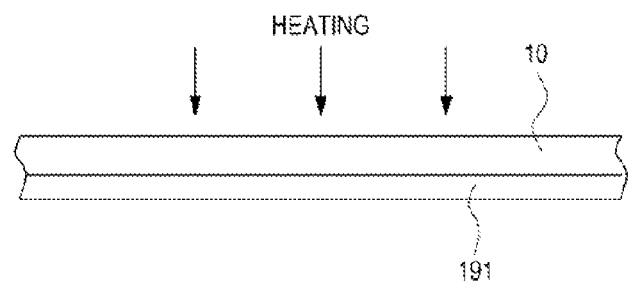
Figure 8C:
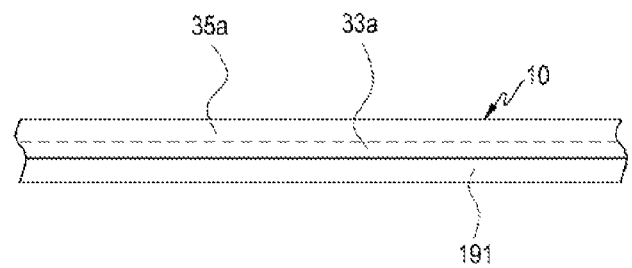
Figure 8D:
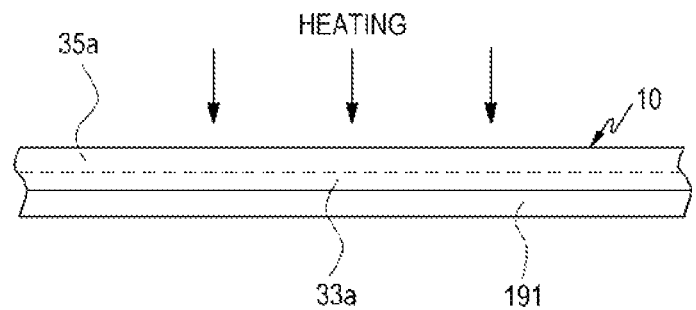
Figure 8E:
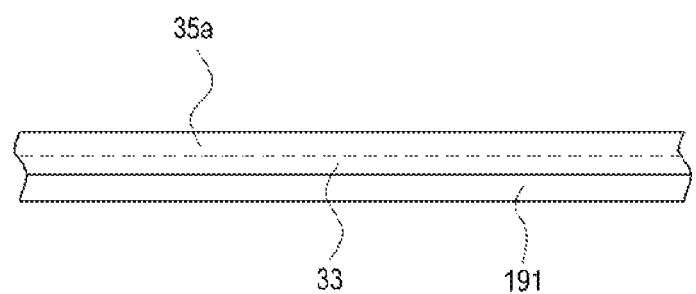
Figures 9A, 9B:
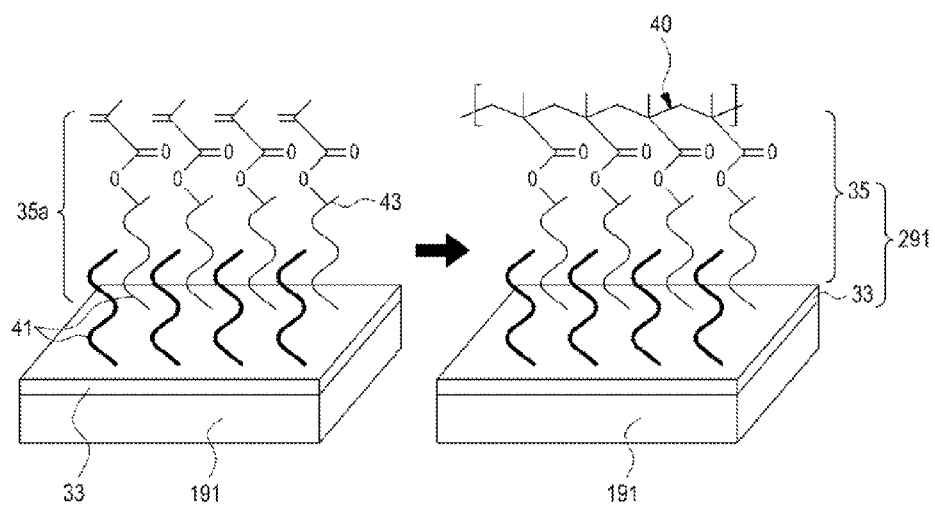
FIG. 9 conceptually illustrates a step of forming a photo hardening layer by hardening a surface photo hardener layer.

Referring to FIG. 8B, the surface alignment reactant 10 formed on the pixel electrode 191 is primarily heated at a low temperature. The primary heating process is performed, for example, for about 100 seconds to about 140 seconds (e.g. about 120 seconds) at about 80° C. to about 110° C. (e.g., about 95° C.). In the primary heating, a solvent of the surface alignment reactant 10 is, for example, vaporized. Referring to FIG. 8C, the surface alignment reactant 10 is phase-separated into a surface main alignment material layer 33a with a surface main alignment material and a surface light hardener layer 35a with a surface light hardener. In the surface alignment reactant 10, based on the polarity difference, a material with a relatively large polarity becomes the surface main alignment material layer 33a with a surface main alignment material by moving around the pixel electrode 191, while a material with a relatively small polarity becomes the surface light hardener layer 35a with a surface light hardener by moving up from the surface main alignment material layer 33a. The surface main alignment material has a relatively large polarity and aligns the liquid crystal molecules 31, for example, perpendicularly to the plane of the substrate or the pixel electrode 191. The surface light hardener layer 35a has a relatively small polarity as it includes an alkylated aromatic diamine-based monomer achieving a non-polarity effect that weakens a side-chain polarity. Referring to FIGS. 8D and 8E, if the surface main alignment material layer 33a and the surface light hardener layer 35a that underwent phase separation, are secondarily heated at a high temperature, the main alignment film 33 is formed on the lower portion of reactant 10, has a relatively large polarity and aligns the liquid crystal molecules 31 perpendicularly to the plane of the substrate or the pixel electrode 191, while the surface light hardener layer 35a with a relatively small polarity is formed on the upper portion of reactant 10. As a result, the main alignment film 33 and the surface light hardener layer 35a have different polarity values. The secondary heating process may be performed, for example, for about 1000 seconds to about 1400 seconds, (e.g., about 1200 seconds) at about 200° C. to about 240° C. (e.g., about 220° C.). In accordance with an exemplary embodiment of the present invention, in the secondary heating process, for example, polyimide (PI) formed by imidization reaction forms main chains of the surface main alignment material layer 33a and the surface light hardener layer 35a.

In an exemplary embodiment of the present invention, when the surface main alignment material 32a with a surface main alignment material and the surface light hardener layer 35a are separately formed on the lower layer of reactant 10 and the upper layer reactant 10, respectively, the primary heating process may be omitted.

Now, the surface light hardener and the surface main alignment material will be described in detail. According to an exemplary embodiment of the present invention, in the surface alignment reactant 10, the surface main alignment material is, for example, about 85 mol % to about 95 mol % (e.g., about 90 mol %), and the surface light hardener is, for example, about 5 mol % to about 15 mol % (e.g., about 10 mol %). A mol % composition ratio of the surface main alignment material and the surface light hardener in the surface alignment reactant 10 is computed based on a solvent not being included in the surface alignment reactant 10. The mol % composition ratio of the surface main alignment material and the surface light hardener is substantially the same, after phase separation into the main alignment film 33 and the surface light hardener layer 35a or after forming of the main alignment film 33 and the photo hardening layer 35. In an exemplary embodiment of the present invention, the surface light hardener may have one of the aforementioned reactive mesogens. In accordance with an exemplary embodiment of the present invention, a solvent may be added to the surface alignment reactant 10 to increase coating and printing properties so that the surface alignment reactant 10 may be well spread on the lower or upper display panel 100 or 200 in a wide and thin manner. In addition, the solvent facilitates dissolution or mixing of a material constituting the surface alignment reactant 10. The solvent may be selected from the group comprising, for example, chlorobenzene, dimethyl sulfoxide, dimethylformamide, N-methylpyrrolidone, γ-butyrolactone, methyl methoxy butanol, ethoxy methyl butanol, toluene, chloroform, methyl cellosolve, butyl cellosolve, butyl carbitol, tetrahydrofuran, and a combination thereof. Other materials may be used as the solvent. The aforesaid solvents may be applied to the foregoing or following main alignment material, surface alignment reactant 10, or polarized alignment reactant. The solvent may be, for example, vaporized by the foregoing or following primary heating, secondary heating, pre-heating, or post-heating process.

A surface main alignment material may be a polymer comprising, for example, a dianhydride group monomer such as an alicyclic dianhydride group monomer, a diamine group monomer such as an aromatic diamine group monomer and an aliphatic ring substituted aromatic diamine group monomer, and an aromatic epoxide group monomer which is a crosslinker.

For example, an alicyclic dianhydride group monomer included in the surface main alignment material may be about 39.5 mol % to about 49.5 mol % in surface alignment reactants 10, an aromatic diamine group monomer may be about 30.5 mol % to about 40.5 mol % in surface alignment reactants 10, an aliphatic ring substituted aromatic diamine group monomer may be about 7.5 mol % to about 10.5 mol % in surface alignment reactants 10, and an aromatic epoxide group monomer may be about 0.5 mol % to about 1.5 mol % in surface alignment reactants 10.

An alicyclic dianhydride group monomer may be a monomer represented by, for example, any one of the following formulas I to V. An alicyclic dianhydride group monomer facilitates a polymer included in a surface main alignment material to be dissolved in a solvent, and enhances electro-optic characteristics of the surface main alignment material.

Formula I

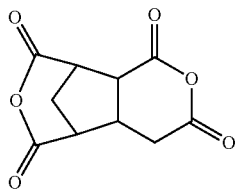

Formula II

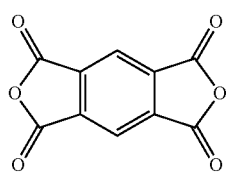

Formula III

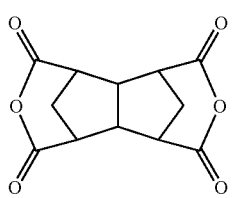

Formula IV

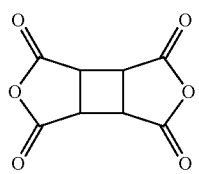

Formula V

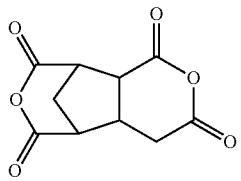

An aromatic diamine group monomer may be a monomer represented by, for example, the following formula VI. An aromatic diamine group monomer in a surface main alignment material facilitates a polymer included in a surface main alignment material to be dissolved in a solvent.

Formula VI

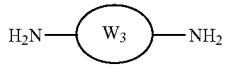

where W3 may be any one of the following formulas VII to IX

Formula VII

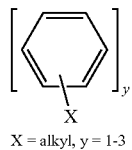

X = alkyl, y = 1-3

Formula VIII

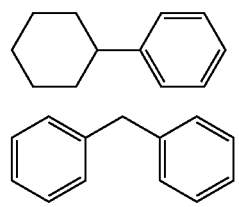

Formula IX

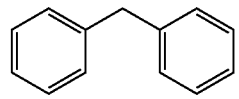

An aliphatic ring substituted aromatic diamine group monomer may be a monomer represented by, for example, the following formula X. An aliphatic ring substituted aromatic diamine group monomer in a surface main alignment material is a vertical alignment component, which increases heat resistance and chemical resistance of the surface main alignment material.

Formula X

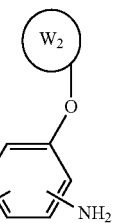

where W2 may be either one of formula XI and formula XII as follows.

Formula XI

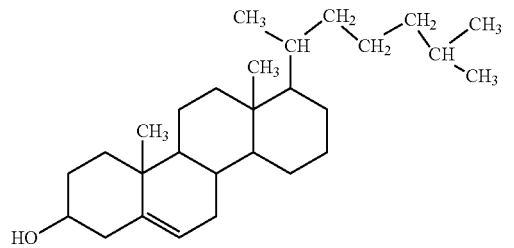

Formula XII

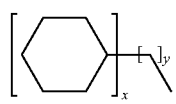

x = 1-5
y = 1-10

An aromatic epoxide group monomer may be a monomer represented by, for example, the following formula XIII. The aromatic epoxide group monomer of a surface main alignment material forms a crosslinked structure, allowing polymers included in a surface main alignment material to be bonded with polymers (reactive mesogen) included in a photo initiator. In addition, an aromatic epoxide group monomer increases physical properties, heat resistance and chemical resistance of a layer.

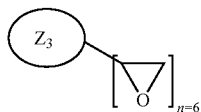

Formula XIII where Z3 may be represented by any one of the following formulas XIV and XV.

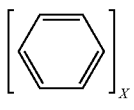

Formula XIV

X = 1~4

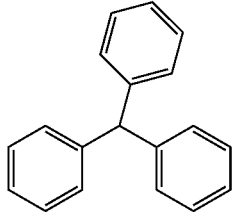

Formula XV

A surface main alignment material according to an exemplary embodiment of the present invention may comprise, for example, at least one selected from polymeric materials, for example, polysiloxane, polyamic acid, polyimide, nylon, PVA (polyvinyl alcohol), PVC and the like.

A surface light hardener may comprise a dianhydride group monomer, for example, an alicyclic dianhydride group monomer, and a diamine group monomer, such as a photo-reactive diamine group monomer, an alkylated aromatic diamine group monomer and an aromatic diamine group monomer.

For example, an alicyclic dianhydride group monomer included in a surface light hardener may be about 2.5 mol % to about 7.5 mol % in surface alignment reactants 10, a photo-reactive diamine group monomer may be about 0.75 mol % to about 2.25 mol % in surface alignment reactants 10, an alkylated aromatic diamine group monomer may be about 0.75 mol % to about 2.25 mol % in surface alignment reactants 10, and an aromatic diamine group monomer may be about 1 mol % to about 3 mol % in surface alignment reactants 10.

An alicyclic dianhydride group monomer and an aromatic diamine group monomer, included in a surface light hardener may be, for example, the same as an alicyclic dianhydride group monomer and an aromatic diamine group monomer included in a surface main alignment material, respectively.

A photo-reactive diamine group monomer is, for example, a monomer comprising a reactive mesogen, which functions to decide the pre-tilt of photo hardening layers 35 and 36 and the pre-tilt direction of liquid crystal molecules. A photo-reactive diamine group monomer may be a monomer represented by, for example, the following formula XVI, more specifically, a monomer represented by, for example, the formula XVII.

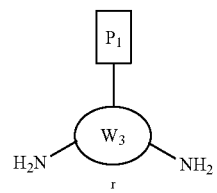

Formula XVI where P1 is a reactive mesogen, and W3 is an aromatic ring, which may be any one of formulas VII to IX described above.

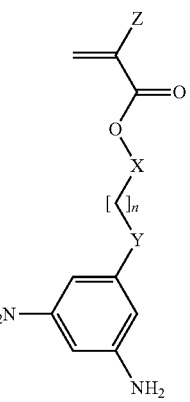

Formula XVII where X may be any one selected from methylene ($CH_2$), phenylene ($C_6H_4$), biphenylene ($C_{12}H_8$), cyclohexylene ($C_6H_8$), bicyclohexylene ($C_{12}H_{16}$) and phenyl-cyclohexylene ($C_6H_4$—$C_6H_8$), Y may be any one selected from methylene ($CH_2$), ether (O), ester (O—C=O or O=C—O), phenylene ($C_6H_4$) and cyclohexylene ($C_6H_8$), and Z may be methyl (CH3) or H. In addition, n may be an integer of 1 to 10. A photo-reactive diamine group monomer may be polystyrene.

An alkylated aromatic diamine group monomer may be a monomer having vertical alignment characteristics represented by, for example, the following formula XVIII. Although a polymeric alkylated aromatic diamine group monomer included in a surface light hardener has a vertical alignment component, it contains an alkyl group which does not exhibit a polarity, in a side chain. Because of this, polymers in a surface light hardener layer 35a have less polarity than those in a surface main alignment material layer 33a.

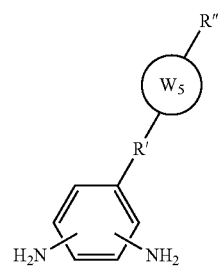

Formula XVIII where R' and R" are defined as follows:

R': —$(CH_2)_n$-[n=1~10] or —O—$(CH_2)_n$-[n=1~10] or —(O—C=O or O=C—O)—$(CH_2)_n$-[n=1~10]

R": —(CH$_2$)$_{n-1}$—CH$_3$ [n=1~10] or —O—(CH$_2$)$_{n-1}$—CH$_3$ [n=1~10] or —(O—C=O or O=C—O)—(CH$_2$)$_{n-1}$—CH$_3$ [n=1~10]

In addition, W$_5$ may be represented by the following formula XIX.

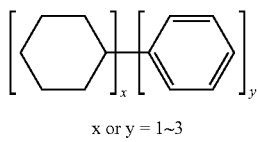

x or y = 1~3

An aromatic diamine group monomer may be a monomer represented by, for example, the above formulas VI to IX. An aromatic diamine group monomer facilitates a polymer constituting a surface light hardener to be dissolved in solvent. The photo initiator described above may be added into a surface light hardener.

For example, after the secondary heating, the surface alignment reactant 10 is cleaned by DIW, and may be further cleaned by IPA. After the cleaning, the surface alignment reactants 10 are dried.

In step S240, the upper-plate common voltage applying point (not shown), the sealant and the liquid crystal layer 3 are formed between the lower and upper display panels 100 and 200, on each of which the surface light hardener layer 35a and the main alignment film 33 are formed, and then the display panels 100 and 200 are assembled. After the drying, a sealant is formed on the lower display panel 100. To increase the adhesion, the sealant may be formed on the outer region of the lower display panel 100, where the surface alignment reactant 10 is not formed. On the other hand, the sealant may be formed on the outer region of the lower display panel 100 or the upper display panel 200 in such a manner that it may, for example, partially overlap the surface alignment reactant 10. The sealant may include, for example, a photoinitiator that is hardened by UV having a wavelength of about 300 nm to about 400 nm. The photoinitiator hardened at a wavelength of about 300 nm to about 400 nm may be, for example, Benzyl Dimethyl Ketal (BDK, Irgacure-651) or one of the aforesaid photoinitiators.

After the drying, the upper-plate common voltage applying point (not shown) and the liquid crystal layer 3 are formed on the upper display panel 200. The upper-plate common voltage applying point receives the common voltage Vcom provided from the outside, for example, the data driver 500, and provides the common voltage Vcom to the common electrode 270 formed on the upper display panel 200. The upper-plate common voltage applying point may be, for example, in direct contact with a common voltage applying pattern (not shown) formed on the lower display panel 100 and the common electrode 270 formed on the upper display panel 200. The common voltage applying pattern is connected to the data driver 500 to receive the common voltage Vcom, and may be formed while a pixel electrode layer is formed. The upper-plate common voltage applying point may be formed on the outer region of the upper display panel 200, where the surface alignment reactant 10 is not formed. The upper-plate common voltage applying point may be comprised of, for example, spherical conductors, which are conductive and are about 4 μm or less in diameter. The liquid crystal layer 3 is formed on the region where the surface alignment reactant 10 of the upper display panel 200 is formed, or on the inside where the sealant is formed. The processes of forming the upper-plate common voltage applying point and the liquid crystal layer 3 may be performed, for example, simultaneously. In accordance with an exemplary embodiment of the present invention, by mixing the sealant, e.g., a conductive sealant, with the conductors forming the upper-plate common voltage applying point, the sealant and the upper-plate common voltage applying point may be formed of the same material in a single process. In a region of the lower display panel 100, in which a conductive sealant is formed, patterns of a data layer conductor may not be formed on a lower layer of the conductive sealant, thereby preventing the conductive sealant from being shorted to the patterns of the data layer conductor.

After the sealant and the liquid crystal layer 3 are formed, the lower and upper display panels 100 and 200 are assembled in a vacuum chamber by the sealant.

In step S250, as exposure voltages are supplied to the assembled display panels 100 and 200 and then light is irradiated thereto, e.g., as the assembled display panels 100 and 200 undergo the electric-field lithography process, the lower-plate photo hardening layer 35 is formed on the lower-plate main alignment film 33 and the upper-plate photo hardening layer 36 is formed on the upper-plate main alignment film 34. The main alignment films 33 and 34 and the photo hardening layers 35 and 36 constitute alignment films 291 and 292, respectively.

After the assembly, the sealant is exposed to UV having a wavelength of about 300 nm to about 400 nm, or to a visible ray having a wavelength of about 400 nm or more, thereby being hardened about 80%. The UV or visible ray may be irradiated to the sealant by being incident from the outside of the lower display panel 100. A shield mask is located between the sealant and the UV source, and shields UV so that the UV may not be irradiated to areas other than the sealant. If the UV irradiated to the sealant hardens light hardener around the sealant due to its deviation, the light hardener around the sealant is hardened in advance, causing the liquid crystal display device to suffer from edge stain defects at around the sealant. The light hardener around the sealant may be, for example, a light hardener forming the alignment film, or a light hardener existing in the liquid crystal layer 3. The visible ray may be irradiated to the sealant without the shield mask.

Thereafter, the sealant undergoes, for example, thermal curing for about 70 minutes at about 100° C.

After the assembly, to increase the spread and uniformity of liquid crystal molecules 31, the lower and upper display panels 100 and 200 are annealed in a chamber at a temperature of, for example, about 100° C. to about 120° C. for about 60 minutes to about 80 minutes.

As a process (step S252) in which after the annealing, exposure voltages are supplied to the assembled display panels 100 and 200 and an electric field is formed in the liquid crystal layer 3 is substantially the same as step S152 in the SVA mode-based manufacturing method, a description thereof is omitted.

In the next step S254, a process is described, in which the photo hardening layer 35 is formed by the electric-field lithography process in which light is irradiated to the assembled liquid crystal display panel assembly 300 while the electric field is being formed. In accordance with an exemplary embodiment of the present invention, after the electric-field lithography process, an aliphatic ring substituted aromatic diamine-based monomer of vertical alignment components, which is a side chain, is bonded to a polyimide, which is a main chain of the main alignment film 33, and an alkylated aromatic diamine-based monomer and a photo-reactive diamine-based monomer, which are side chains, are bonded to polyimide which is a main chain of the photo hardening layer 35. As the process in which light is irradiated and then the photo hardening layer 35 aligns the liquid crystal molecules 31 in step S254 is the same as step S154 in the SVA mode, a detailed description thereof is omitted. To reduce non-hardened light hardener and uniformly form a photo hardening layer, the light irradiated to the surface light hardener layer 35a may be incident in the direction of any one of the substrate 110 of the lower display panel 100 and the substrate 210 of the upper display panel 200, which has fewer layers absorbing or blocking the light.

Now, a process in which upon receipt of light, the surface light hardener layer 35a formed on the main alignment film 33 becomes the photo hardening layer 35 will be described in detail with reference to FIGS. 9A and 9B. If an electric field is formed in the liquid crystal layer 3, surface light hardeners 43 of the surface light hardener layer 35a are aligned in substantially the same direction as that of neighboring liquid crystal molecules 31, and the surface light hardeners 43 are hardened in substantially the same direction as that of the neighboring liquid crystal molecules 31 by the incident UV. The aligned and hardened surface light hardeners 43 form the photo hardening layer 35, whereby liquid crystal molecules 31 adjacent to the photo hardening layer 35 have a pre-tilt angle. The surface light hardeners 43 shown in FIGS. 9A and 9B are high-molecular compounds in which vertical alignment monomers 41 constituting the surface main alignment material and monomers including a reactive mesogen are chemically bonded. When UV is irradiated, the surface light hardeners 43 having a reactive mesogen have the double bond unfastened by the UV and a side-chain network 40 is additionally formed. By such reactions, the surface light hardeners 43 form the photo hardening layer 35 by UV irradiation hardening. As a result, the photo hardening layer 35 aligned in a direction slightly tilted with respect to the normal direction of the lower substrate 110 is formed on the main alignment film 33 that vertically aligns the liquid crystal molecules 31. To harden the non-hardened light hardener and stabilize the photo hardening layer 35, for example, the aforementioned fluorescent lithography process may be performed.

As described above in connection with the SVA mode, as the photo hardening layer 35 is hardened while being aligned along the tilt direction of the liquid crystal molecules 31, the liquid crystal molecules 31 have a pre-tilt angle in a tilt direction parallel with the longitudinal direction of the micro branches 197 of the pixel electrode 191 even in the state where no electric field is applied to the liquid crystal layer 3.

The liquid crystal display panel assembly 300 assembled in this way has characteristics of the SC-VA mode. If the liquid crystal display device is manufactured according to the SC-VA mode, light hardeners exist around the main alignment film 33 without existing in the liquid crystal layer 3, thereby significantly reducing non-hardened light hardeners remaining in the liquid crystal layer 3. Therefore, the liquid crystal display device having characteristics of the SC-VA mode reduces the after image defects, ensuring good quality. In addition, the process of irradiating light in the no-electric field state to harden the non-hardened light hardeners may be omitted, thereby reducing the manufacturing cost of the liquid crystal display device.

Now, characteristics of the liquid crystal display device manufactured based on the SC-VA mode will be described in detail with reference to FIG. 10 and Tables 2 and 3. Table 2 shows characteristics of the liquid crystal display device based on the SC-VA mode with respect to a change in composition ratio of the surface main alignment material and the surface light hardener included in the surface alignment reactant 10. The alicyclic dianhydride-based monomer, aromatic diamine-based monomer, aliphatic ring substituted aromatic diamine-based monomer and aromatic epoxide-based monomer constituting the surface main alignment material that were used in these experiments, were, for example, a tricyclo-hexyl dianhydride, a terphenyl diamine, a cholesteryl benzenediamine, and a hexaepoxy benzene derivative, respectively. In addition, the alicyclic dianhydride-based monomer, photo-reactive dianhydride-based monomer, alkylated aromatic diamine-based monomer, and aromatic diamine-based monomer constituting the surface light hardener that were used in these experiments, were, for example, a tricyclo-hexyl dianhydride, a mono-methacrylic benzenediamine, a mono-alkylated phenylcyclohexy benzenediamine, and a hexaepoxy benzene derivative, respectively.

The structure of a pixel PX is substantially the same as the structure shown in FIG. 3. The width of the micro branches 197 of the pixel electrode 191 was, for example, about 3 µm, and the cell spacing in the liquid crystal layer 3 was, for example, about 3.6 µm. The exposure voltage was, for example, about 7.5V, and UV intensity in the field exposure was, for example, about 5 J/cm$^2$. The liquid crystal display device was operated by charge sharing-based 1G1D driving described below in conjunction with FIG. 11. Other conditions are the same as those applied to the liquid crystal display device based on the SC-VA mode.

TABLE 2

| | Surface main alignment material (mol %) | Surface light hardener (mol %) | Response time (ms) | Afterimage occurrence time |
|---|---|---|---|---|
| Experiment1 | about 95 to about 100 | about 0 to about 5 | about 161.1 | 168 hr or more |
| Experiment2 | about 85 to about 95 | about 5 to about 15 | about 7.9 | 168 hr or more |
| Experiment3 | about 75 to about 85 | about 15 to about 25 | about 7.5 | 168 hr or more |
| Experiment4 | about 65 to about 75 | about 25 to about 35 | about 7.3 | 168 hr or more |

Referring to Table 2, as can be seen from Experiment 2, when the surface main alignment material and the surface light hardener in the surface alignment reactant 10 were about 85 mol % to about 95 mol % and about 5 mol % to about 15 mol %, respectively, the response time of the liquid crystal display device was about 0.0079 seconds, and no afterimage was generated for 168 hours, obtaining better results compared with the other experiments.

Table 3 shows characteristics of the liquid crystal display device based on the SC-VA mode with respect to a change in composition ratio of the photo-reactive dianhydride-based reactive mesogen and the alkylated aromatic diamine-based vertical alignment monomer included in the surface light hardener. The reactive mesogen and the vertical alignment monomer, which were applied to these experiments, were mono-methacrylic benzenediamine and mono-alkylated phenylcyclohexy benzenediamine, respectively. Other conditions were the same as those applied to the liquid crystal display device described in conjunction with Table 2.

TABLE 3

| | Reactive Mesogen (RM) (mol %) | Vertical alignment monomer (mol %) | Response time (ms) | Occurrence of Black light leakage |
|---|---|---|---|---|
| Experiment5 | about 0.75 to about 2.25 | about 0.5 to about 0.75 | about 8.2 | Yes |
| Experiment6 | about 2.25 to about 3.75 | about 0.5 to about 0.75 | about 7.7 | Yes |
| Experiment7 | about 0.75 to about 2.25 | about 0.75 to about 2.25 | about 7.9 | No |
| Experiment8 | about 2.25 to about 3.75 | about 0.75 to about 2.25 | about 7.4 | Yes |

Referring to Table 3, as can be seen from Experiment 7, when the reactive mesogen and the vertical alignment monomer in the surface alignment reactant 10 were about 0.75 mol % to about 2.25 mol % and about 0.75 mol % to about 2.25 mol %, respectively, the response time of the liquid crystal display device was about 0.0079 seconds, and the light leakage did not occur in the black state. Accordingly, it was found that Experiment 7 showed excellent characteristics compared with the other experiments.

Figure 10:
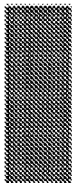
FIG. 10 illustrates Scanning Electron Microscope (SEM) images obtained by photographing one pixel PX of a liquid crystal display device having the SC-VA mode's characteristics over the time.

FIG. 10 illustrates Scanning Electron Microscope (SEM) images obtained by photographing one pixel PX of the liquid crystal display device of the SC-VA mode, over time. The composition ratio of the surface alignment reactant 10 used to manufacture the liquid crystal display device is as follows.

For example, an alicyclic dianhydride group monomer included in a surface main alignment material, e.g., tricyclo-hexyl dianhydride was about 45 mol %, an aromatic diamine group monomer, e.g., terphenyl diamine was about 36 mol %, an aliphatic ring substituted aromatic diamine group monomer, e.g., cholesteryl benzenediamine was about 9 mol %, and an aromatic epoxide group monomer, e.g., hexaepoxy benzene derivative was about 1.25 mol %. For example, an alicyclic dianhydride group monomer included in a surface light hardener, e.g., tricyclo-hexyl dianhydride was about 5 mol %, a photo-reactive diamine group monomer, e.g., mono-methacrylic benzenediamine was about 1.5 mol %, an alkylated aromatic diamine group monomer, e.g., mono-alkylated phenylcyclohexyl benzenediamine was about 1.5 mol %, and an aromatic diamine group monomer, e.g., hexaepoxy benzene derivative was about 2 mol %. Other conditions are the same as those applied in a liquid crystal display device of Table 2. Mol % of each component applied in a liquid crystal display device in Table 2, Table 3 and FIG. 10 was a mol % with respect to the surface alignment reactants 10, and a solvent was excluded from the composition ratio of the surface alignment reactants 10.

As can be seen from FIG. 10, no texture occurred in images of a pixel PX taken from 0 to 0.048 seconds. In addition, the inter-gray level response time of the liquid crystal display device was about 0.008 seconds. Thus, the liquid crystal display device manufactured based on the SC-VA mode had a fast response time and did not cause afterimages and light leakage for a long time, ensuring good quality.

An alignment film of a liquid crystal display device according to an exemplary embodiment of the present invention has negative electricity characteristics. The photo hardening layers 35 and 36 of the alignment film have the negative electricity characteristics, and they are formed by hardening the surface alignment reactant 10. As substances such as, for example, fluorine atoms (F) are bonded with a portion of molecules of the light hardener, the surface alignment reactant 10 may have the negative electricity characteristics.

Because the photo hardening layers 35 and 36 have the negative electricity characteristics, polymers having negative electricity characteristics, which constitute the photo hardening layers 35 and 36, and liquid crystal molecules 31 in the liquid crystal layer 3 may be simultaneously aligned by the electric field formed in the liquid crystal layer 3. As a result, the photo hardening layers 35 and 36 may have a more uniform pre-tilt angle. In addition, when the liquid crystal display device is driven, the liquid crystal molecules 31 in the liquid crystal layer 3 and the photo hardening layers 35 and 36 having the negative electricity characteristics move simultaneously by the electric field, ensuring a fast response time of the liquid crystal display device.

This exemplary embodiment is different from the aforementioned manufacturing method based on the SC-VA mode in that, unlike that in FIG. 8C, the material constituting the surface alignment reactant 10 may not be phase-separated in the process of forming the alignment film. As details of this exemplary embodiment are substantially similar to those of the manufacturing method based on the SC-VA mode, duplicate descriptions thereof are simplified or omitted. Since the upper and lower-plate alignment films 292 and 291 are formed in a substantially similar way, the process of forming alignment films according to exemplary embodiments of the present invention will be described in detail without distinguishing between the alignment films 292 and 291.

Now, a process of forming alignment films having negative electricity characteristics will be described in detail. The lower display panel 100 with the pixel electrode 191 and the upper display panel 200 with the common electrode 270 are each manufactured using the foregoing or following methods corresponding thereto.

The below-stated surface alignment reactant 10 having negative electricity characteristics according to an exemplary embodiment of the present invention is applied onto the pixel electrode 191 and the common electrode 270 by the foregoing methods corresponding thereto. The surface alignment reactant 10 is formed, for example, on inner regions of the lower and upper display panels 100 and 200, and may be partially applied to outer regions thereof.

A surface alignment reactant 10 is a compound characterized by, for example, having negative electricity characteristics and is a material forming a main alignment film which is chemically bonded with a light hardener linked with a material exhibiting negative electricity. A light hardener is, for example, a material, which is cured as described above and then allows liquid crystal molecules 31 to be pre-tilted in a certain tilted direction with respect to substrates 110 and 210 or pixel electrode 191 to form photo hardening layers 35 and 36. A light hardener may be linked with a side chain of a material forming a main alignment film. A light hardener may be, for example, at least one selected from the above-described photo-reactive polymer, reactive mesogen, photo-polymerizable material, photo-isomerizable material, and their compounds or mixtures. A reactive mesogen with negative electricity according to an exemplary embodiment of the present invention is, for example, a photo-reactive fluorinated diamine group monomer described below.

A material forming a main alignment film is, for example, a vertical alignment material which allows liquid crystal molecules 31 to be vertically aligned relative to the plain of substrates 110 and 210 or pixel electrode 191. A material forming a main alignment film may be a compound of, for example, an alicyclic dianhydride group monomer and an aliphatic ring substituted aromatic diamine group monomer. A material forming a main alignment film may comprise, for example, an aromatic diamine group monomer or a crosslinker. In addition, a material forming a main alignment film may be, for example, the surface main alignment material 32a described above.

A surface alignment reactant 10 with negative electricity according to an exemplary embodiment of the present invention will be described in detail below. The surface alignment reactant 10 with negative electricity may be, for example, a polymer comprising a dianhydride group monomer (e.g., an alicyclic dianhydride group monomer), a diamine group monomer (e.g., a photo-reactive fluorinated diamine group monomer, an alkylated aromatic diamine group monomer, an aromatic diamine group monomer and an aliphatic ring substituted aromatic diamine group monomer), and a crosslinker (e.g., an aromatic epoxide group monomer).

A surface alignment reactant 10 with negative electricity according to an exemplary embodiment of the present invention is a mixture of, for example, a polyimide (PI) group compound with a crosslinker. A polyimide (PI)-based compound is, for example, a compound in which monomers constituting a dianhydride group monomer and a diamine group monomer are chemically bonded. A polyimide-based compound can be manufactured by, for example, an imidation process in which a dianhydride monomer and monomers which are included in diamine monomers are mixed with each other and dissolved in a polar solvent to liberate amino groups from monomers included in diamine group monomers, which nucleophilic-attack an acid anhydride group of a dianhydride group monomer. Prior to the imidation process, monomers constituting, for example, a diamine group monomer, e.g., a photo-reactive fluorinated diamine group monomer, an alkylated aromatic diamine group monomer, an aromatic diamine group monomer and an aliphatic ring substituted aromatic diamine group monomer should be mixed together.

A surface alignment reactant 10 with negative electricity may be comprised of, for example, an alicyclic dianhydride group monomer of about 44 mol % to about 54 mol % (e.g., about 49 mol %), a photo-reactive fluorinated diamine group monomer of about 0.5 mol % to about 1.5 mol % (e.g., about 1 mol %), an alkylated aromatic diamine group monomer of about 12 mol % to about 18 mol % (e.g., about 15 mol %), an aromatic diamine group monomer of about 25 mol % to about 35 mol % (e.g., about 30 mol %), an aliphatic ring substituted aromatic diamine group monomer of about 2 mol % to about 6 mol % (e.g., about 4 mol %), and an aromatic epoxide group monomer of about 0.5 mol % to about 1.5 mol % (e.g., about 1 mol %). A mol % composition ratio of a surface alignment reactant 10 is a mol % except for a solvent.

An alicyclic dianhydride group monomer is, for example, the same as materials described above with reference to FIG. 6B. An alicyclic dianhydride group monomer facilitates a polymer included in a surface alignment reactant 10 to be dissolved in a solvent, increases electro-optic properties of an alignment film, for example, the Voltage Holding Ratio (VHR), and enables a Residual Direct Current (RDC) voltage to be lowered. The VHR is defined as, for example, a quantitative measure of which a liquid crystal layer holds the voltage charged while the data voltage is not applied to a pixel electrode. The VHR is ideal when it approaches 100%. As the VHR is higher, the liquid crystal display device has the better image quality. The RDC voltage is defined as, for example, a voltage that is applied to the liquid crystal layer by impurities of the ionized liquid crystal layer adsorbed to an alignment film, even though a voltage is not applied from the outside. As the RDC voltage is lower, the liquid crystal display device has the better image quality.

A photo-reactive fluorinated diamine group monomer is cured by UV to form photo hardening layers 35 and 36. A photo-reactive fluorinated diamine group monomer has a negative electricity property as the fluorine atom (F) therein is linked in a certain direction of benzene. A photo-reactive fluorinated diamine group monomer may be a monomer represented by, for example, the following formula XVI-F, more specifically, a mono-methacrylic fluorinated benzenediamine group monomer represented by, for example, the formula XVII-F.

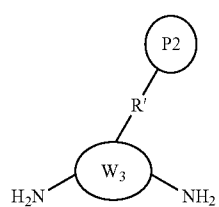

Formula XVI-F where P2 is a fluorinated aryl acrylate group reactive mesogen, and may be any one selected from the following formulas XVI-F-P2-11, XVI-F-P2-21, XVI-F-P2-22, XVI-F-P2-23, XVI-F-P2-31, XVI-F-P2-32, XVI-F-P2-41, and mixtures thereof. In addition, $W_3$ is an aromatic ring, which may be any one of formulas VII to IX described above with reference to FIG. 6B. R' has been described with reference to FIG. 6B.

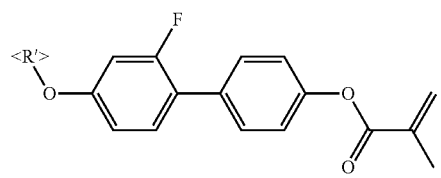

Formula XVI-F-P2-11

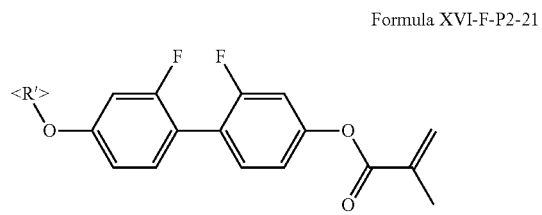

Formula XVI-F-P2-21

Formula XVI-F-P2-22

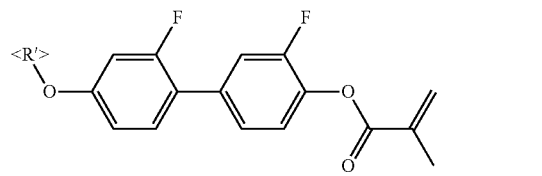

Formula XVI-F-P2-23

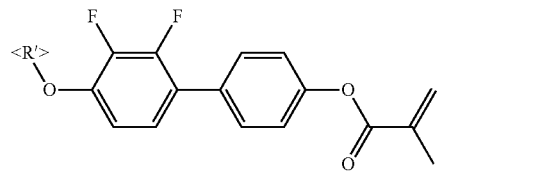

Formula XVI-F-P2-31

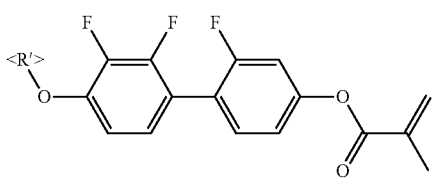

Formula XVI-F-P2-32

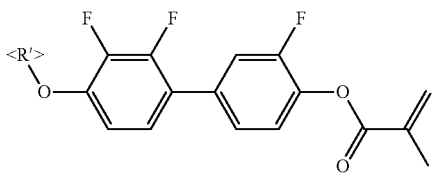

Formula XVI-F-P2-41

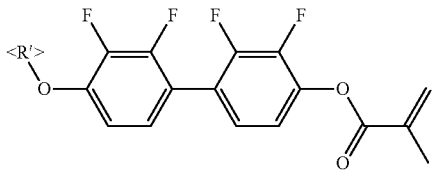

where a fluorine (F) atom is linked to benzene, causing P2 to exhibit negative electricity feature.

A mono-methacrylic fluorinated benzenediamine monomer is represented by, for example, the following formula XVII-F.

Formula XVII-F

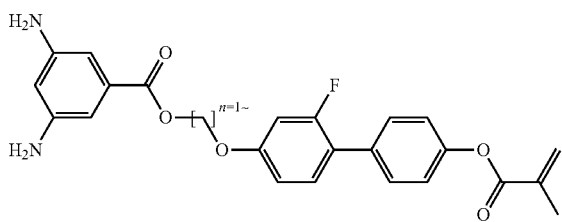

where n may be an integer of 1 to 6.

A mono-methacrylic fluorinated benzenediamine monomer can be manufactured by, for example, mixing a mono-methacrylic hydroxyl fluorinated biphenyl intermediate with a bromoalkyl benzenediamine derivative in a polar solvent to produce a hydroxyl group from the biphenyl intermediate, which nucleophilic-attacks a bromo group of the diamine derivative to be broken away therefrom. A mono-methacrylic hydroxy fluorinated biphenyl intermediate can be synthesized by, for example, mixing a methacrylic chloride with a dihydroxy fluorinated biphenyl in a polar solvent to conduct esterification.

An alkylated aromatic diamine group monomer is, for example, the same as the material described above with reference to FIG. 6B. An alkylated aromatic diamine group monomer included in a surface alignment reactant 10 is a monomer having, for example, vertical alignment characteristics. An alkylated aromatic diamine group monomer may have nonpolar characteristics.

An aromatic diamine group monomer is, for example, the same as the material described above with reference to FIG. 6B. An aromatic diamine group monomer facilitates a polymer included in a surface alignment reactant 10 to be dissolved in a solvent.

An aliphatic ring substituted aromatic diamine group monomer is, for example, the same as the material described above with reference to FIG. 6B. The aliphatic ring substituted aromatic diamine group monomer is, for example, a monomer having vertical alignment characteristics, which vertically aligns liquid crystal molecules with respect to the lower or upper display panel.

An aromatic epoxide group monomer is, for example, the same as the material described above with reference to FIG. 6B. The aromatic epoxide group monomer forms, for example, a crosslinked structure, enabling a dianhydride group monomer to be bonded with a diamine group monomer, or enabling a dianhydride group monomer linked with a diamine group monomer to be bonded with a dianhydride group monomer. The aromatic epoxide group monomer increases physical properties of a film, and increases a heat resistance and a chemical resistance.

A surface alignment reactant 10 having negative electricity features may comprise, for example, a photo initiator. The photo initiator may be, for example, one of those described above, or may be α-hydroxyketone (Irgacure-127, Ciba, Switzerland), methyl benzoylformate (Irgacure-754, Ciba, Switzerland), acrylophosphine oxide (Irgacure-819, Ciba, Switzerland), titanocene (Irgacure-784, Ciba, Switzerland), α-aminoacetophenone (Irgacure-369, Ciba, Switzerland), α-aminoketone (Irgacure-379, Ciba, Switzerland), α-hydroxyketone (Irgacure-2959, Ciba, Switzerland), oxime ester (Irgacure-OXE01, Ciba, Switzerland), oxime ester (Irgacure-OXE02, Ciba, Switzerland) or acrylophosphine oxide (Irgacure-TPO, Ciba, Switzerland).

The surface alignment reactant 10 having negative electricity features may comprise, for example, a reactive mesogen with negative electrical feature, to which a chlorine atom (Cl) or a chlorine molecule (Cl2) is bonded therewith.

The surface alignment reactant 10 having negative electricity features may comprise, for example, a compound in which a dianhydride group monomer is chemically bonded with a diamine group monomer.

In accordance with an exemplary embodiment of the present invention, the surface alignment reactant 10 may be made by, for example, combination of the crosslinker and the surface alignment reactant 10 having negative electricity characteristics.

In accordance with an exemplary embodiment of the present invention, the surface alignment reactant 10 may be, for example, a mixture of the reactive mesogen having negative electricity characteristics and the material forming the main alignment film.

In accordance with an exemplary embodiment of the present invention, in some regions, the surface alignment reactant 10 may be applied, for example, to directly contact the spacer 250, the color filter 230, or the insulating layer 140.

The applied surface alignment reactant 10 having negative electricity characteristics is heated by, for example, the aforementioned primary heating process. During the primary heating process, monomers of the reactive mesogen constituting the surface alignment reactant 10 and the vertical alignment component forming the main alignment film are aligned in a direction perpendicular to the lower layer of the surface alignment reactant 10. In addition, the reactive mesogen molecules linked to a side chain of the material constituting the surface alignment reactant 10 may be on the surface of the surface alignment reactant 10. During the primary heating, the surface alignment reactant 10 having negative electricity characteristics may not undergo the phase separation described in connection with FIG. 8C.

After the primary heating, the surface alignment reactant 10 having negative electricity characteristics is heated by, for example, the aforesaid secondary heating process. During the secondary heating, the solvent of the surface alignment reactant 10 is, for example, vaporized and the crosslinker forms a crosslinking structure, thereby forming the main alignment film.

After the secondary heating, the surface alignment reactant 10 having negative electricity characteristics is, for example, cleaned by DIW and may be further cleaned by, for example, IPA. After the cleaning, the surface alignment reactants 10 are dried.

After the drying, a sealant is formed on the lower display panel 100. As in the foregoing methods, the sealant is formed on the outer region of the lower display panel 100, or may be formed on the inner region of the lower display panel 100 or the upper display panel 200 so that it may partially overlap the surface alignment reactant 10. The sealant may be the aforementioned material, and may be hardened by, for example, UV having a wavelength of about 300 nm to about 400 nm, or by the below-stated visible ray having a wavelength of about 400 nm or more.

After the drying, an upper-plate common voltage applying point (not shown) and a liquid crystal layer 3 are formed on the upper display panel 200 in the aforementioned method corresponding thereto.

After the sealant and the liquid crystal layer 3 are formed, the lower and upper display panels 100 and 200 are assembled by the sealant in a vacuum chamber.

After the assembly, the sealant, as described above, is, for example, hardened about 80% by being exposed to UV having a wavelength of about 300 nm to about 400 nm, or to a visible ray having a wavelength of about 400 nm or more.

Thereafter, the sealant undergoes, for example, thermal curing for about 70 minutes at about 100° C.

After the bonding, to increase the spread and uniformity of liquid crystal molecules 31, the lower and upper display panels 100 and 200 are annealed in a chamber at temperature of, for example, about 100° C. to about 120° C. for about 60 minutes to about 80 minutes.

After the annealing, voltages are supplied to the pixel electrode 191 and the common electrode 270 of the display panels 100 and 200 by the DC voltage supply or multi-step voltage supply described in connection with FIGS. 7A and 7B. The process in which an electric field is formed in the liquid crystal layer 3 is also similar to that described in connection with FIGS. 7A and 7B. The reactive mesogen having no negative electricity characteristics is aligned to be tilted in the electric field through interaction with liquid crystal molecules 31. However, as the reactive mesogen molecules according to an exemplary embodiment of the present invention have negative electricity characteristics, they are aligned to be tilted in the electric field together with the liquid crystal molecules 31. Therefore, it may be good that the reactive mesogen having negative electricity characteristics can be more easily and uniformly aligned to be tilted.

While the liquid crystal molecules 31 and the reactive mesogen polymers are aligned in a specific tilt angle, the electric-field lithography process is performed, in which light is irradiated to the liquid crystal display panel assembly 300. As the method in which the electric-field lithography process and the photo hardening layers 35 and 36 form a pre-tilt angle of the liquid crystal molecules 31 is substantially similar to that of the aforementioned step S254, a description thereof is made in brief.

If UV is incident while the reactive mesogen polymers and the liquid crystal molecules 31 are aligned to be tilted, the reactive mesogen is hardened, for example, in a direction substantially similar to that of the surrounding liquid crystal molecules 31 by the incident UV. How the acrylate reactive group of the reactive mesogen is crosslinked or hardened by UV to form the photo hardening layers 35 and 36 has been described above. The reactive mesogen hardened while being aligned, forms the photo hardening layers 35 and 36 on the main alignment film, and the liquid crystal molecules 31 adjacent to the photo hardening layers 35 and 36 have a pre-tilt angle by the hardened reactive mesogen. The main alignment film formed in the secondary heating process and the photo hardening layers 35 and 36 formed by the photo hardening process form the alignment film.

For example, the aforesaid fluorescent lithography process may be performed in accordance with an exemplary embodiment of the present invention.

The manufactured liquid crystal display panel assembly 300 has characteristics of the SC-VA mode described in connection with FIG. 6B, and has the photo hardening layers 35 and 36 having a more uniform pre-tilt angle. In other words, compared with conventional non-polar photo hardening layers, the photo hardening layers 35 and 36 according to an exemplary embodiment of the present invention can uniformly form a pre-tilt angle of the liquid crystal molecules 31. In addition, during driving of the liquid crystal display device, the photo hardening layers having negative electricity characteristics are controlled by the electric field formed in the liquid crystal layer 3 and the controlled photo hardening layers control the liquid crystal molecules 31, increasing the response time of the liquid crystal molecules 31. As a result, the liquid crystal display device according to an exemplary embodiment of the present invention can reduce the occurrence of a texture and increase video features due to its high-speed driving. In addition, as the reactive mesogen has negative electricity characteristics, the photo hardening layers 35 and 36 may be formed by, for example, a low exposure voltage.

In accordance with an exemplary embodiment of the present invention, a polymer of vertical alignment components forming the main alignment film 33/34, for example, an alkylated aromatic diamine-based monomer constituting a diamine-based monomer may have negative electricity characteristics. The vertical alignment polymer having negative electricity characteristics facilitates fast movement of liquid crystal molecules 31, which are controlled by an electric field. As a result, the liquid crystal display device having this vertical alignment polymer may have a fast response time.

In accordance with an exemplary embodiment of the present invention, the monomers forming the photo hardening layers 35 and 36 or the monomers of the vertical alignment components forming the main alignment film 33/34 may have, for example, positive electricity characteristics. The alignment film having positive electricity characteristics has the same effect as the aforementioned alignment film having negative electricity characteristics.

In accordance with an exemplary embodiment of the present invention, the monomers forming the photo hardening layers 35 and 36 or the monomers of the vertical alignment components forming the main alignment film 33/34 may have negative or positive dielectric anisotropic characteristics. The negative or positive dielectric anisotropic characteristics may occur due to the inclusion of a material which is polarized by the electric field formed in the liquid crystal layer 3. The alignment film having negative or positive dielectric anisotropic characteristics has the same effect as the aforesaid alignment film having negative electricity characteristics.

Now, a description will be made of characteristics of the liquid crystal display device having negative electricity characteristics, which is manufactured by the just described method. The alignment film having negative electricity characteristics is formed by, for example, the surface alignment reactant 10 having the reactive mesogen with which fluorine atoms (F) are bonded.

For manufacturing a liquid crystal display device, a surface alignment reactant 10 having negative electricity features may comprise, for example, about 49 mol % of tricyclo-hexyl dianhydride as an alicyclic dianhydride group monomer, about 1 mol % of mono-methacrylic fluorinated benzenediamine as a photo-reactive fluorinated diamine group monomer, about 15 mol % of mono-alkylated phenylcyclohexyl benzenediamine as an alkylated aromatic diamine group monomer, about 30 mol % of terphenyl diamine as an aromatic diamine group monomer, about 4 mol % of cholesteryl benzenediamine as an aliphatic ring substituted aromatic diamine group monomer, and about 1 mol % of hexaepoxy benzene derivative as an aromatic epoxide group monomer. A mol % of components is a mol % with respect to a surface alignment reactant 10, and a solvent is not included in a component ratio of the surface alignment reactant 10.

The structure of the pixels PX of the liquid crystal display device was substantially the same as, for example, the structure of those in FIG. 3. The width of the micro branches 197 of the pixel electrode 191 was, for example, about 3 μm, and the cell spacing in the liquid crystal layer 3 was, for example, about 3.6 μm. The exposure voltage was, for example, about 20V, and UV intensity in the electric-field lithography process was, for example, about 6.55 J/cm$^2$. UV intensity applied to the fluorescent lithography process was, for example, about 0.15 mW/cm$^2$, and the light irradiation time was, for example, about 40 minutes. The liquid crystal display device was operated by charge sharing-based 1G1D driving described above in conjunction with FIG. 11.

The liquid crystal display device with the alignment film having negative electricity characteristics according to an exemplary embodiment of the present invention had the texture of an allowable level, and showed good quality without the occurrence of texture even at high-speed driving of 240 Hz.

An alignment film of the liquid crystal display device according to an exemplary embodiment of the present invention has rigid vertical alignment side-chains. The rigid vertical alignment side-chains are included in the main alignment films 33 and 34 of the alignment films 291 and 292. The main alignment films 33/34 having the rigid vertical alignment side-chains prevent the liquid crystal molecules 31 from being excessively pre-tilted around the alignment films. If the liquid crystal molecules 31 are excessively pre-tilted in the vicinity of the alignment films, the liquid crystal display device has light leakage defects in black images, thereby reducing its contrast ratio or image clarity. The alignment films having rigid vertical alignment side-chains, which are manufactured in accordance with an exemplary embodiment of the present invention, reduce the light leakage defects of the liquid crystal display device and increase the image quality thereof.

This exemplary embodiment is different from the aforesaid method of manufacturing alignment films having negative electricity characteristics in terms of the material constituting the surface alignment reactant 10 and the structure of the rigid vertical alignment components linked to the side chains. In addition, intensity of the UV irradiated to the liquid crystal display panel assembly 300 may be, for example, higher than that in the SC-VA mode-based methods described above in connection with FIG. 6B. As certain features of this exemplary embodiment are substantially similar to those in the aforesaid method for manufacturing the alignment films having negative electricity characteristics, duplicate descriptions thereof are simplified or omitted. However, other features of this exemplary embodiment will be described in detail, such as the material constituting the surface alignment reactant 10, the structure of the vertical alignment components, and the intensity of the UV irradiated to the liquid crystal display panel assembly 300.

Now, a process of forming an alignment film having rigid vertical alignment components will be described in detail. As described above, the surface alignment reactant 10 having rigid vertical alignment components is applied onto the pixel electrode 191 and the common electrode 270.

The surface alignment reactant 10 including a rigid vertical alignment component is a compound of which a light hardener having a photo-reactive monomer film is chemically linked with a material having a vertical alignment component and forming a main alignment. A light hardener is, for example, at least one selected from the above-described photo-reactive polymer, reactive mesogen, photo-polymerizable material, photo-isomerizable material and a combination or mixture thereof, and is cured to form photo hardening layers 35 and 36. In addition, for example, a light hardener may be linked with a side chain of material forming a main alignment film. A material forming a main alignment film is, for example, a vertical alignment material which allows liquid crystal molecules to be vertically aligned with respect to the plane of substrates 110 and 210 or a pixel electrode 191 as described above. A material forming a main alignment film according to the present invention may be, for example, a compound of an alicyclic dianhydride group monomer and an alkylated aromatic diamine group monomer described below. The alkylated aromatic diamine group monomer makes the vertical alignment material rigid, and may include, for example, a plate-type cyclic ring linked with benzene. The material forming a main alignment film may comprise, for example, an aromatic diamine group monomer or a crosslinker. In addition, a material forming a main alignment film may be the surface main alignment material 32a described above.

A surface alignment reactant 10 having a side chain of a rigid vertical alignment component will be described in detail below. A surface alignment reactant 10 forming an alignment film of a rigid vertical alignment side chain may be a polymer comprising, for example, a dianhydride group monomer (e.g., an alicyclic dianhydride group monomer), a diamine group monomer (e.g., a photo-reactive diamine group monomer, an alkylated aromatic diamine group monomer and an aromatic diamine group monomer), and a crosslinker (e.g., an aromatic epoxide group monomer).

A surface alignment reactant 10 having a side chain of a rigid vertical alignment component according to an exemplary embodiment of the present invention is a mixture, for example, in which a polyimide group compound and a crosslinker are mixed together. A polyimide-based compound is, for example, a compound of which a dianhydride group monomer is chemically linked with a diamine group monomer. A polyimide-based compound can be manufactured by, for example, imidation of a dianhydride group monomer and a monomer included in a diamine group monomer as described above. Monomers constituting, for example, diamine group monomers, e.g., photo-reactive diamine group monomers, alkylated aromatic diamine group monomers and aromatic diamine group monomers are mixed prior to imidation.

A surface alignment reactant 10 forming an alignment film of a rigid vertical alignment side chain is comprised of, for example, alicyclic diahydride group monomers of about 38 mol % to about 48 mol % (e.g., about 43 mol %), photo-reactive diamine group monomers of about 5 mol % to about 11.5 mol % (e.g., about 8.5 mol %), alkylated aromatic diamine group monomers of about 3.5 mol % to about 9.5 mol % (e.g., about 6.5 mol %), aromatic diamine group monomers of about 23 mol % to about 33 mol % (e.g., about 28 mol %), and aromatic epoxide group monomers of about 11 mol % to about 17 mol % (e.g., about 14 mol %). A mol % composition ratio of a surface alignment reactant 10 is a mol % except for a solvent.

Alicyclic diahydride group monomers facilitate polymers included in a surface alignment reactant 10 to be dissolved in a solvent, and enable electro-optic properties of an alignment film, for example, a VHR, to be increased, and an RDC voltage to be decreased. A structure of alicyclic diahydride group monomers may be, for example, a cyclobutyl dianhydride monomer represented by, for example. the following formula XVI-RCA.

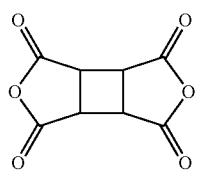

Formula XVI-RCA

Photo-reactive diamine group monomers comprise a reactive mesogen, and are cured by irradiation of UV to form photo hardening layers 35 and 36. In addition, photo-reactive diamine group monomers function to decide the pre-tilt of the photo hardening layers 35 and 36 and the pre-tilt of liquid crystal molecules which are adjacent to the photo hardening layers 35 and 36. A structure of photo-reactive diamine group monomers may be a monomer represented by the following formula XVI-RC or XVI-RA, more specifically, monomers of the following formula XVI-RC1, XVI-RC2, XVI-RC3, XVI-RC4, XVI-RA1, XVI-RA2, XVI-RA3, XVI-RA4, XVI-RA5 or XVI-RA6.

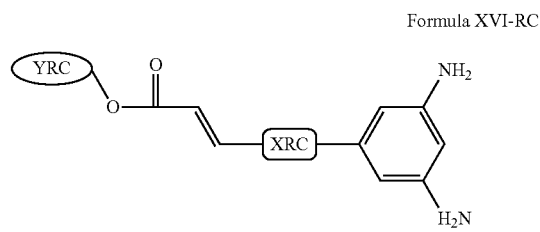

Formula XVI-RC where XRC may be any one selected from alkyl, ether, ester, phenyl, cyclohexyl, and ester-phenyl. YRC may be any one selected from alkyl, phenyl, biphenyl, cyclohexyl, bicyclohexyl, and phenyl-cyclohexyl.

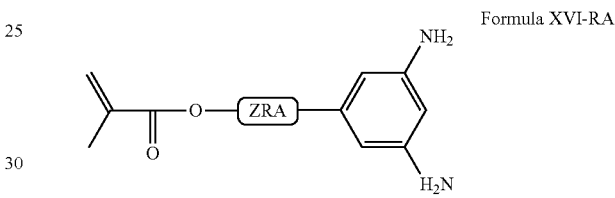

Formula XVI-RA where ZRA may be any one selected from alkyl, alkyl ether, alkyl ester, alkyl phenyl ester, alkyl phenyl ether, alkyl biphenyl ester, alkyl biphenyl ether, phenyl ether, phenyl ether alkyl, biphenyl ether, biphenyl ether alkyl, cyclohexyl alkyl, bicyclohexyl alkyl, and cyclohexyl alkyl ester.

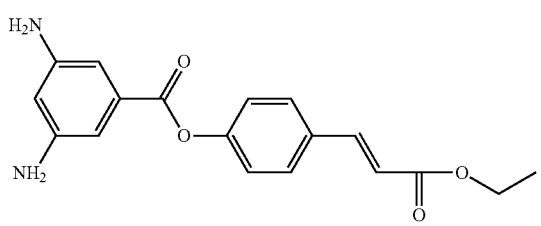

Formula XVI-RC1

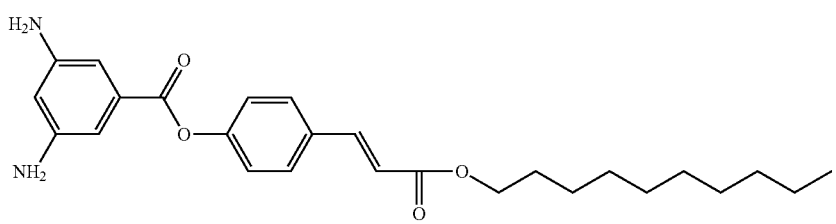

Formula XVI-RC2

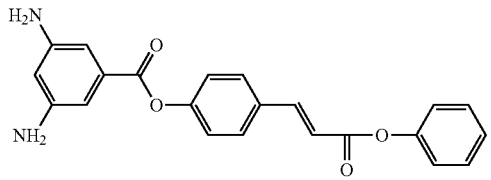

Formula XVI-RC3

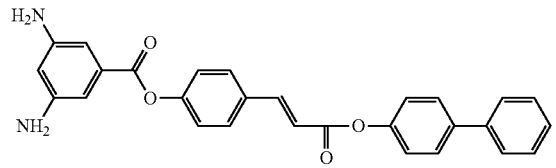

Formula XVI-RC4

-continued

Formula XVI-RA1

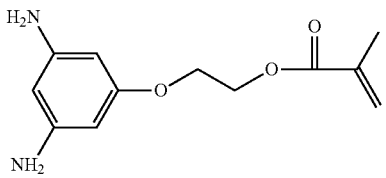

Formula XVI-RA2

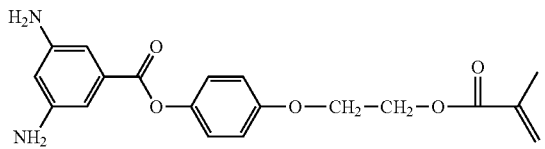

Formula XVI-RA3

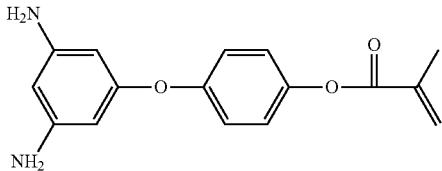

Formula XVI-RA4

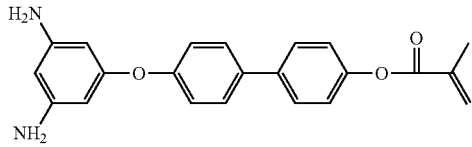

Formula XVI-RA5

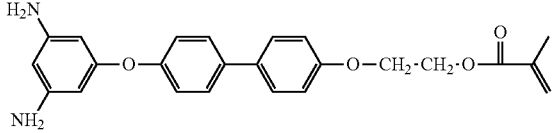

Formula XVI-RA6

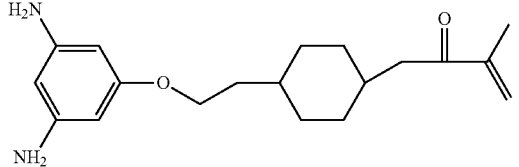

Photo-reactive diamine group monomers may be, for example, a decyl cinnamoyl benzenediamine monomer or a mono-methacrylic benzenediamine monomer. A decyl cinnamoyl benzenediamine monomer can be manufactured by, for example, mixing a decyl cinnamoyl phenol intermediate and a diamino benzoyl chloride derivative in a polar solvent to produce a mixture, and esterifying this mixture. A decyl cinnamoyl phenol intermediate can be manufactured by, for example, mixing a hydroxy benzene cinnamoyl chloride and a decyl alcohol in polar solvent to produce a mixture, and esterifying this mixture. A mono-methacrylic benzenediamine monomer can be manufactured by, for example, mixing a hydroxy alkyl benzenediamine derivative and a methacrylic chloride in a polar solvent to produce a mixture, and esterifying this mixture.

In an exemplary, photo-reactive diamine group monomers may be acryl-cinnamoyl hybrid benzenediamine represented by, for example, formula XVI-RD. Acryl-cinnamoyl hybrid benzenediamine monomer comprises, for example, both an acrylate reactive group and a cinnamate reactive group. An acrylate reactive group reacts with side chains to form a crosslinkage, and cinnamate reactive groups link with each other to increase a pre-tilt angle.

Formula XVI-RD

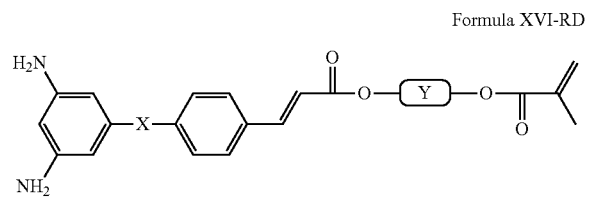

where X may be any one selected from an alkyl group having 1 to 10 carbon atoms, ether and ester, and Y may be any one selected from alkyl, phenyl, biphenyl, cyclohexyl, bicyclohexyl, and phenyl-cyclohexyl.

Alkylated aromatic diamine group monomers are monomers of, for example, a vertical alignment component. The cyclic ring linked with benzene makes a vertical alignment rigid. Liquid crystal molecules which are adjacent to alkylated aromatic diamine group monomers are, for example, vertically aligned. A cyclic ring may be, for example, a plate-type molecule. The structure of an alkylated aromatic diamine monomer may be, for example, octadecyl cyclohexyl benzenediamine represented by formula XVIII-RCA1 or alkyl substituted aliphatic aromatic benzenediamine represented by formula XVIII-RCA2.

Formula XVIII-RCA1

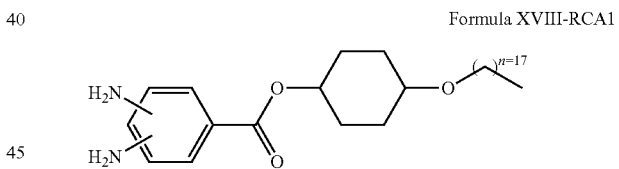

Formula XVIII-RCA2

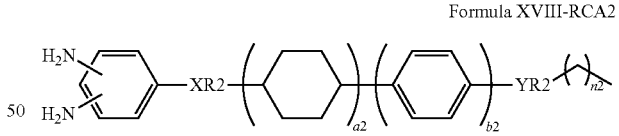

where XR2 may be ether or ester, YR2 may be ether, and n2 may be 10 to 20. a2 and b2 may be 0 to 3, and both a2 and b2 cannot be 0 at the same time.

Octadecyl cyclohexyl benzenediamine monomer can be manufactured by, for example, mixing octadecyl cyclohexanol intermediate and diamino benzoyl chloride derivative in a polar solvent to produce a mixture, and esterifying this mixture. Octadecyl cyclohexanol intermediate can be manufactured by, for example, mixing bromooctadecane and cyclohexanediol in a polar solvent to produce a mixture, and nucleophilic-attacking bromo group of bromooctadecane with hydroxyl group of cyclohexanediol to liberate the bromo group.

Aromatic diamine group monomers facilitate polymers included in a surface alignment reactant 10 to be dissolved in a solvent. The structure of aromatic diamine group monomers may be, for example, diphenyl diamine represented by formula VI-RCA.

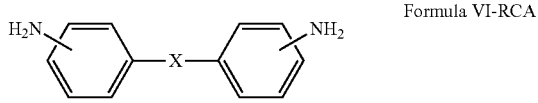

Formula VI-RCA where X may be an aliphatic compound.

Aromatic epoxide group monomers form a crosslinked structure to increase heat resistance and thermal resistance. Aromatic epoxide group monomers may be, for example, an epoxy benzene derivative represented by formula XIII-RCA.

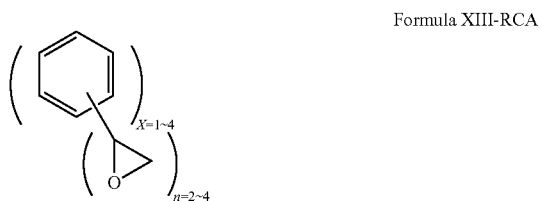

Formula XIII-RCA

The aforesaid photoinitiator may be added to the surface alignment reactant 10. Unlike the surface alignment reactant 10 having negative electricity characteristics, the surface alignment reactant 10 having rigid vertical alignment components may not have the polymer having negative electricity characteristics.

The applied surface alignment reactant 10 having rigid vertical alignment components is primarily heated by, for example, the aforementioned primary heating method. While being primarily heated, the alkylated aromatic diamine-based monomer is aligned in perpendicular to the lower layer of the surface alignment reactant 10, and the alkylated aromatic diamine-based monomer constituting the surface alignment reactant 10 and consisting of reactive mesogen components constituting the photo-reactive diamine-based monomer and vertical alignment components forms the main alignment film. During the primary heating, the surface alignment reactant 10 may not undergo phase separation described above in connection with FIG. 8C.

After undergoing the primary heating, the surface alignment reactant 10 is secondarily heated by, for example, one of the aforesaid secondary heating methods. During the secondary heating, the solvent of the surface alignment reactant 10 is, for example, vaporized. In the secondary heating, side chains of the reactive mesogen may be formed on the surface of the surface alignment reactant 10. After the secondary heating, the surface alignment reactant 10 is, for example, cleaned and dried by the aforementioned cleaning and drying methods.

After the drying, a sealant is formed by an aforementioned method corresponding thereto. As described above, the sealant may be hardened in UV having a wavelength of about 300 nm to about 400 nm, or in light having a wavelength of about 400 nm or more. Thereafter, in accordance with the aforementioned methods corresponding thereto, an upper-plate common voltage applying point (not shown) and a liquid crystal layer are formed, and the lower and upper display panels 100 and 200 are assembled. The sealant is hardened by light or heat as described above.

The assembled display panels are annealed by the aforementioned methods corresponding thereto, and provided with voltages by the DC voltage supply or multi-step voltage supply.

While liquid crystal molecules 31 and reactive mesogens are aligned in a specific tilt angle by the supplied voltage, the electric-field lithography process is performed on the assembled liquid crystal display panel assembly 300 by the aforementioned field exposure method. Unlike in the method of forming alignment films having negative electricity characteristics, the reactive mesogens may be aligned in a specific tilt angle through interaction with the liquid crystal molecules 31. The UV irradiated to the liquid crystal display panel assembly 300 having rigid vertical alignment components according to an exemplary embodiment of the present invention may be, for example, greater in intensity than the aforementioned UV. In accordance with an exemplary embodiment of the present invention, the intensity of UV irradiated to the liquid crystal display panel assembly 300 while an electric field is formed in the liquid crystal layer 3, may be, for example, about 6 J/cm$^2$ to about 17.5 J/cm$^2$. For example, the intensity of the UV irradiated may be about 12 J/cm$^2$. The reactive mesogen is hardened by light, forming the photo hardening layers 35 and 36 on the main alignment film 33/34, and as described above, the photo hardening layers 35 and 36 have a pre-tilt angle. However, as the main alignment film 33/34 according to an exemplary embodiment of the present invention has the rigid vertical alignment components, the pre-tilt angle of the photo hardening layers 35 and 36 may be small. The small pre-tilt angle of the photo hardening layers 35 and 36 may reduce the light leakage in black images, thereby increasing the image quality and contrast ratio of the liquid crystal display device.

Thereafter, the aforementioned fluorescent lithography process may be performed.

Through this process, the surface alignment reactant 10 having rigid vertical alignment components forms the alignment films, manufacturing the liquid crystal display panel assembly 300. The alignment films having rigid vertical alignment side-chains, manufactured according to an exemplary embodiment of the present invention, may reduce the black light leakage defects of the liquid crystal display device.

The liquid crystal display device with the alignment films 291 and 292 including the main alignment films 33 and 34 having rigid vertical alignment side-chains is manufactured according to an exemplary embodiment of the present invention. The surface alignment reactant 10 having rigid vertical alignment side-chains includes, for example, a cyclobutyl dianhydride of about 43 mol % as an alicyclic dianhydride-based monomer, a mono-methacrylic benzenediamine of about 8.5 mol % as a photo-reactive diamine-based monomer, an octadecyl cyclohexyl benzenediamine of about 6.5 mol % as an alkylated aromatic diamine-based monomer, a diphenyl diamine of about 28 mol % as an aromatic diamine-based monomer, and an epoxy benzene derivative of about 14 mol % as an aromatic epoxide-based monomer. Mol % of each component is its mol % in the surface alignment reactant 10, and the solvent is not involved in the composition ratio of the surface alignment reactant 10.

The liquid crystal display panel assembly 300 was manufactured according to the just mentioned method. The structure of the pixels PX of the liquid crystal display device was substantially similar to the structure of those in FIG. 3. The cell spacing in the liquid crystal layer 3 was, for example, about 3.6 μm, the width of the micro branches 197 of the pixel electrode 191 was about the exposure voltage was about 7.5V, about 10V, about 20V, about 30V and about 40V by the DC voltage supply, and UV intensity in the electric-field lithography process was about 7 J/cm², about 9 J/cm², about 11 J/cm², about 12 J/cm² and about 15 J/cm². The manufactured liquid crystal display device was operated by charge sharing-based 1G1D driving described above in conjunction with FIG. 11.

A response time of the manufactured liquid crystal display device was, for example, about 0.01 second to about 0.014 seconds, and a black afterimage thereof showed a good level of approximately 2.

In accordance with an exemplary embodiment of the present invention, the surface alignment reactant 10 forming the alignment films has, for example, a compound in which a light hardener and a crosslinker are bonded. The surface alignment reactant 10 is formed, with the light hardener bonded to the crosslinker, thus reducing the non-hardened light hardener remaining in the process of manufacturing the liquid crystal display panel assembly 300. The non-hardened light hardener increases an RDC in the liquid crystal display device, causing the afterimage defect. In accordance with an exemplary embodiment of the present invention, the alignment films manufactured by the surface alignment reactant 10 having a compound of the light hardener and the crosslinker reduce the afterimage (or persistence) of the liquid crystal display device.

The current exemplary embodiment of the present invention is substantially similar to the aforesaid method of manufacturing the liquid crystal display panel assembly 300 with the alignment films 291 and 292 having negative electricity characteristics, except for the material constituting the surface alignment reactant 10 and that the crosslinker bonded to the light hardener is linked to side chains of the main alignment film 33/34. Duplicate descriptions will be simplified or omitted.

Now, a detailed description will be made of a process of forming alignment films with a compound of a light hardener and a crosslinker. By the aforementioned methods corresponding thereto, the surface alignment reactant 10 having a compound of the light hardener and the crosslinker, is applied onto the lower display panel 100 with the pixel electrode 191 and the upper display panel 200 with the common electrode 270.

The compound of the light hardener and the crosslinker forms the surface alignment reactant 10 by being mixed with the material forming the main alignment film. The light hardener is chemically bonded to the crosslinker, thus reducing the occurrence of ionic impurities. The light hardener may be, for example, the aforementioned photo-reactive polymer, reactive mesogen, light hardener, photopolymerization material, or photo-isomerization material, and the light hardener forms photo hardening layers. The material forming the main alignment film may be one of the aforesaid materials for doing such, and it aligns the liquid crystal molecules 31 in, for example, a direction perpendicular to the surface of the substrates 110 and 210 or the pixel electrode 191.

Materials of a surface alignment reactant 10 including a compound of which a light hardener and a crosslinker are linked to each other will be described in detail below. A surface alignment reactant 10 including a compound of which a light hardener and a crosslinker are linked to each other according to an exemplary embodiment of the present invention is, for example, a mixture in which polyimide-based compounds and a crosslinker are mixed with each other. Polyimide-based compound is a compound of which, for example, a dianhydride group monomer and a diamine group monomer are chemically linked with each other. Polyimide-based compound can be manufactured by, for example, imidation of a dianhydride group monomer and a monomer included in diamine group monomers as described above. Monomers constituting diamine group monomers, e.g., alkylated aromatic diamine group monomers and aromatic diamine group monomers should be mixed, for example, prior to imidation.

A light hardener according to an exemplary embodiment of the present invention is, for example, a reactive mesogen. Therefore, a surface alignment reactant 10 including a compound of which a reactive mesogen and a crosslinker are linked with each other may be a polymer comprising, for example, dianhydride group monomers (e.g., alicyclic dianhydride group monomers), diamine group monomers (e.g., alkylated aromatic diamine group monomers and aromatic diamine group monomers), and a crosslinker (e.g., aromatic acryl-epoxide group monomers). Aromatic acryl-epoxide group monomers according to an exemplary embodiment of the present invention are compounds of which a reactive mesogen and a crosslinker are linked with each other.

A surface alignment reactant 10 including a compound of which a reactive mesogen and a crosslinker are linked with each other is comprised of, for example, alicyclic diahydride group monomers of about 31 mol % to about 41 mol % (e.g., about 36 mol %), alkylated aromatic diamine group monomers of about 3 mol % to about 9 mol % (e.g., about 6 mol %), aromatic diamine group monomers of about 25 mol % to about 35 mol % (e.g., about 30 mol %), and aromatic acryl epoxide group monomers of about 23 mol % to about 33 mol % (e.g., about 28 mol %). A mol % composition ratio of a surface alignment reactant 10 is mol % except for a solvent.

Alicyclic diahydride group monomers facilitate polymers included in a surface alignment reactant 10 to be dissolved in a solvent, and enable electro-optic properties of an alignment film, for example, a VHR, to be increased, and an RDC voltage to be decreased. A structure of alicyclic diahydride group monomers may be, for example, a cyclobutyl dianhydride monomer represented by formula XVI-RCA.

Alkylated aromatic diamine group monomers are, for example, monomers of a vertical alignment component. The cyclic ring linked with benzene makes a vertical alignment rigid. A cyclic ring may be, for example, a plate-type molecule. The structure of an alkylated aromatic diamine monomer may be, for example, octadecyl cyclohexyl benzenediamine represented by formula XVIII-RCA1 or alkyl substituted aliphatic aromatic benzenediamine represented by formula XVIII-RCA2.

Aromatic diamine group monomers facilitate polymers included in a surface alignment reactant 10 to be dissolved in a solvent. The structure of aromatic diamine group monomers may be, for example, diphenyl diamine represented by formula VI-RCA as mentioned above.

Aromatic acryl-epoxide group monomers form a crosslinked structure to increase heat resistance and chemical resistance, and are cured by UV to form a photo hardening layer having a pre-tilt angle. An aromatic acryl-epoxide group monomer is, for example, a compound of which an epoxy molecule which is a crosslinker and an acrylate molecule which is a light hardener are chemically linked with each other. As a light hardener is linked with a crosslinker, the generation of ionic impurities may decrease. The structure of an aromatic acryl-epoxide group monomer may be, for example, an acryl-epoxy hybrid benzene derivative represented by formula XIIIC.

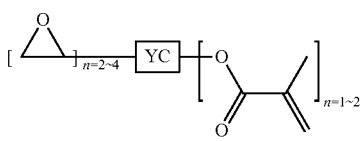

Formula XIII-C where YC may be a phenyl derivative.

An acryl-epoxy hybrid benzene derivative can be manufactured by, for example, mixing an epoxy substituted phenol derivative and a methacrylic chloride in a polar solvent to produce a mixture, and esterifying this mixture.

The aforesaid photoinitiator may be added to the surface alignment reactant 10. Unlike the surface alignment reactant 10 having negative electricity characteristics, the surface alignment reactant 10 having a compound of a light hardener and a crosslinker may not have the polymer having negative electricity characteristics.

After being applied, the surface alignment reactant 10 having a compound of a reactive mesogen and a crosslinker is, for example, primarily heated by the aforementioned primary heating method. While being primarily heated, monomers of the reactive mesogen components and the vertical alignment components forming the main alignment film are aligned, for example, in perpendicular to the lower layer of 10. During the primary heating, the surface alignment reactant 10 having a compound of a reactive mesogen and a crosslinker may not undergo phase separation described above in connection with FIG. 8C.

After undergoing the primary heating, the surface alignment reactant 10 is secondarily heated by, for example, the aforementioned secondary heating method. The solvent of the surface alignment reactant 10 is, for example, vaporized by the secondary heating. In addition, the crosslinker bonded to the reactive mesogen is linked to a side chain of the polymer forming the main alignment film. Therefore, side chains of the reactive mesogen are formed on the surface of the surface alignment reactant 10.

After the secondary heating, the surface alignment reactant 10 is, for example, cleaned and then dried by an aforementioned cleaning and drying method. After the drying, a sealant is formed by one of the aforementioned sealing methods. As described above, the sealant may be hardened in UV having a wavelength of about 300 nm to about 400 nm, or in light having a wavelength of about 400 nm or more. Thereafter, in accordance with the aforementioned methods corresponding thereto, an upper-plate common voltage applying point (not shown) and a liquid crystal layer are formed, and the lower and upper display panels 100 and 200 are assembled. The sealant is hardened by light or heat as described above.

Figure 7A:
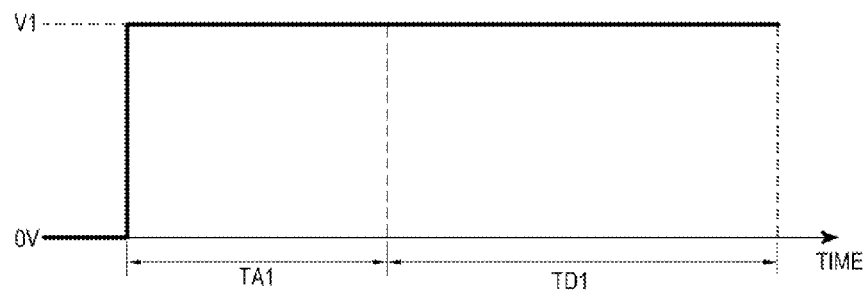
FIG. 7A is a waveform diagram for providing a DC voltage to a liquid crystal display panel assembly.
Figure 7B:
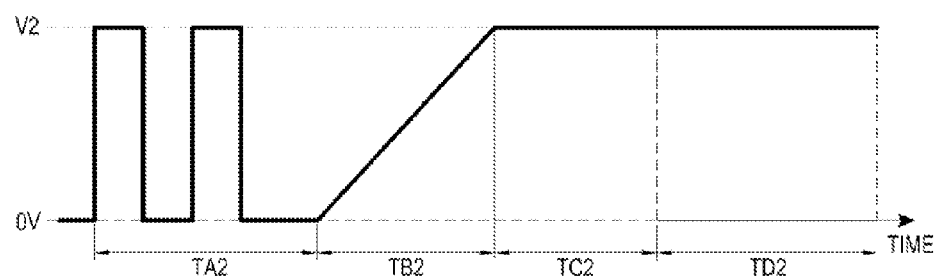
FIG. 7B is a waveform diagram for providing a multi-step voltage to a liquid crystal display panel assembly.

The assembled display panels are annealed by the aforementioned annealing methods, and provided with voltages by the DC voltage supply or multi-step voltage supply of FIG. 7A or 7B. The process in which an electric field is formed in the liquid crystal layer 3 is substantially similar to the aforementioned process corresponding thereto. Unlike the method of forming the alignment films having negative electricity characteristics, the vertically aligned reactive mesogen is aligned to be tilted in the electric field through interaction with liquid crystal molecules 31. While the liquid crystal molecules 31 and the reactive mesogens are aligned in a specific tilt angle by the supplied voltage, the electric-field lithography process is performed on the assembled liquid crystal display panel assembly 300 by the aforementioned field exposure method. An acrylate reactive group of the reactive mesogen is hardened by, for example, light to form a network among reactive mesogen monomers. The reactive mesogen formed as a network forms the photo hardening layers 35 and 36 having a pre-tilt angle on the main alignment film 33/34. The photo hardening layer according to an exemplary embodiment of the present invention, e.g., reactive mesogen, is bonded to the crosslinker, thus significantly reducing the non-hardened reactive mesogen and the occurrence of ionic impurities. In addition, the combination of the reactive mesogen and the crosslinker reduces the ionic impurities and the RDC, contributing to the increased afterimage of the liquid crystal display device.

Thereafter, the aforementioned fluorescent lithography process may be performed.

By doing so, the surface alignment reactant 10 having a compound of a reactive mesogen and a crosslinker forms the alignment films, manufacturing the liquid crystal display panel assembly 300. The alignment films manufactured by the compound bonded to the crosslinker according to an exemplary embodiment of the present invention can reduce the afterimage defect of the liquid crystal display panel.

In accordance with an exemplary embodiment of the present invention, the alignment films 291 and 292 formed by the surface alignment reactant 10 having a compound of a reactive mesogen and a crosslinker were manufactured, and the liquid crystal display device having them was manufactured. In accordance with an exemplary embodiment of the present invention, the surface alignment reactant 10 forming the alignment films included, for example, a cyclobutyl dianhydride of about 36 mol % as an alicyclic dianhydride-based monomer, an octadecyl cyclohexyl benzenediamine of about 6 mol % as an alkylated aromatic diamine-based monomer, a diphenyl diamine of about 30 mol % as an aromatic diamine-based monomer, and an acryl-epoxy hybrid benzene derivative of about 28 mol % as an aromatic acryl-epoxide-based monomer. Mol % of each component is its mol % in the surface alignment reactant 10, and the solvent is not involved in the composition ratio of the surface alignment reactant 10.

The liquid crystal display panel assembly 300 was manufactured according to the just mentioned method. The structure of the pixels PX of the liquid crystal display device was substantially similar to the structure of those in FIG. 3. The cell spacing in the liquid crystal layer 3 was, for example, about 3.6 µm, the width of the micro branches 197 of the pixel electrode 191 was about 3 µm, the exposure voltage was about 30V, about 40V and about 50V by the DC voltage supply, and UV intensity in the electric-field lithography process was about 9 J/cm², about 12 J/cm² and about 17 J/cm². The manufactured liquid crystal display device was operated by charge sharing-based 1G1D driving described above in conjunction with FIG. 11.

The manufactured liquid crystal display device was operated, for example, for about 336 hours, and its black afterimage showed a good level of approximately 2 or less.

In accordance with another exemplary embodiment of the present invention, the surface alignment reactant 10 forming the alignment films has a compound, for example, in which an inorganic material and a light hardener are bonded. In other words, the surface alignment reactant 10 consisting of an inorganic material bonded to a light hardener is used to form the alignment films.

Unlike the organic-based material, the inorganic material forming alignment films does not absorb ionic impurities in the liquid crystal, has small changes in physical properties, and is not oxidized or does not generate ionic impurities at a high temperature. Thus, the alignment films formed by the inorganic material bonded to the light hardener may not only have small changes in physical properties and a photo hardening layer having a stable pre-tilt angle, but may also reduce the afterimage and stains of the liquid crystal display device despite a long operating time and do not reduce a VHR. In addition, the inorganic material can form the alignment films even at a low temperature, making it possible to select various materials forming a lower layer of the alignment films. The inorganic material may be, for example, an orthosilicate-based monomer or a siloxane-based monomer. An alignment film formed of the organic-based material reduces the VHR and generates afterimages, stains and a DC voltage because a lot of non-imidized carboxy groups may absorb ionic impurities in the liquid crystal. Herein, 'imidization' refers to performing thermal cyclodehydration on polyamic acid obtained by conducting condensation polymerization on the dianhydride and the aromatic diamine.

In accordance with an embodiment of the present invention, the inorganic material may comprise, for example, silicon, aluminum, titanium, or the like. The inorganic material may be, for example, silicon oxide (SiOx) such as SiO2 and SiO, or metal oxide such as MgO and ITO.

The current exemplary embodiment of the present invention is substantially similar to the aforesaid method of manufacturing the liquid crystal display panel assembly 300 with the alignment films 291 and 292 having negative electricity characteristics, except for the material constituting the surface alignment reactant 10 and the secondary heating for forming the main alignment film 33/34. Duplicate descriptions will be simplified or omitted.

The surface alignment reactant 10 having a compound of an inorganic material and a light hardener is applied by the aforementioned methods (corresponding thereto) on the lower display panel 100 with the pixel electrode 191 and the upper display panel 200 with the common electrode 270. The inorganic material and the light hardener may be chemically bonded. In accordance with an exemplary embodiment of the present invention, the surface alignment reactant 10 may be deposited on the pixel electrode 191 and the common electrode 270 by, for example, vapor deposition such as Chemical Vapor Deposition (CVD).

Materials of a surface alignment reactant 10 including a compound of which inorganic-based materials and a crosslinker are linked with each other will be described in detail below. According to an exemplary embodiment of the present invention, a surface alignment reactant 10 including a compound of which inorganic-based materials and a crosslinker are linked with each other is, for example, a compound of which an alkyl alcohol group monomer and a vinyl alcohol group monomer included in orthosilicate group monomers and alkoxide group monomers are chemically linked with each other. A surface alignment reactant 10 can be manufactured by, for example, mixing orthosilicate group monomers, alkyl alcohol and vinyl alcohol monomers in a polar solvent to produce a mixture, stirring this mixture in H2O comprising acid or base catalyst to liberate hydroxyl group from alkyl alcohol and vinyl alcohol, which nucleophilic-attacks silicone atom of orthosilicate to perform hydrolysis and condensation polymerization.

According to an exemplary embodiment of the present invention, inorganic-based materials are, for example, orthosilicate group monomers. Therefore, a surface alignment reactant 10 including a compound of which inorganic materials and a crosslinker are linked with each other may be a polymer comprised of, for example, alkoxide group monomers of about 40 mol % to about 70 mol % (e.g., about 56 mol %), which comprise orthosilicate group monomers of about 30 mol % to about 60 mol % (e.g., about 44 mol %) and a crosslinker. Orthosilicate group monomers may be, for example, tetraalkoxy orthosilicate monomers. Alkoxide group monomers may be comprised of, for example, monomers comprising alkyl alcohol group monomers of about 1 mol % to about 10 mol % (e.g., about 6 mol %) and a crosslinker of about 40 mol % to about 60 mol % (e.g., about 50 mol %). A mol % composition ratio of each component in a surface alignment reactant 10 is mol % except for a solvent. Monomers including a light hardener according to the present invention may be at least one selected from, for example, vinyl alcohol group monomers, acryl group monomers, cinnamoyl group monomers and mixtures or combinations thereof.

Orthosilicate group monomers form a main chain of the main alignment film, facilitate monomers included in a surface alignment reactant 10 to be dissolved in a solvent, and increase electro-optic properties of the alignment film, for example, VHR. Orthosilicate group monomers according to an exemplary embodiment of the present invention may be, for example, tetraalkoxy orthosilicate group monomers. The structure of a tetraalkoxy orthosilicate group monomer may include, for example, a tetraethyl orthosilicate monomer represented by formula XIX-T1, an alkyl group monomer, or hydroxyl group monomer.

Formula XIX-T1

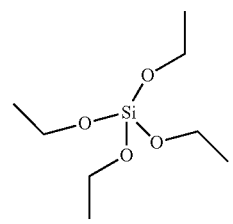

Orthosilicate group monomers according to the present invention may be a polysiloxane group polymer manufactured by, for example, polymerizing silane compounds, or polymerizing alkoxy silane compounds.

Alkyl alcohol group monomers are a monomer of vertical alignment component connected with a side chain of orthosilicate group polymers forming a main chain. Therefore, alkyl alcohol group monomer may comprise, for example, long alkyl-based polymers. The structure of alkyl alcohol group monomers may be, for example, a dodecanol monomer represented by following formula XIX-A1, a cholesteric group monomer represented by formula XIX-A2, an alkylated alicyclic group monomer represented by formula XIX-A3, an alkylated aromatic group monomer represented by formula XIX-A4 or an alkyl group monomer.

Formula XIX-A1

Formula XIX-A2

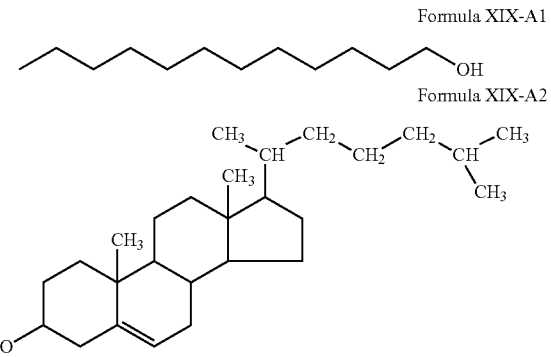

Formula XIX-A3

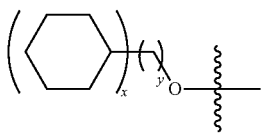

x = 1 ~ 5
y = 1 ~ 10

Formula XIX-A4

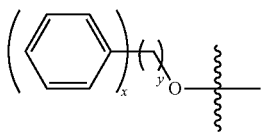

x = 1 ~ 5
y = 1 ~ 10

Vinyl alcohol group monomers are, for example, a vinyl group monomer which is cured by UV to form a photo hardening layer having a pre-tilt angle. Vinyl alcohol group monomers are connected with a side chain of orthosilicate-based polymer forming a main chain. The structure of a vinyl alcohol group monomer may be, for example, a hydroxyalkyl acrylate monomer represented by formula XIX-V1 or an alkylated vinyl group monomer represented by formula XIX-V2.

Formula XIX-V1

Formula XIX-V2

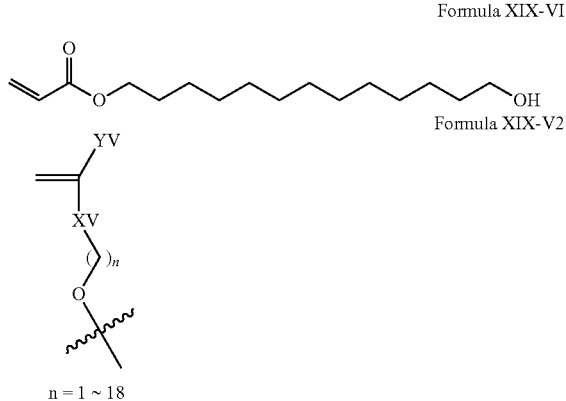

n = 1 ~ 18 where XV may be alkyl, ether or ester, and YV may be methyl or hydrogen. Cinnamoyl group monomers are connected with a side chain of orthosilicate-based polymer forming a main chain, and are cured by UV to form a photo hardening layer having a pre-tilt angle. A hydroxyalkyl acrylate monomer can be manufactured by mixing alkanediol and acrylic chloride in a polar solvent to produce a mixture, and esterifying this mixture.

The structure of a cinnamoyl group monomer may be, for example, an alkylated cinnamoyl group monomer represented by formula XIX-C1.

Formula XIX-C1

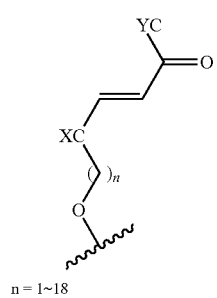

n = 1~18 where XC may be any one selected from alkyl, ether, ester, phenyl, cyclohexyl, and ester-phenyl. YC may be any one selected from alkyl, phenyl, biphenyl, cyclohexyl, bicyclohexyl, and phenyl-cyclohexyl. A light hardener may be the above-described photo-reactive polymer, reactive mesogen, light hardener, photo-polymerizable material or photo-isomerizable material. A photo initiator mentioned above may be added to a surface alignment reactant 10 including a compound of which inorganic-based materials and a light hardener are linked with each other.

The applied surface alignment reactant 10 having a compound of an inorganic material and a light hardener is primarily heated by, for example, the aforementioned primary heating method. While being primarily heated, the alkyl alcohol-based molecules of vertical alignment components linked to side chains of the orthosilicate-based monomer and the light hardener forming the photo hardening layers 35 and 36 are, for example, aligned in perpendicular to the lower layer of 10. During the primary heating, the applied surface alignment reactant 10 having a compound of an inorganic material and a light hardener may not undergo phase separation as described above in connection with FIG. 8C.

After undergoing the primary heating, the surface alignment reactant 10 is, for example, secondarily heated at a temperature lower than the aforementioned secondary heating temperature, e.g., at about 150° C. to about 200° C. (e.g., about 180° C.). The secondary heating may be performed, for example, for about 1000 seconds to about 1400 seconds (e.g., about 1200 seconds). Because of the low secondary heating temperature, the material constituting the lower layer of the surface alignment reactant 10 may be selected from a wide range of materials. A color filter material formed on the bottom of the surface alignment reactant 10 according to an exemplary embodiment of the present invention may be, for example, a dye that can be processed at a low temperature. During the secondary heating, the solvent of the surface alignment reactant 10 is, for example, vaporized, and the orthosilicate-based monomer constituting the main chain and the alkyl alcohol-based monomer of vertical alignment components linked to side chain, form the main alignment film 33/34. The main alignment film 33/34 formed by the surface alignment reactant 10 having a compound of an inorganic material and a light hardener, does not absorb ionic impurities, and is not oxidized or does not generate ionic impurities at a high temperature, thus reducing afterimages and stains of the liquid crystal display device and increasing a VHR.

After the secondary heating, the surface alignment reactant 10 having a compound of an inorganic material and a light hardener is, for example, cleaned and dried by an aforementioned cleaning and drying method. The surface alignment reactant 10 according to an exemplary embodiment of the present invention is not deteriorated in material properties by the cleaning or drying process.

After the drying, a sealant is formed by one of the aforementioned sealing methods. As described above, the sealant may be hardened in UV having a wavelength of about 300 nm to about 400 nm, or in light having a wavelength of about 400 nm or more. Next, in accordance with the aforementioned methods corresponding thereto, an upper-plate common voltage applying point (not shown) and a liquid crystal layer are formed, and the lower and upper display panels 100 and 200 are assembled. The sealant is hardened by light or heat as described above.

The assembled display panels are annealed by one of the aforementioned annealing methods, and provided with voltages by the DC voltage supply or multi-step voltage supply of FIGS. 7A and 7B. The process in which an electric field is formed in the liquid crystal layer is substantially similar to the aforementioned electric-field forming process. Unlike the method of forming the alignment films having negative electricity characteristics, the vertically aligned light hardener or reactive mesogen is aligned, for example, to be tilted in the electric field through interaction with liquid crystal molecules 31. While the liquid crystal molecules and the reactive mesogens are aligned in a specific tilt angle by the supplied voltage, the electric-field lithography process is performed on the assembled liquid crystal display panel assembly by an aforementioned field exposure method. The UV intensity in the electric-field lithography process may be, for example, about 6 J/cm$^2$ to about 20 J/cm$^2$ (e.g, about 12 J/cm$^2$).

An acrylate reactive group of the reactive mesogen is, for example, hardened by light to form a network among reactive mesogen monomers. The reactive mesogen formed as a network forms the photo hardening layers 35 and 36 having a pre-tilt angle on the main alignment film 33/34. The main alignment film 33/34 and the photo hardening layer 35/36 formed in the pre-process form the alignment film. The photo hardening layer 35/36 formed by the surface alignment reactant 10 having a compound of an inorganic material and a light hardener shows excellent reliability and stability because of the combination with the inorganic material.

Thereafter, the aforementioned fluorescence lithography process may be performed.

By doing so, the surface alignment reactant 10 having a compound of an inorganic material and a light hardener, forms the alignment films consisting of the main alignment films 33 and 34 and the photo hardening layers 35 and 36, thereby manufacturing the liquid crystal display panel assembly 300 having the alignment films.

In accordance with an exemplary embodiment of the present invention, the alignment films formed by the surface alignment reactant 10 having a compound of an inorganic material and a light hardener have photo hardening layers having a stable pre-tilt angle, and the alignment films show excellent thermal resistance, long-term reliability, chemical resistance, and uniformity. In addition, the surface alignment reactant 10 having a compound of an inorganic material and a light hardener may reduce the time for manufacturing the liquid crystal display device, as it needs no additional process because of its excellent electrostatic elimination properties.

In accordance with an exemplary embodiment of the present invention, the alignment films 291 and 292 formed by the surface alignment reactant 10 having a compound of an inorganic material and a light hardener were manufactured, and the liquid crystal display device having them was manufactured. In accordance with an exemplary embodiment of the present invention, the surface alignment reactant 10 forming the alignment films included, for example, a tetraalkoxy orthosilicate-based monomer of about 44 mol % as a tetraalkoxy orthosilicate-based monomer, a dodecanol-based monomer of about 6 mol % as an alkyl alcohol-based monomer, and a hybroxyalkyl acrylate-based monomer of about 50 mol % as a vinyl alcohol-based monomer. Mol % of each component is for the surface alignment reactant 10, with a solvent excluded.

The liquid crystal display panel assembly 300 was manufactured according to the just mentioned method. The structure of the pixels PX of the liquid crystal display device was substantially similar to the structure of those in FIG. 3. The cell spacing in the liquid crystal layer 3 was, for example, about 3.6 μm, the width of the micro branches 197 of the pixel electrode 191 was about 4 μm, the exposure voltage was about 20V or about 24V by the DC voltage supply, and UV intensity in the electric-field lithography process was about 5 J/cm$^2$, about 10 J/cm$^2$, and about 20 J/cm$^2$. The manufactured liquid crystal display device was operated by charge sharing-based 1G1D driving described above in conjunction with FIG. 11.

In the manufactured liquid crystal display device, the VHR was, for example, about 90.5% or more, the ion density was about 5 pC/cm$^2$ or less, and the black afterimage showed a good level of about 2.5 in a 168-hour operation.

In accordance with an exemplary embodiment of the present invention, the surface alignment reactant 10 forming an alignment film is, for example, a mixture of inorganic materials in which functional groups are bonded. The alignment film including an inorganic material may have an excellent adhesion with the lower layer, a low adhesion with ionic impurities existing the liquid crystal layer, and a high reliability when used in an oxidizing atmosphere at a high temperature for a long time.

First, a surface alignment reactant 10 manufactured by mixing inorganic group compounds linked with functional groups will be described in detail. A surface alignment reactant 10 mixed with inorganic-based compounds is a mixture of the first surface alignment compounds (not shown) comprising the first inorganic material and the second surface alignment compounds (not shown) comprising the second inorganic-based materials. According to the present invention, the first inorganic-based materials and the second inorganic-based materials may be, for example, a siloxane. The first surface alignment compound may have a functional group which increases the reliability and the physical property of an alignment film. The second surface alignment compound may have various functional groups which aligns liquid crystal molecules. Functional groups will be described below. A solvent used to mix the first surface alignment compound and the second surface alignment compound may be, for example, hexylene glycol (HG), butyl cellosolve (BCS), 1,3-butanediol (1,3-BD) or propylene glycol monobutyl ether. A solvent may be any of materials other than the above-described materials which can dissolve the first surface alignment compound and the second surface alignment compound. The sum of the first surface alignment compound and the second surface alignment compound included in a surface alignment reactant 10 may be, for example, about 2 wt % to about 4 wt %, and a solvent may be about 96 wt % to about 98 wt %. According to the present invention, the first surface alignment compound and the second surface alignment compound may be mixed in, for example, a weight ratio of about 6~about 8 to about 2~about 4 (e.g., in a weight ratio of about 7 to about 3). A solvent is not included in the weight ratio. According to an exemplary embodiment of the present invention, a solvent included in a surface alignment reactant 10 comprises, for example, hexylene glycol (HG) of about 45 wt % to about 65 wt %, butyl cellosolve (BCS) of about 10 wt % to about 30 wt %, and propylene glycol monobutyl ether of about 15 wt % to about 35 wt %. According to an exemplary embodiment of the present invention, a solvent included in a surface alignment reactant 10 comprises, for example, hexylene glycol (HG) of about 25 wt % to about 45 wt %, butyl cellosolve (BCS) of about 8 wt % to about 28 wt %, 1,3-butane diol (1,3-BD) of about 3 wt % to about 11 wt %, and propylene glycol monobutyl ether of about 30 wt % to about 50 wt %. According to an exemplary embodiment of the present invention, a surface alignment reactant 10 may comprise, for example, the first surface alignment compound of about 2.1 wt %, the second surface alignment compound of about 0.9 wt %, hexylene glycol of about 65 wt %, butyl cellosolve of about 30 wt %, and 1,3-butane diol of about 5 wt %. As the surface alignment reactant 10 includes the first surface alignment compound and the second surface alignment compound in a mixture, it may be readily phase-separated into a material comprising a first surface alignment compound and a material comprising a second surface alignment compound in a process of forming an alignment film.

According to the present invention, the first surface alignment compound comprises, for example, a compound of the following formula IM1. A compound of the following formula IM1 is a compound in which siloxane group monomer which is a kind of inorganic-based materials, and IM-R6 functional group are linked to each other. The first surface alignment compound can be stably linked with a lower layer. As the first surface alignment compound has a feature of inorganic materials, alignment films 291 and 292 comprising the first surface alignment compound may have good reliability. As the first surface alignment compound comprises an equal polarity (e.g., hydrophilicity or hydrophobicity) to that of a lower layer, it can be readily phase-separated from the second surface alignment compound having a different polarity in a heating process described below. IM-R6 functional group included in the first surface alignment compound may substantially have the hydrophilic features.

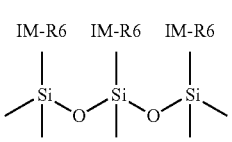

Formula IM1

In the above formula IM1, IM-R6 may comprise alkyl group monomers or hydroxyl group monomers. An alkyl group monomer may comprise about 0 to about 5 carbon atoms.

According to an exemplary embodiment of the present invention, the first surface alignment compound can be synthesized, for example, as in the following reaction formula IM1-M1. The first surface alignment compound can be manufactured by, for example, mixing tetraethyl orthosilicate in a polar solvent (tetrahydrofuran, THF) to produce a mixture, and stirring this mixture in water (H2O) comprising acid (for example, hydrochloric acid, HCl) or base catalyst.

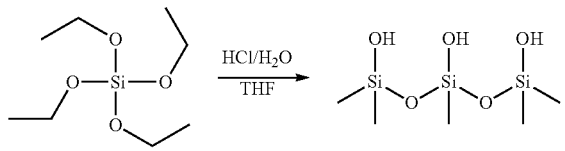

Reaction formula IM1-M1

The second surface alignment compound will be described in detail below. According to the present invention, the second surface alignment compound comprises, for example, the following formula IM2. Formula IM2 is a structure in which a siloxane group monomer which is a kind of inorganic-based material, and IM-T1, IM-T2 and IM-T3 functional groups are linked to each other. IM-T1, IM-T2 and IM-T3 functional groups are each linked to a siloxane group monomer constituting a main chain to form a side chain.

IM-T1 functional group is a vertical functional group which can vertically align liquid crystal molecules with respect to a lower layer. IM-T1 functional group can interact with liquid crystal molecules. IM-T2 functional group can be polymerized by, for example, light (e.g., UV) or heat. IM-T2 functional groups are a pre-tilt functional group which can be cross-linked, or polymerized or cured to align liquid crystal molecules to be tilted. IM-T3 functional groups are a functional group which can increase the reliability of the alignment film which is formed by the second surface alignment compound, and enhance physical properties. The second surface alignment compound comprises, for example, IM-T1 functional group of about 5 mol % to about 15 mol % (e.g. about 10 mol %), IM-T2 functional group of about 40 mol % to about 60 mol % (e.g., about 50 mol %), and IM-T3 functional group of about 30 mol % to about 50 mol % (e.g., about 40 mol %). A mol % of respective functional group is a mol % in the second surface alignment compound except for siloxane and a solvent. The second surface alignment compound comprising these various functional groups can be readily phase-separated in a process of forming alignment films. As various functional groups can align liquid crystal molecules to be perpendicular to or tilted with respect to a lower layer, they can increase the characteristics of a liquid crystal display device. IM-T1 and IM-T2 functional groups included in the second surface alignment compound can, for example, substantially have hydrophobic features. The second surface alignment compound may comprise, for example, the photo initiator described above.

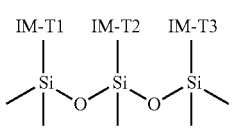

Formula IM2

IM-T1 functional group may comprise, for example, a monomer of the vertical alignment component which vertically aligns liquid crystal molecules of a liquid crystal layer. IM-T1 functional group may comprise, for example, monomers represented by the above-mentioned formulas XIX-A, XIX-A2, XIX-A3 and XIX-A4. IM-T1 functional group may comprise, for example, an alkyl alcohol group monomer having about 5 to 20 carbon atoms.

IM-T2 functional group may be, for example, polymerized and cross-linked by light (e.g., UV) or heat energy in a process of forming alignment films, to form a photo hardening layer having a pre-tilt angle. IM-T2 functional group may comprise, for example, a vinyl group, an acrylic group, an acrylate group, a cinnamate group or a methacrylate group. The vinyl group or the acrylic group may include, for example, aliphatic alkyl group having 1 to 18 carbon atoms. IM-T2 functional group may comprise, for example, monomers represented by the above-mentioned formulas XIX-V1, XIX-V2 and XIX-C1. According to an exemplary embodiment of the present invention, IM-T2 functional group may comprise, for example, the above-mentioned photo-reactive polymer, reactive mesogen, light hardener, photo-polymerizable material or photo-isomerizable material.

IM-T3 functional group may include, for example, materials described above with reference to IM-R6.

According to an exemplary embodiment of the present invention, the second surface alignment compound can be, for example, synthesized as in the following reaction formula IM2-M1. The second surface alignment compound can be formed by, for example, mixing tetraethyl orthosilicate in a polar solvent (tetrahydrofuran, THF) to produce a mixture, and stirring this mixture together with long alkyl and alkylated acrylate, in water (H2O) comprising acid (e.g., hydrochloric acid, HCl) or base catalyst. The long alkyl group can serve as IM-T1 functional group. Acrylate group can serve as IM-T2 functional group. The second surface alignment compound can be manufactured by, for example, nucleophilic hydrolysis and condensation polymerization.

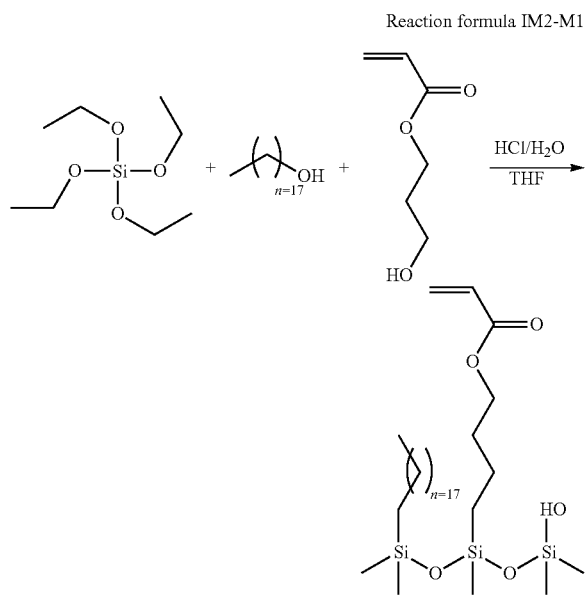

Reaction formula IM2-M1

A process of manufacturing the alignment films 291 and 292 and the liquid crystal display panel assembly 300 using the aforesaid surface alignment reactant 10 manufactured by mixing the inorganic-based compounds in which functional groups are bonded will now be described in detail. This surface alignment reactant 10 includes, for example, the first surface alignment compound for increasing the reliability and the material properties of the alignment film, and the second surface alignment compound having functional groups for aligning the liquid crystal molecules. The surface alignment reactant 10, in which the inorganic-based compounds are mixed, may form the alignment film of the liquid crystal display panel assembly 300 substantially by the SC-VA mode-based method. A method of forming the alignment films 291 and 292 will be described in detail with reference to FIGS. 8A to 8E. Duplicate descriptions will be simplified or omitted. Differences between the SC-VA mode-based method and the method of forming the alignment film according to an exemplary embodiment of the present invention will now be described in detail.

The lower display panel 100 with the pixel electrode 191 and the upper display panel 200 with the common electrode 270 are manufactured in the above/below-described methods. A method of forming the alignment film using the above-described surface alignment reactant 10 manufactured by mixing the inorganic-based compounds in which functional groups are bonded will now be described in detail. To avoid duplicate descriptions, the method of forming the upper-plate alignment film 292 will be omitted, and only the method of forming the lower-plate alignment film 291 will be described.

Referring to FIG. 8A, the surface alignment reactant 10 manufactured by mixing the inorganic-based compounds in which functional groups are bonded, is formed on the pixel electrode 191 by the above-described methods.

Referring to FIG. 8B, the surface alignment reactant 10 including the first and second surface alignment compounds is, for example, primarily heated in the aforesaid method. In the primary heating process, the solvent of the surface alignment reactant 10 may be removed.

Referring to FIG. 8C, the surface alignment reactant 10 is phase-separated into a surface inorganic layer 33a and a surface functional group layer 35a. The surface inorganic layer 33a is a layer in contact with the pixel electrode 191, while the surface functional group layer 35a is a layer in contact with the air. As the surface alignment reactant 10 is phase-separated, the surface inorganic layer 33a may substantially include the first surface alignment compound while the surface functional group layer 35a may substantially include the second surface alignment compound. In the primary heating process, siloxanes included in the surface inorganic layer 33a and the surface functional group layer 35a are bonded, forming polysiloxanes. The polysiloxanes form the main chains in the surface inorganic layer 33a and the surface functional group layer 35a. The functional groups IM-T1 included in the surface functional group layer 35a are disposed in contact with the air, and may be, for example, arranged perpendicularly to the surface of the substrate or the pixel electrode 191. The functional groups IM-T2 included in the surface functional group layer 35a may be disposed in contact with the air. The first surface alignment compound may have, for example, hydrophilic properties, while the second surface alignment compound may have, for example, hydrophobic properties. Each of the first and second surface alignment compounds may include, for example, the aforesaid materials.

Referring to FIGS. 8D and 8E, the phase-separated surface inorganic layer 33a and surface functional group layer 35a are secondarily heated in the aforesaid method. In the secondary heating process, the phase-separated surface inorganic layer 33a and surface functional group layer 35a are hardened. The polysiloxanes included in the surface inorganic layer 33a and the surface functional group layer 35a additionally undergo cross-linking, forming a stable matrix. By the secondary heating process, the surface inorganic layer 33a forms a surface inorganic alignment film 33. The polysiloxanes included in the surface inorganic layer 33a may be cross-linked to the polysiloxanes included in the surface functional group layer 35a. In the secondary heating process, hydroxyl ions remaining in the surface inorganic layer 33a and the surface functional group layer 35a may be removed. In an exemplary embodiment of the present invention, reference numerals 33a, 33 and 35a are used to indicate different names, e.g., the surface inorganic layer 33a, the surface inorganic alignment film 33, and the surface functional group layer 35a, because they have partially different functions from those of the surface main alignment material layer 33a, the main alignment film 33, and the surface light hardener layer 35a. In an embodiment of the present invention, the primary heating process may be omitted, and the reactions described above with reference to the primary and secondary heating processes may occur in the secondary heating process.

Thereafter, for example, the surface inorganic alignment film 33 or the surface functional group layer 35a are cleaned by DIW, and may be further cleaned by IPA. After the cleaning, the surface inorganic alignment film 33 or the surface functional group layer 35a is dried.

In step S240, as described above, the sealant, the upper-plate common voltage applying point, and the liquid crystal layer 3 are formed, and the lower display panel 100 and the upper display panel 200 are assembled. The assembled lower and upper display panels 100 and 200 may be annealed in the aforesaid method.

In step S250, an exposure voltage is applied and light is irradiated to the assembled lower and upper display panels 100 and 200, forming a surface functional hardening layer 35. The surface inorganic alignment film 33 and the surface functional hardening layer 35 form the lower-plate alignment film 291. A surface inorganic alignment film 34 and the surface functional hardening layer 36 included in the upper-plate alignment film 292 may be formed in the above/below-described methods.

A method of forming the surface functional hardening layer 35 will be described in detail below with reference to step S250. In step S252, an electric field is applied to the liquid crystal layer 3. The electric field may be formed in the liquid crystal layer 3 in the methods described with reference to step S152. In step S254, an electric-field lithography process is performed, in which light is irradiated to the assembled lower and upper display panels 100 and 200 while an electric field is formed in the liquid crystal layer 3. The electric-field lithography process may be performed in the aforesaid method.

By the electric-field lithography process, the functional groups IM-T2 included in the surface functional group layer 35a are cured. The cured functional groups IM-T2 may form the surface functional hardening layer 35. The functional groups IM-T2 are cured to be tilted in, for example, the substantially same direction as that of their near liquid crystal molecules 31 by the incident UV in the method described above with reference to FIGS. 9A and 9B. The functional groups IM-T2 may form, for example, a network in which they are bonded to each other, by undergoing polymerization. For example, a double bond of alkenes included in the functional groups IM-T2 may be unfastened by UV, making it possible for the functional groups IM-T2 to form the network or to undergo cross-linking by being bonded to their adjacent functional groups IM-T2. The liquid crystal molecules 31 adjacent to the functional groups IM-T2 may be arranged at a substantially constant pre-tilt angle by the hardened functional groups IM-T2. The liquid crystal molecules 31 may be normally arranged at the substantially constant pre-tilt angle when an electric field is not applied to the liquid crystal layer 3 as described above. An average of the pre-tilt angles of the liquid crystal molecules 31 may correspond to the pre-tilt angle of, for example, the photo hardening layer. The pre-tilt angle may coincide with, for example, the tilt direction being parallel to the longitudinal direction of the micro branches 197 of the pixel electrode 191. The hardened functional groups IM-T2, the functional groups IM-T1 and the functional groups IM-T3 may be linked to the side chains of the polysiloxanes formed by the siloxanes included in the surface functional group layer 35a. The aforementioned fluorescent lithography process may be optional. The polysiloxanes formed by performing the primary and secondary heating on the second surface alignment compound may be formed on the polysiloxanes formed by the first surface alignment compound. Likewise, the fluorescent lithography process may be optional. The upper-plate surface functional hardening layer 36 may be formed by the method of forming the lower-plate surface functional hardening layer 35.

The liquid crystal display panel assembly 300 having the surface alignment reactant 10 manufactured by mixing inorganic-based compounds in which functional groups are bonded, may have the characteristics of the SC-VA mode. The surface alignment reactant 10 may be readily phase-separated in the process of forming the alignment films 291 and 292, because it is a mixture of compounds bonded to the inorganic materials. Because the polymers that align the liquid crystal molecules vertically or at a pre-tilt angle are bonded to the inorganic materials, the manufactured liquid crystal display device may have a high VHR, thereby preventing the display quality of the liquid crystal display device from deteriorating due to the ionic impurities. Because the inorganic materials and the polymers having various functional groups are bonded (e.g., the second surface alignment compound), the process of eliminating the electrostatics is optional in the process of forming the alignment film, thereby simplifying the method of manufacturing the liquid crystal display device.

The surface alignment reactant 10 forming the alignment film according to an exemplary embodiment of the present invention has, for example, two or more light hardeners whose chain lengths are different. The surface alignment reactant 10 includes, for example, light hardeners having different chain lengths, thus increasing a cross-linking rate of the light hardeners.

Materials of the surface alignment reactant 10 including light hardeners having different chain lengths will now be described in detail. The surface alignment reactant 10 including light hardeners having different chain lengths is, for example, a mixture of a third surface alignment compound and a fourth surface alignment compound. The surface alignment reactant 10 may be readily phase-separated in the process of forming the alignment film because it is a mixture of surface alignment compounds. The third surface alignment compound may increase the reliability and the material properties of the alignment film, like the first surface alignment compound. The fourth surface alignment compound includes various functional groups that align the liquid crystal molecules. The fourth surface alignment compound includes, for example, two different types of light hardeners having different chain lengths, as pre-tilting functional groups included in the second surface alignment compound. The light hardeners having different chain lengths may increase their cross-linking rate in the process of forming the alignment film.

According to an exemplary embodiment of the present invention, the third surface alignment compound and the fourth surface alignment compound included in a surface alignment reactant 10 may be mixed, for example, in a weight ratio of about 6~about 8 to about 2~about 4 (e.g, about 7 to about 3). A solvent is not included in the weight ratio. The third surface alignment compound, the fourth surface alignment compound and a solvent may be included in a surface alignment reactant 10 in the ratio described above with reference to the first surface alignment compound and the second surface alignment compound. In a mixing ratio of ingredients, the first surface alignment compound may be replaced with the third surface alignment compound, and the second surface alignment compound may be replaced with the fourth surface alignment compound. A solvent may be the solvent described above together with materials of a surface alignment reactant 10 formed by mixing compounds including inorganic-based materials. According to an exemplary embodiment of the present invention, the third surface alignment compound includes, for example, the formula IM1 described above or the following formula IM3. A siloxane group monomer which forms a main chain and IM-R6 and IM-M6 functional groups which form a side chain are linked together to form formula IM3. The third surface alignment compound having formula IM3 of siloxane group monomer can stably link with the layer formed in lower part. The third surface alignment compound may comprise, for example, IM-M6 functional group of about 5 mol % to about 15 mol % (e.g., about 10 mol %), and IM-R6 functional group of about 80 mol % to about 95 mol % (e.g., about 90 mol %). A mol % of each functional group is a mol % in the third surface alignment compound except for siloxane and a solvent. IM-M6 functional group may be a phase separation enhancer. A phase separation enhancer may inhibit the material included in the third surface alignment compound, for example, silicone, from linking with the material included in the fourth surface alignment compound, for example, silicone in their mixtures to facilitate the phase separation. IM-M6 functional group can decrease the density of a surface inorganic alignment film formed by the third surface alignment compound, facilitating rework of an alignment film. As the density of a surface inorganic alignment film is lower, a solvent used to rework the alignment film may more readily penetrate into a surface inorganic alignment film. IM-M6 functional group may include, for example, a methyl group. IM-R6 functional group has been described above with reference to the formula IM1. IM-M6 and IM-R6 functional groups included in the third surface alignment compound may have, for example, hydrophilic properties.

Formula IM3

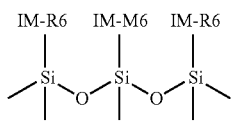

According to an exemplary embodiment of the present invention, the third surface alignment compound can be synthesized as in the following reaction formula IM1-M3. The third surface alignment compound can be manufactured by, for example, mixing tetraethyl orthosilicate in a polar solvent (tetrahydrofuran, THF) to produce a mixture, and stirring this mixture with methyl group in water ($H_2O$) comprising acid (e.g., hydrochloric acid, HCl) or base catalyst.

Reaction formula IM1-M3

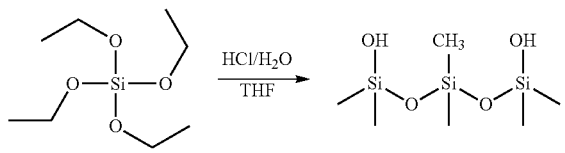

The fourth surface alignment compound will be described in detail below. The fourth surface alignment compound includes, for example, two functional groups (e.g., hardeners) which are cured by light or heat. Two functional groups having, for example, a curing property have different chain lengths. Two functional groups which are cured can substantially serve as the pre-tilt functional group as mentioned above with reference to the second surface alignment compound. As pre-tilt functional groups included in the fourth surface alignment compound have different chain lengths, the density and the cross-linking rate of the pre-tilt functional groups included in the fourth surface alignment compound can be increased. If the cross-linking rate of hardeners or pre-tilt functional groups increases, the display quality of a liquid crystal display device can be increased.

According to the present invention, the fourth surface alignment compound includes the following formula IM4. A siloxane group monomer which forms a main chain and IM-T1, IM-T2, IM-T21 and IM-T3 functional groups which form a side chain are linked together to form formula IM4. The fourth surface alignment compound may comprise IM-T1 functional group of about 5 mol % to about 15 mol % (e.g., about 10 mol %), IM-T2 functional group of about 30 mol % to about 50 mol % (e.g., about 40 mol %), IM-T21 functional group of about 5 mol % to about 15 mol % (e.g., about 10 mol %), and IM-T3 functional group of about 30 mol % to about 50 mol % (e.g., about 40 mol %). A mol % of each functional group is a mol % in the fourth surface alignment compound except for siloxane and a solvent. IM-T1, IM-T2 and IM-T21 functional groups included in the fourth surface alignment compound may substantially have, for example, the hydrophobic property.

Formula IM4

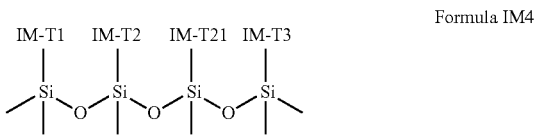

IM-T1, IM-T2 and IM-T3 functional groups have been described above with reference to formula IM2. IM-T21 functional group is a pre-tilt functional group which can be, for example, polymerized or crosslinked by light (e.g., UV) or heat. IM-T21 functional group can form a photo hardening layer having a pre-tilt angle in a process of forming an alignment film in the same way as IM-T2 described above. IM-T21 functional group may comprise, for example, vinyl group, styrene group, methacrylate group, cinnamate group or acrylic group. IM-T21 functional group may comprise monomers represented by above-mentioned formulas XIX-V1, XIX-V2 and XIX-C1. IM-T21 functional group may be, for example, the above-described photo-reactive polymer, reactive mesogen, light hardener, photo-polymerizable material or photo-isomerizable material. According to an exemplary embodiment of the present invention, the mol % composition ratio of IM-T2 functional group to IM-T21 functional group, each having features of pre-tilt functional groups included in the fourth surface alignment compound, may be, for example, about 2~about 10 to 1. According to an exemplary embodiment of the present invention, the mol % composition ratio of IM-T2 functional group to IM-T21 functional group, each having features of vertical functional groups included in the fourth surface alignment compound, may be, for example, about 1~about 3 to about 1~about 3. According to an exemplary embodiment of the present invention, the mol % composition ratio of IM-T1 functional group having a vertical functional group feature, to IM-T2 functional group having a pre-tilt functional group feature, to IM-T21 having a pre-tilt functional group feature, which are included in the fourth surface alignment, to a phase enhancer included in the third surface alignment compound is, for example, about 1~about 3 to about 2~about 10 to about 1~about 3 to about 1~about 3.

The fourth surface alignment compounds may include a catalyst such as, for example, amine, or comprise a photo-initiator such as thiol group. The concentration of a catalyst or a photo-initiator included in the fourth surface alignment compound may be, for example, about 1 mol % to about 7 mol %. A mol % of a catalyst or a photo-initiator is a mol % in the fourth surface alignment compound except for siloxane and a solvent. According to an exemplary embodiment of the present invention, a photo-initiator included in the fourth surface alignment compound may be, for example, an alkylated thiol group having 1 to 5 carbon atoms. A photo-initiator may be linked with a side chain of siloxane group monomer. A photo-initiator can increase the curing of IM-T2 functional group and IM-T21 functional group. As a photo-initiator reacts with a residual radical generated from a material such as an insulation layer to decrease the radical, the quality of a liquid crystal display device can be increased. According to an exemplary embodiment of the present invention, a catalyst included in the fourth surface alignment compound may be, for example, an alkylated amine group having 1 to 5 carbon atoms. In the secondary heating procedure described below, a catalyst can increase the number of cross-linked bonds of polysiloxane. A catalyst can, for example, be bonded to a side chain of siloxane group monomer. For example, a catalyst is a material which has no polarity. A material with polarity collects impurities, causing degradation in the image quality of a liquid crystal display device.

IM-T2 functional group and IM-T21 functional group according to an exemplary embodiment of the present invention will be described in detail below. IM-T2 functional group and IM-T21 functional group comprise, for example, a curing agent. According to an exemplary embodiment of the present invention, the chain length of IM-T2 functional group is, for example, different from that of IM-T21. A chain length of IM-T2 functional group may be, for example, longer than that of IM-T21. As the chain length of IM-T21 functional group is shorter than that of IM-T2, the density of functional groups which are polymerizable or crosslinkable or hardeners can be increased. In the process of performing a polymerization or crosslinking by light or heat, as IM-T21 functional groups placed between IM-T2 functional groups increase the degree of polymerization or crosslinking, the cross-linking rate of a curing agent, e.g., IM-T2 functional group or IM-T21 functional group can be increased. The chain length is the sum of the length of bonds linked in the shortest distance from alkene included in IM-T21 functional group to main chain. In counting the chain length, it is assumed that the bonding length between atoms is equal. For example, it is assumed that the bonding length between carbon atoms, the bonding length between carbon atom and oxygen atom, and the bonding length between carbon atom and silicone atom are equal. According to an exemplary embodiment of the present invention, the chain length of IM-T2 functional group is, for example, longer about 3 to about 7 times than that of IM-T21 functional group. If the chain length of IM-T2 exceeds about 7 times that of IM-T21, the force for aligning liquid crystal molecules is decreased to make the alignment of liquid crystal molecules non-uniform. Non-uniformities of liquid crystal molecules can deteriorate the image quality of a liquid crystal display device.

According to an exemplary embodiment of the present invention, the bonding number of IM-T2 functional group is different from that of IM-T21. The bonding number of IM-T2 may be, for example, larger than that of IM-T21. A bonding number is the number of bonds linked in the shortest distance from alkene included in IM-T21 functional group to main chain. According to an exemplary embodiment of the present invention, a bonding number may be, for example, the number of single bonds among bonds linked in the shortest distance from alkene included in IM-T21 functional group to main chain.

According to an exemplary embodiment of the present invention, the bonding number of IM-T2 functional group may be, for example, larger about 3 to about 7 times than that of IM-T21 functional group. If the single bonding number of IM-T2 exceeds about 7 times that of IM-T21, the force for aligning liquid crystal molecules may be decreased, thereby making the alignment of liquid crystal molecules non-uniform.

According to an exemplary embodiment of the present invention, the number of spacers included in IM-T2 functional group is, for example, different from that of IM-T21. The number of spacers included in IM-T2 may be, for example, larger than that of IM-T21. The number of spacers included in IM-T2 may be, for example, larger about twice to about 5 times than that of IM-T21. According to an exemplary embodiment of the present invention, the number of spacers included in IM-T2 may be, for example, about 1 to about 5, and the number of spacers included in IM-T21 may be about 0 to about 4. According to an exemplary embodiment of the present invention, a spacer may be, for example, alkyl group, and the number of spacers is the number of carbon atoms. According to an exemplary embodiment of the present invention, IM-T21 functional group may, for example, not comprise a spacer.

According to an exemplary embodiment of the present invention, IM-T2 functional group comprises, for example, alkylated methacrylate group, and IM-T21 functional group comprises vinyl group. An alkyl group included in alkylated methacrylate group may comprise, for example, about 2 to 4 carbon atoms. When an alkylated methacrylate group including an alkyl group of $(CH_2)_3$ is bonded with siloxane, the chain length of IM-T2 functional group is about 6 times the unit length of carbon-silicone bond, and the number of spacers is 3. When a vinyl group included in IM-T21, of which number of spacers is 0, is bonded with a siloxane, the chain length of IM-T2 functional group is about one time the unit length of carbon-silicone bond. Therefore, the chain length of IM-T2 functional group is about 6 times that of IM-T21 functional group. In IM-T2 functional group of alkylated methacrylate group including an alkyl group of $(CH_2)_3$, the single bonding number of carbon-carbon is 3, the single bonding number of carbon-oxygen is 2, and the single bonding number of carbon-silicone is 1. In IM-T21 functional group of vinyl group, the single bonding number of carbon-silicone is 1. The single bonding number of IM-T2 functional group is about 6 times that of IM-T21. According to an exemplary embodiment of the present invention, IM-T2 functional group and IM-T21 functional group have a curing part from, for example, same or different materials, and the chain length or bonding number of IM-T2 is different from that of IM-T21.

According to an exemplary embodiment of the present invention, the fourth surface alignment compound can be synthesized as, for example, in the following reaction formula IM2-M4. The fourth surface alignment compound can be formed by, for example, mixing tetraethyl orthosilicate into a polar solvent (tetrahydrofuran, THF) to produce a mixture, and stirring this mixture, long alkyl, vinyl group and alkylated acrylate in water ($H_2O$) comprising an acid (for example, hydrochloric acid, HCl) or base catalyst. A long alkyl group can function as, for example, IM-T1 functional group, an acrylate group can function as IM-T2 functional group, a vinyl group can function as IM-T21 functional group, and a hydroxyl group can function as IM-T3 functional group. The fourth surface alignment compound can be formed by, for example, nucleophilic hydrolysis and condensation polymerization.

Reaction formula IM2-M4

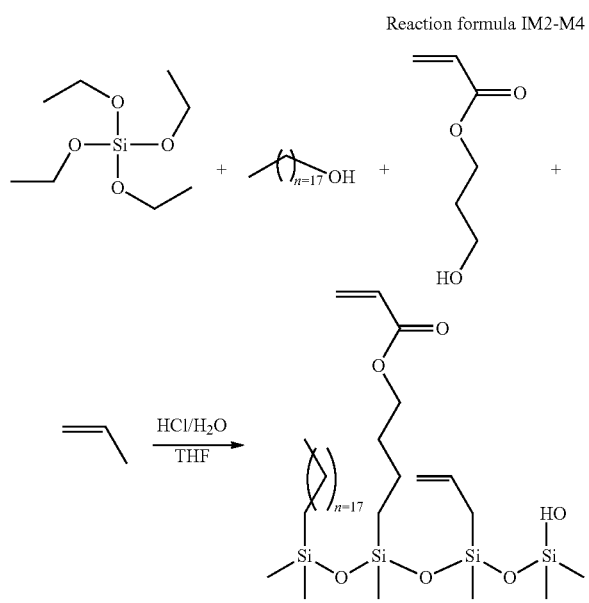

A process of manufacturing the alignment films 291 and 292, and the liquid crystal display panel assembly 300 using the surface alignment reactant 10 including the pre-tilting functional groups having different chain lengths, will be described in detail below. The surface alignment reactant 10 including the pre-tilting functional groups (e.g., light hardeners) having different chain lengths forms the alignment film of the liquid crystal display panel assembly 300 substantially by the SC-VA mode-based method. This surface alignment reactant 10 may increase in cross-linking rate in the electric-field lithography process.

Based on the aforesaid method of forming the alignment films 291 and 292 using the surface alignment reactant 10 formed by, for example, mixing the inorganic-based compounds in which functional groups are bonded, a method of forming the alignment films 291 and 292 using the surface alignment reactant 10 including the light initiators having different chain lengths will be described below. Duplicate descriptions will be simplified or omitted for convenience. To avoid duplicate descriptions, a method of forming the upper-plate alignment film 292 will be omitted, and only the method of forming the lower-plate alignment film 291 will be described.

The lower display panel 100 with the pixel electrode 191 and the upper display panel 200 with the common electrode 270 are manufactured in the above/below-described methods. The surface alignment reactant 10 including the pre-tilting functional groups (e.g., light initiators) having different chain lengths is formed on the pixel electrode 191 by the aforesaid methods. The surface alignment reactant 10 having a mixture of the third and fourth surface alignment compounds undergoes a primary heating process, thereby removing its solvent.

In the primary heating process, the surface alignment reactant 10 is, for example, phase-separated into the surface inorganic layer 33*a* and the surface functional group layer 35*a*. The surface inorganic layer 33*a* substantially includes, for example, the third surface alignment compound, while the surface functional group layer 35*a* substantially includes the fourth surface alignment compound. For example, the functional groups IM-T1, IM-T2, and IM-T21 of the fourth surface alignment compound included in the surface functional group layer 35*a* may be linked to the side chains of polysiloxanes, and may be arranged substantially perpendicularly to the surface of the substrate or the pixel electrode 191, or arranged in contact with the air. The third surface alignment compound may include, for example, a phase separation enhancer. The surface alignment reactant 10 including the phase separation enhancer (e.g., methyl groups) may be readily phase-separated for the above reasons. In the primary heating process, the siloxanes included in the surface inorganic layer 33*a* and the surface functional group layer 35*a* may form the main chains including the polysiloxanes as described above. After the primary heating, the surface inorganic layer 33*a* and the surface functional group layer 35*a* may undergo alignment film rework if they were formed poorly. The alignment film rework is a process of removing the poorly formed surface inorganic layer 33*a* and surface functional group layer 35*a*, re-forming the surface alignment reactant 10 on the pixel, and re-performing the primary heating process thereon.

The surface alignment reactant 10 including the phase-separated surface inorganic layer 33*a* and surface functional group layer 35*a* is secondarily heated in the aforesaid method. In the secondary heating process, the surface functional group layer 35*a* is cured in the aforesaid method, and the polysiloxanes included in the surface inorganic layer 33*a* and the surface functional group layer 35*a* may undergo cross-linking. The surface inorganic layer 33*a* forms the surface inorganic alignment film 33 as its polysiloxanes are additionally bonded. The primary heating process is optional. In this case, the reactions described with reference to the primary and secondary heating processes may occur in the second heating process.

Thereafter, for example, the surface inorganic alignment film 33 or the surface functional group layer 35*a* is cleaned by DIW, and may be further cleaned by IPA. After the cleaning, the surface inorganic alignment film 33 or the surface functional group layer 35*a* is dried.

Thereafter, as described above, the sealant, the upper-plate common voltage applying point, and the liquid crystal layer 3 are formed, and the lower and upper display panels 100 and 200 are assembled and then annealed in the aforementioned method.

Thereafter, light is irradiated to the assembled lower and upper display panels 100 and 200, with an exposure voltage applied thereto. By doing so, the surface functional group layer 35*a* forms the surface functional hardening layer 35. The surface inorganic alignment film 33 and the surface functional hardening layer 35 form the lower-plate alignment film 291.

A method of forming the surface functional hardening layer 35 is similar to the method described with reference to the functional groups IM-T2 in Formulae IM2, so only differences therebetween will be described in detail. The electric-field lithography process is performed while an electric field is formed in the liquid crystal layer 3. The functional groups IM-T2 and IM-T21 included in the surface functional group layer 35*a* are cross-linked and cured by, for example, the electric-field lithography process. The functional groups IM-T2 may, for example, form a network by being cross-linked to the functional groups IM-T2 or IM-T21. As for the alkenes included in the functional groups IM-T2 and the alkenes included the functional groups IM-T21, their double bonds are unfastened by light energy, and the functional groups IM-T2 and IM-T21 are cross-linked. The alkenes included in the functional groups IM-T2 and IM-T21 serve as reaction parts for cross-linking. As the functional groups IM-T2 and IM-T21 are cross-linked, the reaction part of the functional groups IM-T2 becomes a cross-linking part of the functional groups IM-T2, and the reaction part of the functional groups IM-T21 becomes a cross-linking part of the functional groups IM-T21. The functional groups IM-T2 and IM-T21 cured in the electric-field lithography process form the surface functional hardening layer 35. The functional groups IM-T1 have the characteristics of the vertical alignment monomers of the vertical functional groups. The functional groups IM-T2, IM-T21, IM-T1 and IM-T3 may be linked to the side chains of the polysiloxanes formed by, for example, primarily or secondarily heating the fourth surface alignment compound. As described above, the functional groups IM-T2 are different from the functional groups IM-T21 in chain length, making it possible to increase the cross-linking rate of the functional groups IM-T2 and IM-T21. The increase in cross-linking rate may reduce the number of the non-hardened (non-cured) functional groups IM-T2 or IM-T21. In the process of manufacturing the liquid crystal display device, the non-cured functional groups IM-T2 or IM-T21 may generate impurities, or may cause the pre-tilt angle to be irregular by being cured later on. The increase in cross-linking rate may increase the reliability or the quality of the liquid crystal display device, and may make the fluorescent lithography process unnecessary. By the cross-linking, the cured functional groups IM-T2 and IM-T21 arrange their adjacent liquid crystal molecules 31 to be tilted in the substantially same direction. The liquid crystal molecules 31 adjacent to the cured functional groups IM-T2 and IM-T21 may be arranged, for example, at a substantially constant pre-tilt angle when no electric field is applied in the liquid crystal layer 3. The surface inorganic alignment film 34 and the surface functional hardening layer 36 included in the upper-plate alignment film 292 may be formed in the above/below-described methods of forming the lower-plate alignment film 291. The functional groups IM-T2 may be, for example, different from the functional groups IM-T21 in terms of the bonding number or the number of spacers. The polysiloxanes formed by primarily or secondarily heating the fourth surface alignment compound are formed on the polysiloxanes formed by the third surface alignment compound.

The liquid crystal display panel assembly 300 manufactured by the surface alignment reactant 10 including the light initiators having different chain lengths may have the characteristics of the SC-VA mode. Because the surface alignment reactant 10 includes the light initiators having different chain lengths, the cross-linking rate of the light initiators may increase, thereby increasing the quality of the liquid crystal display device.

In accordance with an exemplary embodiment of the present invention, the alignment films 291 and 292 formed by the surface alignment reactant 10 including the light initiators having different chain lengths was manufactured, and the liquid crystal display device having these alignment films was manufactured. The surface alignment reactant 10 forming these alignment films was, for example, a mixture of the third and fourth surface alignment compounds having the following materials, mixed at the weight ratio of about 7 to about 3. The third surface alignment compound included, for example, methyl groups of about 10 mol %, and hydroxy groups of about 90 mol %. The fourth surface alignment compounds included, for example, alkyl groups of about 10 mol % having about 17 carbons, methacrylate groups of about 40 mol % having $(CH_2)_3$, vinyl groups of about 10 mol %, and hydroxy groups of about 40 mol %. Mol % of each component is its mol % in the third and fourth surface alignment compounds with the solvent excluded. The chain length of the functional groups IM-T2 is, for example, about 6 times the chain length of the functional groups IM-T21. The bonding number of the functional groups IM-T2 is, for example, about 6 times the bonding number of the functional groups IM-T21.

The liquid crystal display panel assembly 300 was manufactured according to the method of manufacturing the alignment films 291 and 292 using the surface alignment reactant 10 including the light hardeners having different chain lengths. In the process of manufacturing the liquid crystal display panel assembly 300, the surface inorganic alignment film 33 or the surface functional group layer 35a was cleaned by DIW and IPA. The pixel structure of the liquid crystal display device was substantially similar to that of FIG. 3. The cell spacing in the liquid crystal layer 3 was, for example, about 3.0 μm. For example, the width of the micro branches 197 of the pixel electrode 191 were about 5 μm, and the width of the micro slits 199 was about 3 μm. The exposure voltage V2 supplied by the multi-step voltage supply was, for example, about 15V. The UV intensity of the electric-field lithography process was, for example, about 6.5 J/cm². The manufactured liquid crystal display device was operated by charge sharing-based 1G1D driving described with reference to FIG. 11. The stacked structure of the liquid crystal display panel assembly 300 was as shown in FIG. 21A or 21B. The overcoat 225 formed on the upper display panel 200 included, for example, the acrylic materials. In the manufactured liquid crystal display device, the cross-linking rate increased by about 80% or more, and the black afterimage showed a good level of about 2.5 in a 168-hour operation.

In accordance with an exemplary embodiment of the present invention, a new surface alignment reactant 10 will be described. In addition, an alignment film formed using the surface alignment reactant 10 and a method for forming the alignment film, and a liquid crystal display device manufactured using the alignment film and a method for manufacturing the liquid crystal display device will be described in detail. In accordance with an exemplary embodiment of the present invention, the surface alignment reactant 10 forming the alignment film includes, for example, a monomer that is linked to a side chain of an inorganic material by a vertical functional group including rigid molecules. The vertical functional group including rigid molecules may increase the vertical alignment properties of liquid crystal molecules. An increase in vertical alignment force of liquid crystal molecules may reduce light leakage of the liquid crystal display device during its initial use or even after its operation for a long time, thereby contributing to the increase in display quality of the liquid crystal display device.

A surface alignment reactant 10 having, for example, a vertical functional group including a rigid molecule is a mixture of the fifth surface alignment compound and the sixth surface alignment compound. As described above, surface alignment reactants 10 of which compounds are mixed with each other can be readily phase-separated in a process of forming an alignment film. The fifth surface alignment compound is substantially similar with the first or third surface alignment compound described above. The sixth surface alignment compound may comprise a pre-tilt functional group or a vertical functional group. According to an exemplary embodiment of the present invention, the sixth surface alignment compound is, for example, linked with a side chain of inorganic-based materials, and includes a vertical functional group including a rigid molecule. According to an exemplary embodiment of the present invention, the fifth surface alignment compound and the sixth surface alignment compound can be mixed, for example, in a weight ratio of about 6~about 8 to about 2~about 4. A solvent is not included in the weight ratio of the fifth surface alignment compound and the sixth surface alignment compound. The weight of solid contents included in a surface alignment reactant 10, e.g., the combined weight of the fifth surface alignment compound and the sixth surface alignment compound, may be, for example, about 2 wt % to about 4 wt %, and the weight of a solvent may be, for example, about 96 wt % to about 98 wt %. A solvent may be, for example, any one selected from solvents described above. The fifth surface alignment compound and the sixth surface alignment compound can be mixed, for example, in a weight ratio of about 7 to about 3. The combined weight of the fifth surface alignment compound and the sixth surface alignment compound included in a surface alignment reactant 10 may be, for example, about 3 wt %, and that of a solvent may be, for example, about 97 wt %.

According to an exemplary embodiment of the present invention, the fifth surface alignment compound comprises, for example, the above-described formula IM1 or the following formula IM5. A siloxane group monomer forming a main chain is linked with IM-R6 and IM-A6 functional groups forming side chains to form formula IM5. The fifth surface alignment compound may comprise, for example, IM-R6 of about 80 mol % to about 97 mol %, and IM-A6 functional group of about 3 mol % to about 20 mol %. A mol % of each functional group is a mol % of the fifth surface alignment compound except for siloxane and a solvent. The functional group included in the fifth surface alignment compound may substantially have, for example, the hydrophobic features. According to an exemplary embodiment of the present invention, the fifth surface alignment compound may comprise, for example, IM-A6 functional group of about 5 mol % and IM-R6 functional group of about 95 mol %. Formula IM1 has been described above.

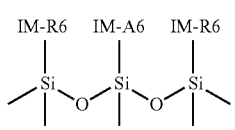

Formula IM5

IM-A6 functional group may be an aggregation inhibitor. An aggregation inhibitor can prevent compounds from separately aggregating. For example, IM-A6 functional group can reduce excessive segregation of the fifth surface alignment compound and the sixth surface alignment compound, such that the sixth surface alignment compounds get together to be separated from the fifth surface alignment compounds. IM-A6 functional group may comprise, for example, an alkylated amine having about 1 to about 5 carbon atoms. IM-A6 functional group may have hydrophobic features. IM-A6 functional group may comprise, for example, an amine group or a thiol group. IM-R6 functional group has been described above with reference to formula IM1.

According to an exemplary embodiment of the present invention, a compound of formula IM5 can be synthesized by, for example, the process described below. First, monomers of IM-R6 portion and monomers of IM-A6 portion are manufactured by the process described below. Then, monomers of IM-R6 portion and monomers of IM-A6 portion are mixed with a solvent in the composition ratio described above, and heated at, for example, about 60° C. to be formed as a compound of formula IM5 by polymerizing monomers. A solvent used in this process may be, for example, any one selected from the above-described solvents capable of mixing the first surface alignment compound and the second surface alignment compound. A monomer of IM-R6 portion may be, for example, orthosilic acid, Si(OH)4. Orthosilic acid, Si(OH)4 can be prepared by, for example, mixing tetraethyl orthosilicate in a polar solvent, for example, tetrahydrofuran (THF) to produce a mixture, and stirring this mixture with water (H$_2$O) comprising an acid (for example, hydrochloric acid, HCl) or base catalyst. A monomer of IM-R6 portion may be one comprising a siloxane of which one of bonds is substituted with alkylated amine. A siloxane of which one of bonds is substituted with alkylated amine can be prepared by, for example, mixing tetraethyl orthosilicate in a polar solvent, for example, tetrahydrofuran (THF) to produce a mixture, and stirring this mixture and an alkylated amine with water (H$_2$O) comprising an acid (for example, hydrochloric acid, HCl) or base catalyst.

The sixth surface alignment compound will be described in detail below. The sixth surface alignment compound has, for example, a vertical functional group including a rigid molecule. According to an exemplary embodiment of the present invention, the sixth surface alignment compound comprises, for example, the following formula IM6. A siloxane group monomer forming a main chain is linked with IM-T11, IM-T2, IM-T21, IM-R6 and IM-T4 functional groups forming side chains to form formula IM6. The sixth surface alignment compound may comprise, for example, IM-T11 functional group of about 5 mol % to about 25 mol %, IM-T2 functional group of about 35 mol % to about 55 mol %, IM-T21 functional group of about 5 mol % to about 15 mol %, IM-R6 functional group of about 25 mol % to about 40 mol %, and IM-T4 functional group of about 1 mol % to about 5 mol %. A mol % of each functional group is a mol % of the sixth surface alignment compound except for siloxane and a solvent. IM-T11, IM-T2, and IM-T21 functional groups included in the sixth surface alignment compound may, for example, substantially have the hydrophobic features. According to an exemplary embodiment of the present invention, the sixth surface alignment compound may comprise, for example, IM-T11 functional group of about 8 mol %, IM-T2 functional group of about 45 mol %, IM-T21 functional group of about 10 mol %, IM-R6 functional group of about 34 mol %, and IM-T4 functional group of about 3 mol %.

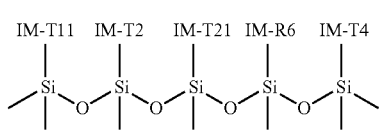

Formula IM6

IM-T11 functional group comprises, for example, a rigid molecule, and is a monomer of a vertical alignment component which reacts with liquid crystal molecules to align liquid crystal molecules perpendicularly to a lower layer. IM-T11 functional group comprising a rigid molecule allows liquid crystal molecules to be more stably aligned perpendicularly. As IM-T11 functional groups can increase the vertical aligning force of liquid crystal molecules, black light leakage of a liquid crystal display device including them can be reduced. IM-T11 functional group is a linkage of a rigid molecule and alkyl group. A rigid molecule may be, for example, a cyclic compound. According to an exemplary embodiment of the present invention, a rigid molecule may include, for example, benzene, cyclohexane, biphenyl, or combinations thereof. According to an exemplary embodiment of the present invention, the number of carbon atoms of alkyl group may be, for example, about 16 or less. IM-T11 functional group may include the following formula XIX-A5, XIX-A6, XIX-A7, XIX-A8 or XIX-A9.

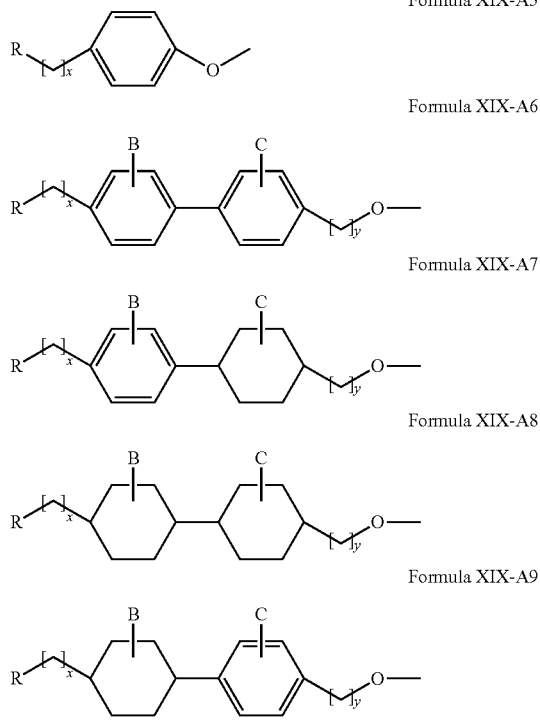

Formula XIX-A5

Formula XIX-A6

Formula XIX-A7

Formula XIX-A8

Formula XIX-A9 where x may be about 1 to about 20, y may be about 1 to about 10, R may be $CH_3$, HCOO—, $CH_2$=CH—, $CH_2S$—, $CH_3O$—, $CH_3S$—, or $CH_2CH$—COO—, and B and C may be H, F, Cl, Br, I, CN, SCN, $SF_5H$, or $NO_2$.

IM-T11 functional group may include, for example, a cholesteric group monomer represented by the above mentioned formula XIX-A2, an alkylated alicyclic group monomer represented by formula XIX-A3, and an alkylated aromatic group monomer represented by formula XIX-A4. A rigid molecule may have a linkage between silicone (Si) and an alkyl group. According to the present invention, IM-T11 functional group may include, for example, an alkyl benzene group having about 6 to about 12 carbon atoms.

IM-T4 functional group may be a catalyst for sol-gel reaction, for example, dehydration. IM-T4 functional group can increase the cross-linking density of polysiloxane. IM-T4 functional group may include, for example, the material described above with reference to IM-A6 functional group. As alkylated amine substantially has hydrophobic features, an alignment film formed by a surface alignment reactant 10 comprising alkylated amine group may not collect impurities. The image quality of a liquid crystal display device may be increased by this. IM-T4 functional group can serve as IM-A6 functional group described above with reference to IM5. For reducing the excessive separation into separate surface alignment compounds caused by separate agglomeration of surface alignment compounds, only one of IM-T4 functional group and IM-A6 functional group can be included in the fifth or sixth surface alignment compound. According to an exemplary embodiment of the present invention, IM-T4 functional group is not included in the sixth surface alignment compound, while IM-A6 functional group is included in the fifth surface alignment compound. IM-T2, IM-T21 and IM-R6 functional groups have been described above with reference to formulas IM1, IM2 and IM4.

According an exemplary embodiment of the present invention, a compound of formula IM6 can be synthesized by, for example, the process described below. First, monomers of IM-T11 portion, monomers of IM-T2 portion, monomers of IM-T21 portion, monomers of IM-R6 portion and monomers of IM-T4 portion are manufactured by the process described below. Then, a compound of formula IM6 can be synthesized by, for example, mixing monomers of IM-T11 portion, monomers of IM-T2 portion, monomers of IM-T21 portion, monomers of IM-R6 portion and monomers of IM-T4 portion in the composition ratio described above, and heating the resulting mixture at about 50 to 70° C. to polymerize monomers. A solvent used in this process may be, for example, any one selected from the above-described solvents capable of mixing the first surface alignment compound and the second surface alignment compound.

According to an exemplary embodiment of the present invention, monomers of IM-T11 may be, for example, siloxane of which any bond is substituted with alkyl benzene. A siloxane of which any bond is substituted with alkyl benzene can be prepared by, for example, mixing tetraethyl orthosilicate in a polar solvent, for example, tetrahydrofuran (THF) to produce a mixture, and stirring this mixture and alkyl benzene with water ($H_2O$) comprising an acid (for example, hydrochloric acid, HCl) or base catalyst. The alkyl group has about 6 to about 12 carbon atoms. According to an exemplary embodiment of the present invention, alkyl benzene can be replaced with, for example, any of above-described molecules included in IM-T11 functional group.

According to an exemplary embodiment of the present invention, monomers of IM-T2 may be, for example, siloxane of which any bond is substituted with alkylated methacrylate. A siloxane of which any bond is substituted with alkylated methacrylate can be prepared by, for example, mixing tetraethyl orthosilicate (TEOS) in a polar solvent, for example, tetrahydrofuran (THF) to produce a mixture, and stirring this mixture and alkylated methacrylate with water ($H_2O$) comprising an acid (for example, hydrochloric acid, HCl) or base catalyst. The alkyl group has, for example, about 1 to about 7 carbon atoms. According to an exemplary embodiment of the present invention, alkylated methacrylate can be replaced with, for example, any one of above-described molecules included in IM-T2 functional group.

According to an exemplary embodiment of the present invention, monomers of IM-T21 may be, for example, siloxane of which any bond is substituted with vinyl group. A siloxane of which any bond is substituted with vinyl group can be prepared by, for example, mixing tetraethyl orthosilicate (TEOS) in a polar solvent, for example, tetrahydrofuran (THF) to produce a mixture, and stirring this mixture and vinyl group with water ($H_2O$) comprising an acid (for example, hydrochloric acid, HCl) or base catalyst. The number of spacers linked with vinyl group, for example, the number of carbon atoms of alkyl group may be 0 to about 4. According to an exemplary embodiment of the present invention, vinyl group can be replaced with, for example, any one of above-described molecules included in IM-T21 functional group.

According to an exemplary embodiment of the present invention, monomers of IM-R6 may be, for example, siloxane of which any bond is substituted with hydroxyl group. A siloxane of which any bond is substituted with hydroxyl group can be prepared by, for example, mixing tetraethyl orthosilicate in a polar solvent, for example, tetrahydrofuran (THF) to produce a mixture, and stirring this mixture and hydroxyl group with water ($H_2O$) comprising an acid (for example, hydrochloric acid, HCl) or base catalyst. According to an exemplary embodiment of the present invention, hydroxyl group can be replaced with, for example, any one of above-described molecules included in IM-R6 functional group.

According to an exemplary embodiment of the present invention, monomers of IM-T4 may be, for example, siloxane of which any bond is substituted with alkylated amine group. A siloxane of which any bond is substituted with alkylated amine group can be prepared by, for example, mixing tetraethyl orthosilicate in a polar solvent, for example, tetrahydrofuran (THF) to produce a mixture, and stirring this mixture and alkylated amine group with water ($H_2O$) comprising an acid (for example, hydrochloric acid, HCl) or base catalyst. The alkyl group has, for example, about 1 to about 5 carbon atoms. According to an exemplary embodiment of the present invention, alkylated amine group can be replaced with, for example, any one of above-described molecules included in IM-T4 functional group.

A process of manufacturing alignment films 291 and 292 and a liquid crystal display panel assembly 300 using the surface alignment reactant 10 including a rigid monomer linked to a side chain of the inorganic material will be described in detail below. In accordance with an exemplary embodiment of the present invention, the surface alignment reactant 10 including a rigid monomer linked to a side chain of the inorganic material includes a vertical functional group including rigid molecules that are linked to a main chain of the inorganic material and a side chain of the inorganic material as described above. The surface alignment reactant 10 including a rigid monomer linked to a side chain of the inorganic material substantially forms the alignment film and the liquid crystal display panel assembly 300 by the above-described SC-VA mode-based manufacturing method. As described above, the vertical functional group including rigid molecules may increase vertical alignment properties of liquid crystal molecules.

Based on the above-described method for forming the alignment films 291 and 292 and the liquid crystal display panel assembly 300 using the surface alignment reactant 10 formed by mixing inorganic-based compounds in which functional groups are bonded, a method for forming the surface alignment reactant 10 including a rigid monomer linked to a side chain of the inorganic material on the alignment films 291 and 292 and in the liquid crystal display panel assembly 300 will be described below. Duplicate descriptions will be simplified or omitted for convenience. To avoid duplicate descriptions, a method of forming the upper-plate alignment film 292 will be omitted, and only the method of forming the lower-plate alignment film 291 will be described.

A lower display panel 100 with a pixel electrode 191 and an upper display panel 200 with a common electrode 270 are manufactured using the above/below-described methods.

The surface alignment reactant 10 including, for example, a rigid monomer linked to a side chain of the inorganic material is formed on the pixel electrode 191 by the above-described methods. The surface alignment reactant 10 including, for example, a mixture of the above-described fifth and sixth surface alignment compounds undergoes a primary heating process in the above-described method, thereby removing a solvent thereof. In the primary heating process, the surface alignment reactant 10 is, for example, phase-separated into a surface inorganic layer 33a including the fifth surface alignment compound and a surface functional group layer 35a including a sixth surface alignment compound. The fifth surface alignment compound is formed, for example, near the pixel electrode 191 or the common electrode 270, and the sixth surface alignment compound moves to the air layer as it includes functional groups having hydrophobic features. IM-A6 functional group included in the fifth surface alignment compound may prevent the fifth and sixth surface alignment compounds from being completely phase-separated and aggregating independently. In the primary heating process, dehydration occurs slightly and some of siloxanes included in the fifth and sixth surface alignment compounds are polymerized, forming polysiloxane.

The phase-separated surface alignment reactant 10 undergoes secondary heating in the above-described method. In the secondary heading process, dehydration occurs mainly and siloxanes and polysiloxanes included in the surface inorganic layer 33a and the surface functional group layer 35a are cured by being cross-linked to each other. As the siloxanes or polysiloxanes are cross-linked or cured, the surface inorganic layer 33a forms a surface inorganic alignment film 33. In accordance with an exemplary embodiment of the present invention, in the primary and/or secondary heating processes, IM-T4 functional group may accelerate dehydration and increase cross-linking of siloxanes. An increase in cross-linking of siloxanes may cause a reduction in the amount of hydroxyl groups included in the surface inorganic alignment film 33 and the surface functional group layer 35a. If the alignment film 291 formed by the surface inorganic alignment film 33 and the surface functional group layer 35a includes a lesser amount of hydroxyl groups, the alignment film 291 may gather less impurities because of the small amount of hydroxyl groups having polarity, thus contributing to a reduction in liquid crystal display device's stains occurring due to the impurities. In an embodiment, any one of the primary and secondary heating processes may be omitted, and in the other heating process, the above-described reactions may occur with reference to the primary and secondary heating processes.

Thereafter, for example, the surface inorganic alignment film 33 or the surface functional group layer 35a is cleaned by DIW, and may be additionally cleaned by IPA. Thereafter, the surface inorganic alignment film 33 or the surface functional group layer 35a is dried.

Thereafter, as described above, a sealant, an upper-plate common voltage applying point, and a liquid crystal layer 3 are formed, and the lower and upper display panels 100 and 200 are assembled. The assembled lower and upper display panels 100 and 200 may be annealed in the above-described method.

Thereafter, light is irradiated to the assembled lower and upper display panels 100 and 200 to which an exposure voltage has been supplied. Then, the surface functional group layer 35a forms a surface functional hardening layer 35. The surface inorganic alignment film 33 and the surface functional hardening layer 35 form the lower-plate alignment film 291. As a method for forming the surface functional hardening layer 35 is similar to the method described with reference to Formula IM4, differences between the methods will be described in detail. The electric-field lithography process is performed by the above-described methods while an electric field is formed in the liquid crystal layer 3 by the above-described methods. IM-T2 functional groups and IM-T21 functional groups that are included the surface functional group layer 35a by the electric-field lithography process, for example, form a network by the above-described method, forming the surface functional hardening layer 35. The functional groups having formed the network have a pre-tilt angle as described above, and align the surrounding liquid crystal molecules 31 to be tilted in a direction substantially parallel to a direction of the pre-tilt angle. The IM-T11 functional groups having vertical alignment properties may prevent the liquid crystal molecules 31 from being aligned to be excessively tilted. If the liquid crystal molecules 31 are aligned to be excessively tilted, black light leakage may occur, thereby deteriorating the display quality of the liquid crystal display device. As described above, the IM-T11 functional groups may align the liquid crystal molecules 31 to be less tilted because they have vertical alignment properties and include rigid molecules. Owing to the IM-T11 functional groups, the liquid crystal molecules 31 may be more rigidly aligned and their tilt angle may be adjusted. The liquid crystal molecules 31 may be aligned at a predetermined pre-tilt angle by the IM-T11, IM-T2 and IM-T21 functional groups, with no electric field applied to the liquid crystal layer 3. The predetermined pre-tilt angle has been described above. The lower-plate alignment film 291 formed in this way has a combined structure of polysiloxane and the above functional groups. In accordance with an exemplary embodiment of the present invention, a mol % composition ratio of IM-T11 functional group bonded to polysiloxane to IM-T2 functional group may be, for example, about 1:about 1.5 to about 11. A mol % composition ratio of IM-T11 functional group bonded to polysiloxane, IM-T2 functional group, to IM-T21 functional group may be, for example, about 1:about 1.5 to about 11:about 1 to about 3. A mol % composition ratio of IM-T11 functional group bonded to polysiloxane, IM-T2 functional group, to IM-T4 functional group may be, for example, about 1:about 1.5 to about 11:about 0.5 to about 4. In accordance with an exemplary embodiment of the present invention, a relative ratio of any of IM-T11, IM-T2, IM-T21 and IM-T4 functional groups linked to polysiloxane may be a comparison with mol % of each one included in the fifth and sixth surface alignment compounds. The surface inorganic alignment film 34 and the surface functional hardening layer 36 included in the upper-plate alignment film 292 may be formed in the above/below-described methods of forming the upper-plate alignment film 292.

The liquid crystal display panel assembly 300 manufactured by the surface alignment reactant 10 including a rigid monomer linked to a side chain of the inorganic material may have the characteristics of the SC-VA mode. The vertical functional group may reduce the light leakage defects of the liquid crystal display device because it includes rigid molecules. Amine group with no polarity may increase the picture quality of the liquid crystal display device because it can increase reliability of the alignment film by increasing cross-linking density of polysiloxanes and does not collect impurities.

In accordance with an exemplary embodiment of the present invention, the alignment films 291 and 292 were manufactured with the surface alignment reactant 10 including a rigid monomer linked to a side chain of the inorganic material, and the liquid crystal display device having the same was manufactured. The surface alignment reactant 10 including a rigid monomer linked to a side chain of the inorganic material included solvent and solid contents which were mixed at, for example, a weight ratio of about 97 to about 3. The solid content included the fifth and sixth surface alignment compounds which were mixed at a weight ratio of, for example, about 7 to about 3. The solvent included, for example, hexylene glycol (HG) of about 55 wt %, butyl cellosolve (BCS) of about 20 wt %, and propylene glycol monobutyl ether (PB) of about 25 wt %. The fifth surface alignment compound included, for example, Formula IM5. The fifth surface alignment compound included, for example, IM-A6 functional group of about 5 mol %, and IM-R6 functional group of about 95 mol %. The IM-A6 functional group was, for example, hydroxyl group, and the IM-A6 functional group was, for example, alkylated amine having 3 carbon atoms. The sixth surface alignment compound included Formula IM6. The sixth surface alignment compound included, for example, IM-T11 functional group of about 10 mol %, IM-T2 functional group of about 45 mol %, IM-T21 functional group of about 10 mol %, IM-R6 functional group of about 32 mol %, and IM-T4 functional group of about 3 mol %. The IM-T11 functional group was, for example, alkyl benzene having about 10 carbon atoms. The IM-T2 functional group was, for example, alkylated methacrylate group having about 5 carbon atoms. The IM-T21 functional group was, for example, alkylated vinyl group having about 3 carbon atoms. The IM-R6 functional group was, for example, hydroxyl group, and the IM-T4 functional group was alkylated amine having three carbon atoms. The liquid crystal display panel assembly 300 was manufactured using the surface alignment reactant 10 including a rigid monomer linked to a side chain of the inorganic material in accordance with the above-described method. The surface inorganic alignment film 33 and the surface functional group layer 35a were, for example, cleaned by DIW and IPA in the above-described process of manufacturing the liquid crystal display panel assembly 300. A structure of the pixel PX of the liquid crystal display device is substantially similar to the structure in FIG. 3. The liquid crystal display panel assembly 300 has the stacked structure shown in FIG. 21A or 21B. The overcoat 225 formed on the upper display panel 200 included an acrylic material. The cell spacing in the liquid crystal layer 3 was, for example, about 3.0 μm. The width of the micro branches 197 of the pixel electrode 191 were, for example, about 5 μm, and the width of the micro slits 199 was, for example, about 3 μm. The exposure voltage V2 supplied by the multi-step voltage supply was, for example, about 22V. The UV intensity of the electric-field lithography process was, for example, about 6.5 J/cm$^2$. The manufactured liquid crystal display device was operated by charge sharing-based 1G1D driving described with reference to FIG. 11. The black light leakage was increased in the manufactured liquid crystal display device.

In accordance with an exemplary embodiment of the present invention, a new surface alignment reactant 10, and an alignment film or a liquid crystal display device formed using the same will be described. The surface alignment reactant 10 forming the alignment film is a mixture of, for example, 3 different types of compounds. For example, the 3 types of compounds, one compound comprises a first vertical functional group including flexible molecules, another compound comprises a second vertical functional group including rigid molecules, and the other compound comprises no vertical functional group. The amounts of the first and second vertical functional groups may be readily adjusted by manufacturing the compound including, for example, the first vertical functional group and the compound including the second vertical functional group independently. As the pre-tilt angle and response speed of the liquid crystal molecules depend on the amounts of the first and second vertical functional groups, the liquid crystal display device comprising these vertical functional groups may have the response speed and black light leakage characteristics which are adjusted in balance.

The surface alignment reactant 10 including, for example, a mixture of 3 different types of compounds is a mixture of seventh, eighth, and ninth surface alignment compounds. The eighth surface alignment compound comprises, for example, the first vertical functional group including flexible molecules, and the ninth surface alignment compound comprises the second vertical functional group including rigid molecules. A weight of solid contents included in the surface alignment reactant 10, e.g., a sum of the weights of the seventh, eighth and ninth surface alignment compounds, may be, for example, about 2 wt % to about 4 wt %, and a solvent thereof may be, for example, about 96 wt % to about 98 wt %. In accordance with an exemplary embodiment of the present invention, the seventh, eighth and ninth surface alignment compounds may be mixed, for example, at a weight ratio of about 6 to about 8.5:about 0.5 to about 2:about 1 to about 2. The weight of the ninth surface alignment compound may be, for example, about 0.5 times to about 4 times the weight of the eighth surface alignment compound.

The seventh, eighth and ninth surface alignment compounds will be described below. In accordance with an exemplary embodiment of the present invention, the seventh surface alignment compound may include, for example, Formula IM1 or IM5, and has the characteristics described in conjunction with the formula. Formula IM1 or IM5 may be synthesized in the above-described method.

According to an exemplary embodiment of the present invention, the eighth surface alignment compound comprises, for example, the first vertical functional group including a flexible molecule. According to an exemplary embodiment of the present invention, the eighth surface alignment compound includes, for example, the following formula IM7. A siloxane group monomer forming a main chain is linked with IM-T12, IM-T2, IM-T21, IM-R6 and IM-T4 functional groups forming side chains to form formula IM7. The eighth surface alignment compound may comprise, for example, IM-T12 functional group of about 5 mol % to about 30 mol %, IM-T2 functional group of about 40 mol % to about 60 mol %, IM-T21 functional group of about 5 mol % to about 15 mol %, IM-R6 functional group of about 20 mol % to about 40 mol %, and IM-T4 functional group of about 1 mol % to about 5 mol %. A mol % of each functional group is a mol % of the eighth surface alignment compound except for siloxane and a solvent. IM-T12, IM-T2, and IM-T21 functional groups included in the eighth surface alignment compound may, for example, substantially have the hydrophobic features. According to an exemplary embodiment of the present invention, the eighth surface alignment compound may comprise, for example, IM-T12 functional group of about 10 mol %, IM-T2 functional group of about 50 mol %, IM-T21 functional group of about 10 mol %, IM-R6 functional group of about 27 mol % and IM-T4 functional group of about 3 mol %.

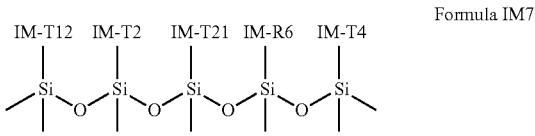

Formula IM7

IM-T12 functional group is, for example, the first vertical functional group comprised of flexible molecules. IM-T12 functional group or the first vertical functional group is a monomer of a vertical alignment component which interacts with liquid crystal molecules to align liquid crystal molecules perpendicular to a lower layer. As liquid crystal molecules, which interact with IM-T12 functional group or the first vertical functional group comprised of flexible molecules, can more quickly move, the liquid crystal display device comprising them can have fast response time. A flexible molecule included in IM-T12 functional group may comprise, for example, the above-described formula XIX-A1 or long alkyl group. IM-T12 functional group may comprise, for example, about 5 to about 20 carbon atoms. IM-T2, IM-T21, IM-R6 and IM-T4 functional groups have been described above with reference to formulas IM1, IM2, IM4 and IM6, and may have the effects described above.

According to an exemplary embodiment of the present invention, a compound of formula IM7 can be synthesized by, for example, the process described below. First, monomer of IM-T12 portion, monomer of IM-T2 portion, monomer of IM-T21 portion, monomer of IM-R6 portion, and monomer of IM-T4 portion are prepared by, for example, the process described below. Then, monomer of IM-T12 portion, monomer of IM-T2 portion, monomer of IM-T21 portion, monomer of IM-R6 portion, and monomer of IM-T4 portion are mixed with a solvent in the composition ratio described above, and heated at about 50 to 70° C. to be synthesized with, for example, a compound of formula IM7 by polymerizing monomers. A solvent used in this process may be, for example, any one selected from the above-described solvents capable of mixing the first surface alignment compound and the second surface alignment compound. According to an exemplary embodiment of the present invention, monomers of IM-T12 may be, for example, siloxane of which any bond is substituted with alkyl group. A siloxane of which any bond is substituted with alkyl group can be prepared by, for example, mixing tetraethyl orthosilicate (TEOS) in a polar solvent, for example, tetrahydrofuran (THF) to produce a mixture, and stirring this mixture and alkyl group with water ($H_2O$) comprising an acid (for example, hydrochloric acid, HCl) or base catalyst. The alkyl group has about 5 to about 20 carbon atoms. According to an exemplary embodiment of the present invention, alkyl group can be replaced with, for example, any one of above-described flexible molecules included in IM-T12 functional group. Monomer of IM-T2 portion, monomer of IM-T21 portion, monomer of IM-R6 portion, and monomer of IM-T4 portion can be prepared by, for example, the process described above with reference to formula IM6.

According to an exemplary embodiment of the present invention, the ninth surface alignment compound comprises, for example, the second vertical functional group including a rigid molecule. The ninth surface alignment compound may comprise, for example, formula IM6, and has the feature described above. Formula IM6 can be synthesized by, for example, the process described above. The seventh, eighth and ninth surface alignment compounds form alignment films 291 and 292 by, for example, the process described below. An alignment film 291 formed by the seventh, eighth and ninth surface alignment compounds has the structure in which the above-mentioned functional groups are linked with polysiloxane. The relative ratio of any of IM-T11, IM-T12, IM-T2, IM-T21 and IM-T4 functional groups linked with polysiloxane may be a comparison with mol % of each one included in the seventh, eighth and ninth surface alignment compounds. According to an exemplary embodiment of the present invention, the mol % composition ratio of IM-T11 functional group linked with polysiloxane to IM-T2 functional group may be, for example, about 1:about 1.5 to about 11:about 11. According to an exemplary embodiment of the present invention, the mol % composition ratio of IM-T11 functional group linked with polysiloxane to IM-T2 functional group to IM-T21 functional group may be, for example, about 1:about 1.5 to about 11:about 0.5 to about 3. According to an exemplary embodiment of the present invention, the mol % composition ratio of IM-T11 functional group linked with polysiloxane to IM-T2 functional group to IM-T4 functional group may be, for example, about 1:about 1.5 to about 11:about 0.5 to about 4. According to an exemplary embodiment of the present invention, the mol % composition ratio of IM-T11 functional group linked with polysiloxane to IM-T12 functional group to IM-T2 functional group may be, for example, about 1:about 0.3 to about 3:about 1.5 to about 11.

A process of manufacturing alignment films 291 and 292 and a liquid crystal display panel assembly 300 using the surface alignment reactant 10 comprising a mixture of, for example, 3 different types of compounds will be described in detail below. In accordance with an exemplary embodiment of the present invention, the method of manufacturing the alignment films 291 and 292 and the liquid crystal display panel assembly 300 using the surface alignment reactant 10 comprising a mixture of 3 different types of compounds is, for example, substantially the same as the above-described method of manufacturing the alignment films 291 and 292 and the liquid crystal display panel assembly 300 using the surface alignment reactant 10 comprising a rigid monomer linked to a side chain of the inorganic material.

Based on the above-described method of manufacturing the alignment films 291 and 292 and the liquid crystal display panel assembly 300 using the surface alignment reactant 10 comprising a rigid monomer linked to a side chain of the inorganic material, the alignment films 291 and 292 and the liquid crystal display panel assembly 300 were manufactured using the below-described surface alignment reactant 10. A manufacturing process thereof will be described in detail below. To avoid duplicate descriptions, a method of forming the upper-plate alignment film 292 will be omitted, and only the method of forming the lower-plate alignment film 291 will be described.

First, a lower display panel 100 with a pixel electrode 191 and an upper display panel 200 with a common electrode 270 were manufactured using, for example, the above/below-described methods. A pixel PX with a pixel electrode and a common electrode had the structure of FIG. 3 and the stacked structure of FIG. 21A or 21B. For example, micro branches 197 of the pixel electrode 191 were about 5 μm in width and micro slits thereof were about in 3 μm width. An overcoat 225 formed on the upper display panel 200 comprised, for example, an acrylic group material. Thereafter, the below-described surface alignment reactant 10 comprising a mixture of 3 different types of compounds was formed on the pixel electrode 191 by, for example, an inkjet process.

According to an exemplary embodiment of the present invention, a surface alignment reactant 10 including a mixture of three kinds of compounds was a combination of, for example, about 3 wt % of solid contents and about 97 wt % of solvent. The solid contents included, for example, about 80 wt % of the seventh surface alignment compound, about 5 wt % of the eighth surface alignment compound, and about 15 wt % of the ninth surface alignment compound. The seventh surface alignment compound had the feature of, for example, formula IM5, and comprised, for example, about 5 mol % of IM-A6 functional group and about 95 mol % of IM-A6 functional group forming side chains of siloxane group monomer. IM-R6 functional group was, for example, a hydroxyl group, and IM-A6 functional group was, for example, an alkylated amine having about 3 carbon atoms. The eighth surface alignment compound included, for example, formula IM7 described above. For example, the eighth surface alignment compound comprised about 14 mol % of IM-T12 functional group, about 46 mol % of IM-T2 functional group, about 10 mol % of IM-T21 functional group, about 27 mol % of IM-R6 functional group and about 3 mol % of IM-T4 functional group. IM-T12 functional group comprised, for example, a long alkyl which is a flexible molecule as the first vertical functional group. A long alkyl comprised, for example, about 16 carbon atoms. IM-T2 functional group comprised, for example, an alkylated methacrylate group. An alkyl group included, for example, in alkylated methacrylate group comprised about 3 carbon atoms. IM-T21 functional group comprised, for example, a vinyl group. The number of spacers linked with a vinyl group was, for example, 0 (zero). IM-R6 functional group was, for example, a hydroxyl group. IM-T4 functional group was, for example, an alkylated amine. An alkyl group included in alkylated amine comprised, for example, about 3 carbon atoms. The ninth surface alignment compound included formula IM6 described above. For example, the ninth surface alignment compound comprised about 14 mol % of IM-T11 functional group, about 46 mol % of IM-T2 functional group, about 10 mol % of IM-T21 functional group, about 27 mol % of IM-R6 functional group and about 3 mol % of IM-T4 functional group. IM-T11 functional group comprised, for example, an alkyl benzene including benzene which is a rigid molecule as the second vertical functional group. An alkyl included in alkyl benzene comprised about 10 carbon atoms. IM-T2 functional group, IM-T21 functional group, IM-R6 functional group, and IM-T4 functional group were the same as the above-mentioned functional groups included in the eighth surface alignment compound. A solvent comprised about 55 wt % of hexylene glycol (HG), about 20 wt % of butyl cellosolve (BCS), and about 25 wt % of propylene glycol monobutyl ether (PB).

The primary heating process was carried out on the surface alignment reactant 10 formed on a pixel electrode 191. The primary heating process was carried out, for example, at 95° C. for 120 seconds. A solvent was removed in the primary heating process, and the surface alignment reactant 10 was phase-separated into a surface inorganic material layer 33a and a surface functional group layer 35a. The surface inorganic material layer 33a formed in close proximity to a pixel electrode 191 mainly comprises the seventh surface alignment compound, while the surface functional group layer 35a formed in close proximity to an air layer mainly comprises the eighth surface alignment compound and the ninth surface alignment compound. As IM-T11, IM-T12, IM-T2, and IM-21 functional groups have a hydrophobic feature, the eighth or ninth surface alignment compounds are formed in a direction of the air layer. The eighth surface alignment compound and the ninth surface alignment compound included in the surface functional group layer 35a may be, for example, in a randomly mixed state. As IM-T11 functional group included in the ninth surface alignment compound is more hydrophobic than IM-T12 functional group included in the eighth surface alignment compound, the ninth surface alignment compound can be placed in more close proximity to the air layer, compared to the eighth surface alignment compound. In addition, a surface alignment reactant 10 undergoes dehydration in the primary heating process.

After being primarily heated, the surface alignment reactant 10 was secondarily heated. The secondary heating process was carried out, for example, at about 220° C. for about 1000 seconds. Dehydration was completed in the secondary heating process, and siloxanes and polysiloxanes included in a surface inorganic layer 33a and a surface functional group layer 35a were cross-linked. In this way, a surface inorganic layer 33a formed a surface inorganic alignment film 33. Each functional group serves as described above.

Thereafter, for example, the surface inorganic alignment film 33 or the surface functional group layer 35a was cleaned by impurities, cleaned by IPA, and dried in sequence.

Thereafter, a sealant, an upper-plate common voltage applying point, and a liquid crystal layer 3 were formed, and the lower and upper display panels 100 and 200 were assembled in a vacuum. The sealant was cured by, for example, UV. The assembled display panels 100 and 200 were annealed at, for example, about 110° C. for about 2 hours. The sealant underwent heat curing during the annealing process.

Thereafter, an exposure voltage was applied and light was irradiated. The exposure voltage was applied by, for example, the multi-step voltage supply, and V2 of the exposure voltage was about 15 volts (V), and UV intensity of the electric-field lithography process was about 6.5 J/cm². The fluorescent lithography process was omitted. By doing so, the surface functional group layer 35a formed the surface functional hardening layer 35. In other words, IM-T2 and IM-T21 functional groups included in the eighth and ninth surface alignment compounds had a pre-tilt angle by forming a network. A lower-plate alignment film 291 including the surface inorganic alignment film 33 and the surface functional hardening layer 35 was formed by, for example, the above-described process. In the lower-plate alignment film 291 formed in this way, vertical functional groups having rigid molecules may be distributed near the air layer or the liquid crystal layer, compared with the vertical functional groups having flexible molecules. A surface inorganic alignment film 34 and a surface functional hardening layer 36 included in an upper-plate alignment film 292 were formed by, for example, the above-described method of forming the lower-plate alignment film 291. The cell spacing in the liquid crystal display device was, for example, about 3.0 μm. The liquid crystal display device was operated by charge sharing-based 1G1D driving described with reference to FIG. 11.

The lower/upper-plate alignment films 291 and 292 formed in this way improved the black light leakage defects by adjusting the pre-tilt angle of liquid crystal molecules, and could increase mobility of the liquid crystal molecules. The alignment films 291 and 292 comprising flexible vertical alignment functional groups and rigid vertical alignment functional groups may adjust the response speed and pre-tilt angle of the liquid crystal molecules in balance, improving the display quality of the liquid crystal display device.

In accordance with an exemplary embodiment of the present invention, a new surface alignment reactant 10 and an alignment film or a liquid crystal display device formed using the same will be described. The surface alignment reactant 10 forming an alignment film comprises a compound including, for example, 2 different types of monomers that align liquid crystal molecules vertically. Any one of the 2 different types of monomers included in one compound is, for example, a first vertical functional group including flexible molecules, and the other is a second vertical functional group including rigid molecules. As the alignment film including the first vertical functional group comprising flexible molecules and the second vertical functional group comprising rigid molecules may adjust the pre-tilt angle and response speed of the liquid crystal molecules by the amounts of the first and second vertical functional groups as described above, the liquid crystal display device including this alignment film may have the response speed and black light leakage characteristics which are adjusted in balance. As one compound may comprise the first vertical functional group including flexible molecules and the second vertical functional group including rigid molecules, the liquid crystal molecules may be aligned at a more uniform angle and the process of forming the alignment film may be simplified.

The surface alignment reactant 10 comprising a compound having two different types of monomers that align liquid crystal molecules vertically is a mixture of, for example, tenth and eleventh surface alignment compounds. The eleventh surface alignment compound comprises, for example, two different types of monomers that align liquid crystal molecules vertically. A mixing ratio of the tenth and eleventh surface alignment compounds included in the surface alignment reactant 10, a mixing ratio of solid contents and a solvent, and the solvent mixing compounds are the same as those described with reference to the fifth and sixth surface alignment compounds.

In accordance with an exemplary embodiment of the present invention, the tenth surface alignment compound may include, for example, Formula IM1 or IM5, and has the characteristics described in conjunction with the formula. Formula IM1 or IM5 may be synthesized in the above-described method.

According to an exemplary embodiment of the present invention, the eleventh surface alignment compound including two different kinds of monomers which vertically align liquid crystal molecules comprises, for example, the following formula IM8. A siloxane group monomer forming a main chain and IM-T12, IM-T11, IM-T2, IM-T21, IM-R6 and IM-T4 functional groups forming side chains are linked with each other to form formula IM8. The eleventh surface alignment compound may comprise, for example, IM-T12 functional group of about 5 mol % to about 15 mol %, IM-T11 functional group of about 5 mol % to about 15 mol %, IM-T2 functional group of about 35 mol % to about 55 mol %, IM-T21 functional group of about 5 mol % to about 15 mol %, IM-R6 functional group of about 20 mol % to about 40 mol %, and IM-T4 functional group of about 1 mol % to about 5 mol %. A mol % of each functional group is a mol % in the eleventh surface alignment compound except for siloxane and a solvent. IM-T12, IM-T11, IM-T2, and IM-T21 functional group included in the eleventh surface alignment compound may substantially have the hydrophobic features. According to an exemplary embodiment of the present invention, the eleventh surface alignment compound may comprise, for example, IM-T12 functional group of about 10 mol %, IM-T11 functional group of about 10 mol %, IM-T2 functional group of about 45 mol %, IM-T21 functional group of about 10 mol %, IM-R6 functional group of about 22 mol % and IM-T4 functional group of about 3 mol %.

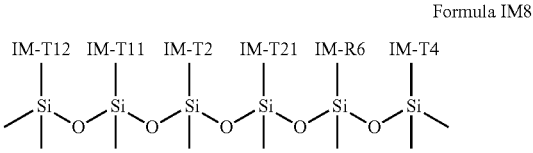

Formula IM8

IM-T12 functional group comprises, for example, a flexible molecule described above with reference to formula IM7. IM-T11 functional group comprises a rigid molecule described above with reference to formula IM6. IM-T12 functional group and IM-T11 functional group are monomers of a vertical alignment component which interacts with liquid crystal molecules to align liquid crystal molecules perpendicularly to a lower layer. IM-T12 may be the first vertical functional group described above, and IM-T11 may be the second vertical functional group described above. An alignment film, which comprises the combined IM-T12 functional group and IM-T11 functional group in a certain ratio or amount as described above, can increase the display quality of a liquid crystal display device. As IM-T12 functional group and IM-T11 functional group can be uniformly distributed within one compound, the alignment of liquid crystal molecules can be uniform. IM-T2, IM-T21, IM-R6 and IM-T4 functional groups have been described above with reference to formula IM1, formula IM2, formula IM4 and formula IM6, and may have the effects described above.

According to an exemplary embodiment of the present invention, a compound of formula IM8 can be synthesized by, for example, the process described below. First, monomer of IM-T12 portion, monomer of IM-T11 portion, monomer of IM-T2 portion, monomer of IM-T21 portion, monomer of IM-R6 portion, and monomer of IM-T4 portion are prepared by the process described below. Then, monomer of IM-T12 portion, monomer of IM-T11 portion, monomer of IM-T2 portion, monomer of IM-T21 portion, monomer of IM-R6 portion, and monomer of IM-T4 portion are mixed with, for example, a solvent in the composition ratio described above, and heated at about 50 to 70° C. to be synthesized with a compound of formula IM8 by polymerizing monomers. A solvent used in this process may be, for example, any one selected from the above-described solvents capable of mixing the first surface alignment compound and the second surface alignment compound. According to an exemplary embodiment of the present invention, monomers of IM-T12 portion may be, for example, siloxane of which any bond is substituted with alkyl group. A siloxane of which any bond is substituted with alkyl group can be prepared by, for example, mixing tetraethyl orthosilicate (TEOS) in a polar solvent, for example, tetrahydrofuran (THF) to produce a mixture, and stirring this mixture and alkyl group with water ($H_2O$) comprising an acid (for example, hydrochloric acid, HCl) or base catalyst. The alkyl group has, for example, about 5 to about 20 carbon atoms. According to an exemplary embodiment of the present invention, alkyl group can be replaced with, for example, any one of above-described flexible molecules included in IM-T12 functional group. Monomer of IM-T11 portion, monomer of IM-T2 portion, monomer of IM-T21 portion, monomer of IM-R6 portion, and monomer of IM-T4 portion can be prepared by, for example, the process described above with reference to formula IM6.

A surface alignment reactant 10 comprising, for example, two different kinds of monomers which vertically align liquid crystal molecules may form alignment films 291 and 292 and a liquid crystal display panel assembly 300 by the above-described method for forming the alignment films 291 and 292 and the liquid crystal display panel assembly 300 using a surface alignment reactant 10 comprising the fifth surface alignment compound and the sixth surface alignment compound. In the formed alignment films 291 and 292, vertical functional groups including a flexible molecule and vertical functional groups including a rigid molecule may be distributed without being separated from each other. The alignment film 291 formed by the tenth and eleventh surface alignment compounds has a structure of which polysiloxane and the above-described functional groups are linked to each other. The relative ratio of any of IM-T11, IM-T12, IM-T2, IM-T21 and IM-T4 functional groups linked with polysiloxane may be a comparison with mol % of each one included in the seventh, eighth and ninth surface alignment compounds.

A sealant according to an exemplary embodiment of the present invention is cured in light having a wavelength of about 400 nm or more. By the light having a wavelength of about 400 nm or more, the sealant is cured and the light hardeners existing in an inner region of the lower or upper display panel are not cured, reducing edge stain defects occurring around the sealant. As the sealant cured in UV with a wavelength of about 300 nm to about 400 nm is cured by the light curing light hardeners included in a material forming the alignment film or the liquid crystal, the light hardeners around the sealant are cured when the sealant is cured. Thus, the liquid crystal display device could have edge stain defects. To address this difficulty, the sealant and the light hardener are required to be cured in light having different wavelengths.

The sealant that is cured in light with a wavelength of about 400 nm or more according to an exemplary embodiment of the present invention is substantially the same as that applied in the above-described processes except for a material of the sealant and a method of curing the sealant. Therefore, duplicate descriptions of the sealant process will be omitted for convenience of description.

The sealant that is cured in light with a wavelength of about 400 nm or more according to an exemplary embodiment of the present invention may be applied onto the lower or upper display panel in accordance with the liquid crystal display panel assembly manufacturing methods described about or below with reference to FIGS. 6A, 6B and 6C, e.g., to the SVA mode, the SC-VA mode and the polarized UV-VA mode. The applied sealant is cured in light with a wavelength of, for example, about 400 nm or more. The light with a wavelength of about 400 nm or more may be visible ray.

As the sealant according to an exemplary embodiment of the present invention is cured in light with a wavelength of about 400 nm or more, light hardeners forming the alignment film or included in the liquid crystal layer 3 are not cured even though the light irradiated to the sealant is partially mis-irradiated to the periphery of the sealant. Therefore, the shield mask may not be required, which was required to block the light irradiated to the sealant from being mis-irradiated to the periphery of the sealant. By doing so, the process of manufacturing the liquid crystal display panel assembly maybe simplified, and the liquid crystal display device may not have the edge stain defects which occur around the sealant.

Materials of sealant which is cured at the wavelength of about 400 nm or more will be described in detail below. For example, a sealant which is cured at the wavelength of about 400 nm or more includes a resin comprised of an acryl-epoxy hybrid resin, an acryl resin and an epoxy resin, a hardener comprised of diamine, a coupling agent comprised of silane, a photo initiator comprised of oxime ester and a filler comprised of silica and acryl particles. According to an exemplary embodiment of the present invention, a sealant which is cured at the wavelength of about 400 nm or more may include, for example, oxime ester-based photo initiator.

For example, an acryl-epoxy hybrid resin, an acryl resin and an epoxy resin form a main chain of a sealant, and serve as a prepolymer. An acryl-epoxy hybrid resin may be, for example, a diphenylpropyl acryl-epoxy hybrid resin represented by the following formula S-I, an acryl resin may be a diphenylpropyl acryl resin represented by the following formula S-II, and an epoxy resin may be a diphenylpropyl epoxy hybrid resin represented by the following formula S-III.

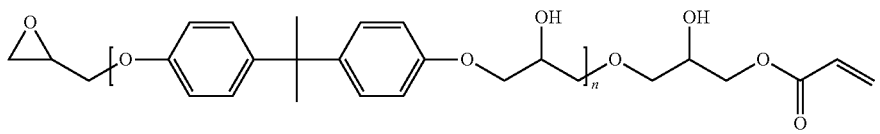

Formula S-I

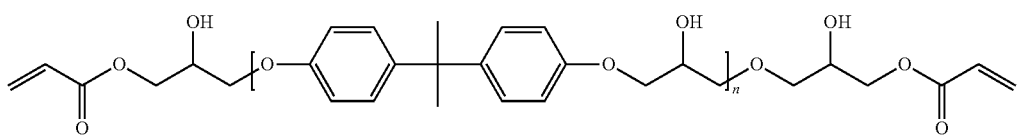

Formula S-II

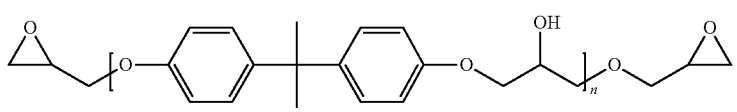

Formula S-III

A diamine reacts with an epoxy resin to be cured, decreasing the contamination of a sealant. A diamine may be, for example, octanedihydrazide, and may be represented by the following formula S-IV.

Formula S-IV

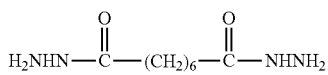

A silane improves the adhesion of filler and organic or inorganic materials. A silane may be, for example, trimethoxy[3-(oxiranylmethoxy)propyl]silane, and may be represented by the following formula S-V.

Formula S-V

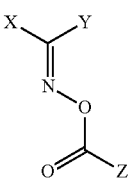

An oxime ester is a photo initiator which cures a prepolymer. An oxime ester may be, for example, 4-acetyldiphenyl sulfide oxime ester (Ciba, IRGACURE OXE01, OXE02), and may be represented by the following formula S-VI. An oxime ester can be cured at a wavelength of about 400 nm or more, and can also be cured by visible light.

Formula S-VI

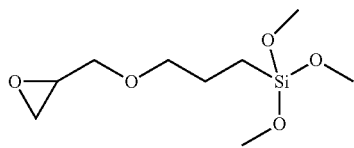

An oxime ester according to exemplary embodiment of the present invention can be represented by, for example, the following formula S-VII.

Formula S-VII

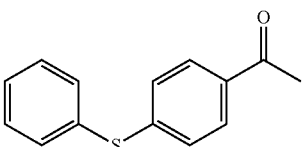

where X may be any one selected from 4-acetyldiphenyl sulfide, N-ethylcarbazole and 2'-methylphenonyl n-ethylcarbazole, which can be represented by the following formula S-VII-X1, S-VII-X2 and S-VII-X3, respectively. Y and Z each may be alkyl group (CnH2n+1), where n may be an integer of 1 to 12. Z may be phenyl.

Formula S-VII-X1

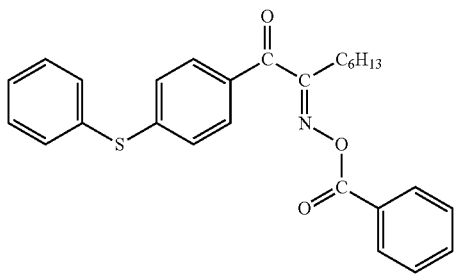

Formula S-VII-X2

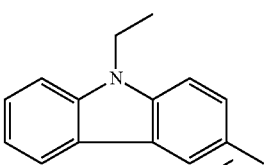

Formula S-VII-X3

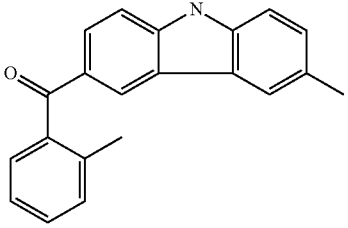

Acryl particles decrease internal stress of a sealant, increase adhesion strength and prevent the liquid crystal from being eluted from the resin. Acryl particles may be, for example, an acryl resin, and may be represented by the following formula S-VIII.

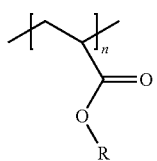

Formula S-VIII

Silica may decrease coefficient of heat expansion and hygroscopicity of a sealant, and increase strength of a sealant. Silica may be, for example, silica dioxide (SiO2).

According to an exemplary embodiment of the present invention, a sealant which is cured by light with a wavelength of about 400 nm or more may be comprised of, for example, diphenylpropyl acryl-epoxy hybrid resin of about 13 wt % to about 19 wt % (e.g., about 16 wt %), diphenylpropyl acryl resin of about 39 wt % to about 49 wt % (e.g. about 44 wt %), diphenylpropyl epoxy hybrid resin of about 2 wt % to about 7 wt % (e.g., about 4.5 wt %), octanedihydrazide of about 2 wt % to about 6 wt % (e.g., about 4 wt %), trimethoxy[3-(oxiranylmethoxy)propyl]silane of about 0.75 wt % to about 1.75 wt % (e.g., about 1.25 wt %, 4-acetyldiphenyl sulfide oxime ester (Ciba, IRGACURE OXE01, OXE02) of about 0.75 wt % to about 1.75 wt % (e.g., about 1.25 wt %), silica dioxide (SiO2) of about 13 wt % to about 19 wt % (e.g., about 16 wt %), and acryl resin of about 10 wt % to about 16 wt % (e.g., about 13 wt %).

In accordance with an exemplary embodiment of the present invention, the process of manufacturing the liquid crystal display panel assembly 300 including the sealant cured in the light having a wavelength of about 400 nm or more is simplified. In addition, the liquid crystal display device may not have the edge stain defects occurring around the sealant. Furthermore, because it is not necessary to form the sealant on the inner regions of the display panels 100 and 200 apart from the edges to reduce the edge stains and the sealant may be formed on the inner regions of the display panels 100 and 200 or formed close to the inner regions, the width of the outer regions of the liquid crystal display device can be narrower than the conventional liquid crystal display device's width by, for example, about 0.3 mm to about 1.5 mm.

The sealant hardened in the light having a wavelength of about 400 nm or more according to an exemplary embodiment of the present invention may be applied to the liquid crystal display panel assembly manufacturing methods described above or below in connection with FIGS. 6A, 6B and 6C, e.g., to the SVA mode, SC-VA mode, and polarized UV-VA mode.

A liquid crystal display panel assembly manufactured by lower and upper mother-glass (not shown) display panels according to an exemplary embodiment of the present invention will be described in detail. An exposure voltage is stably supplied to the mother-glass assembly in which a plurality of liquid crystal display panel assemblies are included according to an exemplary embodiment of the present invention, thus reducing the manufacturing time of the liquid crystal display panel assemblies and enabling mass production thereof.

The lower mother-glass display panel according to an exemplary embodiment of the present invention has a plurality of lower display panels 100, and the upper mother-glass display panel has a plurality of upper display panels 200. It will be understood by those of ordinary skill in the art that the lower or upper mother-glass display panel may have a different number of display panels according to the size of the lower or upper display panels. Except that one assembled mother-glass display panel has a plurality of liquid crystal display panel assemblies, the method of manufacturing one liquid crystal display panel assembly is substantially similar to the SVA mode or SC-VA mode-based manufacturing methods described above in connection with FIGS. 6A and 6B. Therefore, in a description of a method for manufacturing a liquid crystal display panel assembly using the mother-glass display panel, the duplicate description of the SVA mode or SC-VA mode-based manufacturing method will be omitted or simplified. The rest of the features of the method for manufacturing a liquid crystal display panel assembly using the mother-glass display panel according to an exemplary embodiment of the present invention will be described in detail.

The lower mother-glass display panel having a plurality of lower display panels 100 and the upper mother-glass display panel having a plurality of upper display panels 200 are manufactured by a manufacturing method substantially similar to the aforementioned manufacturing method for the lower display panel 100 and the upper display panel 200. The mother-glass display panel manufactured and assembled by the SVA mode or SC-VA mode-based manufacturing methods described above in connection with FIGS. 6A and 6B is annealed as described above. The assembled mother-glass display panel is comprised of a lower mother-glass display panel and an upper mother-glass display panel, and includes a plurality of assembled liquid crystal display panels.

After the annealing, to apply exposure voltages to the pixel electrodes and the common electrodes of a plurality of assembled liquid crystal display panels, the lower mother-glass display panel of the assembled mother-glass display panel is, for example, partially cut at one or more sides. In other words, a horizontal or vertical side of the lower mother-glass display panel is cut so that the lower mother-glass display panel is, for example, smaller in size than the upper mother-glass display panel by about 10 mm. As the upper mother-glass display panel is greater than the lower mother-glass display panel by about 10 mm, a common electrode layer formed on the upper mother-glass display panel is exposed. The exposed common electrode layer has a common voltage applying trimming pattern and a pixel voltage applying trimming pattern. The common voltage applying trimming pattern and the pixel voltage applying trimming pattern may be formed in a prior process by a method such as, for example, laser trimming. The common voltage applying trimming pattern is connected to common electrodes of respective assembled liquid crystal display panels, and the pixel voltage applying trimming pattern is connected to pixel electrodes of respective assembled liquid crystal display panels.

The exposure voltages are applied to the trimming patterns on the exposed common electrode layer. In other words, a common electrode voltage is applied to the common voltage applying trimming pattern, and a pixel voltage is applied to the pixel voltage applying trimming pattern. The exposure voltages are supplied by, for example, the DC voltage or multi-step voltage supply methods described above in connection with FIGS. 7A and 7B. In accordance with an exemplary embodiment of the present invention, the common voltage applying trimming pattern and the pixel voltage applying trimming pattern may receive, for example, a voltage of about 0V and a voltage of about 9V to about 25V, alternately. In other words, a voltage of about 0V and a voltage within a range of about 9V to about 25V are applied to the common voltage applying trimming pattern and the pixel voltage applying trimming pattern, swinging at a frequency of about 0.05 Hz to about 5 Hz. For example, a voltage of about 0V and a voltage of about 10V may swing at a frequency within a range of about 0.05 Hz to about 1 Hz, while a voltage of 0V and a voltage of about 20V may swing at a frequency within a range of about 0.05 Hz to about 5 Hz. A time between cycles may fall within a range of, for example, about 0 ms to about 5 ms. The applied exposure voltages are, for example, simultaneously supplied to the pixel electrodes and common electrodes constituting the plurality of liquid crystal display panels. As the exposure voltages are applied to the trimming patters of the mother-glass display panels connected to the pixel electrodes and common electrodes of the plurality of liquid crystal display panel assemblies, the manufacturing process may be simple and the uniform exposure voltages may be applied to the plurality of liquid crystal display panel assemblies. Thereafter, the methods of forming the photo hardening layers 35 and 36 having a pre-tilt angle by irradiating UV to the liquid crystal display panel assembly are performed, and these methods are substantially similar to the SVA mode or SC-VA mode-based manufacturing methods described above in connection with FIGS. 6A and 6B. The completed liquid crystal display panel assemblies are each separated from the mother-glass display panels.

By supplying the exposure voltages to the mother-glass display panels according to an exemplary embodiment of the present invention, the image qualities of the liquid crystal display panel assemblies are uniform and a lot of the liquid crystal display panel assemblies can be manufactured in a short time.

To reduce the signal delay and the deviation between voltages applied to the pixel electrodes and common electrodes of the liquid crystal display panel assemblies which are formed on the mother-glass display panels and then assembled according to an exemplary embodiment of the present invention, cut portions of the lower mother-glass display panel may be on two or more sides facing each other.

In accordance with an exemplary embodiment of the present invention, the pixel voltage applying trimming pattern may be electrically connected to the pixel electrodes by an electric conductor applied during forming of the upper-plate common voltage applying point, in the process of forming the upper-plate common voltage applying point.

Polarized UV-VA Mode

Now, a method for manufacturing the liquid crystal display panel assembly 300 based on the polarized UV-VA mode will be described with reference to FIG. 6C. FIG. 6C is a schematic flowchart illustrating a method for manufacturing the liquid crystal display panel assembly 300 based on the polarized UV-VA mode using the lower and upper display panels 100 and 200 manufactured with reference to FIG. 1 to FIGS. 5A and 5B. The method for manufacturing the liquid crystal display panel assembly 300 based on the polarized UV-VA mode is similar to the method for manufacturing the liquid crystal display panel assembly 300 based on the SVA mode or the SC-VA mode except for how to form the alignment films 291 and 292. Therefore, duplicate descriptions will be omitted except for how to form the alignment films 291 and 292 of the instant exemplary embodiment. Further, the difference between the polarized UV-VA mode and other modes will be described in detail. In addition, since the lower-plate and upper-plate alignment films 291 and 292 are substantially the same in their forming process, a forming process of the lower-plate alignment film 291 will be described in detail to avoid duplicate description.

Manufacturing the lower display panel 100 with the pixel electrode 191 and the upper display panel 200 with the common electrode 270 in first steps S310 and S320 is substantially the same as that described in conjunction with FIG. 1 to FIGS. 5A and 5B. The pixel electrode 191 and the common electrode 270 may not have the aforementioned micro branches 197 or micro slits 199.

In the next steps S331 and S332, a polarized alignment reactant (not shown) is applied onto each of the pixel electrode 191 and the common electrode 270, and then undergoes, for example, Micro Phase Separation (MPS) into a vertical photo alignment material layer (not shown) and a polarized main alignment material layer (not shown), by heat. After polarized UV is irradiated to the MPS-separated polarized alignment reactants, the lower-plate and upper-plate alignment films 291 and 292 having directionality are formed. Now, the forming process of the lower-plate alignment film 291 will be described in detail.

The polarized alignment reactant is made of, for example, a vertical photo alignment material and a polarized main alignment material. The polarized alignment reactant is applied onto the electrodes 191 and 270 by, for example, an inkjet or roll printing process, and then MPS-separated by a hardening described below. The hardening for MPS may proceed in, for example, two steps. First, for example, pre-heating, or a pre-bake process, proceeds at about 60° C. to about 90° C. (e.g., at about 80° C.), for about 1 minute to about 5 minutes (e.g., about 2 minutes to about 3 minutes) to remove a solvent of the polarized alignment reactant, and then post-heating, or a post-bake process, proceeds at about 200° C. to about 240° C., (e.g., about 220° C.), for about 10 minutes to about 60 minutes (e.g., about 10 minutes to about 20 minutes), thereby forming an MPS structure. After the polarized alignment reactant undergoes MPS, the vertical photo alignment material forms a vertical photo alignment material layer (not shown) mainly in the vicinity of the liquid crystal layer 3, and the polarized main alignment material forms a polarized main alignment material layer (not shown) mainly in the vicinity of the pixel electrode 191. The polarized main alignment material layer MPS-separated by hardening becomes the main alignment films 33 and 34. The lower-plate main alignment film 33 may be, for example, about 1000 Å thick. Therefore, the closer it gets to the liquid crystal layer 3, the higher the molarity of the vertical photo alignment material is compared with that of the polarized main alignment material.

The mixing wt % ratio of a vertical photo alignment material and a polarized main alignment material constituting the polarized alignment reactant may be, for example, about 5:95 to 50:50 (e.g., about 10:90 to 30:70). A solvent was not included in the composition ratio of a polarized alignment reactant. As the less vertical alignment materials mixed in a polarized alignment reactant are the less uncured photo reactive groups, afterimage of a liquid crystal display device is reduced, and the efficiency of reaction is increased, as well. For example, vertical photo alignment materials may be mixed in a concentration of about 50 wt % or less therein. In addition, if vertical photo alignment materials are mixed in a concentration of, for example, about 5 wt % or more therein, better pre-tilt uniformity can be obtained, and thus stains in the liquid crystal display device can be reduced. The surface tension of vertical photo alignment materials and polarized main alignment materials is, for example, about 25 to 65 dyne/cm, respectively. Surface tension of vertical photo alignment material should be, for example, equal to or less than that of polarized main alignment material to accomplish more sharp MPS.

Vertical photo alignment material is polymeric material having a weight-average molecular weight of, for example, about 1,000 to about 1,000,000, and is a compound having, for example, a main chain to which at least one side chain is linked, the side chain comprising a flexible functional group, a thermoplastic functional group, a photo reactive group, a vertical functional group and the like.

A flexible or thermoplastic functional group is a functional group that facilitates side chain linked to main chain of polymer to be aligned, and can be comprised of, for example, substituted or unsubstituted alkyl or alkoxy group having about 3 to 20 carbon atoms.

A photo reactive group is a functional group that directly undergoes photo dimerization or photo isomerization by irradiation of light such as, for example, UV. For example, a photo reactive group is comprised of at least one selected from azo group compounds, cinnamate group compounds, chalcone group compounds, coumarin group compounds, maleimide group compounds and combinations thereof.

A vertical functional group serves as a group which immigrates the whole side chain to be perpendicular to the main chain placed parallel to substrates 110 and 210, and may be comprised of, for example, aryl group substituted with alkyl group or alkoxy group having about 3 to 10 carbon atoms or cyclohexyl group substituted with alkyl group or alkoxy group having about 3 to 10 carbon atoms.

For example, monomers of diamine and the like, linked with a flexible group, a photo reactive group, vertical functional group and the like, are polymerized with acid anhydride and the like to form a vertical photo alignment material. For example, diamine, of which at least one of side chain including fluorine, aryl group and cinnamate is substituted, is polymerized with acid anhydride to form a vertical photo alignment material. Fluorine is a marker for detecting a vertical photo alignment material.

Vertical photo alignment material according to an exemplary embodiment of the present invention may be prepared by, for example, adding a compound, which is linked with thermoplastic functional group, photo reactive group, vertical functional group and the like, to polyimide, polyamic acid and the like. In this case, a side chain comprises, for example, thermoplastic functional group, photo reactive group, vertical functional group and the like by direct linking thermoplastic functional group with main chain of polymer.

Polarized main alignment material may comprise, for example, polymeric main chain, and its weight-average molecular weight is about 10,000 to about 1,000,000. If an imide group is included in polarized main alignment material in concentration of about 50-80 mol %, stains and afterimage of a liquid crystal display device can be reduced. To achieve sharper MPS and reduce afterimage of a liquid crystal display device, main alignment material may comprise, for example, a vertical functional group linked with a main chain of a polymer in concentration of about 5 mol % or less.

Main chain may be comprised of, for example, at least one selected from polyimide, polyamic acid, polyamide, polyamicimide, polyester, polyethylene, polyurethane, polystyrene, and mixtures thereof. As main chain comprises more cyclic structures of imide (e.g., as main chain comprises imide group preferably in concentration of about 50 mol % or more), its rigidity may be higher. Thus, stains which may occur in case of long-term driving a liquid crystal display device, is reduced, and thus alignment stability of liquid crystal molecules will be better.

The polarized main alignment material may correspond to the surface main alignment material in the SC-VA mode. In addition, it will be understood that the polarized main alignment material may be a material used for making the VA mode or the TN mode devices.

If UV is irradiated to the MPS-separated vertical photo alignment material layer, a photo-reactive group is light-hardened, thereby forming the photo hardening layer 35. The main alignment film 33 formed by thermal hardening and the photo hardening layer 35 formed by UV constitute the lower-plate alignment film 291.

The light irradiated to the vertical photo alignment material layer may be, for example, polarized UV, collimated UV, or slanted light. The polarized UV may be, for example, Linearly Polarized Ultra Violet (LPUV) or Partially Polarized Ultra Violet (PPUV). The irradiated wavelength may be, for example, about 270 nm to about 360 nm, and the irradiated energy may be about 10 mJ to about 5,000 mJ. A mask provided with an opening portion transmitting light and a light blocking portion blocking light is placed to correspond to a photo hardening region or a non-photo hardening region on the lower or upper display panel 100 and 200, and then light is irradiated thereto. In accordance with an exemplary embodiment of the present invention, the LPUV is irradiated at a predetermined tilt angle, e.g., about 20° to about 70°, with respect to the substrates 110 and the 210 of the display panels 100 and 200. The vertical photo alignment material layer undergoes a dimerization reaction, cis-trans isomerization, or light-decomposition reaction by the light passing through the opening portion in the mask. Therefore, the polymer of the photo hardening layer 35 light-hardened according to the LPUV's direction and the polarization direction has a direction that is slightly tilted with respect to the direction perpendicular to the substrate 110.

This gives the same effect as if the surfaces of the alignment films 291 and 292 have been rubbed in a specific direction. The liquid crystal molecules 31 adjacent to the photo hardening layer 35 are tilted similar to the polymer of the photo hardening layer 35, having a pre-tilt angle of a specific angle. Therefore, depending on the tilt angle of polarized UV, a direction of the pre-tilt angle of the liquid crystal molecules 31 is determined and a domain having liquid crystal molecules 31 aligned in a specific pre-tilt direction is formed. According to an exemplary embodiment of the present invention, photo hardening layers 35 and 36 having two pre-tilt angle directions are formed on each of the lower and upper display panels 100 and 200, and the liquid crystal layer 3 of the liquid crystal display device has four domains, which have different azimuths in the pre-tilt angles of the photo hardening layers 35 and 36 by the vector sum. On the other hand, the photo hardening layers 35 and 36 having four different directions may be formed on any one of the lower and upper display panels 100 and 200, so that the liquid crystal layer 3 may have, for example, four domains. Azimuths of the four domains may be tilted, for example, about 45° with respect to the polarization axis of the polarizer.

In the next step S340, a sealant is formed between the lower and upper display panels 100 and 200 on which the lower-plate and upper-plate alignment films 291 and 292 are formed, respectively, and the two display panels 100 and 200 are sealed, thereby manufacturing the liquid crystal display panel assembly 300. The manufactured liquid crystal display panel assembly 300 has characteristics of the polarized UV-VA mode. If the liquid crystal display device is manufactured based on the polarized UV-VA mode, the non-hardened photo-reactive group is reduced, contributing to a reduction in afterimage of the liquid crystal display device. In addition, domains are formed depending on the direction of the polarized UV, improving processability of the liquid crystal display devices. In other words, in the SVA mode or the SC-VA mode, the liquid crystal molecules 31 have a pre-tilt angle according to the electric field, which is formed in the liquid crystal layer 3 by an exposure voltage, and the direction of the micro branches 197, but in the polarized UV-VA mode, the photo hardening layer 35 is formed before sealing of the two display panels 100 and 200 regardless of the existence and direction of the micro branches 197, thereby increasing the processability.

An alignment film of a liquid crystal display device according to an exemplary embodiment of the present invention is formed by, for example, a polarized alignment reactant having a mixed photo alignment material 48. The mixed photo alignment material 48 contained in the polarized alignment reactant according to an exemplary embodiment of the present invention easily moves to the surface of the polarized alignment reactant in the phase separation process, thus reducing the non-hardened photo-reactive polymer, and reducing the production cost, the RDC voltage, or the afterimages of the liquid crystal display device. The mixed photo alignment material 48 according to an exemplary embodiment of the present invention includes, for example, a heat-reactive part 48a, a photo-reactive part 48b, and a vertical functional part 48c (see FIGS. 15A-G), and may be a compound thereof.

This exemplary embodiment of the present invention is substantially similar to the exemplary embodiment of the liquid crystal display panel assembly manufactured by the aforementioned polarized UV-VA mode except for the materials constituting the polarized alignment reactant and the MPS process in the thermal curing process. A duplicate description will be simplified or omitted. Since the lower-plate and upper-plate alignment films 291 and 292 are formed in a substantially similar way, the forming process of the alignment film according to the current exemplary embodiment of the present invention will be described without distinguishing between the alignment films 291 and 292.

Figure 15A:
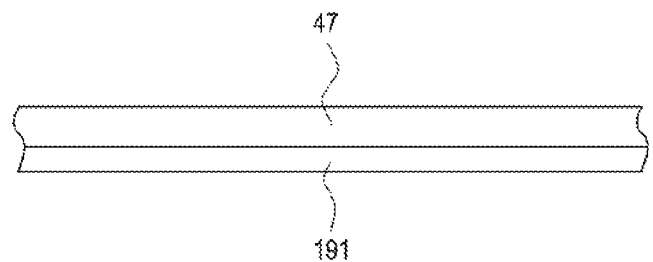
FIGS. 15A to 15G sequentially illustrate a process of forming an alignment film of a liquid crystal display panel assembly according to an exemplary embodiment (UV-VA mode) of the present invention.

Now, reference will be made to FIGS. 15A to 15G to give a detailed description of a forming process for an alignment film formed by a polarized alignment reactant 47 having the mixed photo alignment material 48 according to an exemplary embodiment of the present invention. FIGS. 15A to 15G illustrate a sequential process of forming an alignment film of a liquid crystal display panel assembly of another UV-VA mode according to an exemplary embodiment of the present invention. Referring to FIG. 15A, the polarized alignment reactant 47 having the mixed photo alignment material 48 is applied onto the pixel electrode 191 and the common electrode 270 as described above. The polarized alignment reactant 47 having the mixed photo alignment material 48 is, for example, formed on inner regions of the lower and upper display panels 100 and 200, or may be applied on outer regions thereof in a partially overlapping manner. The polarized alignment reactant 47 having the mixed photo alignment material 48 may be may be a mixture of for example, a polarized main alignment material 37, a photo alignment vertical material 49, the mixed photo alignment material 48, and a solvent. The pixel electrode 191 and the common electrode 270 may not have the aforementioned micro branches 197 or micro slits 199.

Now, a detailed description will be made of a composition ratio of the polarized main alignment material 37, the photo alignment vertical material 49, the mixed photo alignment material 48, and the solvent constituting the polarized alignment reactant 47 having the mixed photo alignment material 48.

Solid contents prepared by including photo alignment vertical material 49, polarized main alignment material 37 and mixed photo alignment material 48 are dissolved in a solvent to form polarized alignment reactant 47 including mixed photo alignment material 48. The concentration of solvent in polarized alignment reactant 47 may be, for example, about 85 wt % to about 98 wt % (e.g., about 93.5 wt %), and the concentration of solid contents except for solvent, e.g., the combination of mixed photo alignment material 48, polarized main alignment material 37 and photo alignment vertical material 49 may be about 2 wt % to about 15 wt % (e.g., about 6.5 wt %) in polarized alignment reactant 47. The solid contents in concentration of, for example, about 2 wt % or more can contribute to enhancing the printability of the polarized alignment reactant 47 when applied to the upper display panel. The solid contents in concentration of, for example, about 15 wt % or less can contribute to preventing from the generation of precipitates formed by undissolved solid contents in solvent, and make the printability of polarized alignment reactant 47 good.

The concentration of polarized main alignment material 37 in solid contents may be, for example, about 34 wt % to about 89.55 wt % (e.g., about 70 wt %), the concentration of photo alignment vertical material 48 may be about 8.5 wt % to about 59.7 wt % (e.g., about 30 wt %), and the concentration of mixed photo alignment material 48 may be about 0.5 wt % to about 15 wt % (e.g., about 5 wt %). Solid contents are polarized alignment reactant 47 except for solvent. Mixed photo alignment material 48 of which concentration is, for example, about 0.5 wt % or more in total weight of solid contents can react with photo alignment vertical material 49 to introduce minimal photo reactivity into photo alignment vertical material 49. Mixed photo alignment material 48 of which concentration is, for example, about 15 wt % or less in total weight of solid contents can minimize the decrease in alignment property of alignment film formed by polarized alignment reactant 47.

The weight ratio of photo alignment vertical material 49 versus polarized main alignment material 37 may be, for example, about 1:9 to about 6:4 (e.g. about 1:9 to about 5:5). Polarized alignment reactant 47 having this weight ratio can be readily phase-separated after the above-described preheating or heating process, and mixed photo alignment vertical material 49 can be readily moved to the surface of polarized alignment material 47 which is in contact with the air. Photo alignment vertical material 49 and polarized main alignment material 37 may have a weight-average molecular weight of, for example, about 10,000 to about 900,000 for storage property and printability of materials. A weight-average molecular weight is a conversed value of monodisperse polystyrene assessed by gel permeation chromatography (GPC).

Polarized main alignment material 37, photo alignment vertical material 49, mixed photo alignment material 48 and solvents, which constitute polarized alignment reactant 47 including mixed photo alignment material 48 will be described in detail below.

Polarized main alignment material 37 is a compound comprised of, for example, monomers which have no side chain and concentration of about 95 mol % to about 100 mol % and monomers which have side chain and concentration of about 0 mol % to about 5 mol %, and polarized main alignment material 37 having the composition ratio has horizontal alignment property. For example, a monomer which has no side chain may be about 100 mol % in polarized main alignment reactant 37, but may be in the composition range which does not decrease horizontal alignment property, e.g., about 95 mol % to about 100 mol %. In addition, monomers which have side chain may be in the composition range which does not decrease horizontal alignment property, e.g., about 0 mol % to about 5 mol % in polarized main alignment reactant 37.

Side chain of monomers constituting polarized main alignment material 37 may include, for example, all of functional groups other than—H. Side chain of monomers constituting surface main alignment material 37 may be, for example, substantially equal to that of monomers constituting photo alignment vertical material 49, but polarized main alignment material 37 may have horizontal alignment property as this composition ratio of monomers having a side chain is low.

Polarized main alignment material 37 may be, for example, at least one selected from polyimide-based compound, polyamic acid-based compound, polysiloxane-based compound, polyvinylcinnamate-based compound, polyacrylate-based compound, polymethylmethacrylate-based compound, and mixtures thereof.

According to an exemplary embodiment of the present invention, if polarized main alignment material 37 is a polyimide-based compound, main chain of this compound may be a monomer having an imide bond.

Photo alignment vertical material 49 is a compound comprised of, for example, monomers of which end is linked with side chains having a hydrophobic group and monomers which have no side chain. Monomers which have side chains constituting photo alignment vertical material 49 may be, for example, 10 mol % to 70 mol % (e.g., about 20 mol % to about 60 mol %), and monomers which have no side chain may be, for example, 30 mol % to 90 mol % (e.g., about 40 mol % to about 80 mol %). Photo alignment vertical material 49 having this composition ratio has vertical alignment property.

Monomers with side chains and monomers with no side chain, constituting photo alignment vertical material 49, may be, for example, at least one selected from monomers of imide bond which constitute polyimide-based compounds, amic acid group monomers which constitute polyamic acid-based compounds, siloxane group monomers which constitute polysiloxane-based compounds, vinylcinnamate group monomers which constitute polyvinylcinnamate-based compounds, acrylate group monomers which constitute polyacrylate-based compounds, methyl methacrylate group monomers which constitute polymethylmethacrylate-based compounds, and mixtures thereof.

Main chain of photo alignment vertical material 49 may be, for example, polyimide-based compounds or polyamic acid-based compounds. According to an exemplary embodiment of the present invention, photo alignment vertical material 49 comprised of monomers of imide bond includes, for example, polyimide-based compounds as a main chain, and has a structure of which a side chain is linked to a main chain. Photo alignment vertical material 49 comprised of monomers of imide bond may be prepared by, for example, imidation of a part of polyamic acid-based compounds. A main chain of photo alignment vertical material 49 is defined as a linking part of monomers other than side chain. According to an exemplar), embodiment of the present invention, photo alignment vertical material 49 which comprises polyamic acid-based compounds as a main chain can be prepared by, for example, reaction of diamine-based compounds with acid anhydride. Diamine-based compounds may be diamine having substantially the same functional groups as side chains.

Side chains of photo alignment vertical material 49 have the first functional group, the second functional group linked with the first functional group and including a large number of cyclic carbon atoms, and a vertical functional group 49c linked with the second functional group. The first functional group may comprise, for example, alkyl group or alkoxy group having 1 to 10 carbon atoms. The second functional group is linked with a main chain by the first functional group, and linked with a vertical functional group 49c. The second functional group may comprise, for example, cyclohexane, benzene, chroman, naphthalene, tetrahydropyran, and dioxane or steroid derivatives. A vertical functional group 49c shown in FIG. 15C is a hydrophobic group which is linked with the end of a side chain. A vertical functional group 49c may comprise, for example, a linear type or a branched type, of which side chain is linked with linear type, of alkyl group having 1 to 12 carbon atoms or an alkenyl group having 2 to 12 carbon atoms. Hydrogen atoms in a vertical functional group 49c may be substituted by, for example, F or Cl.

According to an exemplary embodiment of the present invention, a side chain of photo alignment vertical material 49 may be a monomer represented by, for example, the following formula X-UV1 to X-UV4.

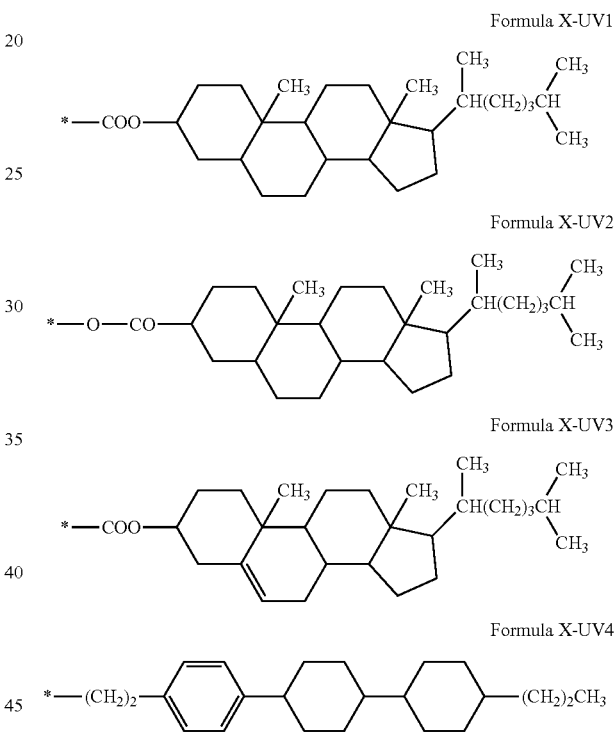

According to an exemplary embodiment of the present invention, a side chain of photo alignment vertical material 49 may comprise, for example, a photo-reactive part having a photo-reactive group. A photo-reactive group linked to a side chain of photo alignment vertical material 49 may be cured by light to form a photo hardening layer having a pre-tilt angle. A photo-reactive part may be replaced with, for example, the second functional group, which is placed between the first functional group and a vertical functional group 49c, to be linked with the first functional group and a vertical functional group 49c. Unlike this, a photo-reactive part may be, for example, placed between the first functional group and the second functional group to be linked with the first and second functional groups, respectively. A photo-reactive part linked with the side chain of a photo alignment vertical material 49 may be monomers represented by, for example, the following formulas X-UV5 to X-UV9.

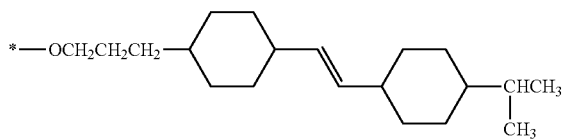

Formula X-UV5

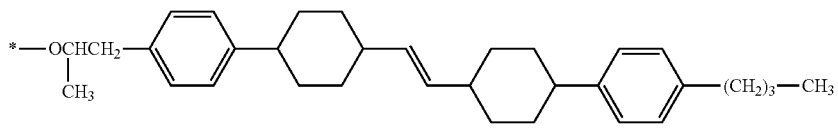

Formula X-UV6

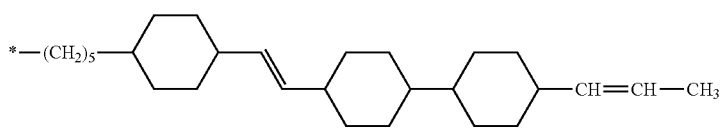

Formula X-UV7

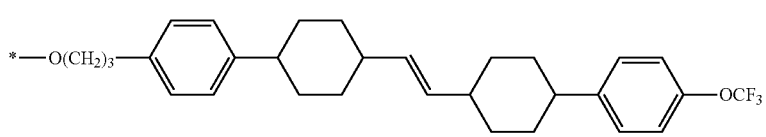

Formula X-UV8

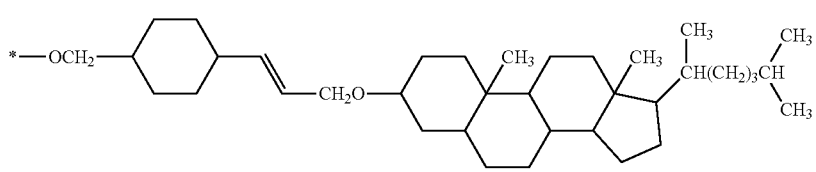

Formula X-UV9

A photo-reactive part linked to a side chain of photo alignment vertical material 49 may be, for example, at least one selected from the above-described photo-reactive polymer, reactive mesogen, photo-polymerizable material, photo-isomerizable material, and combinations or mixtures thereof.

Mixed photo alignment material 48 according to the present invention includes a compound represented by, for example, the following formula X-UP1. Mixed photo alignment material 48 is comprised of, for example, a heat-reactive part 48a, a photo-reactive part 48b, a linking part and a vertical functional part 48c. A carbon-carbon bond in a heat-reactive part 48a is cleaved by heat, and facilitates photo alignment vertical material 49 and mixed photo alignment material 48 to be linked to each other. A photo-reactive part 48b is linked with any other photo-reactive part by light. A linking part connects a photo-reactive part 48b with a heat-reactive part 48a and a vertical functional part 48c. A vertical functional part 48c increases vertical alignment property of mixed photo alignment material 48.

$B_1—X_1-A_1-Y_1-D$  Formula X-UP1 where $A_1$ is a photo-reactive part 48b of mixed photo alignment material 48 depicted in FIG. 15C. A photo-reactive part 48b may be polymerized or cured with adjacent photo-reactive part 48b by irradiation of light. $A_1$ may be cinnamate, coumarin or chalcone.

$X_1$ and $Y_1$ are a linking part, and connect a photo-reactive part $A_1$ with a heat-reactive part $B_1$ and a vertical functional part D. $X_1$ and $Y_1$ each may be a single bond or —$C_nH_{2n}$— (where n is an integer of 1 to 6). If $X_1$ and/or $Y_1$ is —$C_nH_{2n}$—, —$X_1$ and/or $Y_1$ may have a linear type or a branched type hydrocarbon. One or more of —$CH_2$— constituting $X_1$ or $Y_1$ may be substituted by —O— or —Si—, respectively.

According to an exemplary embodiment of the present invention, $X_1$ and/or $Y_1$ may be —$CH_2$—, —$CH_2$—$CH_2$—, —O—$CH_2$—, —$CH_2$—Si— or —O—Si—O—.

$B_1$ is a heat-reactive part 48a depicted in FIG. 15C. $B_1$ is comprised of carbon-oxygen bond which is easily cleaved by heat, and can be easily linked with photo alignment vertical material 49. $B_1$ may be

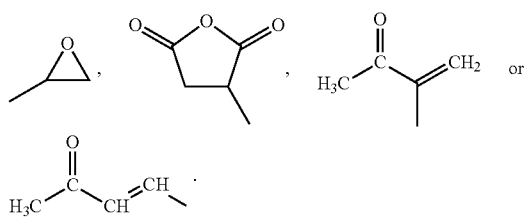

D is a vertical functional part 48c of mixed photo alignment material 48 having vertical alignment property depicted in FIG. 15C, and is alkyl group having 1 to 12 carbon atoms or alkenyl group having 2 to 12 carbon atoms. A vertical functional part 48c of mixed photo alignment material 48 increases vertical alignment property. For example, mixed photo alignment material 48 includes a vertical functional part 48c other than a vertical functional group 49c linked to a side chain of photo alignment vertical material 49, and thus the number of vertical functional groups constituting polarized alignment reactant 47 is increased. Therefore, mixed photo alignment material 48 having a vertical functional part 48c and photo alignment vertical material 49 having a vertical functional group 49c are linked to each other by, for example, a heat curing process to increase the density of a vertical alignment functional group, and can improve vertical alignment property of alignment film. Hydrogen atoms other than $B_1$ in formula X-UP1 each may be substituted by, for example, F or Cl.

According to an exemplary embodiment of the present invention, mixed photo alignment material 48 represented by, for example, formula X-UP1 has cinnamate which constitutes $A_1$, —O—Si—O— which constitutes $X_1$ and $Y_1$, respectively,

which constitutes $B_1$, and

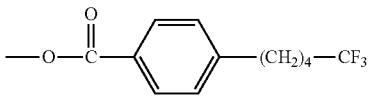

which constitutes D.

According to an exemplary embodiment of the present invention, mixed photo alignment material 48 may include a compound represented by, for example, the following formula X-UP2.

   Formula X-UP2 where $A_2$ may be materials constituting a photo-reactive part 48b of the above-described mixed photo alignment material 48, $X_2$ may be materials constituting a linking part of the above-described mixed photo alignment material 48, and $B_2$ may be materials constituting a heat-reactive part 48a of the above-described mixed photo alignment material 48. In the formula X-UP2, hydrogen atoms other than $B_2$ may be substituted by, for example, F or Cl.

Compared with the mixed photo alignment material 48 expressed by Formula X-UP1, the mixed photo alignment material 48 expressed by Formula X-UP2 does not have the vertical functional part 48c. Although the mixed photo alignment material 48 expressed by Formula X-UP2 does not have the vertical functional part 48c, the large size of the photo-reactive part 48b enables stable arrangement of the side chains of the photo alignment vertical material 49.

The solvent may be, for example, a compound for facilitating dissolution or mixing of the photo alignment vertical material 49, the polarized main alignment material 37, and the mixed photo alignment material 48, or a compound capable of increasing the printability thereof. The solvent may be, for example, an organic solvent, or may be one of the aforementioned solvent materials.

To increase the photo hardening reaction, the polarized alignment reactant 47 may further include the aforementioned photoinitiator.

Referring to FIGS. 15B to 15E, after being applied, the polarized alignment reactant 47 is, for example, thermally cured by pre-heating (FIG. 15B) or post-heating (FIG. 15D) as described above. The polarized alignment reactant 47 undergoes MPS by the thermal curing. In accordance with an exemplary embodiment of the present invention, the polarized alignment reactant 47 undergoes phase separation in the pre-heating step, and the phase separation is completed in the post-heating step. Now, the phase separation process for the polarized alignment reactant 47 will be described in detail.

Figure 15B:
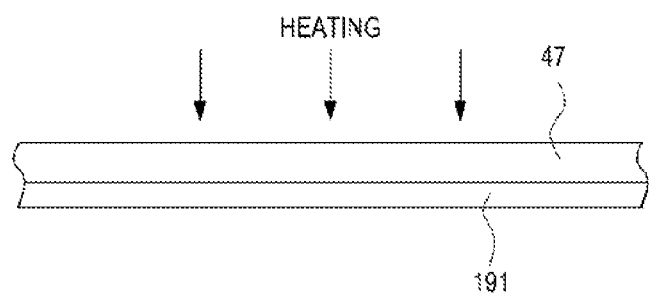
Figure 15C:
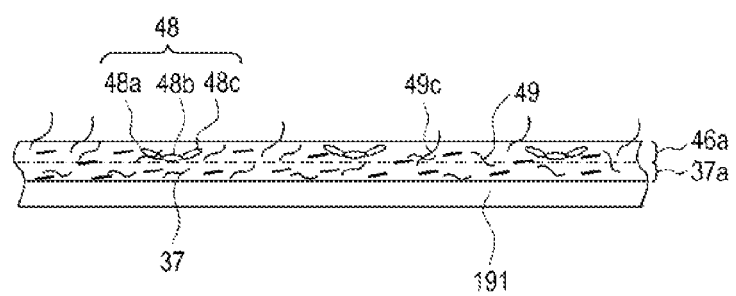

Referring to FIG. 15B, the polarized alignment reactant 47 is pre-heated. The pre-heated polarized alignment reactant 47 is MPS-separated into a polarized main alignment material layer 37a and a vertical photo alignment material layer 46a, and the solvent of the polarized alignment reactant 47 is, for example, vaporized. The polarized main alignment material layer 37a is formed, for example, close to the pixel electrode or the common electrode, and primarily contains the polarized main alignment material 37. The polarized main alignment material layer 37a may contain, for example, the photo alignment vertical material 49 and the mixed photo alignment material 48. The vertical photo alignment material layer 46a is formed, for example, close to the surface contacting air, and primarily contains the polarized main alignment material 37 and the mixed photo alignment material 48. The vertical photo alignment material layer 46a may contain, for example, the polarized main alignment material 37. The photo alignment vertical material 49 and the polarized main alignment material 37 might be substantially mixed in the interface between the polarized main alignment material layer 37a and the vertical photo alignment material layer 46a.

Referring to FIG. 15C, the polarized alignment reactant 47 is phase-separated as follows. In accordance with an exemplary embodiment of the present invention, the photo alignment vertical material 49 constituting the polarized alignment reactant 47 has a non-polarity compared with the polarized main alignment material 37, while the polarized main alignment material 37 has a polarity compared with the photo alignment vertical material 49. In addition, air has a non-polarity compared with the material constituting the pixel or common electrode, while the material constituting the pixel or common electrode has a polarity compared with air. Hence, in the pre-heating process, the photo alignment vertical material 49 constituting the polarized alignment reactant 47 mostly moves in the direction of the surface contacting air because its affinity to air is greater than that of the polarized main alignment material 37. In addition, as the polarized main alignment material 37 having a polarity extrudes the mixed photo alignment material 48, the mixed photo alignment material 48 moves like the photo alignment vertical material 49, thus being mixed with the photo alignment vertical material 49. Hence, the mixed photo alignment material 48 and the photo alignment vertical material 49, which have moved in the direction of the surface in the pre-heating step, form the vertical photo alignment material layer 46a. Consequently, the mixed photo alignment material 48 can readily move toward the surface contacting air by virtue of the phase separation process for the polarized main alignment material 37 and the photo alignment vertical material 49, thus reducing the content of the mixed photo alignment material 48 contained in the polarized alignment reactant 47. On the other hand, the polarized main alignment material 37 constituting the polarized alignment reactant 47 moves toward an electrode layer because its affinity to the material formed on the bottom of the polarized alignment material 47, e.g., near the pixel electrode or the common electrode, is greater than that of the photo alignment vertical material 49. Having moved toward the electrode layer, the polarized main alignment material 37 and some of the photo alignment vertical material 49 form the polarized main alignment material layer 37a. The vertical functional group 49c of the photo alignment vertical material 49 may have a vertical alignment in the pre-heating. The mixed photo alignment material 48 may include, for example, the heat-reactive part 48a, the photo-reactive part 48b, and the vertical functional part 48c.

Figure 15D:
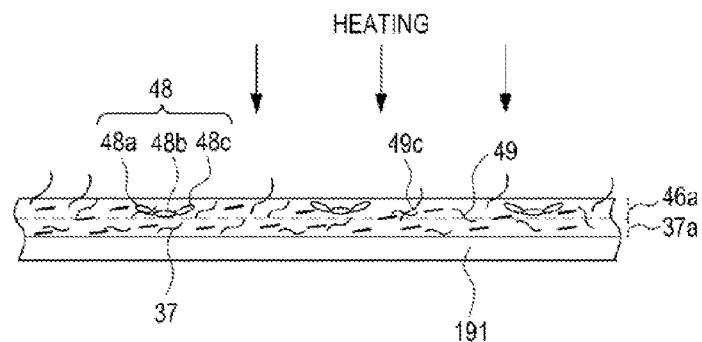
Figure 15E:
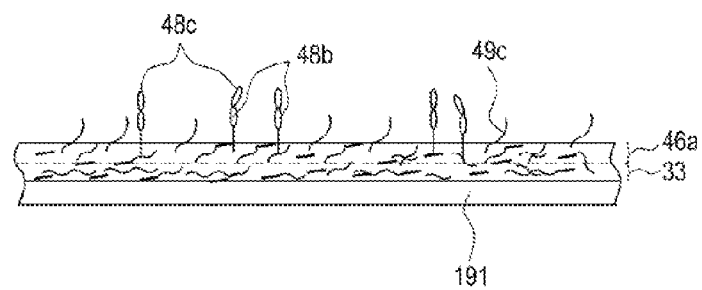

Referring to FIGS. 15D and 15E, the phase-separated polarized alignment reactants 46a and 37a are post-heated as described above. The post-heated polarized alignment reactants 46a and 37a form a main alignment film 33 and a vertical alignment. The main alignment film 33 is formed mainly by, for example, curing of the polarized main alignment material 37. In the post-heating process, the chemical bond of the heat-reactive part 48a constituting the mixed photo alignment material 48 is readily broken, and the bond-broken heat-reactive part 48a is chemically bonded to the photo alignment vertical material 49. Therefore, the photo alignment vertical material 49 constituting the vertical photo alignment material layer 46a, and the heat-reactive part 48a of the mixed photo alignment material 48 are chemically bonded, and the photo-reactive part 48b and the vertical functional part 48c form a vertical alignment on the surface of the vertical alignment material layer 46a. Accordingly, even though the photo alignment vertical material 49 does not have the photo reactivity, the photo alignment vertical material 49 may have the photo reactivity by being bonded to the heat-reactive part 48a of the mixed photo alignment material 48. The photo alignment vertical material 49 or the polarized main alignment material 37 bonded to the mixed photo alignment material 48 can have the photo reactivity, thus further reducing the content of the mixed photo alignment material 48 contained in the polarized alignment reactant 47. In the post-heating process, the solvent of the polarized alignment reactant 47 may be additionally vaporized. Further, in the post-heating process, the vertical functional group 49c contained in the photo alignment vertical material 49 may be vertically aligned.

For example, after completion of the post-heating process, the polarized alignment reactant 47 is cleaned by DIW, and may be additionally cleaned by IPA. After the cleaning, the polarized alignment reactants 47 are dried.

Figure 15F:
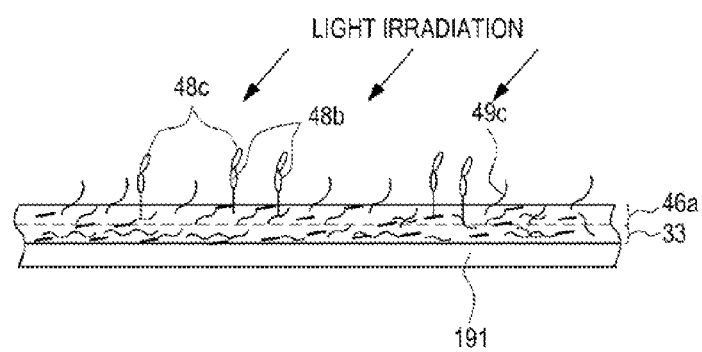
Figure 15G:
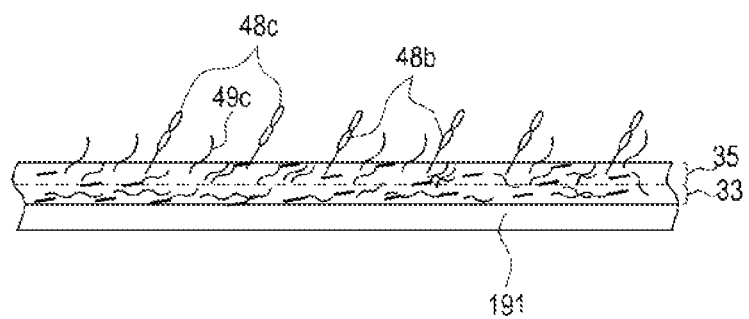

Now, referring to FIGS. 15F and 15G, if light is irradiated to the vertical photo alignment material layer 46a, the photo-reactive part 48b of the mixed photo alignment material 48 is hardened, forming the photo hardening layer 35 on the main alignment film as illustrated in FIG. 15G. The main alignment film 33 formed by heat curing and the photo hardening layer 35 formed by UV light constitute the lower-plate alignment film 291. The light irradiated to the vertical photo alignment material layer 46a and the photo hardening process, shown in FIG. 15F, are the same as those described above in relation to the polarized UV-VA mode. By the non-content photo hardening process, the photo hardening layer has a pre-tilt angle. The pre-tilt angle of the photo hardening layer may be, for example, about 80° to about 90°, more preferably about 87.5° to about 89.5°, with respect to the substrates of the display panels 100 and 200. Owing to the light irradiation method, even though the pixel electrodes do not have the micro slits 199 or micro branches 197, the liquid crystal display device according to an exemplary embodiment of the present invention may have a plurality of domains, which divide the liquid crystal layer 3 into a plurality of domains.

Thereafter, as described above in relation to step S340, the liquid crystal layer 3 and the sealant are formed between the lower and upper display panels 100 and 200 on which the lower-plate and upper-plate alignment films 291 and 292 are formed, respectively. The display panels 100 and 200 assembled by the sealant are annealed. The material of the sealant, the process of curing the sealant, and the annealing may be the same as those described above for the main alignment films 33 and 34 having rigid vertical alignment sidechains. The liquid crystal display panel assembly 300 manufactured in this way has characteristics of the polarized UV-VA mode.

According to an exemplary embodiment of the present invention, the mixed photo alignment material 48 contained in the polarized alignment reactant 47 can readily move toward the surface onto which light is irradiated, in the process of forming the alignment film, making it possible to reduce the content of the mixed photo alignment material 48 contained in the polarized alignment reactant 47. Therefore, the production cost of the liquid crystal display device may be reduced.

In addition, the photo alignment vertical material 49 or the polarized main alignment material 37 can have a polarity due to their combination with the mixed photo alignment material 48, contributing to a further reduction in the content of the mixed photo alignment material 48 contained in the polarized alignment reactant 47.

Furthermore, the amount of the mixed photo alignment material 48 remaining in the alignment film can be minimized, contributing to a reduction in the RDC voltage or afterimages of the liquid crystal display device.

The main alignment films 33 and 34 were formed by the polarized alignment reactant 47 having the mixed photo alignment material 48 according to an exemplary embodiment of the present invention, and the liquid crystal display device having the same was manufactured.

The polarized alignment reactant 47 applied the experiment of the present invention included solid contents comprising, for example, polarized main alignment material 37, photo alignment vertical material 49 and mixed photo alignment material 48 and a solvent. Solid contents constituting polarized alignment reactant 47 were, for example, about 6.5 wt %, and a solvent was about 93.5 wt %. In addition, for example, photo alignment vertical materials 49 constituting solid contents were about 30 wt %, polarized main alignment materials 37 were about 70 wt %, and mixed photo alignment materials 48 were about 5 wt %, in solid contents.

Photo alignment vertical material 49 was, for example, a compound (JSR, PI-37) of diacid anhydride and diamine, which is comprised of

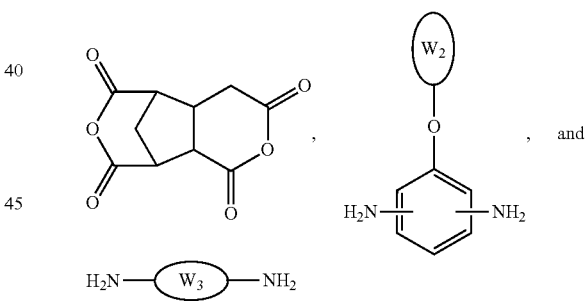

in a ratio of about 1:0.4:0.6, where W2 is

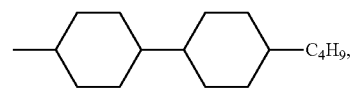

and W3 is

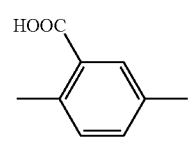

Polarized main alignment material 37 was a compound (JSR, PA-4) of diacid anhydride and diamine, which is comprised of

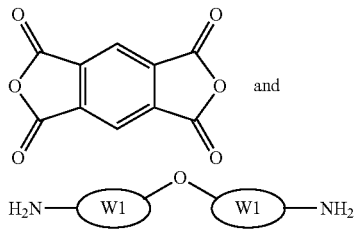

in a ratio of about 1:1, where W1 is

Mixed photo alignment material 48 was, for example, a compound (JSR, P_A(std.) represented by the following formula X-UP3.

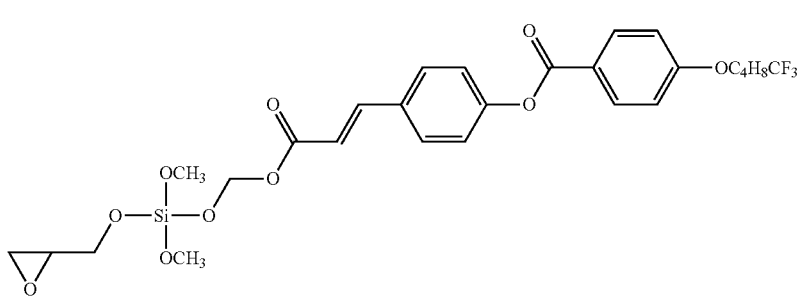

Formula X-UP3

A solvent was, for example, a mixture of N-methylpyrrolidone of about 45 wt % and butyl cellosolve of about 55 wt %.

The polarized alignment reactant 47 having the above composition ratio, applied onto a 17-inch liquid crystal display panel, was, for example, pre-heated at about 80° C., and then post-heated at about 220° C. for about 20 minutes. Thereafter, linearly polarized UV was, for example, irradiated in an anti-parallel direction to the polarized alignment reactant 47 formed on the common electrode constituting the upper display panel, while having a tilt angle of about 50° with respect to the surface of the substrate of the display panel. In the same manner, the linearly polarized UV was irradiated to the polarized alignment reactants 47 formed on the pixel electrodes constituting the lower display panel.

Due to the irradiated UV, the lower-plate and upper-plate photo hardening layers 35 and 36 had anti-parallel pre-tilt angles. In other words, the photo hardening layers 35 and 36 had, for example, four different pre-tilt angles, and the liquid crystal layer 3 of the liquid crystal display device had four domains which were formed to have different azimuths by the photo hardening layers 35 and 36 having four different pre-tilt angles. The azimuths of the four domains are defined by a vector sum of the four different pre-tilt angles. An intensity of the linearly polarized UV was, for example, about 20 mJ/cm². The manufactured liquid crystal display panel assembly was operated by charge sharing-based 1G1D driving described above in conjunction with FIG. 11.

In the manufactured liquid crystal display device, liquid crystal molecules 31 adjacent to the photo hardening layer 35/36 had a pre-tilt angle of, for example, about 88.2° with respect to the surface of the substrate of the liquid crystal display panel. In addition, the surface afterimage of the liquid crystal display device, which had been operated in a chamber having, for example, a high temperature of about 50° C. for 24 hours with an image of a check flicker pattern, showed a good level of approximately 3.

Driving of Liquid Crystal Display Device

Now, the structure and operation of an equivalent circuit for one pixel PX of a liquid crystal display device will be described with reference to FIG. 11. FIG. 11 is an equivalent circuit diagram of a Charge Sharing (CS) charging-based 1 1G1D for one pixel PX shown in FIG. 3 according to an exemplary embodiment of the present invention. The equivalent circuit for one pixel PX in the liquid crystal display device includes, for example, signal lines and a pixel PX connected thereto, the signal lines including a gate line 121, a storage electrode line 125, a down gate line 123, and a data line 171.

One pixel PX is comprised of, for example, first, second and third TFTs Qh, Ql and Qc, first and second liquid crystal capacitors Clch and Clcl, first and second storage capacitors Csth and Cstl, and a down capacitor Cstd. The first and second TFTs Qh and Ql formed on the lower display panel 100 are, for example, 3-terminal devices, in which their gate electrodes or control terminals are connected to the gate line 121, their source electrodes or input terminals are connected to the data line 171, and their drain electrodes or output terminals are connected to the first and second liquid crystal capacitors Clch and Clcl and the first and second storage capacitors Csth and Cstl, respectively. The third TFT Qc is a 3-terminal device, in which its gate electrode or a control terminal is connected to the down gate line 123, its source electrode or an input terminal is connected to the second liquid crystal capacitor Clcl or the output terminal the second TFT Ql, and its drain electrode or an output terminal is connected to the down capacitor Cstd. First and second subpixel electrodes 191h and 191l constituting a pixel electrode 191 are connected to the drain electrodes or output terminals of the first and second TFTs Qh and Ql, respectively. Electrodes of the first and second liquid crystal capacitors Clch and Clcl are connected to the first and second subpixel electrodes 191h and 191l, respectively, and other electrodes thereof are each connected to the common electrode 270 on the upper display panel 200. Electrodes of the first and second storage capacitors Csth and Cstl are connected to the first and second subpixel electrodes 191h and 191l, respectively, and other electrodes thereof are each connected to the storage electrode line 125 on the lower display panel 100, or to the portions 126, 127 and 128 connected to the storage electrode line 125. One electrode of the down capacitor Cstd is connected to the output terminal of the third TFT Qc, and another electrode thereof is connected to the storage electrode line 125. The first and second storage electrodes Csth and Cstl may increase voltage maintaining abilities of the first and second liquid crystal capacitors Clch and Clcl, respectively. The electrodes of the capacitors Clch, Clcl, Csth, Cstl and Cstd overlap one another, with the insulators 3, 140, 181 and 182 interposed therebetween.

Now, the charging principle of a pixel PX will be described in detail. If a gate-on voltage Von is supplied to an n-th gate line Gn, the first and second TFTs Qh and Ql connected thereto are turned on, and a gate-off voltage Voff is supplied to an n-th down gate line An. Accordingly, a data voltage on an n-th data line Dn is equally supplied to the first and second subpixel electrodes 191*h* and 191*l* via the first and second TFTs Qh and Ql, which are turned on. As the first and second liquid crystal capacitors Clch and Clcl charge charges as much as voltage differences between a common voltage Vcom on the common electrode 270 and the voltages on the first and second subpixel electrodes 191*h* and 191*l*, respectively, the charged voltage values of the first and second liquid crystal capacitors Clch and Clcl are the same. Thereafter, the gate-off voltage Voff is supplied to the n-th gate line Gn and the gate-on voltage Von is supplied to the n-th down gate line An. In other words, the first and second TFTs Qh and Ql are each turned off, and the third TFT Qc is turned on. Thus, charges on the second subpixel electrode 191*l* connected to the output terminal of the second TFT Ql flow into the down capacitor Cstd, lowering a voltage on the second liquid crystal capacitor Clcl. As a result, though the same data voltage is supplied to the subpixel electrodes 191*h* and 191*l*, the charged voltage on the first liquid crystal capacitor Clch is greater than that on the second liquid crystal capacitor Clcl. A ratio of the voltage on the second liquid crystal capacitor Clcl to the voltage on the first liquid crystal capacitor Clch may be, for example, about 0.6 to about 0.9:1 (e.g., about 0.77:1). In this manner, the first and second subpixel electrodes 191*h* and 191*l* are provided with the same data voltage, and the second liquid crystal capacitor Clcl of the second subpixel electrode 191*l* and the down capacitor Cstd share charges to make capacitances of the first and second liquid crystal capacitors Clch and Clcl different from each other. This is called CS charging.

As a result, liquid crystal molecules 31 of the first subpixel electrode 191*h* receive an electric field of higher strength than that of liquid crystal molecules 31 of the second subpixel electrode 191*l*, so the liquid crystal molecules 31 of the first subpixel electrode 191*h* are tilted more. As the liquid crystal molecules 31 of first and second subpixels 190*h* and 190*l* charged by CS compensate for phase retardation of light if they have different tilt angles, the liquid crystal display device according to an exemplary embodiment of the present invention may have excellent side visibility and a wide reference viewing angle. The reference viewing angle refers to a limit angle or an inter-gray level luminance-crossing limit angle at which a side contrast ratio versus a front contrast ratio is, for example about 1/10. The wider the reference viewing angle, the better the side visibility of the liquid crystal display device may be. In addition, one gate line 121 and one data line 171 are connected to one pixel PX to operate subpixels 190*h* and 190*l* constituting one pixel PX, thus increasing the aperture ratio of the liquid crystal display device. This method in which one gate line 121 and one data line 171 are connected to one pixel PX is 1G1D.

In an exemplary embodiment of the present invention, if the gate-on voltage Von supplied to the n-th gate line Gn and the gate-on voltage Von supplied to the n-th down gate line An overlap due to a signal delay of the gate-on voltages, poor charging may occur in the pixel electrode. To correct this, the n-th down gate line An may, for example, be connected to an (n+m)-th gate line 121 (where m≥1)(e.g., an (n+4)-th gate line 121) to receive the gate-on voltage Von.

A 1-pixel PX circuit according to an exemplary embodiment of the present invention is 2-TFT (2T) charging-based 1 Gate 2 Data (1G2D), in which two TFTs and two data lines are connected to one pixel PX. In other words, first and second subpixel electrodes 191*h* and 191*l* are respectively connected to output terminals of first and second TFTs having gate electrodes connected to the same gate line, and two different data lines are connected to input terminals of the first and second TFTs, respectively. Different data voltages supplied to the first and second subpixel electrodes 191*h* and 191*l* via the two different data lines are divided voltages of a voltage corresponding to one image. The 2T charging-based 1G2D driving can apply an arbitrary data voltage to each of the subpixel electrodes 191*h* and 191*l*, thus further increasing the side visibility of the liquid crystal display device.

An exemplary embodiment of the present invention provides a swing voltage electrode line driving method. For example, in this driving method, each pixel has two TFTs, one gate line, one data line, and two swing voltage electrode lines. Gate electrodes of first and second TFTs are connected to the gate line, source electrodes thereof are connected to the data line, and drain electrodes thereof are connected to first and second subpixel electrodes and first and second storage capacitors, respectively. Electrodes of first and second liquid crystal capacitors are connected to the first and second subpixel electrodes, respectively, and other electrodes thereof are each connected to a common electrode formed on the upper display panel. Electrodes of the first and second storage capacitors are connected to the first and second subpixel electrodes, respectively, and other electrodes thereof are connected to swing voltage electrode lines, respectively. During a pixel operation, pulse trains having a voltage level of a specific period are applied to the swing voltage electrode lines, and opposite-phase voltages are simultaneously applied to the swing voltage electrode line of the first subpixel and the swing voltage electrode line of the second subpixel. The pulse trains provided to the swing voltage electrode lines may have, for example, two different voltages. Hence, a voltage charged in a first-subpixel liquid crystal capacitor and a voltage charged in a second-subpixel liquid crystal capacitor are different from each other in level, thereby improving side visibility of the liquid crystal display device.

An exemplary embodiment of the present invention provides, for example, a storage electrode line charge sharing driving method. In this driving method, each pixel has, for example, three TFTs, one gate line, one data line, and one storage electrode line. Gate electrodes of first and second TFTs are connected to the gate line, source electrodes thereof are connected to the data line, and drain electrodes thereof are connected to terminals of first and second-subpixel liquid crystal capacitors, respectively. Other terminals of the first and second-subpixel liquid crystal capacitors are each connected to the upper-plate common electrode. A gate electrode of a third TFT is connected to the storage electrode line, a source electrode thereof is connected to the second-subpixel liquid crystal capacitor's electrode that is connected to the drain electrode of the second TFT, and a drain electrode thereof is connected to an opposing electrode of the storage electrode line or a drain electrode's extended portion of the third TFT. As a charged voltage of the second-subpixel liquid crystal capacitor shares charges with the drain electrode's extended portion of the third TFT by the voltage on the storage electrode line, a charged voltage of the second subpixel is lower than a charged voltage of the first subpixel. The voltage supplied to the storage electrode line may be, for example, substantially the same as the voltage on the common electrode.

Now, an operation of the liquid crystal display device manufactured by the aforementioned method will be described in detail. The liquid crystal display device has the pixel PX structure shown in FIG. 3, and operates in the method described in conjunction with FIG. 11. Each of the modes for manufacturing the liquid crystal display panel assembly 300, e.g., SVA, SC-VA and polarized UV-VA modes, was distinguished depending on the method of forming the alignment films 291 and 292. However, after the liquid crystal display panel assembly 300 is manufactured, the liquid crystal display device operates in substantially the same way regardless of the mode used. Therefore, the operation of the liquid crystal display device will be described below without reference to the modes used to form the alignment films.

The liquid crystal display panel assembly 300 is assembled based on the SVA, SC-VA or polarized UV-VA mode, using the lower and upper display panels 100 and 200 having the pixel PX of FIG. 3. The liquid crystal display device is manufactured by, for example, connecting the drivers 400 and 500, the signal controller 600 and the gray level voltage generator 800 to the liquid crystal display panel assembly 300 as illustrated in FIG. 1. While no voltage is supplied to the pixel PX in the liquid crystal display device, liquid crystal molecules 31 adjacent to the alignment films 291 and 292 have a specific pre-tilt angle slightly tilted with respect to the direction perpendicular to the lower and upper display panels 100 and 200. If a data voltage is supplied to the pixel electrode 191, the liquid crystal molecules 31 in the same domain move in the same tilt direction. Because directions of the micro branches 197 of the first and second subpixel electrodes 191$h$ and 191$l$ are different from each other with respect to the transmission axis or polarization axis of the polarizer, the strength of the fringe electric field is different according to the widths of micro slits 199, voltages of the liquid crystal capacitors are different, and the subpixel electrodes 190$h$ and 190$l$ are different in luminance. By adjusting the liquid crystal's tilt angles of the subpixel electrodes 191$h$ and 191$l$ in this way, the side visibility of the liquid crystal display device may be increased. In addition, as the second subpixel electrode 191$l$ has the MA region described above, the arrangement of the liquid crystal molecules 31 may continuously change, thereby reducing the texture occurring when the liquid crystal molecules 31 are aligned discontinuously.

Basic Pixel Group of Liquid Crystal Display Device

Now, with reference to FIGS. 12, 14, and 28 to 32, a basic pixel group PS representing the primary colors according to an exemplary embodiment of the present invention will be described. This basic pixel group PS may increase the visibility of the liquid crystal display device and reduce rainbow stains or the yellowish phenomenon, contributing to increase of the quality of a liquid crystal display device having this basic pixel group. FIGS. 12, 14, and 28 to 32 are plan views of the pixel electrodes 191 of the basic pixel group PS of the liquid crystal display device according to an exemplary embodiment of the present invention. FIGS. 12, 14, and 28 to 32 illustrate plan views of only the pixel electrodes of the basic pixel group PS formed on the lower display panel 100.

As other plan views except the plan view of the pixel electrode 191 are the same as above, a description thereof is omitted, as well as other duplicate descriptions.

Figure 12:
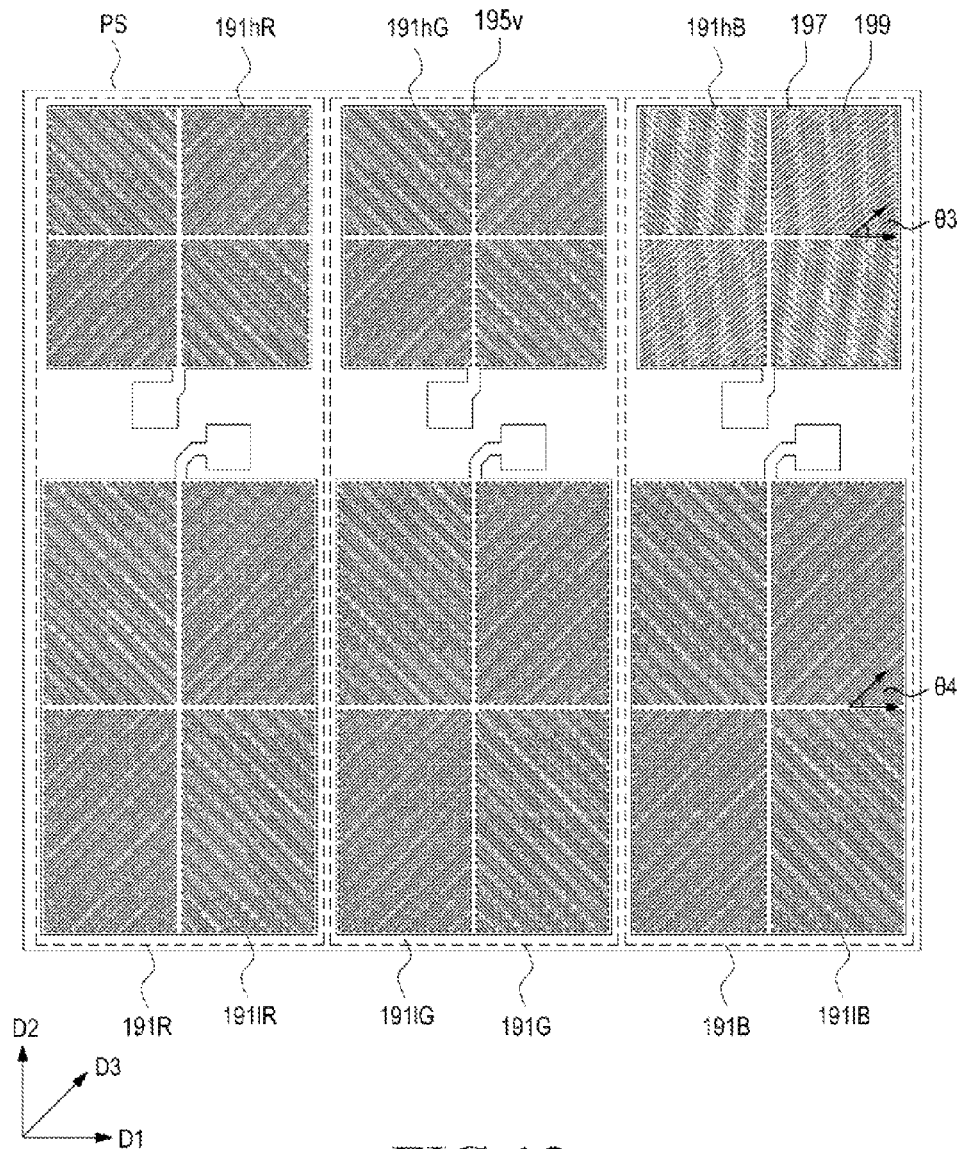
FIG. 12 is a plan view of pixel electrodes in a basic pixel group of a liquid crystal display device according to an exemplary embodiment of the present invention.

As illustrated in FIG. 12, the basic pixel group PS is comprised of, for example, pixel electrodes 191R, 191G and 191B corresponding to the primary colors of red, green and blue. The pixel electrodes 191R and 191G of red and green pixels PX are, for example, the same in structure, but the pixel electrode 191B of a blue pixel PX is partially different in structure from the other pixel electrodes 191R and 191G. The basic pixel group PS includes, for example, red, green and blue pixels PX corresponding to the 3 primary colors: red R, green G and blue B. The red, green and blue pixels PX have the red, green and blue pixel electrodes 191R, 191G and 191B, respectively. Color filters representing the primary colors may be formed on the lower or upper display panel 100 or 200. Each of the pixel electrodes 191R, 191G and 191B is, for example, divided into two subpixel electrodes 191$h$ and 191$l$ formed in two subpixel regions. The red pixel electrode 191R has a first red subpixel electrode 191$h$R formed in a first subpixel region of the red pixel and a second red subpixel electrode 191$l$R formed in a second subpixel region of the red pixel. The green pixel electrode 191G has a first green subpixel electrode 191$h$G formed in a first subpixel region of the green pixel and a second green subpixel electrode 191$l$G formed in a second subpixel region of the green pixel. The blue pixel electrode 191B has a first blue subpixel electrode 191$h$B formed in a first subpixel region of the blue pixel and a second blue subpixel electrode 191$l$B formed in a second subpixel region of the blue pixel. A micro branch width and a micro slit width of each of the first red subpixel electrode 191$h$R and the first green subpixel electrode 191$h$G is, for example, about 3 μm and about 3 μm, respectively, and a micro branch width and a micro slit width of the first blue subpixel electrode 191$h$B is, for example, about 3 μm and about 4 μm, respectively. A micro branch width and a micro slit width of each of the second red subpixel electrode 191$l$R, the second green subpixel electrode 191$l$G and the second blue subpixel electrode 191$l$B were, for example, about 3 μm and about 3 μm, respectively. According to an exemplary embodiment of the present invention, the width of the micro slits of the first subpixel electrode 191$h$B in the blue pixel is, for example, greater than the widths of the micro slits of the first subpixel electrodes 191$h$R and 191$h$G and the second subpixel electrodes 191$l$R, 191$l$G and 191$l$B in the other pixels, thus reducing first subpixel's luminance in the blue pixel.

A direction of micro branches of each of the first red, green and blue subpixel electrodes 191$h$R, 191$h$G and 191$h$B is, for example, θ3, which is about 40°. A direction of micro branches of each of the second red, green and blue subpixel electrodes 191$l$R, 191$l$G and 191$l$B is, for example, θ4, which is about 45°. Each of θ3 and θ4 is an angle with respect to the polarization axis of the polarizer. If micro branch directions of the first subpixel electrodes 191$h$R, 191$h$G and 191$h$B and the second subpixel electrodes 191$l$R, 191$l$G and 191$l$B are set different in this way, luminance of the first subpixels and luminance of the second subpixels are adjusted. In each of the pixels constituting the basic pixel group, the area of the second subpixel is, for example, about 1.75 times that of the first subpixel.

Figure 13A:
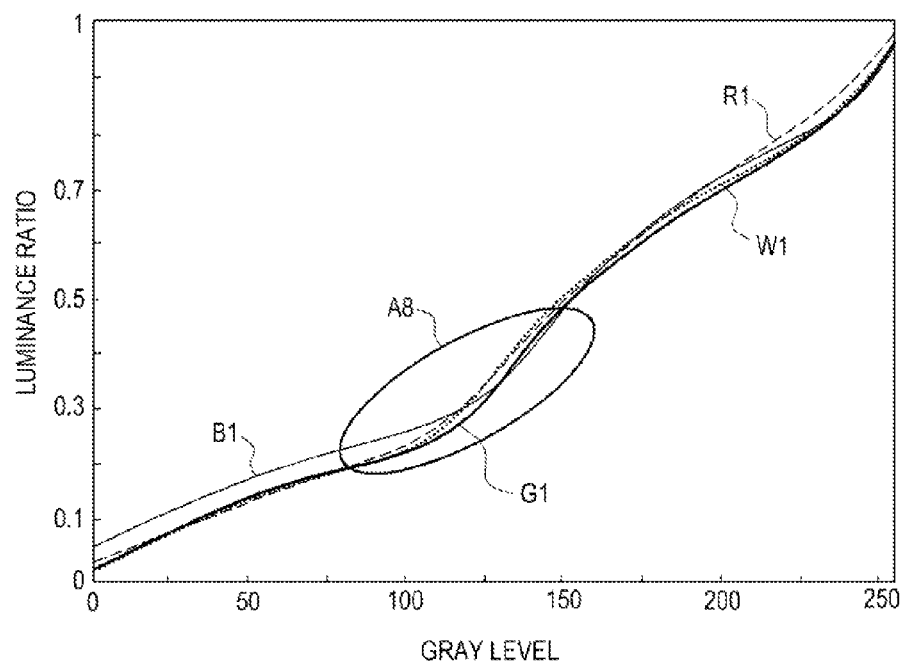
FIG. 13A is a gray level-luminance ratio graph of a conventional liquid crystal display device.
Figure 13B:
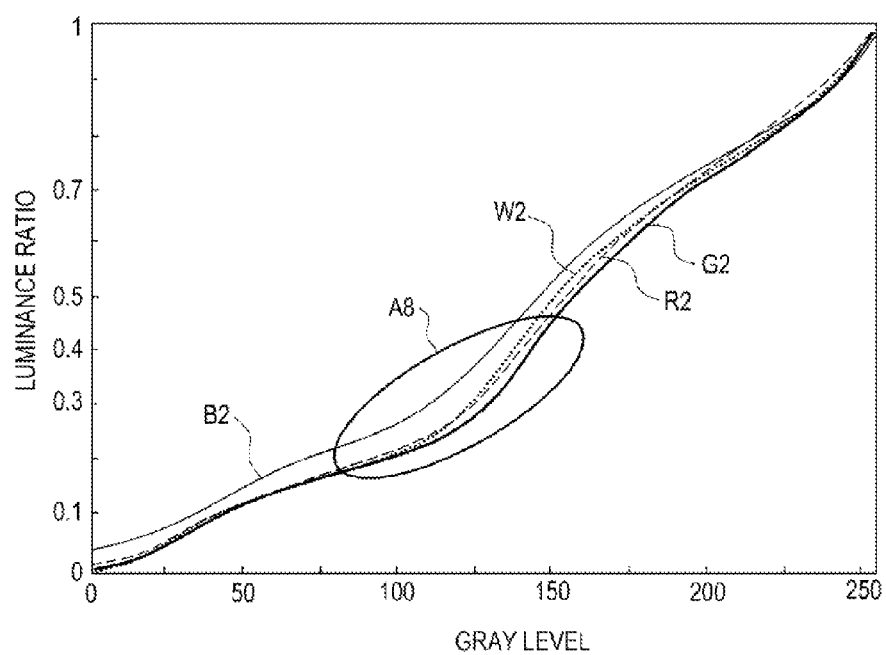
FIG. 13B is a gray level-luminance ratio graph of a proposed liquid crystal display device.

Now, a description will be made of optical properties and effects of the liquid crystal display device having the pixel electrodes 191 of the basic pixel group PS shown in FIG. 12. FIG. 13A is a gray level-luminance ratio graph measured in a conventional liquid crystal display device in which all of the pixel electrodes constituting a basic pixel group PS have the same structure. FIG. 13B is a gray level-luminance ratio graph measured in the liquid crystal display device having the pixel electrodes 191 of the basic pixel group PS shown in FIG. 12 according to an exemplary embodiment of the present invention. The liquid crystal display device according to an exemplary embodiment of the present invention was manufactured based on the SVA mode and operated using the CS charging-based 1G1D driving. Further, in the current exemplary embodiment of the present invention, the voltage charged in the second subpixel electrode was, for example, about 0.77 times the voltage charged in the first subpixel electrode, and the cell spacing in the liquid crystal layer was, for example, about 3.55 µm.

The horizontal axis of the gray level-luminance ratio graph represents a gray level corresponding to a voltage supplied to the subpixel electrodes 191*h* and 191*l*, and the vertical axis thereof represents a luminance ratio of the liquid crystal display device, which was measured by a spectroscope on the right side of the liquid crystal display device at, for example, approximately 60°. The luminance ratio on the vertical axis represents a ratio of gray level luminance to the maximum luminance of each color, measured at the right side at, for example, approximately 60°. Referring to a blue luminance curve B1 shown in FIG. 13A by way of example, if blue pixel's luminance is 100 candela (cd) at the highest gray level of 250, and 50 cd at a gray level of 150, the luminance ratio of the blue luminance curve B1 is about 0.5. Curves R1, G1, B1 and W1 shown in FIG. 13A are luminance ratio curves of red light, green light, blue light and white light, respectively, measured in the conventional liquid crystal display device. Curves R2, G2, B2 and W2 shown in FIG. 13B are luminance ratio curves of red light, green light, blue light and white light, respectively, measured in the liquid crystal display device according to an exemplary embodiment of the present invention. The white-light luminance W1 and W2 are sums of the red-light luminance R1 and R2, the green-light luminance G1 and G2, and the blue-light luminance B1 and B2. Ratios of the red-light luminance, green-light luminance and blue-light luminance to the white-light luminance are, for example, about 55% to about 65%, 20% to about 30% and 10% to about 20%, respectively.

As can be seen from the graph of FIG. 13A, in the medium gray level portion A8 represented by an ellipse, the conventional red-light luminance ratio curve R1 abruptly increases in slope, crossing the blue-light luminance ratio curve B1. After passing the point where the red-light luminance ratio curve R1 and the blue-light luminance ratio curve B1 cross each other, the red-light luminance ratio is higher than the blue-light luminance ratio. In this gray level portion A8 where the blue-light luminance ratio becomes lower than the red-light luminance ratio, a yellowish color appears at the side of the liquid crystal display device. If the yellowish color is visually perceived, the image quality may be decreased and the color of the original image may be disordered, thus deteriorating the display quality of the liquid crystal display device. Therefore, it may be good to prevent the yellowish color from being visually perceived. The luminance ratios of the primary colors cross each other at a specific one of high gray levels, but at the high gray levels, a luminance difference between gray levels is large, so the yellowish color can be scarcely observed.

However, as illustrated in FIG. 13B, the liquid crystal display device having the pixel electrodes of the basic pixel group PS according to an exemplary embodiment of the present invention does not have the point where the red-light luminance ratio curve R1 and the blue-light luminance ratio curve B1 cross each other, which was observed in the conventional liquid crystal display device. In the medium gray level portion A8 represented by all ellipse in FIG. 13B, since the red-light luminance ratio curve R2 and the blue-light luminance ratio curve B2 are similar in the slope, there is no point where the red-light luminance ratio and the blue-light luminance ratio cross each other. Therefore, the liquid crystal display device according to an exemplary embodiment of the present invention may not generate the yellowish color.

In addition, if luminance ratios among the primary colors change as the luminance ratios of different primary colors cross each other at a particular gray level, the liquid crystal display device may cause color error or chromaticity shift. To correct this, the luminance ratios among the primary color pixels constituting the basic pixel group PS may be designed in balance.

Figure 14:
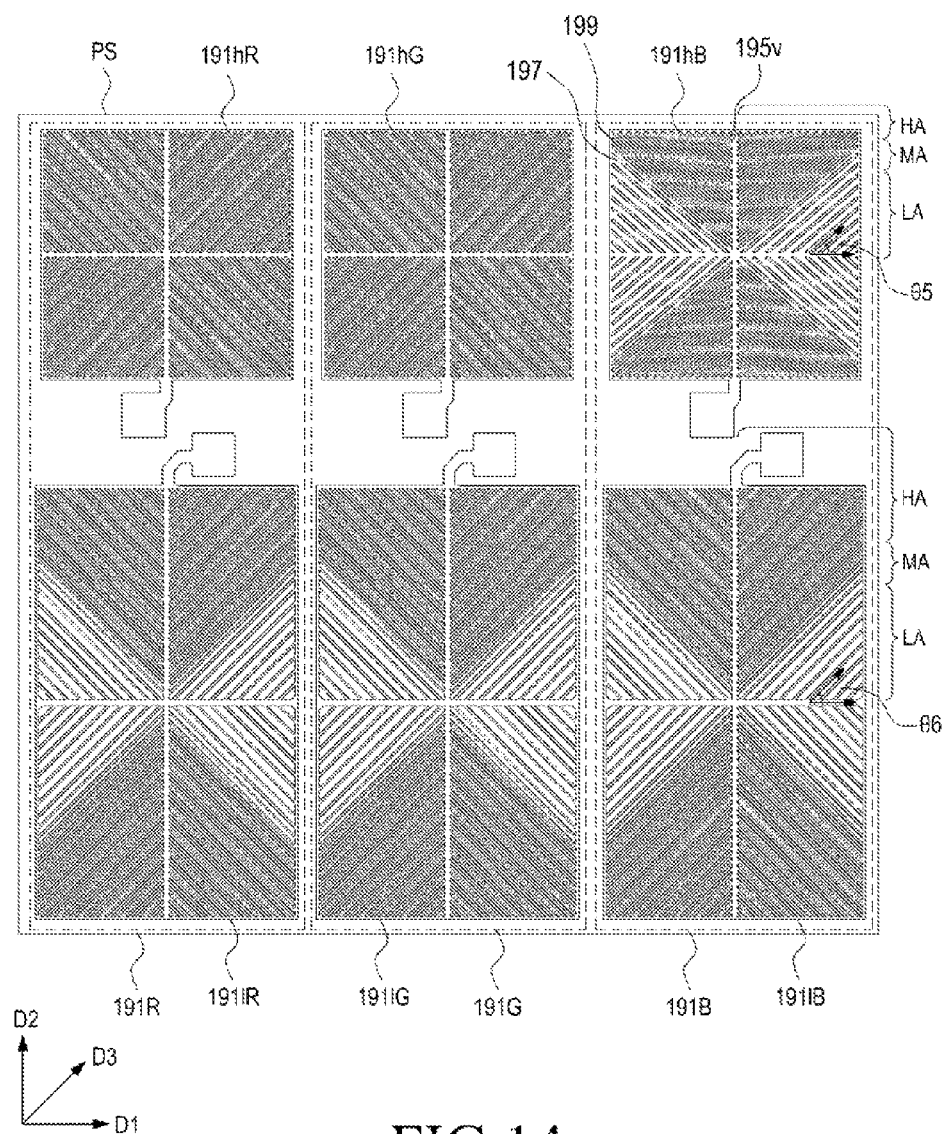
FIG. 14 is a plan view of pixel electrodes in a basic pixel group of a liquid crystal display device according to an exemplary embodiment of the present invention.

FIG. 14 is a plan view of the pixel electrodes 191 of the basic pixel group PS of a liquid crystal display device according to an exemplary embodiment of the present invention. FIG. 14 illustrates a plan view of only the pixel electrodes 191 of the basic pixel group PS formed on the lower display panel 100. As other plan views except the plan view of the pixel electrode 191 are the same as those described in FIG. 12, a description thereof is omitted, and other duplicate descriptions are also omitted except for the differences. The basic pixel group PS includes, for example, red, green and blue pixels PX corresponding to the three primary colors: red R, green G and blue B. In each of the pixels, pixel electrodes are formed, and each pixel electrode includes, for example, first and second subpixel electrodes.

For example, a micro branch width and a micro slit width of each of the first red subpixel electrode 191*h*R and the first green subpixel electrode 191*h*G are about 3 µm and about 3 µm, respectively, and a micro branch width and a micro slit width of the first blue subpixel electrode 191*h*B are, respectively, about 3 µm and about 3 µm in the HA region, about 3 µm and about 4 µm in the LA region, and about 3 µm and about 3 µm to about 4 µm in the MA region. Micro branches 197 formed in each domain are symmetrical about the horizontal and vertical cross-shaped branches 195. If the first blue subpixel electrode 191*h*B is formed in this manner, the first blue subpixel is lower in luminance than the first subpixels of other color pixels.

A micro branch width and a micro slit width of each of the second red subpixel electrode 191*l*R, the second green subpixel electrode 191*l*G and the second blue subpixel electrode 191*l*B are, respectively, for example, about 3 µm and about 3 µm in the HA region, about 3 µm and about 4 µm in the LA region, and about 3 µm and about 3 µm to about 4 µm in the MA region. The MA region included in each of the first and second blue subpixel electrodes 191*h*B and 191*l*B, the second red subpixel electrode 191*l*R and the second green subpixel electrode 191*l*G is a region where the micro branch width is, for example, constant to about 3 µm and the micro slit width, for example, gradually changes from about 3 µm to about 4 µM. In each domain, the area of the HA region is, for example, about 61% of the total area of the domain region, e.g., the combined area of the HA region, LA region and the MA region. In addition, the area of the MA region is, for example, about 30% to about 35% of the HA region's area. Micro branches 197 formed in each domain in each subpixel are, for example, symmetrical about the horizontal and vertical cross-shaped branches 195. By forming the subpixel electrodes of the second subpixels in this manner, it is possible to adjust luminance of the second subpixels with respect to luminance of the first subpixels. In addition, as the MA regions are formed on the second subpixel electrodes, texture occurrence decreases and luminance of the second subpixels increases.

A direction of micro branches of each of the first red, green and blue subpixel electrodes 191hR, 191hG and 191hB is equal to, for example, θ5, which is about 40°. A direction of micro slits of each of the second red, green and blue subpixel electrodes 191lR, 191lG and 191lB is equal to, for example, θ6, which is about 45°. Each of θ5 and θ6 is an angle with respect to the polarization axis of the polarizer. As angles of θ5 and θ6 are formed different, the luminance of the first and second subpixels may be adjusted, thereby increasing the side visibility of the liquid crystal display device.

By differentiating the micro slit width of the first subpixel electrode 191hB of the blue pixel electrode 191B from those of the first subpixel electrodes of other color pixels as illustrated in FIG. 14, the yellowish phenomenon of the liquid crystal display device may be prevented.

Unlike the exemplary embodiments shown in FIGS. 12 and 14, one pixel electrode other than the blue pixel electrode may be formed different in structure from other pixel electrodes.

In an exemplary embodiment of the present invention, micro branches 197 formed in each domain may be, for example, symmetrical about any one of the horizontal and vertical cross-shaped branches 195. For example, micro branches 197 formed in each domain may be, for example, symmetrical about the horizontal cross-shaped branch 195.

In an exemplary embodiment of the present invention, the basic pixel group PS may be comprised of, for example, four or more colors, including the yellow color. To increase the color quality of the liquid crystal display device, the structure of two or more primary colors' pixel electrodes 191 may be formed, for example, different from the structure of the other one primary color's pixel electrode 191 in the basic pixel group PS comprised of four or more primary colors.

A pixel electrode structure of a basic pixel group (PS) will be described in detail below with reference to FIGS. 28 to 32. Micro branches 197 and micro slits 199 illustrated FIGS. 28 to 32 have, for example, a zigzag shape. An area ratio of a first subpixel electrode 191h28 to a second subpixel electrode 191l28 may fall within a range of, for example, about 1:2 to about 1:1.5. Duplicate descriptions will be omitted hereinafter.

Figure 28:
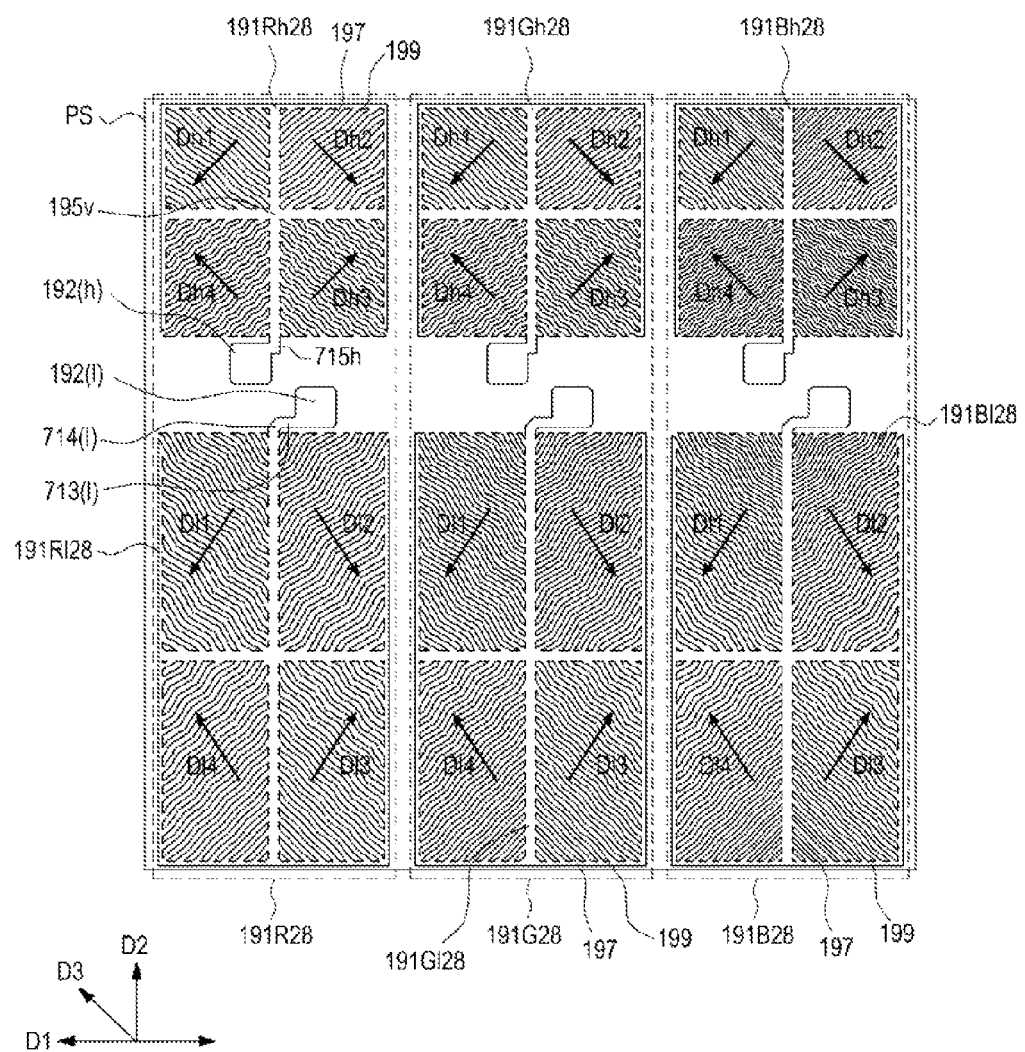
FIG. 28 is a plan view of pixel electrodes in a basic pixel group of a liquid crystal display device according to an exemplary embodiment of the present invention.

According to an exemplary embodiment of the present invention, a basic pixel group PS illustrated in FIG. 28 includes different structures of pixel electrodes corresponding to pixels having different primary colors. The primary colors include, for example, a red color R, a green color G and a blue color B, and they constitute red, green and blue pixels PXs, respectively. On a red pixel PX is formed a red pixel electrode 191R28, which includes first and second subpixel electrodes 191Rh28 and 191Rl28. On a green pixel PX is formed a green pixel electrode 191G28, which includes first and second subpixel electrodes 191Gh28 and 191Gl28. On a blue pixel PX is formed a blue pixel electrode 191B28, which includes first and second subpixel electrodes 191Bh28 and 191Bl28. For example, first subpixel electrodes 191Bh28, 191Gh28, and 191Rh28 of pixel electrodes, e.g., red, green and blue pixel electrodes 191R28, 191G28, and 191B28 of the basic pixel group, each have four domain regions Dh1, Dh2, Dh3, and Dh4, and also, second subpixel electrodes 191Bl28, 191Gl28, and 191Rl28 thereof each have four domain regions Dl1, Dl2, Dl3, and Dl4.

Micro branches 197 and micro slits 199 constituting pixel electrodes of the primary colors may, for example, be different in widths in different pixel electrodes of the primary colors. For example, in eight domains Dh1, Dh2, Dh3, Dh4, Dl1, Dl2, Dl3, and Dl4 formed on first and second subpixel electrodes 191Rh28 and 191Rl28 of the red pixel electrode 191R28, widths S and W of micro branches 197 and micro slits 199 gradually increase in the arrow directions illustrated in FIG. 28 from about 3.4 μm to about 4.2 μm by a value falling within a range of about 0.2 μm to about 0.5 μm. In eight domains Dh1, Dh2, Dh3, Dh4, Dl1, Dl2, Dl3, and Dl4 formed on first and second subpixel electrodes 191Gh28 and 191Gl28 of the green pixel electrode 191G28, widths S and W of micro branches 197 and micro slits 199, for example, gradually increase in the arrow directions illustrated in FIG. 28 from about 3 μm to about 3.8 μm by a value falling within a range of about 0.4 μm to about 0.5 μm. In eight domains Dh1, Dh2, Dh3, Dh4, Dl1, Dl2, Dl3, and Dl4 formed on first and second subpixel electrodes 191Bh28 and 191Bl28 of the blue pixel electrode 191B28, widths S and W of micro branches 197 and micro slits 199, for example, gradually increase in the arrow directions illustrated in FIG. 28 from about 2.5 μm to about 4 μm by a value falling within a range of about 0.2 μm to about 0.5 μm. In accordance with an exemplary embodiment of the present invention, each of domains Dh1~Dh4, and Dl1~Dl4 is divided into a plurality of groups, which have micro branches with the same widths S and micro slits with the same widths W, and in which widths of micro branches and micro slits may increase along groups in the arrow directions.

Main directions, zigzag angles and zigzag unit lengths of zigzag-shaped micro branches 197 will be described below. For example, in domains Dh1 and Dh2 formed on first subpixel electrodes 191Rh28, 191Gh28, and 191Bh28 of pixel electrodes 191R28, 191G28, and 191B28 in the basic pixel group, a zigzag unit length is about 20 μm, main direction angles of micro branches 197 are about 40°, and a zigzag angle gradually increases in the arrow directions illustrated in FIG. 28 from about ±0° to about ±12° by a value falling within a range of about 0.5° to about 1°. In domains Dh3 and Dh4 formed on first subpixel electrodes 191Rh28, 191Gh28, and 191Bh28 of pixel electrodes 191R28, 191G28, and 191B28 in the basic pixel group, for example, a zigzag unit length is about 7 μm, main direction angles of micro branches 197 are about 40°, and a zigzag angle is about ±15°. In domains Dl1 and Dl2 formed on second subpixel electrodes 191Rl28, 191Gl28, and 191Bl28 of red, green and blue pixel electrodes 191R28, 191G28 and 191B28, for example, a zigzag unit length is about 20 μm, main direction angles of micro branches 197 are about 45°, and a zigzag angle is about ±15°. In domains Dl3 and Dl4 formed on second subpixel electrodes 191Rl28, 191Gl28, and 191Bl28 of pixel electrodes 191R28, 191G28, and 191B28 in the basic pixel group, for example, a zigzag unit length is, about 14 μm, main direction angles of micro branches 197 are about 45°, and zigzag angles gradually increase in the arrow directions illustrated in FIG. 28 from about ±0° to about ±15° by a value falling within a range of about 0.5° to about 1°. Main directions, zigzag angles and zigzag unit lengths of micro branches 197 formed in domains Dh1, Dh2, Dh3, Dh4, Dl1, Dl2, Dl3 and Dl4 constituting the green pixel electrode 191G28 are, for example, equal to main directions, zigzag angles and zigzag unit lengths of micro branches 197 formed in domains constituting the red and blue pixel electrodes 191R28 and 191B28. In accordance with an exemplary embodiment of the present invention, in pixel electrodes 191R28, 191G28, and 191B28 of the basic pixel group, pixel electrode structures in domains Dh1, Dh4, Dl1, and Dl4 formed at the left of cross-shaped branch's vertical portions 195v may be, for example, symmetrical to pixel electrode structures in domains Dh2, Dh3, Dl2, and Dl3 formed at the right of the cross-shaped branch's vertical portions 195v about the vertical portions 195v. The basic pixel group constructed with these pixel electrodes may increase visibility of the liquid crystal display device, prevent the yellowish color from being visible, and significantly reduce rainbow stains by dispersing diffraction spots of light diffracted in the liquid crystal display device.

Each of pixel electrode junction connection portions formed on first subpixel electrodes 191Rh28, 191Gh28, and 191Bh28 has, for example, a pixel electrode's vertical connection portion 715h that connects a first pixel electrode contact portion 192h to a cross-shaped branch's vertical portion 195v. Each of pixel electrode junction connection portions formed on second subpixel electrodes 191Rl28, 191Gl28, and 191Bl28 has, for example, a pixel electrode's horizontal connection portion 713l connected to a second pixel electrode contact portion 192l, and a pixel electrode's oblique connection portion 714l that connects the pixel electrode's horizontal connection portion 713l to a cross-shaped branch's vertical portion 195v. These pixel electrode junction connection portions may reduce liquid crystal molecule's unrestoration and light leakage defects.

Figure 29:
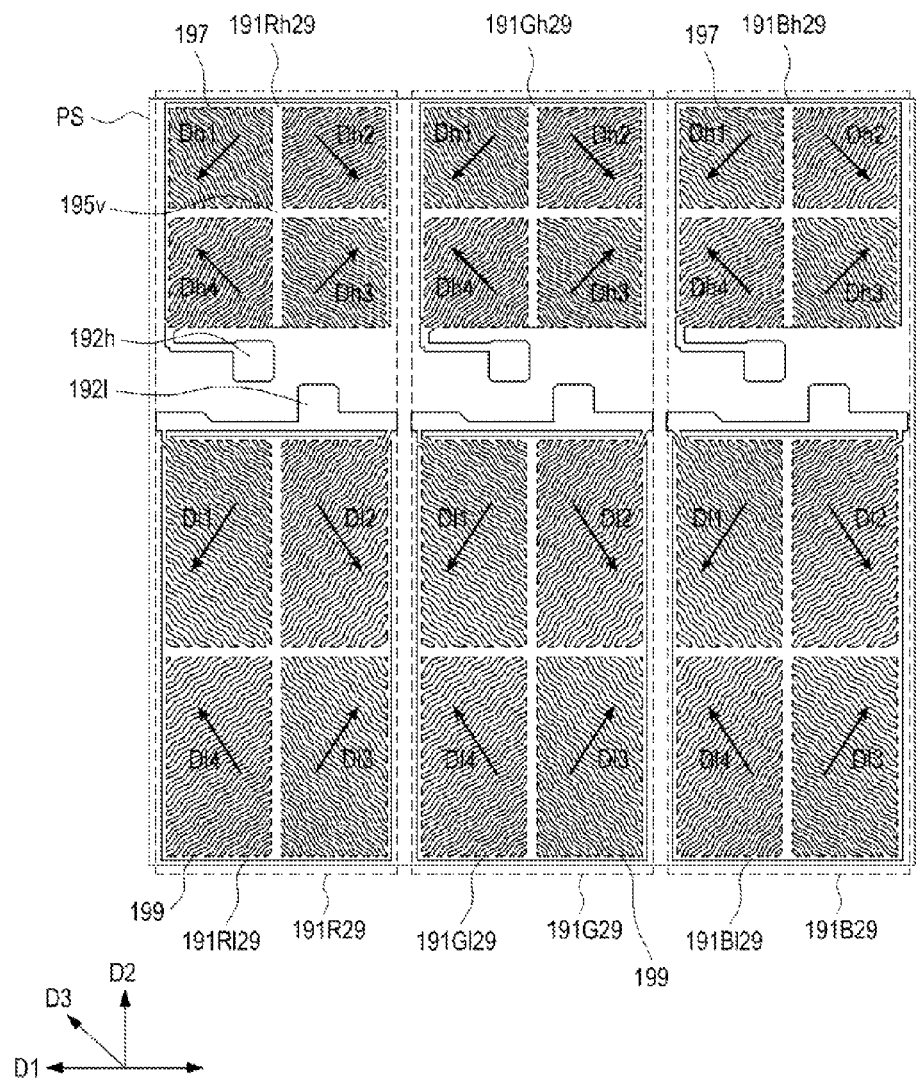
FIG. 29 is a plan view of pixel electrodes in a basic pixel group of a liquid crystal display device according to an exemplary embodiment of the present invention.

Domains formed on pixel electrodes constituting a basic pixel group illustrated in FIG. 29 have, for example, different main directions and the same zigzag angle according to an exemplary embodiment of the present invention. Widths of micro branches 197 and micro slits 199 illustrated in FIG. 29 are, for example, equal in domains formed on the same subpixels. In other words, widths of micro branches 197 and micro slits 199 are uniformly distributed in all domains Dh1, Dh2, Dh3, and Dh4 formed on first subpixels, and widths of micro branches 197 and micro slits 199 are uniformly distributed in all domains Dl1, Dl2, Dl3, and Dl4 formed on second subpixels. However, widths of micro branches 197 or micro slits 199 formed in domains of first subpixels are, for example, different from those in domains of second subpixels. For example, in domains Dh1, Dh2, Dh3, and Dh4 formed on first subpixel electrodes 191Rh29, 191Gh29, and 191Bh29 of pixel electrodes 191R29, 191G29, and 191B29 in the basic pixel group, widths S and W of micro branches 197 and micro slits 199 gradually increase in the arrow directions illustrated in FIG. 29 from about 2.5 µm to about 3.2 µm by a value falling within a range of about 0.2 µm to about 0.5 µm. In domains Dl1, Dl2, Dl3, and Dl4 formed on second subpixel electrodes 191Rl29, 191Gl29, and 191Bl29 of pixel electrodes 191R29, 191G29, and 191B29 in the basic pixel group, widths S and W of micro branches 197 and micro slits 199 gradually increase in the arrow directions illustrated in FIG. 29 from about 2.5 µm to about 3.5 µm by a value falling within a range of about 0.4 µm to about 0.5 µm. In accordance with an exemplary embodiment of the present invention, each of domains Dh1 to Dh4, and Dl1 to Dl4 is divided into, for example, a plurality of groups, which have micro branches with the same widths and micro slits with the same widths, and in which widths of micro branches and micro slits may increase along groups in the arrow directions.

Main directions, zigzag angles and zigzag unit lengths of zigzag-shaped micro branches 197 will be described below. Zigzag unit lengths are, for example, about 14 µm in domains Dh1, Dh2, Dh3 and Dh4 formed on first subpixel electrodes 191Rh29, 191Gh29, and 191Bh29 of pixel electrodes 191R29, 191G29, and 191B29 in the basic pixel group, and about 10 µm in domains Dl1, Dl2, Dl3 and Dl4 formed on second subpixel electrodes 191Rl29, 191Gl29, and 191Bl29. In domains Dh1, Dh2, Dh3 and Dh4 formed on first subpixel electrodes 191Rh29 and 191Gh29 of red and green pixel electrodes 191R29 and 191G29, and domains Dl1, Dl2, Dl3 and Dl4 formed on a second subpixel 191Bl29 of a blue pixel electrode 191B29, main direction angles of micro branches 197 are, for example, about 50°, about 48°, about 40°, and about 41.3°, respectively, and zigzag angles are about ±15° in each domain. In domains Dl1, Dl2, Dl3 and Dl4 formed on second subpixel electrodes 191Rl29 and 191Gl29 of red and green pixel electrodes 191R29 and 191G29, and domains Dh1, Dh2, Dh3 and Dh4 formed on a first subpixel electrode 191Bh29 of a blue pixel electrode 191B29, main direction angles of micro branches 197 are, for example, about 42°, about 40.8°, about 48°, and about 49.2°, respectively, and zigzag angles are, for example, about ±15° in each domain.

The basic pixel group PS having primary colors, the pixel electrodes 191R29, 191G29, and 191B29 including first subpixel electrodes 191Rh29, 191Gh29, and 191Bh29 and second subpixel electrodes 191Rl29, 191Gl29, and 191Bl29, the pixel electrodes divided into, for example, domain regions Dh1, Dh2, Dh3, Dh4, Dl1, Dl2, Dl3, and Dl4, the zigzag-shaped micro branches 197, and the area ratios of first subpixel electrodes to second subpixel electrodes are substantially similar to those described above or in connection with FIG. 28. The basic pixel group constructed with these pixel electrodes has the characteristics described in connection with FIG. 28. Pixel electrode junction connection portions formed on first and second subpixel electrodes 191Rh29, 191Gh29, 191Bh29, 191Rl29, 191Gl29, and 191Bl29 are similar to those described with reference to FIGS. 23C and 24C.

Figure 30:
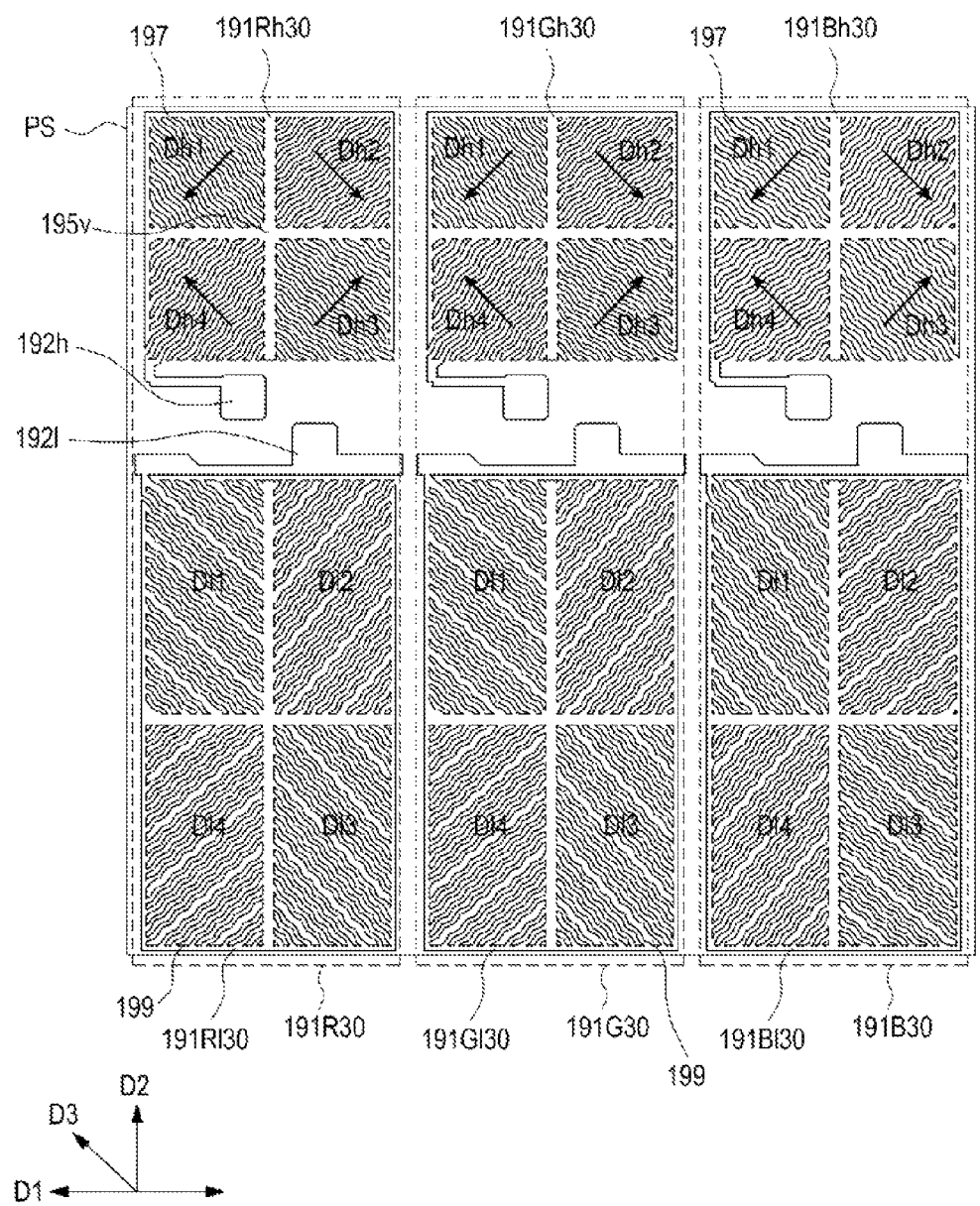
FIG. 30 is a plan view of pixel electrodes in a basic pixel group of a liquid crystal display device according to an exemplary embodiment of the present invention.

According to an exemplary embodiment of the present invention, in pixel electrodes constituting a basic pixel group PS illustrated in FIG. 30, each of domains Dl1, Dl2, Dl3, and Dl4 on second subpixel electrodes 191Rl30, 191Gl30, and 191Bl30 has, for example, a plurality of subdomains, micro branches and micro slits in each subdomain have the same widths, and a width between adjacent subdomains is greater than the widths of micro branches or micro slits in each subdomain. However, in domains Dh1 to Dh4 on first subpixel electrodes 191Rh30, 191Gh30, and 191Bh30, widths of micro branches and micro slits may, for example, gradually increase in the arrow directions. For example, in domains Dh1, Dh2, Dh3, and Dh4 formed on first subpixel electrodes 191Rh30 and 191Gh30 of red and green pixel electrodes 191R30 and 191G30, widths S and W of micro branches 197 and micro slits 199 gradually increase in the arrow directions illustrated in FIG. 30 from about 2.8 µm to about 3.3 µm by a value falling within a range of about 0.2 µm to about 0.5 µm. In domains Dh1, Dh2, Dh3, and Dh4 formed on a first subpixel electrode 191Bh30 of a blue pixel electrode 191B30, widths S of micro branches 197, for example, gradually increase in the arrow directions illustrated in FIG. 30 from about 2.8 µm to about 3.3 µm by a value falling within a range about 0.2 µm to about 0.5 µm, and widths W of micro slits 199 gradually increase from about 3.8 µm to about 4.0 µm. In accordance with an exemplary embodiment of the present invention, each of domains Dh1 to Dh4, and Dl1 to Dl4 is divided into, for example, a plurality of groups, which have micro branches with the same widths and micro slits with the same widths.

In subdomains of domains Dl1, Dl2, Dl3, and Dl4 on second subpixel electrodes 191Rl30, 191Gl30, and 191Bl30 of pixel electrodes 191R30, 191G30, and 191B30 in the basic pixel group, widths S and W of micro branches 197 and micro slits 199 are, for example, about 3.0 µm, respectively. For example, a width of each subdomain in each domain is about 27 µm, and an interval between adjacent subdomains in each domain is about 4.5 µm. Domains Dl3 and Dl4 formed on second subpixel electrodes 191Rl30, 191Gl30, and 191Bl30 may have, for example, subdomains in which widths S and W of most micro branches 197 and micro slits 199 are about 3.0 µm, and micro slits 199 include a width, for example, a width of about 4.5 µm, different from the width S of their adjacent micro slits 199, at intervals of a specific distance, for example, about 27 μm. In accordance with an exemplary embodiment of the present invention, micro branches 197 or micro slits 199 having, for example, a width greater than a width of their adjacent micro branches 197 or micro slits 199 may be formed in domains Dh1, Dh2, Dh3, Dh4, Dl1, Dl2, Dl3, and Dl4 constituting first or second subpixel electrode, at intervals of a specific distance. Zigzag unit lengths are, for example, about 10 μm in domains Dh1, Dh2, Dh3 and Dh4 formed on first subpixel electrodes 191Rh30, 191Gh30, and 191Bh30 of pixel electrodes 191R30, 191G30, and 191B30 in the basic pixel group, and about 7 μm in domains Dl1, Dl2, Dl3 and Dl4 formed on second subpixel electrodes 191Rl30, 191Gl30, and 191Bl30. Main directions and zigzag angles of micro branches 197 formed in domains of the basic pixel group are, for example, substantially similar to those described in connection with FIG. 29.

The basic pixel group PS having primary colors, the pixel electrodes 191R30, 191G30, and 191B30 including first subpixel electrodes 191Rh30, 191Gh30, and 191Bh30 and second subpixel electrodes 191Rl30, 191Bl30, and 191Bl30, the pixel electrodes divided into domains Dh1, Dh2, Dh3, Dh4, Dl1, Dl2, Dl3, and Dl4, the zigzag-shaped micro branches 197, and the area ratios of first subpixel electrodes to second subpixel electrodes are, for example, substantially similar to those described above or in connection with FIG. 28. The basic pixel group constructed with these pixel electrodes has, for example, the characteristics described in connection with FIG. 28. Pixel electrode junction connection portions formed on first and second subpixel electrodes 191Rh30, 191Gh30, 191Bh30, 191Rl30, 191Gl30, and 191Bl30 are, for example, similar to those described with reference to FIGS. 23F and 24C.

Figure 31:
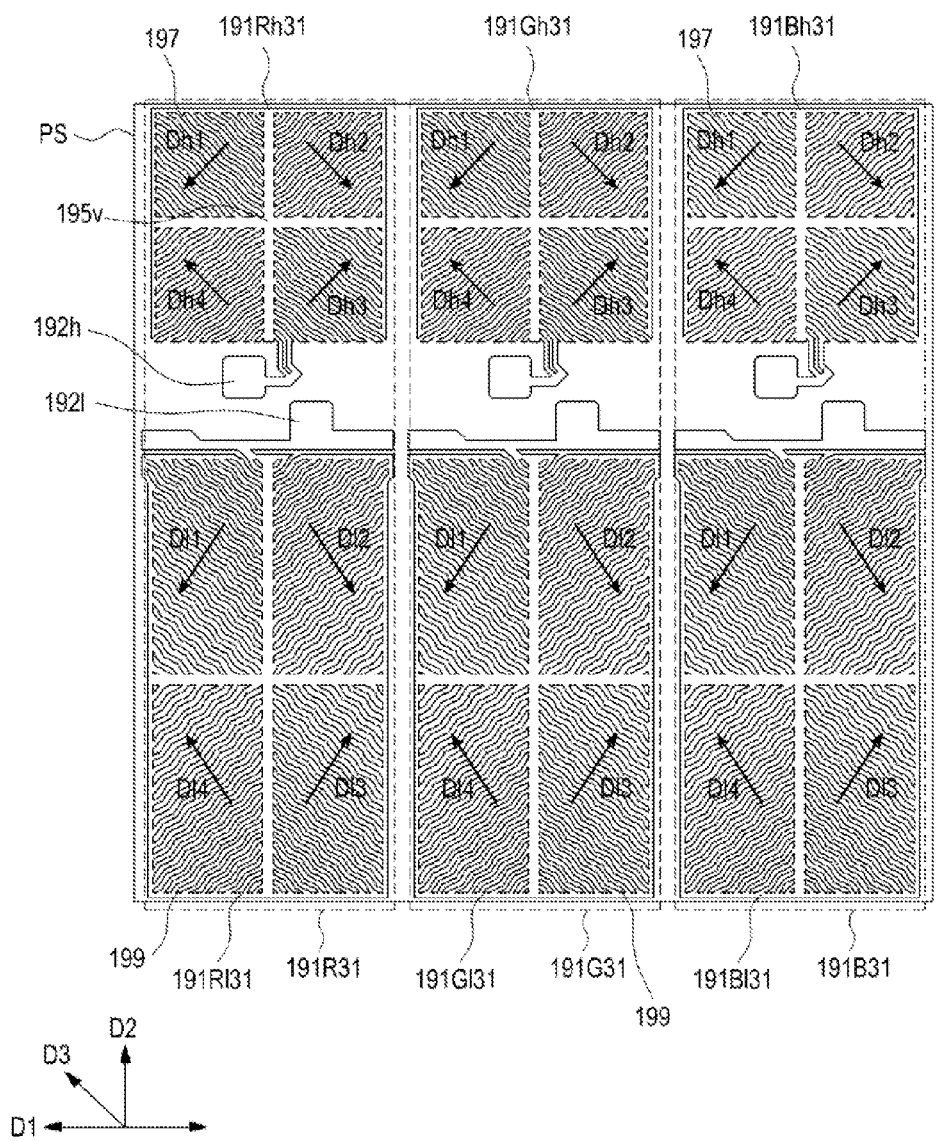
FIG. 31 is a plan view of pixel electrodes in a basic pixel group of a liquid crystal display device according to an exemplary embodiment of the present invention.

In a basic pixel group PS illustrated in FIG. 31, main direction angles of micro branches 197 are greater in domains formed on second subpixel electrodes 191Rl31, 191Gl31, and 191Bl31 rather than in domains formed on first subpixel electrodes 191Rh31, 191Gh31, and 191Bh31 according to an exemplary embodiment of the present invention. For example, in domains Dh1 and Dh2 on first subpixel electrodes 191Rh31, 191Gh31, and 191Bh31 of pixel electrodes 191R31, 191G31, and 191B31 in the basic pixel group, a zigzag unit length is about 14 μm, main direction angles of micro branches 197 are about 40.8°, and a zigzag angle is about 10°. In domains Dh3 and Dh4 thereof, for example, a zigzag unit length is about 14 μm, main direction angles of micro branches 197 are about 39.2°, and a zigzag angle is about 10°. In domains Dl1 and Dl2 on second subpixel electrodes 191Rl31, 191Gl31, and 191Bl31 of pixel electrodes 191R31, 191G31, 191B31 in the basic pixel group, for example, a zigzag unit length is about 10 μm, main direction angles of micro branches 197 are about 42°, and a zigzag angle is about 15°. In domains Dl3 and Dl4 thereof, for example, a zigzag unit length is about 10 μm, main direction angles of micro branches 197 are about 41.3°, and a zigzag angle is about 15°. Main direction angles of micro branches 197 may be an angle with respect to the direction D1.

In domains Dh1, Dh2, Dh3, and Dh4 formed on first subpixel electrodes 191Rh31, and 191Gh31 of red and green pixel electrodes 191R31 and 191G31, widths S and W of micro branches 197 and micro slits 199, may, for example, gradually increase in the arrow directions illustrated in FIG. 31 from about 2.8 μm to about 3.3 μm by a value falling within a range of about 0.2 μm to about 0.5 μm. In domains Dh1, Dh2, Dh3, and Dh4 formed on a first subpixel electrode 191Bh31 of a blue pixel electrode 191B31, for example, widths S and W of micro branches 197 and micro slits 199 gradually increase in the arrow directions illustrated in FIG. 31 from 3.3 μm to about 3.7 μm by a value falling within a range of about 0.2 μm to about 0.5 μm. In domains Dl1, Dl2, Dl3, and Dl4 on second subpixel electrodes 191Rl31, 191Gl31, and 191Bl31 of pixel electrodes 191R31, 191G31, and 191B31, for example, widths S and W of micro branches 197 and micro slits 199 gradually increase in the arrow directions illustrated in FIG. 31 from about 2.8 μm to about 3.9 μm by a value falling within a range of about 0.2 μm to about 0.5 μm. In accordance with an exemplary embodiment of the present invention, each of domains Dh1 to Dh4, and Dl1 to Dl4 is, for example, divided into a plurality of groups, which have micro branches with the same widths and micro slits with the same widths, and in which widths of micro branches and micro slits may increase along groups in the arrow directions. Other components are similar to those described in connection with FIG. 28, so a description thereof is omitted. Pixel electrode junction connection portions formed on first and second subpixel electrodes 191Rh31, 191Gh31, 191Bh31, 191Rl31, 191Gl31, and 191Bl31 are, for example, similar to those described with reference to FIG. 20C.

In accordance with an exemplary embodiment of the present invention, a basic pixel group PS illustrated in FIG. 32 includes, for example, four pixels PX having the structures described in connection with FIGS. 25 to 27B, in which longer sides of pixel electrodes are formed in parallel to a gate line 121. In accordance with an exemplary embodiment of the present invention, the four pixels PX illustrated in FIG. 32 have, for example, four different primary colors—red R, green G, blue B and white W—and include red, green, blue and white pixel electrodes 191R32, 191G32, 191B32 and 191W32. The pixel electrodes 191R32, 191G32, 191B32 and 191W32 include, for example, first subpixel electrodes 191Rh32, 191Gh32, 191Bh32, and 191Wh32, and second subpixel electrodes 191Rl32, 191Gl32, 191Bl32, and 191Wl32. Each of the first subpixel electrodes has, for example, four domain regions Dh1, Dh2, Dh3, and Dh4, and each of the second subpixel electrodes has four domain regions Dl1, Dl2, Dl3, and Dl4. For example, first subpixel electrodes of the red, green and white pixel electrodes 191R32, 191G32 and 191W32 are equal in structure, and a first subpixel electrode of the blue pixel electrode 191B32 is different from the first subpixel electrodes of pixel electrodes having other colors. For example, widths S and W of micro branches 197 and micro slits 199 formed in domains of the first subpixel electrodes 191Rh32, 191Gh32 and 191Wh32 may fall within a range of about 5 μm to about 5.6 μm, and they may have different sizes in one domain. In accordance with an exemplary embodiment of the present invention, widths S and W of micro branches 197 and micro slits 199 formed in domains of first subpixel electrodes 191Rh32, 191Gh32 and 191Wh32 may, for example, gradually increase in the arrow directions illustrated in FIG. 32. Widths S and W of micro branches 197 and 199 formed in domains of a first subpixel electrode 191Bh32 may fall, for example, within a range of about 6 μm to about 6.8 μm, or may have different sizes. In accordance with an exemplary embodiment of the present invention, widths S and W of micro branches 197 and micro slits 199 formed in domains of the first subpixel electrode 191Bh32 may, for example, gradually increase in the arrow directions illustrated in FIG. 32. In accordance with an exemplary embodiment of the present invention, widths S of micro branches 197 formed in domains of the first subpixel electrode 191Bh32 are, for example, greater than widths S of micro branches 197 formed in domains of the first subpixel electrodes 191Rh32, 191Gh32 and 191Wh32. Widths W of micro slits 199 formed in domains of the first subpixel electrode 191Bh32 are, for example, greater than widths W of micro slits 199 formed in domains of the first subpixel electrodes 191Rh32, 191Gh32 and 191Wh32.

Second subpixel electrodes of the red, green and white pixel electrodes 191R32, 191G32 and 191W32 are, for example, equal in structure. For example, widths S and W of micro branches 197 and micro slits 199 formed in domains of second subpixel electrodes 191Rl32, 191Gl32, 191Bl32 and 191Wl32 may fall within a range of about 5 µm to about 6.8 µm, and they may have different sizes in one domain. Widths S and W of micro branches 197 and micro slits 199 may, for example, gradually increase in the arrow directions illustrated in FIG. 32. Main directions, zigzag angles and zigzag unit lengths of zigzag-shaped micro branches 197 are described below. In domains Dh1, Dh2, Dh3 and Dh4 formed on first subpixel electrodes 191Rh32, 191Gh32, 191Bh32, and 191Wh32 of pixel electrodes 191R32, 191G32, 191B32, and 191W32 in the basic pixel group, for example, a zigzag unit length is about 14 µm, main direction angles of micro branches 197 may be about 40.8° or about 39.2°, and a zigzag angle may be about ±7°. In domains Dh1, Dh2, Dh3 and Dh4 formed on second subpixel electrodes 191Rl32, 191G132, 191Bl32, and 191Wl32, for example, a zigzag length is about 10 µm, main direction angles of micro branches 197 may be about 42° or about 41.3°, and a zigzag angle may be about ±5°. The basic pixel group constructed with these pixel electrodes may not only have the characteristics of the basic pixel group described in connection with FIG. 28, but also may increase transmittance of the liquid crystal display device. Pixel electrode junction connection portions formed on first subpixel electrodes 191Rh32, 191Gh32, 191Bh32, and 191Wh32 are, for example, similar to those described with reference to FIG. 23B, while pixel electrode junction connection portions formed on second subpixel electrodes 191Rl32, 191Gl32, 191Bl32, and 191Wl32 are connected to pixel electrode contact portions extending in the direction of a gate line, and are substantially similar to those described with reference to FIG. 23A. In accordance with an exemplary embodiment of the present invention, the primary colors may include, for example, red, green, blue and yellow colors.

Shapes of pixel electrodes, splitting of pixel electrodes, partitioning of domains, and structures of basic pixel groups will be described in detail below with reference to FIGS. 33A to 33I. For convenience of description, shapes of pixel electrodes illustrated in FIGS. 33A to 33I may be represented by contours of pixel electrodes or splitting of pixel electrodes. Other parts of pixel electrodes, for example, pixel electrode contact portions, micro branches 197 and micro slits 199, will be described in FIGS. 33A to 33I, as well. The structures and methods described with reference to FIGS. 3, 5, 12, 14, 16, 17, 18, 20, 23, 24, 25 and 28 to 32, may be applied to pixel electrodes illustrated in FIGS. 33A to 33I.

First, shapes and splitting of pixel electrodes will be described in detail with reference to FIGS. 33A to 33F. Each of the pixel electrodes illustrated in FIGS. 33A to 33F includes a first subpixel electrode 191h and a second subpixel electrode 191l. Each of the subpixel electrodes 191h and 191l may receive a data voltage by the above-described data voltage reception method, and the first subpixel electrode 191h may be, for example, higher than the second subpixel electrode 191l in terms of the charging voltage thereon. Referring to FIG. 33A, a first subpixel electrode 191h has, for example, four domains, and a second subpixel electrode 191l has, for example, eight domains. In other words, for example, the first subpixel electrode 191h has domains Dha, Dhb, Dhc and Dhd, and the second subpixel electrode 191l has domains Dla, Dlb, Dlc, Dld, Dle, Dlf, Dlg and Dlh. The structure of the second subpixel electrode 191l formed in this way may increase the visibility of the liquid crystal display device. The second subpixel electrode 191l may be, for example, greater in area than the first subpixel electrode 191h. Domains thereof may have the above-described structure. Referring to FIGS. 33B to 33F, each of first and second subpixel electrodes 191h and 191l includes, for example, four domains. In other words, for example, the first subpixel electrode 191h has domains Dha, Dhb, Dhc and Dhd, and the second subpixel electrode 191l has domains Dla, Dlb, Dlc and Dld. Sides of first and second subpixel electrodes 191h and 191l illustrated in FIG. 33B may be oblique lines extending in the direction of a data line 171. The oblique lines may be, for example, substantially in parallel to a transmission axis of a polarizer. Domains of the first and second subpixel electrodes 191h and 191l may be in the shape of, for example, a parallelogram. The pixel electrode formed in this way may increase the visibility and transmittance of the liquid crystal display device. First and second subpixel electrodes 191h and 191l illustrated in FIGS. 33C to 33F are adjacent to each other by oblique sides thereof. The oblique directions may be, for example, substantially in parallel to a transmission axis of a polarizer. The structure of a pixel electrode formed in this way may increase the visibility and transmittance of the liquid crystal display device. In the structure of pixel electrodes illustrated in FIGS. 33D to 33F, any one of first and second subpixel electrodes 191h and 191l substantially accommodates the other one. If boundary sides between adjacent subpixel electrodes are large in area, or domains of first and second subpixel electrodes 191h and 191l are uniformly distributed in this manner, the visibility of the liquid crystal display device may be increased. A first subpixel electrode 191h illustrated in FIG. 33D is split into, for example, two, bordering on a second subpixel electrode 191l. A second subpixel electrode 191l illustrated in FIG. 33E, for example, substantially surrounds a first subpixel electrode 191h, and a first subpixel electrode 191h illustrated in FIG. 33F substantially surrounds a second subpixel electrode 191l. For example, the second subpixel electrode 191l illustrated in FIG. 33F is diamond-shaped, and domains thereof are triangular.

Figure 33G:
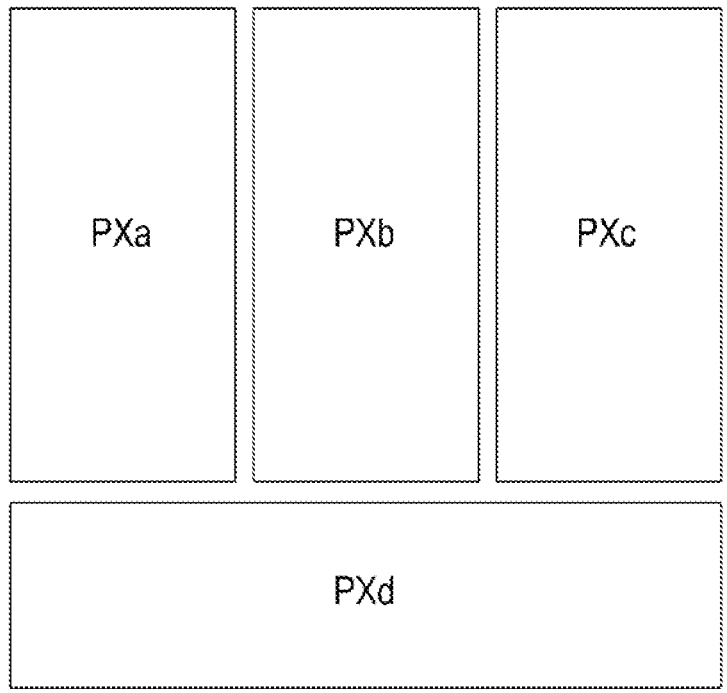
Figure 33H:
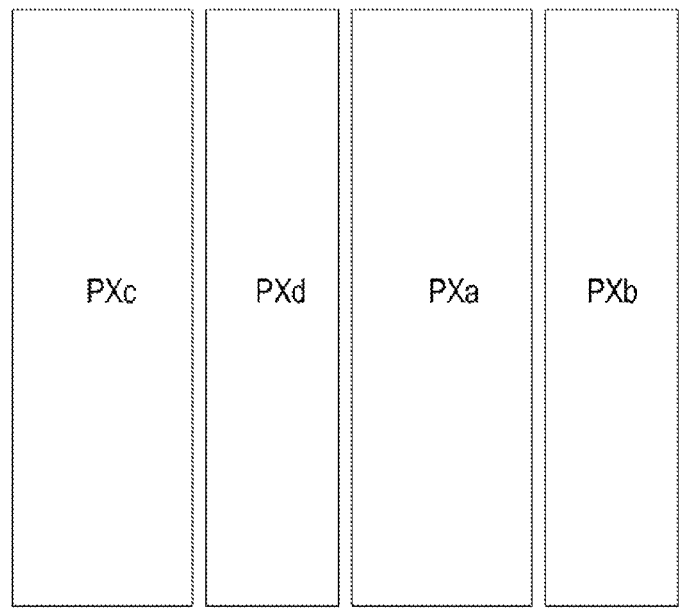
Figure 33I:
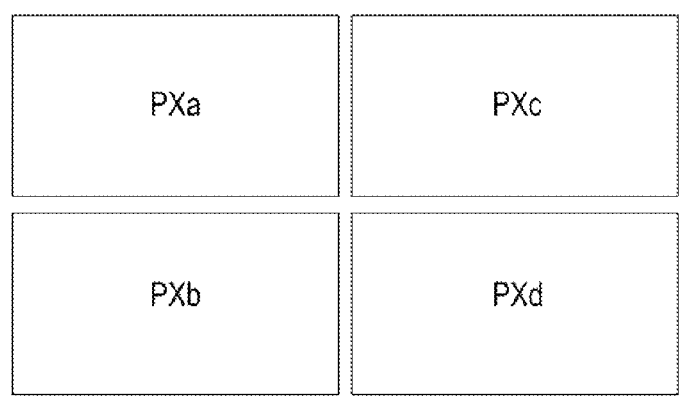

Structures of basic pixel groups PS will be described in detail below with reference to FIGS. 33G to 33I. Each of the basic pixel groups PS illustrated in FIGS. 33G to 33I includes, for example, four pixels PXa, PXb, PXc, and PXd having four different primary colors. The four primary colors may include, for example, red, green, blue and yellow or white colors. A pixel PXa may have, for example, a red color, a pixel PXb may have a green colon a pixel PXc may have a blue color, and a pixel PXd may have a yellow or white color. The basic pixel groups PS formed in this way may increase the color reproducibility, transmittance and visibility of the liquid crystal display device. In accordance with an exemplary embodiment of the present invention, the primary colors may include a variety of colors as described above. The pixels PXa, PXb, PXc and PXd illustrated in FIG. 33G have red, green, blue and white colors in order, thereby increasing the transmittance of the liquid crystal display device. The pixels PXa, PXb, PXc and PXd illustrated in FIG. 33H have red, green, blue and yellow colors in order, thereby increasing the color reproducibility and display quality of the liquid crystal display device. In addition, to further increase the color reproducibility and display quality of the liquid crystal display device, an area ratio of the red, green, blue and yellow pixels may be, for example, about 1.4 to about 1.8:1.0 to about 1.3:1.4 to about 1.8:1 (e.g., about 1.6:1.1:1.6:1). The basic pixel group PS including pixels PXa, PXb, PXc and PXd illustrated in FIG. 33I is similar to, for example, that described in connection with FIG. 32. The pixels in FIG. 33I may be, for example, substantially identical in area.

As is apparent from the foregoing description, according to an exemplary embodiments of the present invention, the side visibility of the liquid crystal display device may be increased and the display quality thereof may also be increased.

The liquid crystal display device and the alignment film provided by exemplary embodiments of the present invention may increase the alignment properties of liquid crystal molecules and the reliability of the alignment film, thereby ensuring the excellent display quality of the liquid crystal display device.

Having described exemplary embodiments of the present invention, it is further noted that it is readily apparent to those of ordinary skill in the art that various modifications may be made without departing from the spirit and scope of the invention which is defined by the metes and bounds of the appended claims.

What is claimed is:

1. An alignment film comprising:
   a first pre-tilt functional group, a second pre-tilt functional group and a first vertical alignment functional group, which are linked to polysiloxane on a substrate;
   wherein the first vertical alignment functional group includes a cyclic group and is aligned substantially perpendicularly to the substrate;
   wherein the first pre-tilt functional group is cross-linked to the second pre-tilt functional group and tilted with respect to the substrate,
   wherein the alignment film further comprises an aggregation inhibitor linked to the polysiloxane.

2. The alignment film of claim 1, wherein a mol % composition ratio of the first vertical alignment functional group and the first pre-tilt functional group is about 1:about 1.5 to about 11.

3. The alignment film of claim 2, wherein the first pre-tilt functional group is greater than the second pre-tilt functional group in chain length.

4. The alignment film of claim 3, further comprising a second vertical alignment functional group linked to the polysiloxane, wherein the second vertical alignment functional group does not include a cyclic group.

5. The alignment film of claim 2, further comprising a second vertical alignment functional group linked to the polysiloxane, wherein the second vertical alignment functional group does not include a cyclic group.

6. The alignment film of claim 2, wherein the first vertical alignment functional group includes any one of an alkyl benzene group, a cholesteric group, an alkylated alicyclic group, or an alkylated aromatic group.

7. The alignment film of claim 1, wherein the first pre-tilt functional group is greater than the second pre-tilt functional group in chain length.

8. The alignment film of claim 7, further comprising a second vertical alignment functional group linked to the polysiloxane, wherein the second vertical alignment functional group does not include a cyclic group.

9. The alignment film of claim 7, wherein the first and second pre-tilt functional groups each include a different one of a vinyl group, a styrene group, a methacrylate group, a cinnamate group, or an acrylic group.

10. The alignment film of claim 7, wherein a mol % composition ratio of the first vertical alignment functional group, the first pre-tilt functional group, and the second pre-tilt functional group is about 1:about 1.5 to about 11:about 1 to about 3.

11. The alignment film of claim 1, wherein a mol % composition ratio of the first vertical alignment functional group, the first pre-tilt functional group, and the aggregation inhibitor is about 1:about 1.5 to about 11:about 0.5 to about 4.

12. The alignment film of claim 1, further comprising a second vertical alignment functional group linked to the polysiloxane, wherein the second vertical alignment functional group does not include a cyclic group.

13. The alignment film of claim 12, wherein a mol % composition ratio of the first vertical alignment functional group, the second vertical alignment functional group, and the first pre-tilt functional group is about 1:about 0.3 to about 3:about 1.5 to about 11.

14. A liquid crystal display device comprising:
   a liquid crystal layer including liquid crystal molecules and interposed between a first display panel and a second display panel; and
   an alignment film formed on at least one of the first and second display panels, wherein the alignment film includes a first pre-tilt functional group, a second pre-tilt functional group and a first vertical alignment functional group, which are linked to polysiloxane;
   wherein the first vertical alignment functional group includes a cyclic group and is configured to align first liquid crystal molecules among the liquid crystal molecules to be substantially perpendicular to the first or second display panels;
   wherein the first pre-tilt functional group is cross-linked to the second pre-tilt functional group and is configured to align second liquid crystal molecules among the liquid crystal molecules to be tilted with respect to the first or second display panels,
   wherein the alignment film further comprises an aggregation inhibitor linked to the polysiloxane.

* * * * *